United States Patent
Jeon et al.

(10) Patent No.: US 11,665,957 B2
(45) Date of Patent: May 30, 2023

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Aram Jeon, Suwon-si (KR); Ohyun Kwon, Seoul (KR); Seungyeon Kwak, Suwon-si (KR); Yoonhyun Kwak, Seoul (KR); Kum Hee Lee, Suwon-si (KR); Hyeonho Choi, Seoul (KR); Whail Choi, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 657 days.

(21) Appl. No.: 16/718,275

(22) Filed: Dec. 18, 2019

(65) Prior Publication Data
US 2020/0212320 A1    Jul. 2, 2020

(30) Foreign Application Priority Data
Dec. 31, 2018    (KR) ........................ 10-2018-0174222

(51) Int. Cl.
*C07F 15/00* (2006.01)
*C09K 11/06* (2006.01)

(52) U.S. Cl.
CPC ....... *H10K 85/346* (2023.02); *C07F 15/0086* (2013.01); *C09K 11/06* (2013.01); *C09K 2211/185* (2013.01); *H10K 50/11* (2023.02); *H10K 2101/10* (2023.02)

(58) Field of Classification Search
CPC ............. H01L 51/0087; H01L 51/5016; H01L 51/0081; H01L 51/5024; C07F 15/0086; C09K 11/06; C09K 2211/185; G01N 21/64; G01N 33/58; G01N 21/06; G01N 21/04; H10K 85/346; H10K 50/11; H10K 2101/10; H10K 85/324; H10K 50/12
USPC ........................................................ 428/690
See application file for complete search history.

(56) References Cited

U.S. PATENT DOCUMENTS

| | | | |
|---|---|---|---|
| 9,461,254 B2 | 10/2016 | Tsai et al. | |
| 10,937,974 B2* | 3/2021 | Jeon | C09K 11/06 |
| 11,352,384 B2* | 6/2022 | Lee | C07F 15/0086 |
| 2015/0194615 A1 | 7/2015 | Lin et al. | |
| 2016/0359125 A1* | 12/2016 | Li | H01L 51/0087 |
| 2017/0040551 A1 | 2/2017 | Hwang et al. | |
| 2017/0256727 A1* | 9/2017 | Lee | H01L 51/0094 |
| 2017/0346025 A1* | 11/2017 | Hwang | C07D 213/16 |
| 2018/0090707 A1 | 3/2018 | Jeon et al. | |
| 2018/0148464 A1 | 5/2018 | Li et al. | |
| 2018/0309071 A1 | 10/2018 | Jeon et al. | |
| 2019/0135844 A1* | 5/2019 | Jeon | C07F 1/12 |
| 2020/0152891 A1 | 5/2020 | Li et al. | |
| 2022/0127290 A1* | 4/2022 | Hwang | C07F 15/006 |
| 2022/0185834 A1* | 6/2022 | Kwon | C07F 15/0033 |
| 2022/0213132 A1* | 7/2022 | Lee | H01L 51/5096 |

FOREIGN PATENT DOCUMENTS

| | | | |
|---|---|---|---|
| KR | 1020150043225 A | 4/2015 | |
| KR | 1020170016155 A | 2/2017 | |

OTHER PUBLICATIONS

CAS reg. No. 2450961-89-2, Jul. 28, 2020. (Year: 2020).*
Piotr Zabierowski, et al., Cobalt(II) and copper(II) supramolecular networks with a 1-iminoisoindoline asymmetric pincer, The Royal Society of Chemistry 2015, 5, 25911-25918.
Sangita Adhikari, et al., Cu(II) complex of a new isoindole derivative structure, catecholase like activity, antimicrobial properties and bio-molecular interactions, New J. Chem., 2016, 40, 10094-10099.

* cited by examiner

*Primary Examiner* — Douglas J McGinty
(74) *Attorney, Agent, or Firm* — Cantor Colburn LLP

(57) ABSTRACT

An organometallic compound represented by Formula 1, an organic light-emitting device including the organometallic compound, and a diagnostic composition including the organometallic compound:

Formula 1

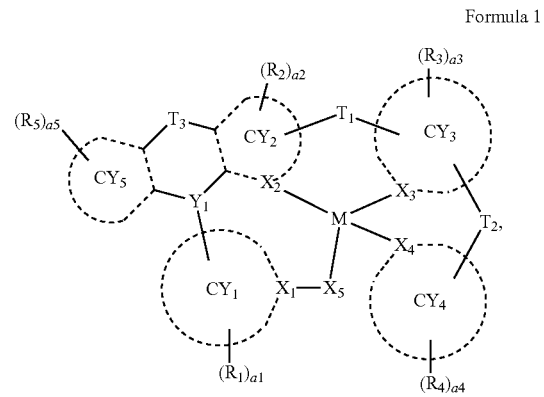

wherein, in Formula 1, M, $X_1$ to $X_4$, $Y_1$, $X_5$, ring $CY_1$ to ring $CY_5$, $T_1$ to $T_3$, $T_1$ to $T_5$, and a1 to a5 are each independently the same as described above.

20 Claims, 1 Drawing Sheet

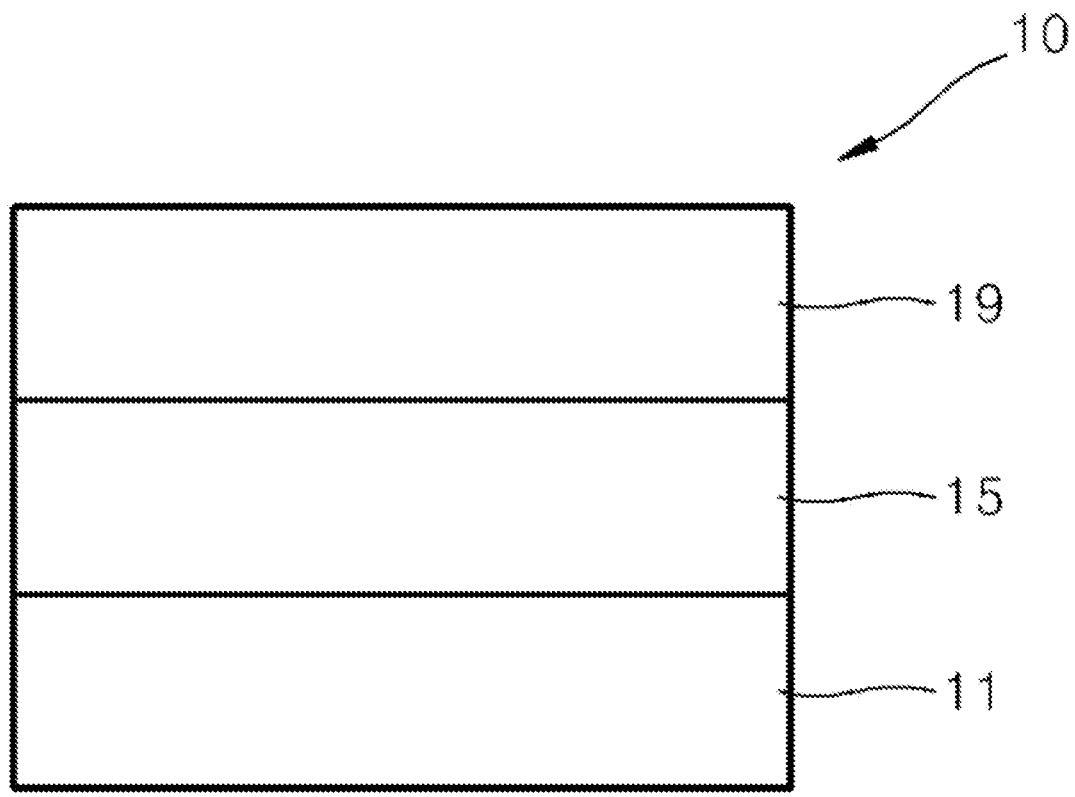

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to and the benefit of Korean Patent Application No. 10-2018-0174222, filed on Dec. 31, 2018, in the Korean Intellectual Property Office, and all the benefits accruing therefrom under 35 U.S.C. § 119, the contents of which in their entirety are herein incorporated by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices are self-emission devices, which have better characteristics in terms of a viewing angle, a response time, a brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the disclosed embodiments.

An aspect of the present disclosure provides an organometallic compound represented by Formula 1 below:

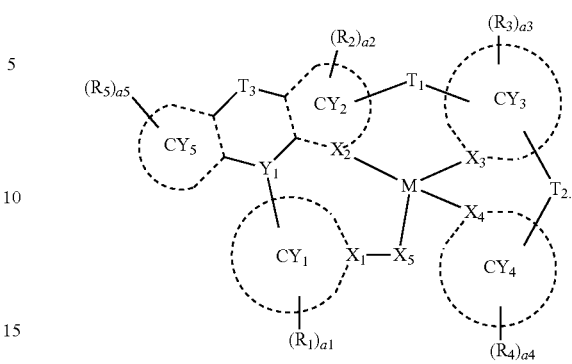

Formula 1

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ to $X_4$ may each independently be N or C, $Y_1$ may be C, Si, Ge, B, N, or P, $X_5$ may be O, S, B(R'), N(R'), P(R'), C(R')(R''), Si(R')(R''), Ge(R')(R''), C(=O), B(R')(R''), N(R')(R''), or P(R')(R''), two bonds of a bond between $X_5$ and M, a bond between $X_2$ and M, a bond between $X_3$ and M, and a bond between $X_4$ and M may each be a covalent bond, and the others thereof may each be a coordinate bond, ring $CY_1$ to ring $CY_5$ may each independently be a $C_5$-$C_{30}$ carbocyclic group or a $C_2$-$C_{30}$ heterocyclic group, $T_1$ and $T_2$ may each independently be a single bond, a double bond, *—N($R_6$)—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=*', *=C($R_6$)—*', *—C($R_6$)=C($R_7$)—*', *—C(=S)—*', or *—C≡C—*', and * and *' each indicate a binding site to a neighboring atom, wherein $T_2$ is not a single bond, $R_7$ and $R_8$ may optionally be linked via a single bond, a double bond, or a first linking group to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, $T_3$ may each independently be linked via a single bond, a double bond, *—N($R_8$)—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=*', *=C($R_8$)—*', *—C($R_8$)=C($R_9$)—*', *—C(=S)—*', or *—C≡C—*', and * and *' each indicate a binding site to a neighboring atom, $R_8$ and $R_9$ may optionally be linked via a single bond, a double bond, or a second linking group to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, $R_1$ to $R_9$, R', and R'' may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), a1 to a5 may each independently be an integer from 0 to 20, two or more of a plurality of neighboring $R_1$(s) may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, two or more of a plurality of neighboring $R_2$(s) may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, two or more of a plurality of neighboring $R_3$(s) may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, two or more of a plurality of neighboring $R_4$(s) may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, two or more of a plurality of neighboring $R_5$(s) may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, two or more of $R_1$ to $R_9$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, $R_{10a}$ may be the same as defined in connection with $R_1$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Another aspect of the present disclosure provides an organic light-emitting device including: a first electrode; a second electrode; and an organic layer between the first electrode and the second electrode and including an emission layer, wherein the organic layer may include at least one organometallic compound represented by Formula 1.

The organometallic compound represented by Formula 1 in the organic layer may act as a dopant.

Another aspect of the present disclosure provides a diagnostic composition including the organometallic compound represented by Formula 1.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower" can, therefore, encompass both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURES are schematic in nature and their shapes are not intended to illustrate the precise shape of a region and are not intended to limit the scope of the present claims.

An organometallic compound according to an embodiment is represented by Formula 1 below:

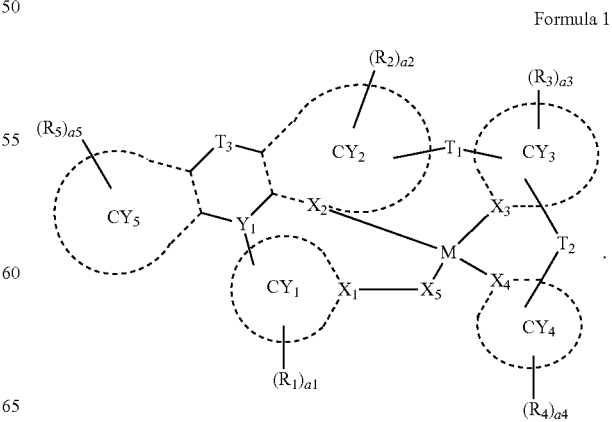

Formula 1

In Formula 1, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pd, Pt, or Au, but embodiments of the present disclosure are not limited thereto.

In Formula 1, $X_1$ to $X_4$ may each independently be N or C, and $Y_1$ may be C, Si, Ge, B, N, or P.

For example, i) $X_1$ and $X_3$ may each independently be C, and $X_2$ and $X_4$ may each independently be N; or ii) $X_1$ and $X_4$ may each independently be C, and $X_2$ and $X_3$ may each independently be N.

In one embodiment, $X_1$ and $X_3$ may each independently be C, $X_2$ and $X_4$ may each independently be N, and $Y_1$ may be B, N, or P, but embodiments of the present disclosure are not limited thereto.

In Formula 1, $X_5$ may be O, S, B(R'), N(R'), P(R'), C(R')(R"), Si(R')(R"), Ge(R')(R"), C(=O), B(R')(R"), N(R')(R"), or P(R')(R"). R' and R" may each independently be the same as described herein.

For example, $X_5$ may be O or S.

In Formula 1, two bonds of a bond between $X_5$ and M, a bond between $X_2$ and M, a bond between $X_3$ and M, and a bond between $X_4$ and M may each be a covalent bond, and the others thereof may each be a coordinate bond. Therefore, the organometallic compound represented by Formula 1 may be electrically neutral.

For example, i) a bond between $X_5$ and M and a bond between $X_3$ and M may each be a covalent bond, and a bond between $X_2$ and M and a bond between $X_4$ and M may each be a coordinate bond; or ii) a bond between $X_5$ and M and a bond between $X_4$ and M may each be a covalent bond, and a bond between $X_2$ and M and a bond between $X_3$ and M may each be a coordinate bond, but embodiments of the present disclosure are not limited thereto.

In Formula 1, ring $CY_1$ to ring $CY_5$ may each independently be a $C_5$-$C_{30}$ carbocyclic group or a $C_2$-$C_{30}$ heterocyclic group.

For example, ring $CY_1$ to ring $CY_5$ may each independently be a 6-membered ring.

In one embodiment, ring $CY_1$ to ring $CY_5$ may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the 6-membered ring may be a cyclohexane group, a cyclohexene group, a benzene group, a pyridine group, a pyrimidine group, a pyrazine group, a pyridazine group or a triazine group.

In one embodiment, ring $CY_1$ to ring $CY_5$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an indazole group, a benzofluorene group, a benzocarbazole group, a naphthobenzofuran group, a naphthobenzothiophene group, or a naphthobenzosilole group, but embodiments of the present disclosure are not limited thereto.

In one embodiment, $T_1$ and $T_2$ in Formula 1 may each independently be a single bond, a double bond, *—N($R_6$)—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=', *=C($R_6$)—*', *—C($R_6$)=C($R_7$)—*', *—C(=S)—*', or *—C≡C—*', wherein * and *' each indicate a binding site to a neighboring atom, and $T_2$ may not be a single bond. $R_6$ and $R_7$ are the same as described above and $R_7$ and $R_8$ may optionally be linked via a single bond, a double bond, or a first linking group to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof.

In one or more embodiments, $T_1$ may be a single bond, and $T_2$ may be *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', or *—O—*, but embodiments of the present disclosure are not limited thereto.

In one or more embodiments, $T_3$ in Formula 1 may each independently a single bond, a double bond, *—N($R_8$)—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=', *=C($R_8$)—*', *—C($R_8$)=C($R_9$)—*', *—C(=S)—*', or *—C≡C—*, wherein * and *' each indicate a binding site to a neighboring atom, and $R_8$ and $R_9$ are the same as described above, and $R_8$ and $R_9$ may optionally be linked via a single bond, a double bond, or a second linking group to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof.

In one embodiment, $T_3$ may a single bond, but embodiments of the present disclosure are not limited thereto.

The first linking group and the second linking group may each independently be *—N($R_{9a}$)—*', *—B($R_{9a}$)—*', *—P($R_{9a}$)—*', *—C($R_{9a}$)($R_{9b}$)—*', *—Si($R_{9a}$)($R_{9b}$)—*', *—Ge($R_{9a}$)($R_{9b}$)—*', *—S—*', *—Se—*', *—O—*', *—C(=O)—*', *—S(=O)—*', *—S(=O)$_2$—*', *—C($R_{9a}$)=*', *=C($R_{9a}$)—*', *—C($R_{9a}$)=C($R_{9b}$)—*', *—C(=S)—*', or *—C≡C—*', wherein $R_{9a}$ and $R_{9b}$ are the same as described above for $R_9$, and * and *' each independently indicate a binding site to a neighboring atom.

$R_1$ to $R_9$, R', and R" may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, and $Q_1$ to $Q_9$ are the same as described above.

For example, $R_1$ to $R_9$, R', and R" may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, or a naphthoxy group;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, or a naphthoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —$Si(Q_{33})(Q_{34})(Q_{35})$, or any combination thereof; or —$N(Q_1)(Q_2)$, —$Si(Q_3)(Q_4)(Q_5)$, —$B(Q_6)(Q_7)$, or —$P(=O)(Q_8)(Q_9)$, $Q_1$ to $Q_9$ and $Q_{33}$ to $Q_{35}$ may each independently be:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group or a naphthyl group, each substituted with deuterium, a $C_1$-$C_{10}$ alkyl group, a phenyl group, or any combination thereof.

In one embodiment, $R_1$ to $R_9$, R', and R" may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a $C_1$-$C_{10}$ alkoxy group, a group represented by one of Formulae 9-1 to 9-19, a group represented by one of Formulae 10-1 to 10-226, —N($Q_1$)($Q_2$), —Si($Q_3$)($Q_4$)($Q_5$), —B($Q_6$)($Q_7$), or —P(=O)($Q_8$)($Q_9$):

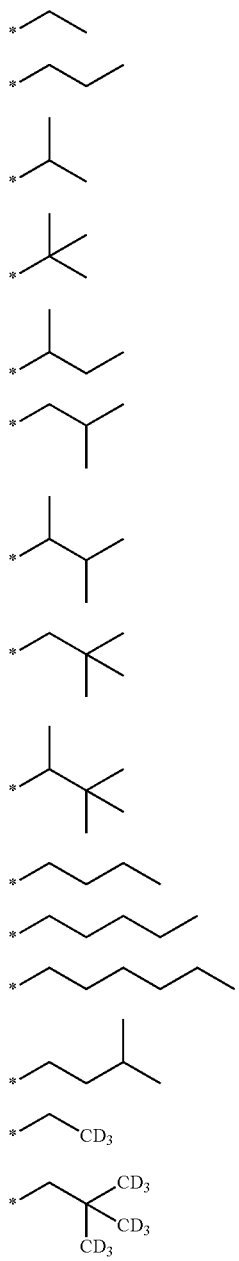

-continued

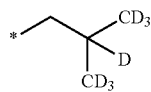
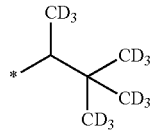
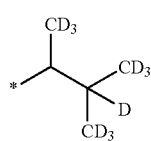
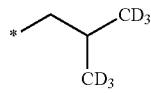
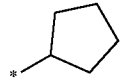
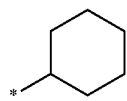
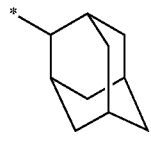
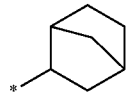
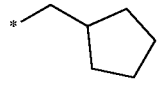
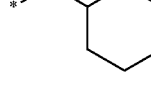
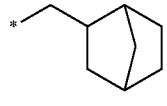
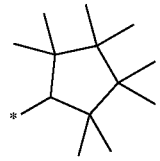

-continued
10-10 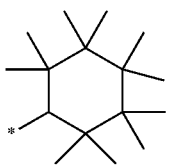
10-11 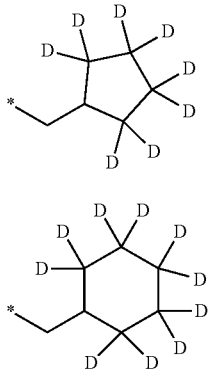
10-12 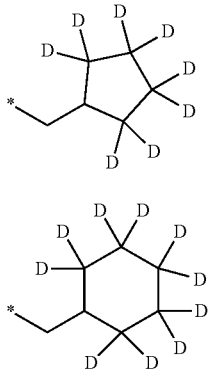
10-13 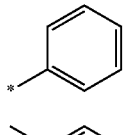
10-14 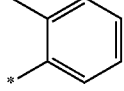
10-15 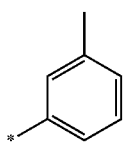
10-16 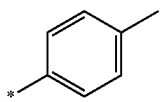
10-17 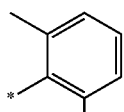
10-18 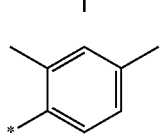
10-19 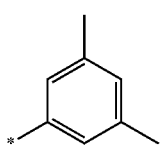
10-20 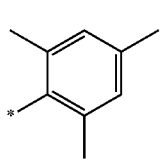
10-21 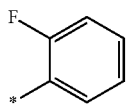
10-22 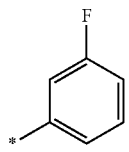
10-23 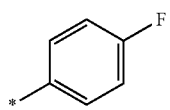
10-24 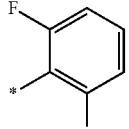
10-25 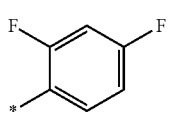
10-26 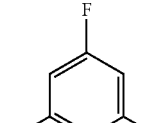
10-27 
10-28 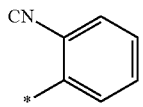
10-29 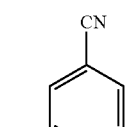
10-30 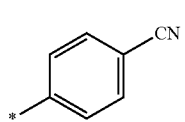
10-31 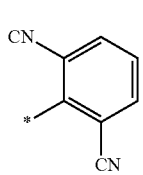

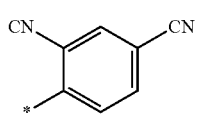
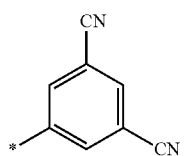
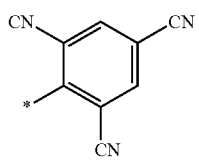
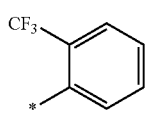
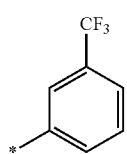
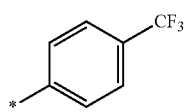
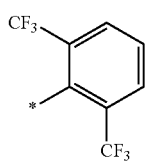
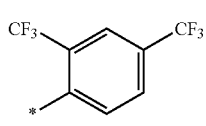
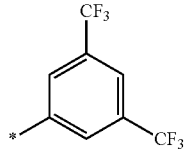
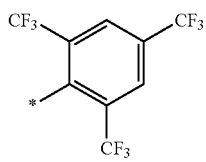
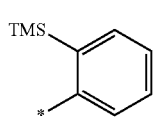
10-32
10-33
10-34
10-35
10-36
10-37
10-38
10-39
10-40
10-41
10-42
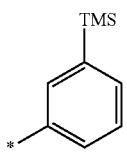
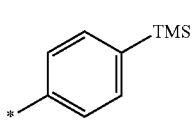
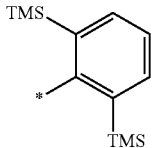
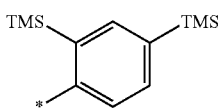
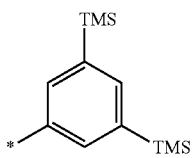
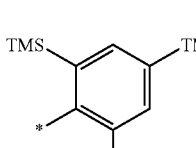
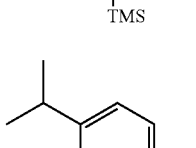
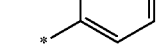
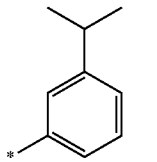
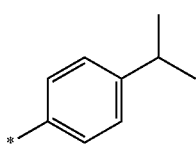
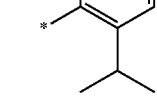
10-43
10-44
10-45
10-46
10-47
10-48
10-49
10-50
10-51
10-52

-continued
10-53
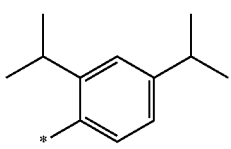
10-54
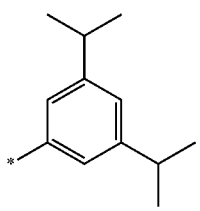
10-55
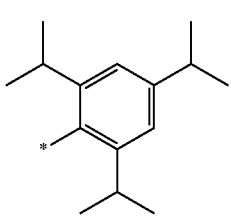
10-56
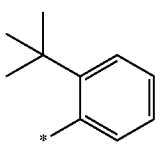
10-57
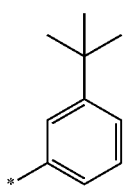
10-58
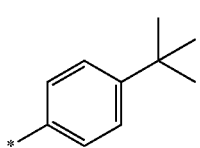
10-59
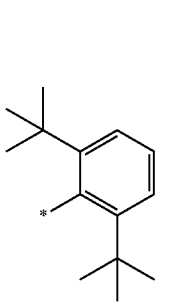
10-60
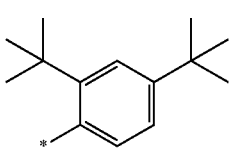
-continued
10-61
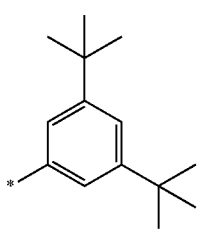
10-62
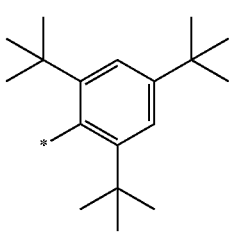
10-63
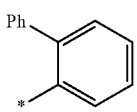
10-64
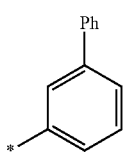
10-65
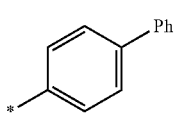
10-66
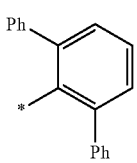
10-67
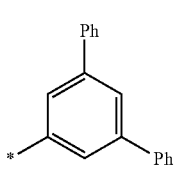
10-68
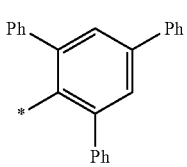
10-69
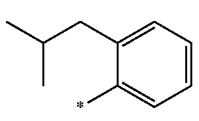
10-70

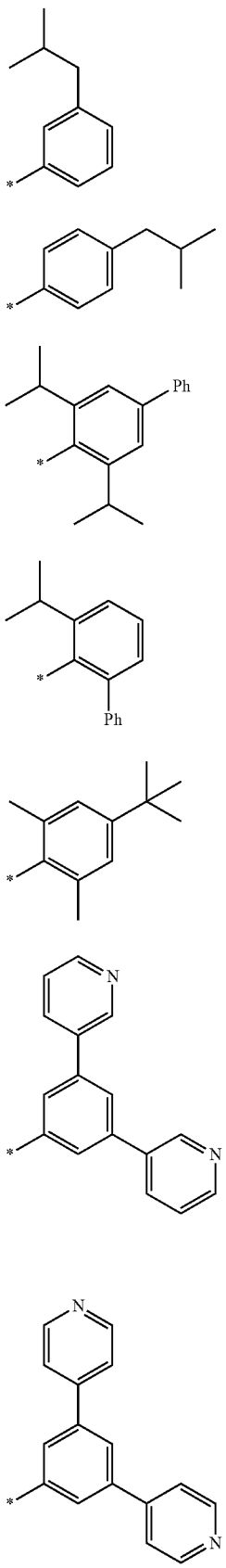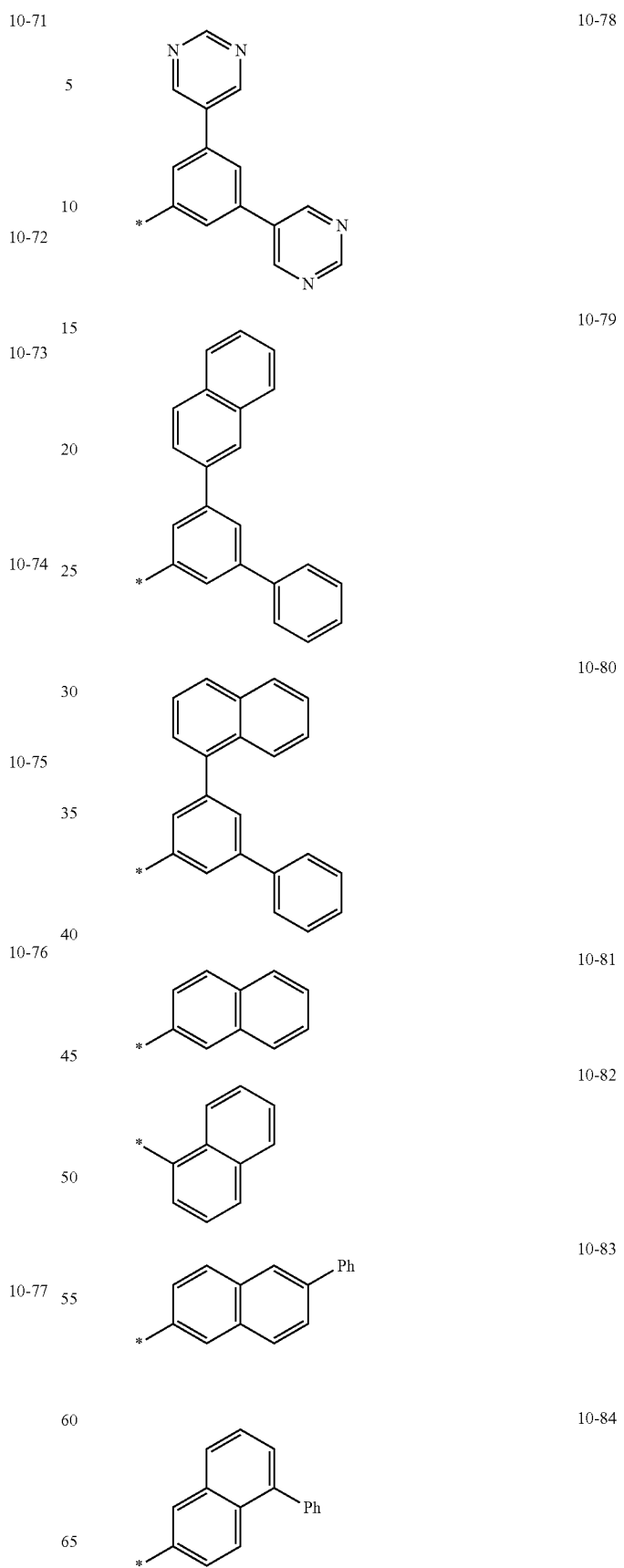

-continued
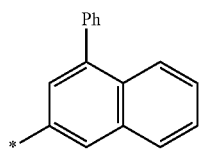
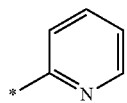
10-86
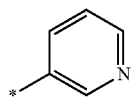
10-87
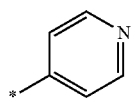
10-88
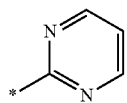
10-89
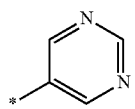
10-90
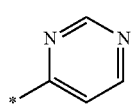
10-91
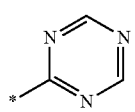
10-92
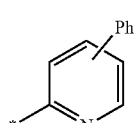
10-93
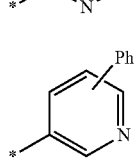
10-94
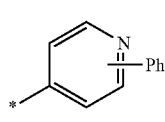
10-95
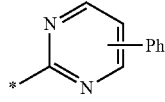
10-96
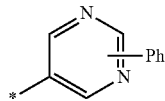
10-97
-continued
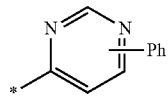
10-85
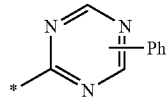
10-86
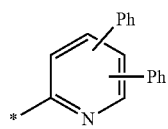
10-87
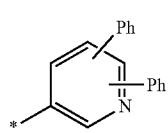
10-88
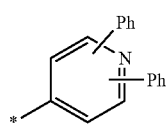
10-89
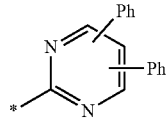
10-90
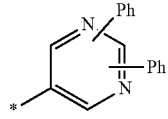
10-91
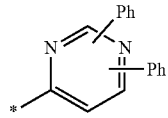
10-92
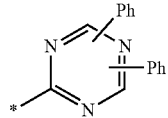
10-93
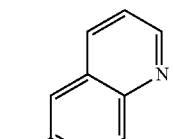
10-94
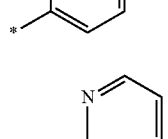
10-95
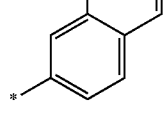
10-96
10-98
10-99
10-100
10-101
10-102
10-103
10-104
10-105
10-106
10-107
10-108

-continued
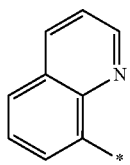
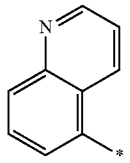
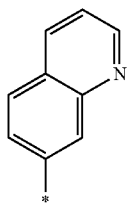
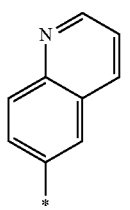
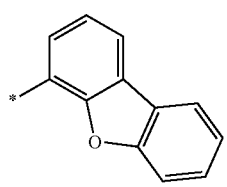
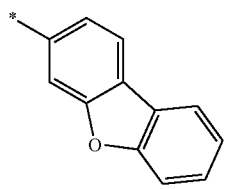
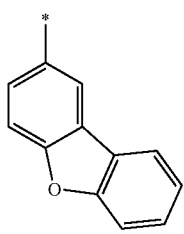
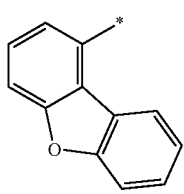
-continued
10-109
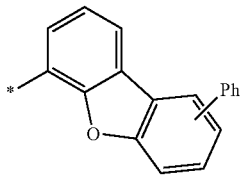
10-110
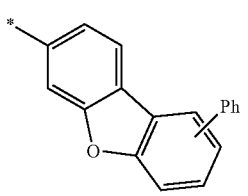
10-111
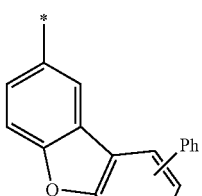
10-112
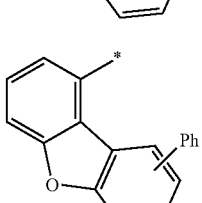
10-113
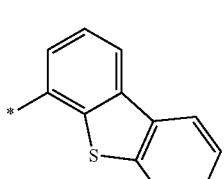
10-114
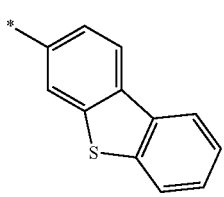
10-115
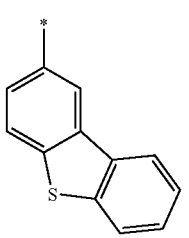
10-116
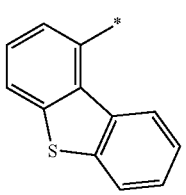
10-117
10-118
10-119
10-120
10-121
10-122
10-123
10-124

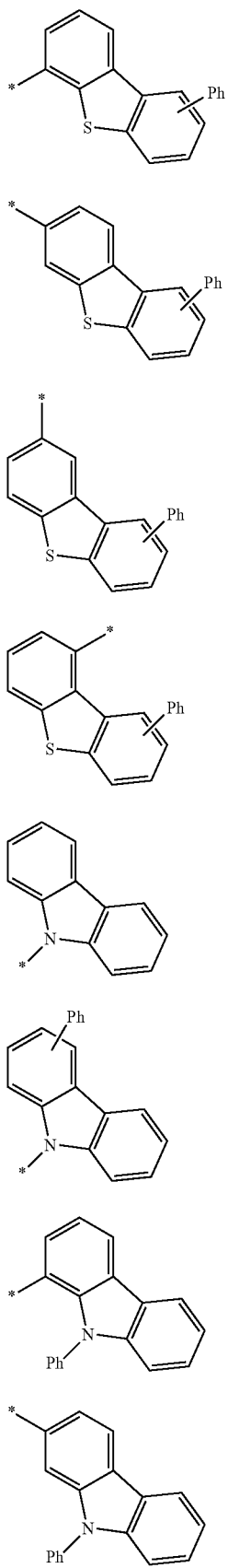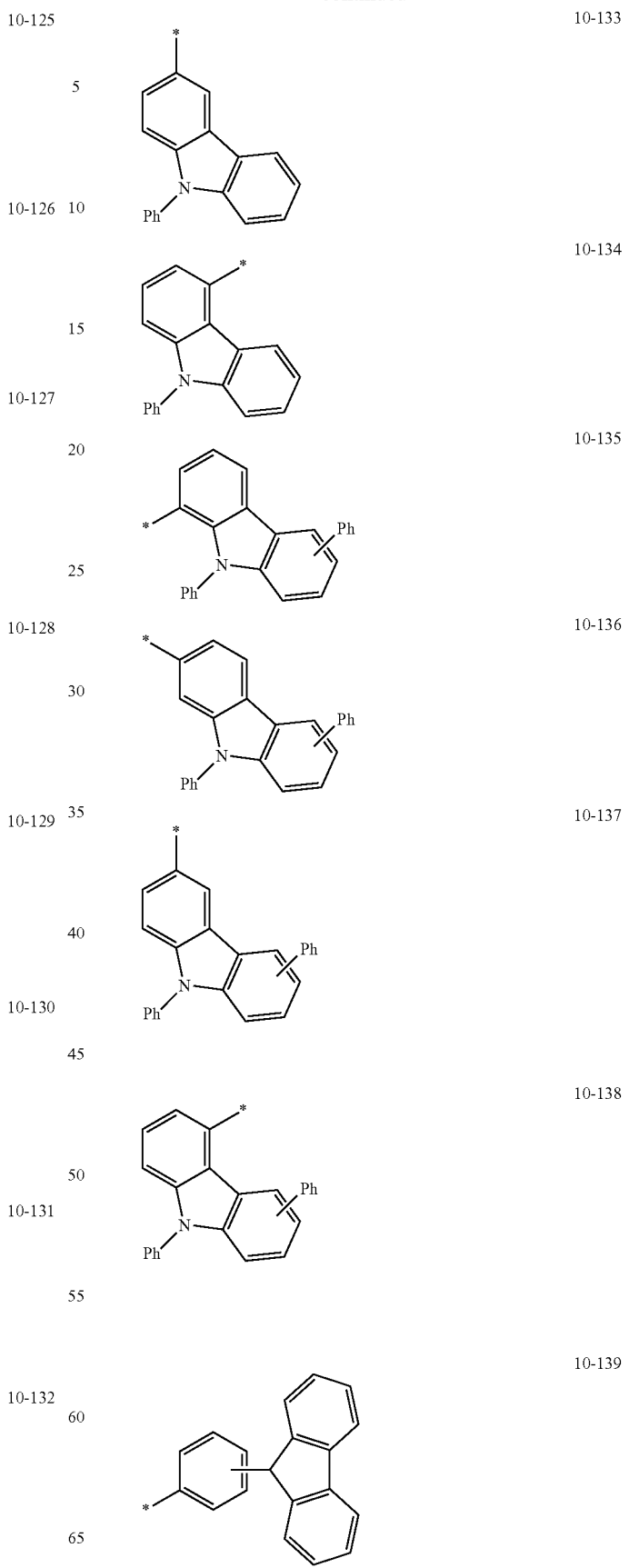

-continued
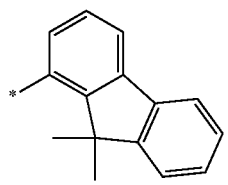 10-140
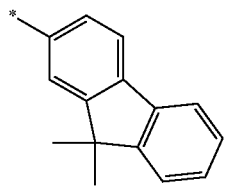 10-141
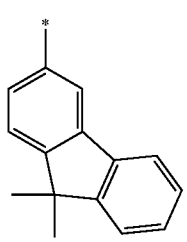 10-142
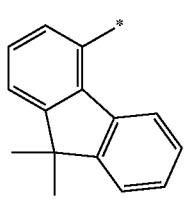 10-143
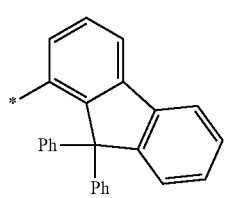 10-144
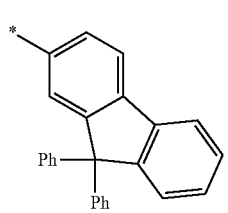 10-145
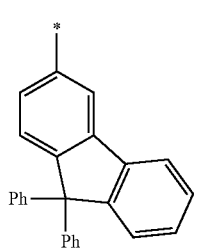 10-146
-continued
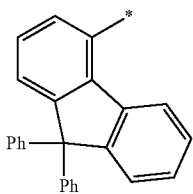 10-147
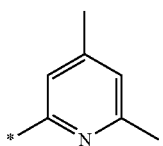 10-148
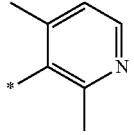 10-149
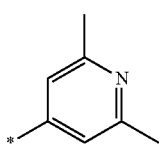 10-150
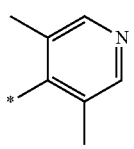 10-151
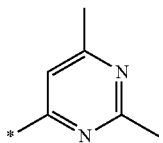 10-152
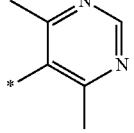 10-153
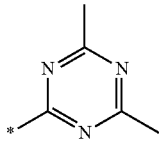 10-154
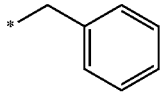 10-155
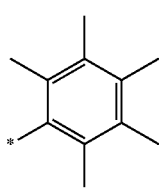 10-156

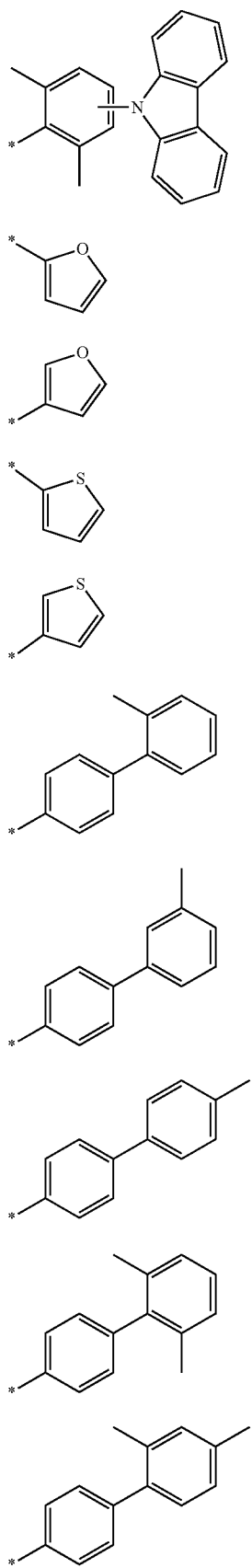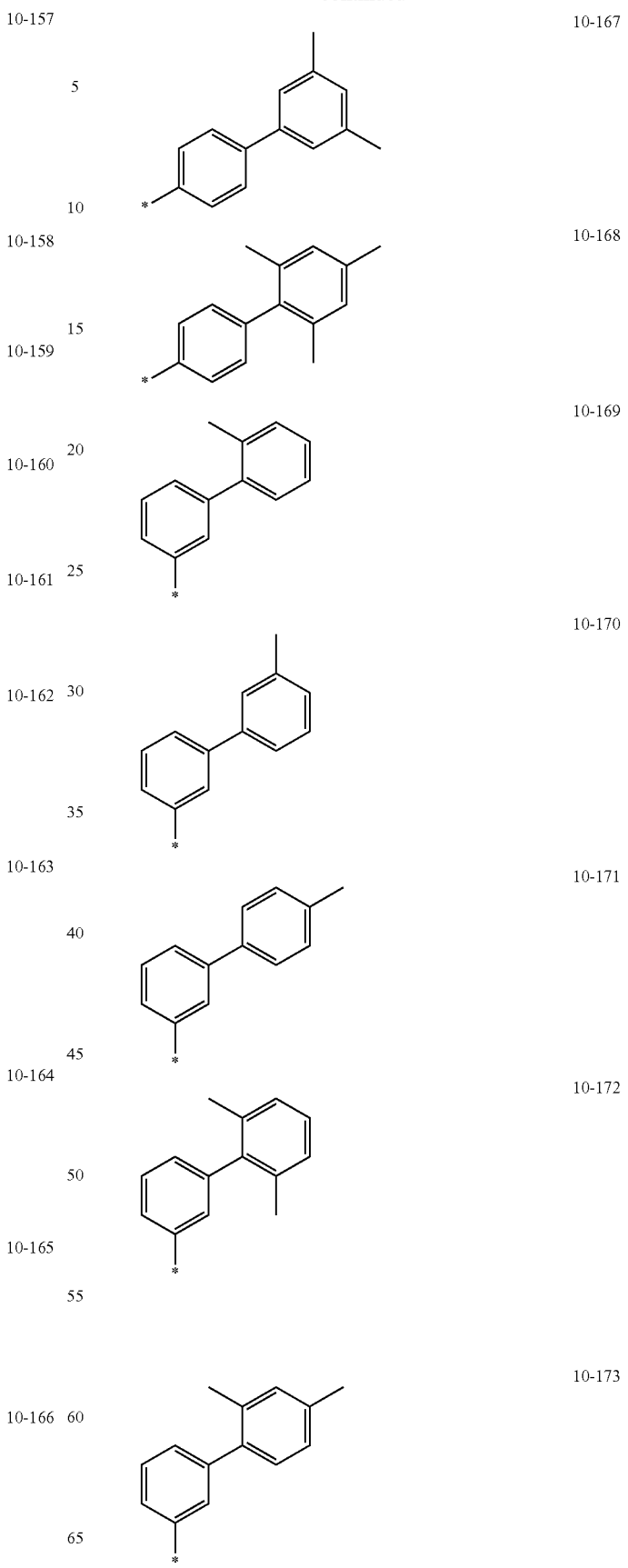

| | |
|---|---|
| 10-174 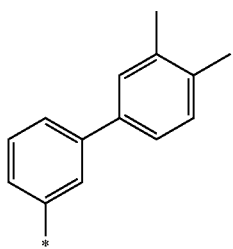 | 10-182 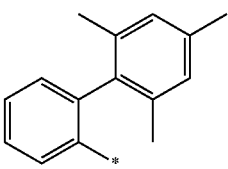 |
| 10-175 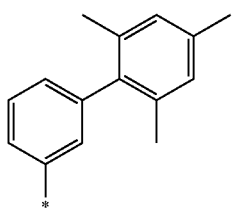 | 10-183 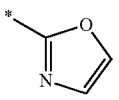 |
| 10-176 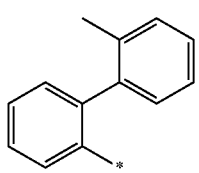 | 10-184 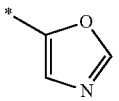 |
| 10-177 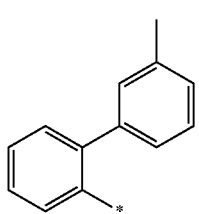 | 10-185 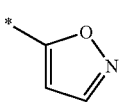 |
| 10-178 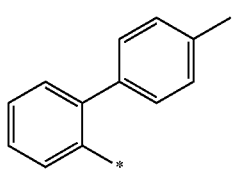 | 10-186 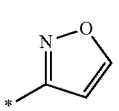 |
| 10-179 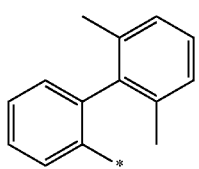 | 10-187 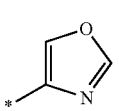 |
| 10-180 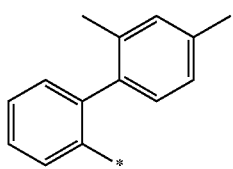 | 10-188 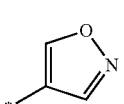 |
| 10-181 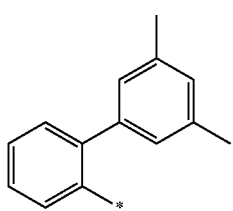 | 10-189 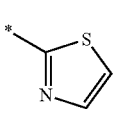 |
| | 10-190 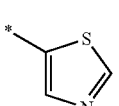 |
| | 10-191 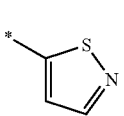 |
| | 10-192 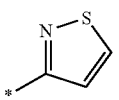 |
| | 10-193 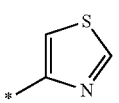 |
| | 10-194 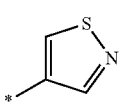 |
| | 10-195 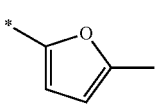 |

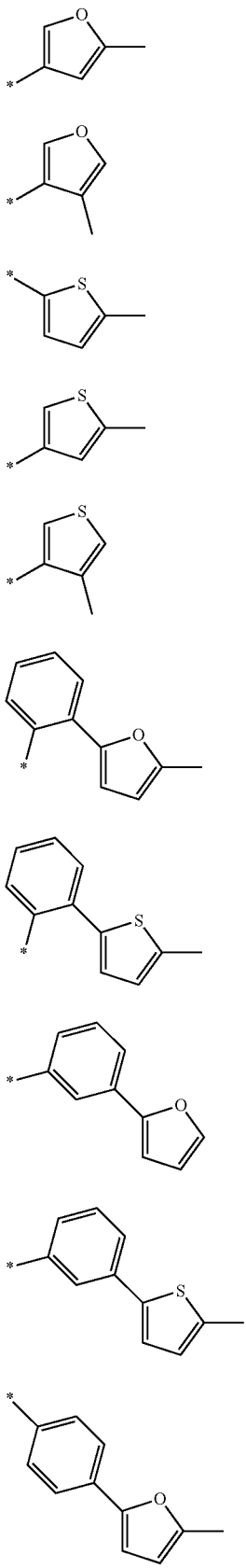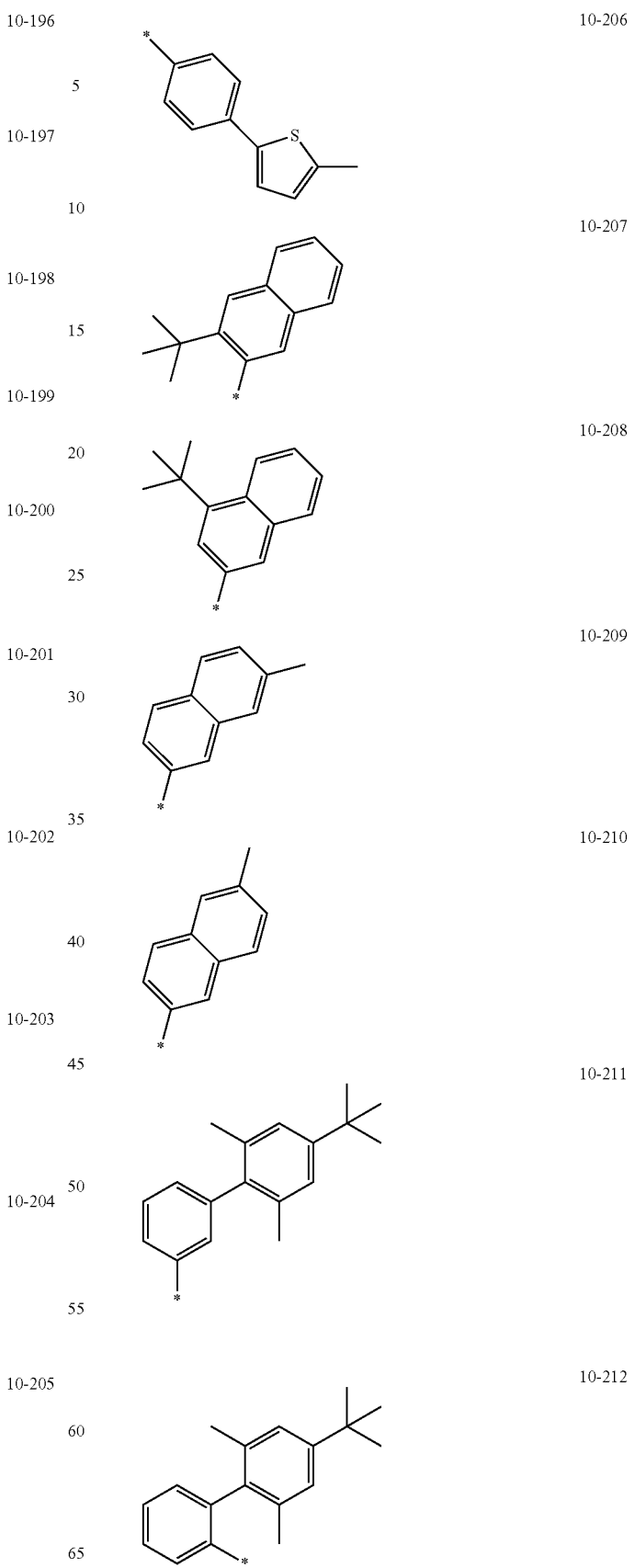

-continued 10-213 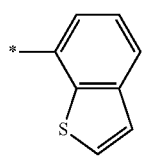

10-214 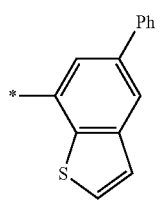

10-215 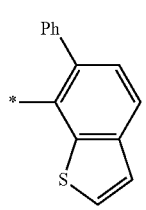

10-216 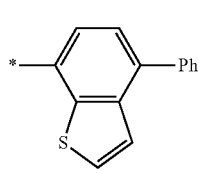

10-217 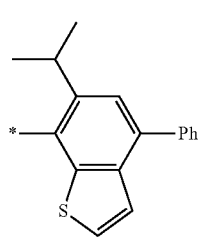

10-218 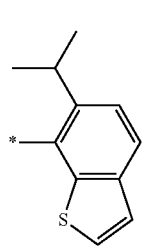

10-219 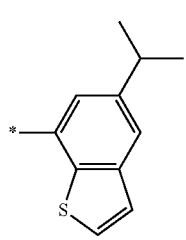

10-220 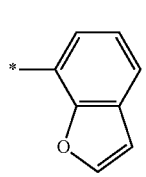

-continued 10-221 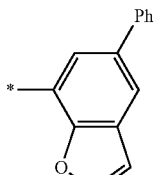

10-222 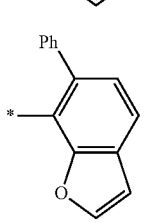

10-223 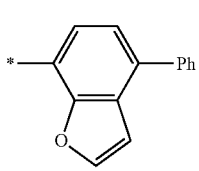

10-224 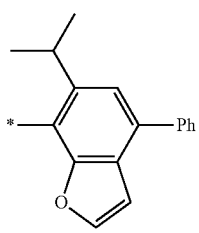

10-225 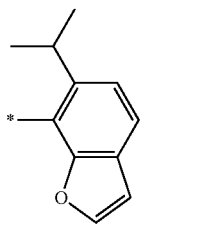

10-226 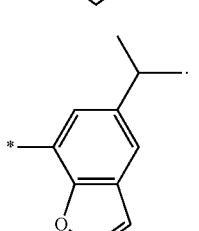

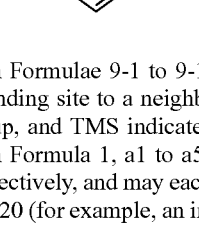

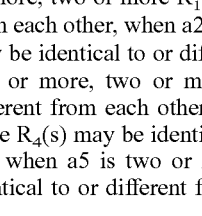

In Formulae 9-1 to 9-19 and 10-1 to 10-226, * indicates a binding site to a neighboring atom, Ph indicates a phenyl group, and TMS indicates a trimethylsilyl group.

In Formula 1, a1 to a5 indicate the number of $R_1$ to $R_5$, respectively, and may each independently be an integer from 0 to 20 (for example, an integer from 0 to 4). When a1 is two or more, two or more $R_1$(s) may be identical to or different from each other, when a2 is two or more, two or more $R_2$(s) may be identical to or different from each other, when a3 is two or more, two or more $R_3$(s) may be identical to or different from each other, when a4 is two or more, two or more $R_4$(s) may be identical to or different from each other, and when a5 is two or more, two or more $R_5$(s) may be identical to or different from each other.

In Formula 1, i) two or more of a plurality of neighboring $R_1(s)$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, ii) two or more of a plurality of neighboring $R_2(s)$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, iii) two or more of a plurality of neighboring $R_3(s)$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, iv) two or more of a plurality of neighboring $R_4(s)$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, v) two or more of a plurality of neighboring $R_5(s)$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof, and vi) two or more of $R_1$ to $R_9$ may optionally be linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or any combination thereof.

For example, the $C_5$-$C_{30}$ carbocyclic group that is unsubstituted or substituted with at least one $R_{10a}$ or the $C_2$-$C_{30}$ heterocyclic group that is unsubstituted or substituted with at least one $R_{10a}$ may be a pentadiene group, a cyclohexane group, a cycloheptane group, an adamantane group, a bicyclo[2.2.1]heptane group, a bicyclo[2.2.2]octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, or an azabenzosilole group, each unsubstituted or substituted with at least one $R_{10a}$, but embodiments of the present disclosure are not limited thereto.

$R_{10a}$ may be the same as defined in connection with $R_1$.

In the present specification, the terms "an azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group" as used herein each refer to a heterocyclic ring having the same backbone as "a benzothiophene group, a benzofuran group, an indene group, an indole group, a benzosilole group, a dibenzothiophene group, a dibenzofuran group, a fluorene group, a carbazole group, and a dibenzosilole group", respectively, in which at least one carbon atom of the foregoing rings is substituted with a nitrogen.

In one embodiment, a group represented by

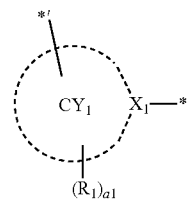

in Formula 1 may be a group represented by one of Formulae CY1-1 to CY1-34:

CY1-1

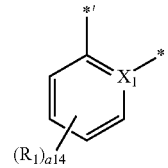

CY1-2

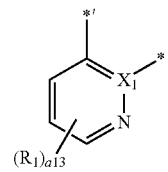

CY1-3

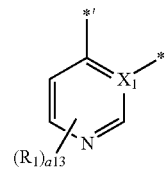

CY1-4

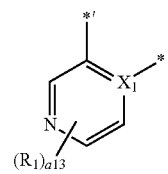

CY1-5

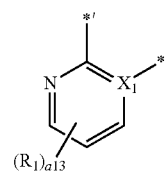

CY1-6

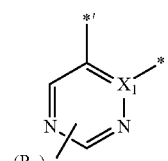

CY1-7

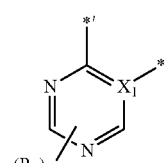

-continued
CY1-8
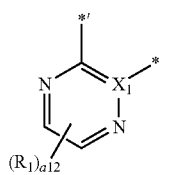
CY1-9
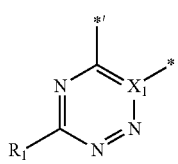
CY1-10
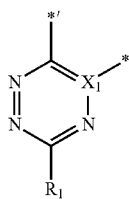
CY1-11
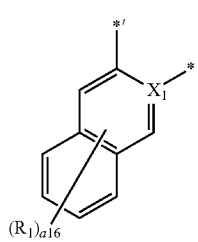
CY1-12
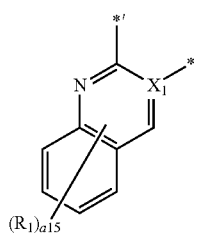
CY1-13
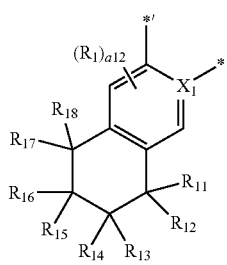
CY1-14
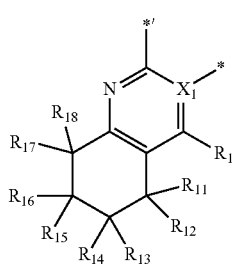
CY1-15
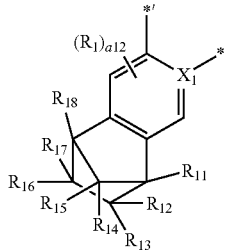
CY1-16
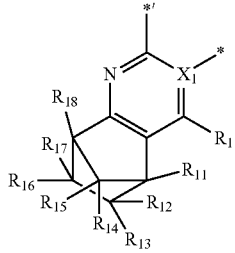
CY1-17
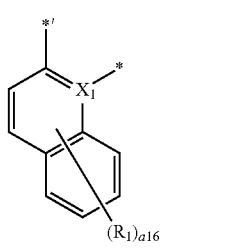
CY1-18
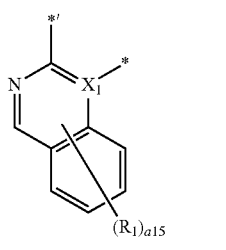
CY1-19
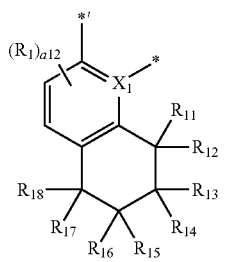
CY1-20
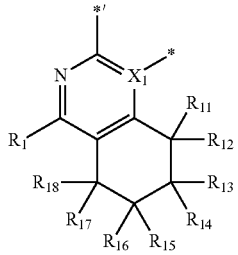

CY1-21 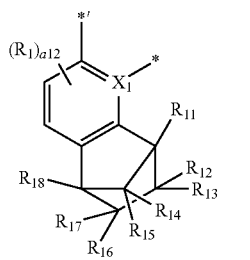
CY1-22 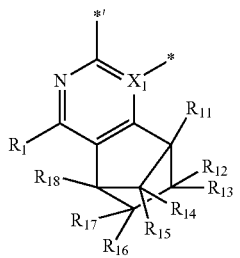
CY1-23 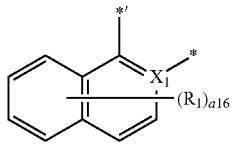
CY1-24 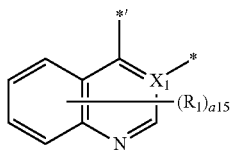
CY1-25 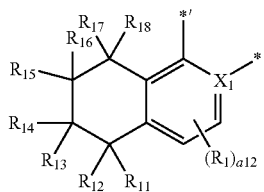
CY1-26 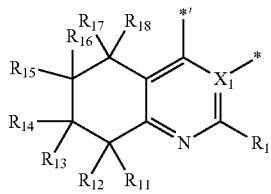
CY1-27 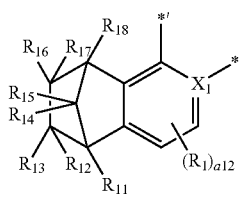
CY1-28 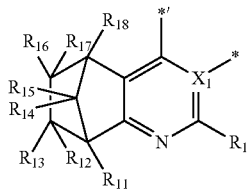
CY1-29 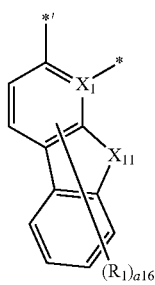
CY1-30 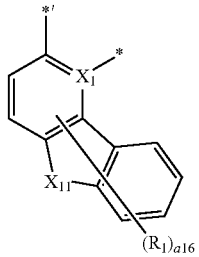
CY1-31 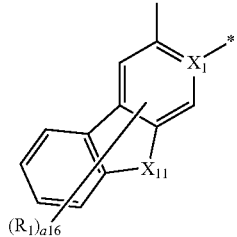
CY1-32 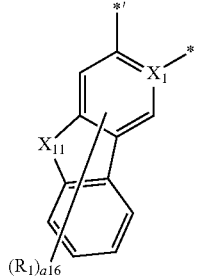
CY1-33 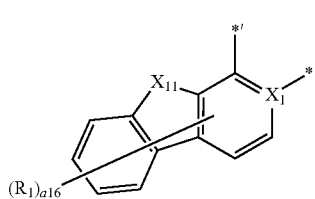

-continued

CY1-34

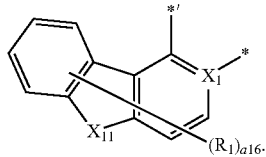

In Formulae CY1-1 to CY1-34, $X_1$ and $R_1$ may each independently be the same as described herein, $X_{11}$ may be O, S, $N(R_{11})$, $C(R_{11})(R_{12})$, or $Si(R_{11})(R_{12})$, $R_{11}$ to $R_{18}$ may each independently be the same as defined as in connection with $R_1$, a16 may be an integer from 0 to 6, a15 may be an integer from 0 to 5, a14 may be an integer from 0 to 4, a13 may be an integer from 0 to 3, a12 may be an integer from 0 to 2,

* indicates a binding site to $X_5$ in Formula 1, and

*′ indicates a binding site to $Y_1$ in Formula 1.

In one or more embodiments, a group represented by

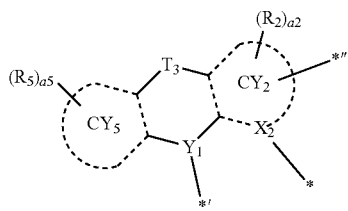

in Formula 1 may be a group represented by one of Formulae CY2-1 to CY2-7:

CY2-1

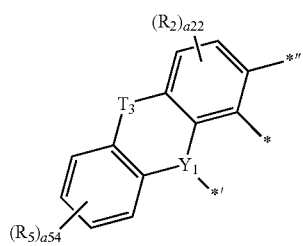

CY2-2

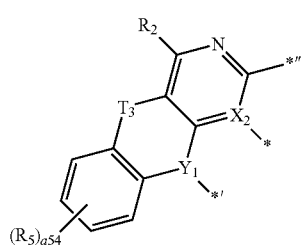

-continued

CY2-3

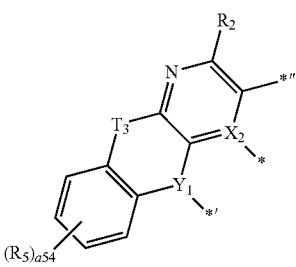

CY2-4

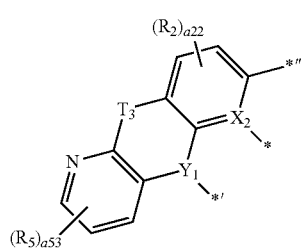

CY2-5

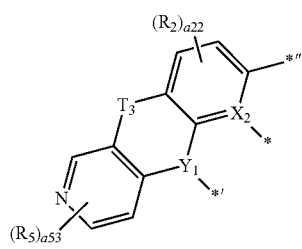

CY2-6

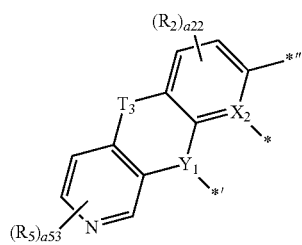

CY2-7

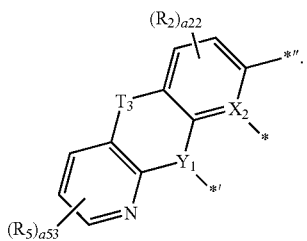

In Formulae CY2-1 to CY2-7, $X_2$, $Y_1$, $T_3$, $R_2$, and $R_5$ may each independently be the same as described herein, a22 may be an integer from 0 to 2, a54 may be an integer from 0 to 4, a53 may be an integer from 0 to 3,

* indicates a binding site to M in Formula 1,

*′ indicates a binding site to ring $CY_1$ in Formula 1, and

*″ indicates a binding site to $T_1$ in Formula 1.

In one or more embodiments, a group represented by
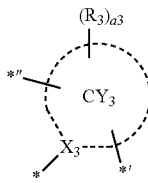
in Formula 1 may be a group represented by one of Formulae CY3-1 to CY3-26:
CY3-1
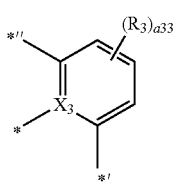
CY3-2
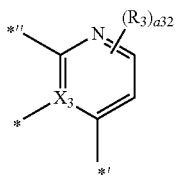
CY3-3
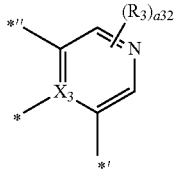
CY3-4
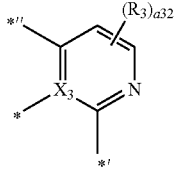
CY3-5
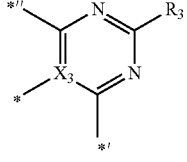
CY3-6
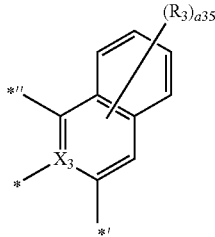
-continued
CY3-7
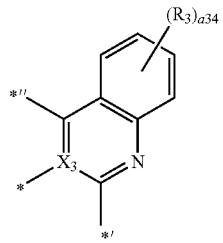
CY3-8
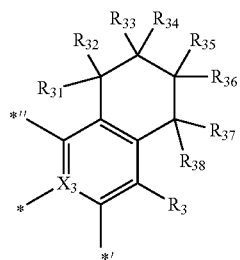
CY3-9
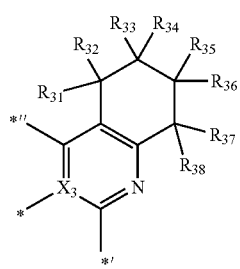
CY3-10
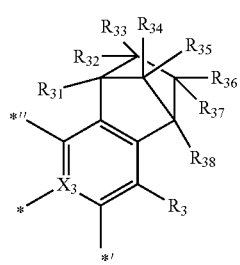
CY3-11
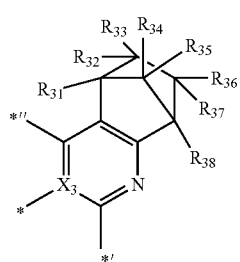
CY3-12
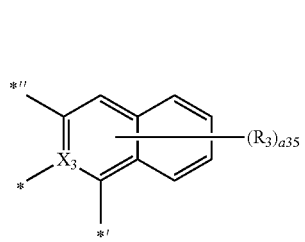

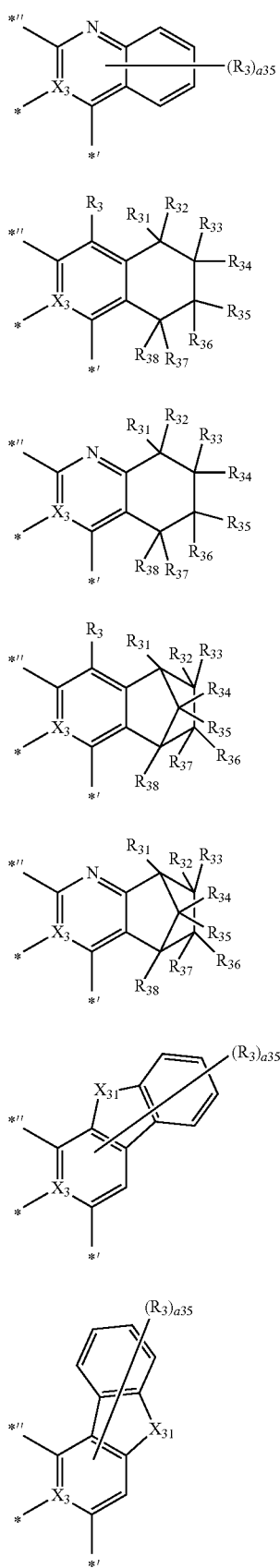
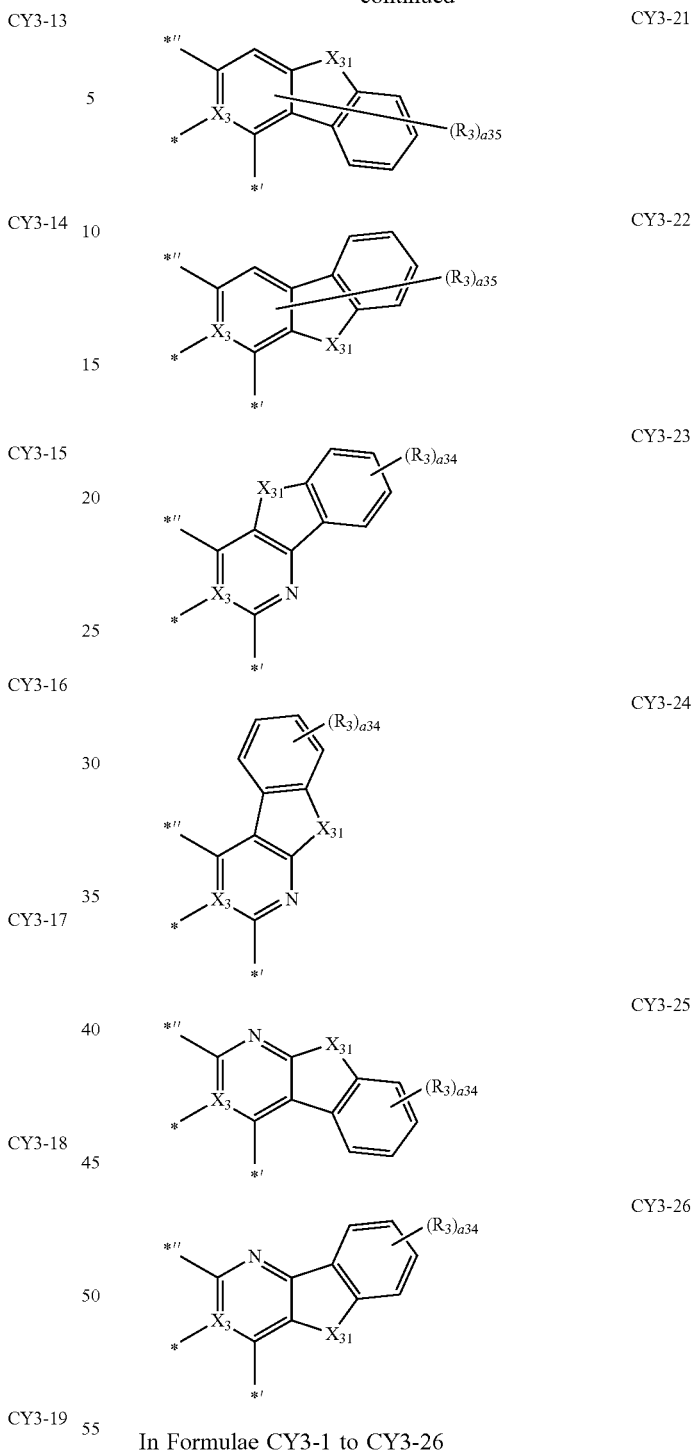

In Formulae CY3-1 to CY3-26

$X_3$ and $R_3$ may each independently be the same as described herein, $X_{31}$ may be O, S, $N(R_{31})$, $C(R_{31})(R_{32})$, or $Si(R_{31})(R_{32})$, $R_{31}$ to $R_{38}$ may each independently be the same as defined in connection with $R_3$, a35 may be an integer from 0 to 5,
a34 may be an integer from 0 to 4,
a33 may be an integer from 0 to 3,
a32 may be an integer from 0 to 2,

*" indicates a binding site to $T_1$ in Formula 1,
* indicates a binding site to M in Formula 1, and
*' indicates a binding site to $T_2$ in Formula 1.

In one or more embodiments, a group represented by
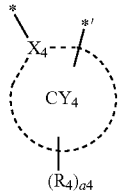
in Formula 1 may be a group represented by one of Formulae CY4-1 to CY4-34:
CY4-1
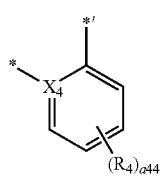
CY4-2
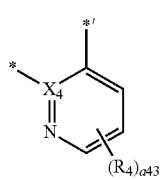
CY4-3
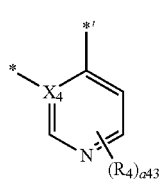
CY4-4
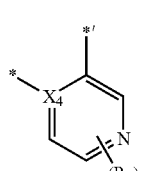
CY4-5
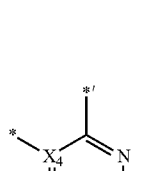
CY4-6
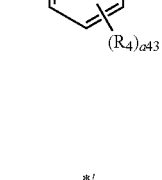
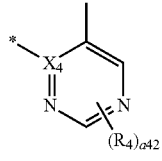
-continued
CY4-7
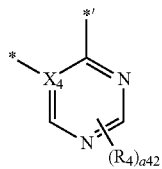
CY4-8
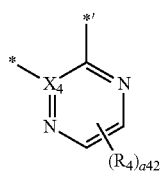
CY4-9
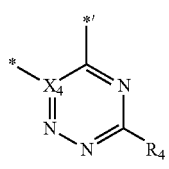
CY4-10
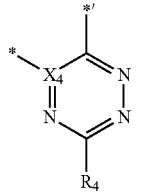
CY4-11
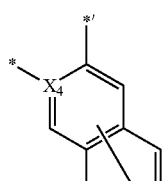
CY4-12
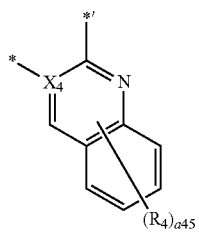
CY4-13
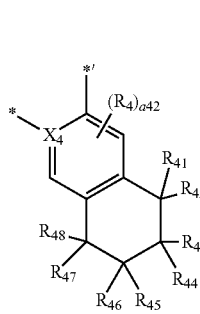

-continued
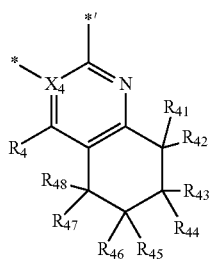
CY4-14
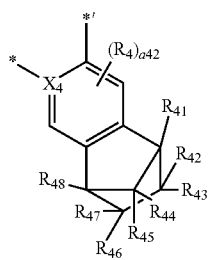
CY4-15
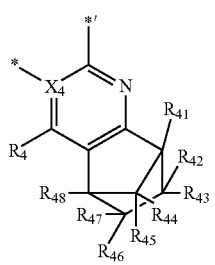
CY4-16
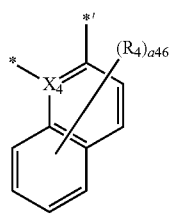
CY4-17
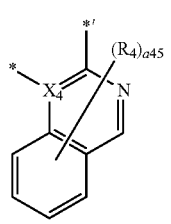
CY4-18
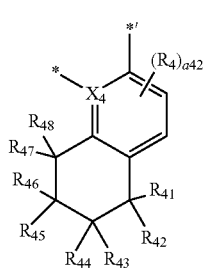
CY4-19
-continued
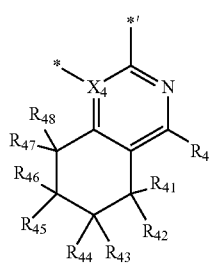
CY4-20
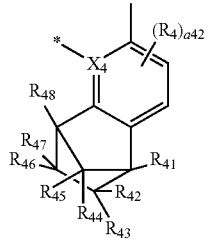
CY4-21
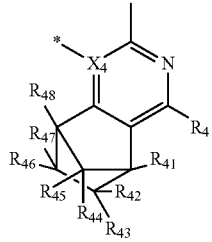
CY4-22
CY4-23
CY4-24
CY4-25
CY4-26

CY4-27 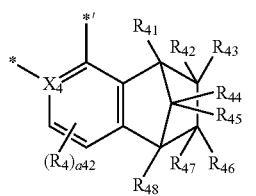

CY4-28 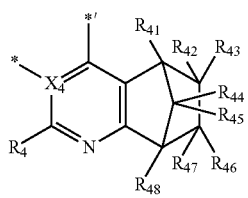

CY4-29 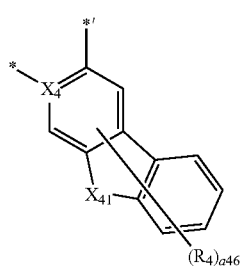

CY4-30 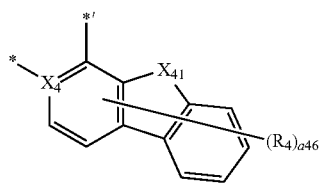

CY4-31 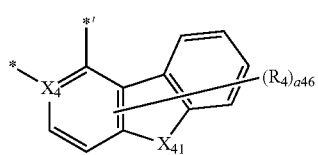

CY4-32 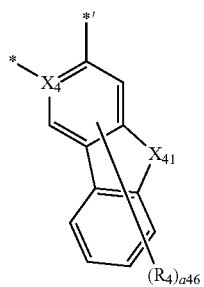

CY4-33 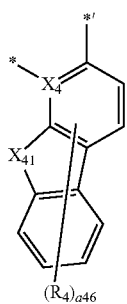

CY4-34 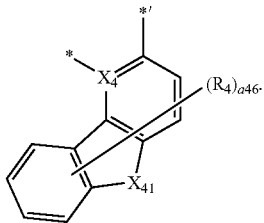

In Formulae CY4-1 to CY4-34, $X_4$ and $R_4$ may each independently be the same as described herein, $X_{41}$ may be O, S, N($R_{41}$), C($R_{41}$)($R_{42}$), or Si($R_{41}$)($R_{42}$), $R_{41}$ to $R_{48}$ may each independently be the same as defined in connection with $R_4$, a46 may be an integer from 0 to 6, a45 may be an integer from 0 to 5, a44 may be an integer from 0 to 4, a43 may be an integer from 0 to 3, a42 may be an integer from 0 to 2, \* indicates a binding site to M in Formula 1, and \*' indicates a binding site to $T_2$ in Formula 1.

In one or more embodiments, in Formula 1, a group represented by

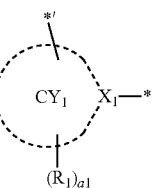

may be a group represented by one of Formulae CY1(1) to CY1(31), a group represented by

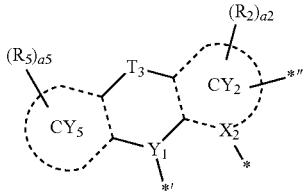

may be a group represented by one of Formulae CY2(1) to CY2(8), a group represented by

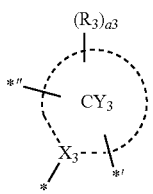

may be a group represented by one of Formulae CY3(1) to CY3(18), and/or a group represented by
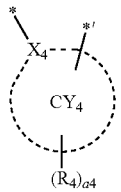
may be a group represented by one of Formulae CY4(1) to CY4(76), but embodiments of the present disclosure are not limited thereto:
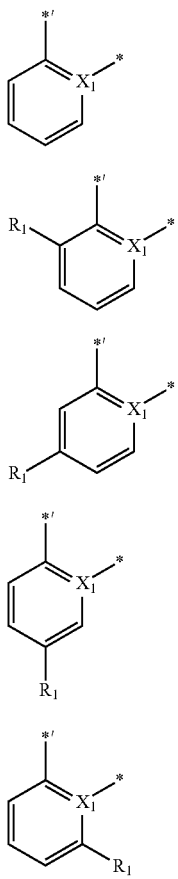
CY1(1)
CY1(2)
CY1(3)
CY1(4)
CY1(5)
CY1(6)
CY1(7)
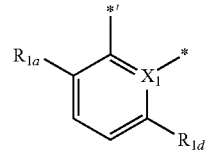
CY1(8)
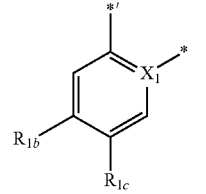
CY1(9)
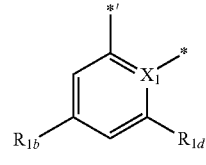
CY1(10)
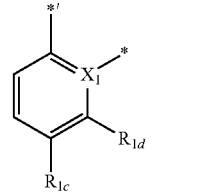
CY1(11)
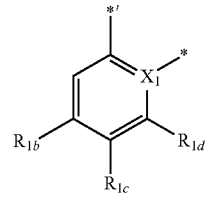
CY1(12)
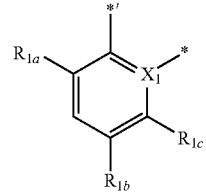
CY1(13)
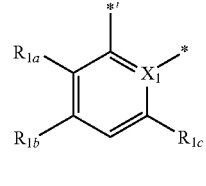
CY1(14)
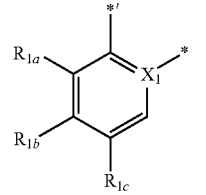
CY1(15)

CY1(16) 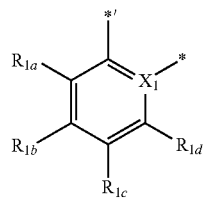
CY1(17) 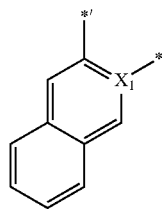
CY1(18) 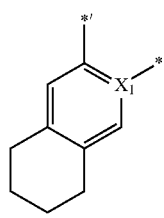
CY1(19) 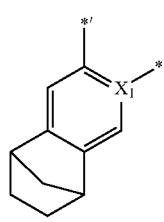
CY1(20) 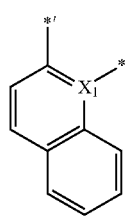
CY1(21) 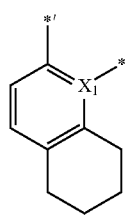
CY1(22) 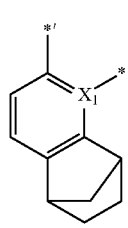
CY1(23) 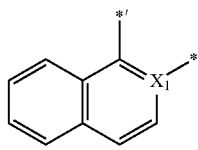
CY1(24) 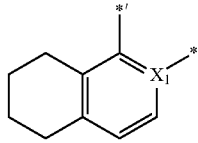
CY1(25) 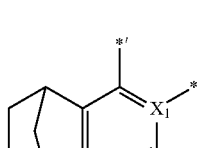
CY1(26) 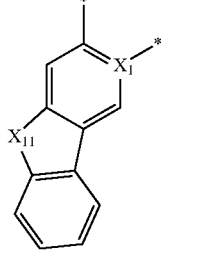
CY1(27) 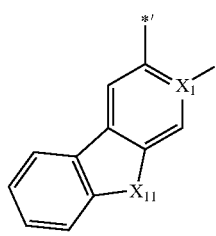
CY1(28) 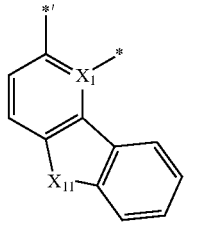
CY1(29) 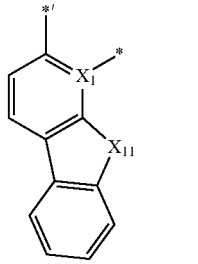

CY1(30)
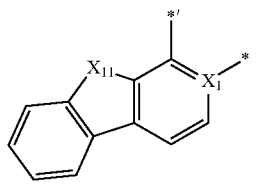
CY1(31)
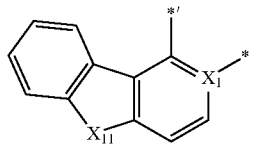
CY2(1)
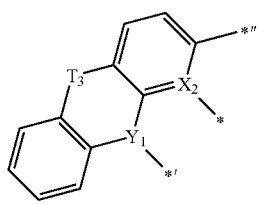
CY2(2)
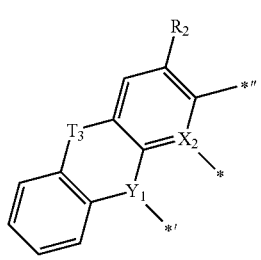
CY2(3)
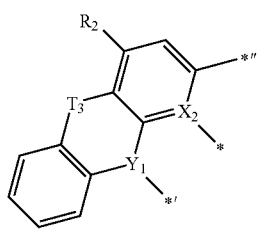
CY2(4)
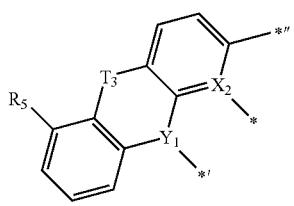
CY2(5)
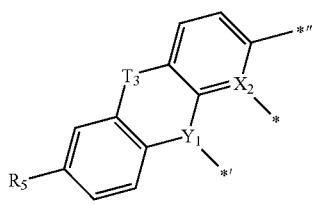
CY2(6)
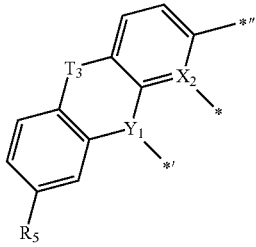
CY2(7)
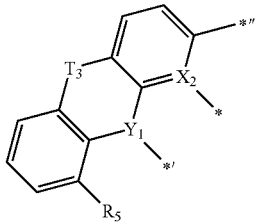
CY2(8)
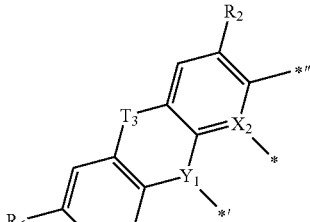
CY3(1)
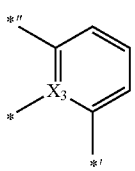
CY3(2)
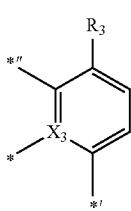
CY3(3)
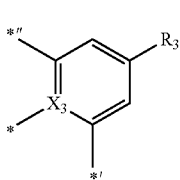
CY3(4)
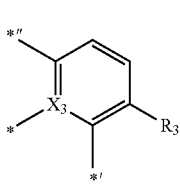

-continued
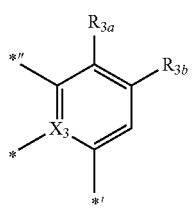
CY3(5)
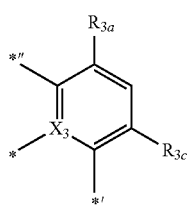
CY3(6)
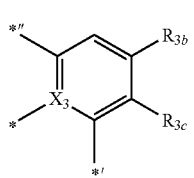
CY3(7)
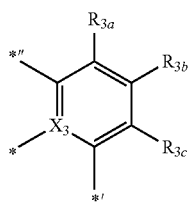
CY3(8)
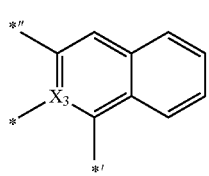
CY3(9)
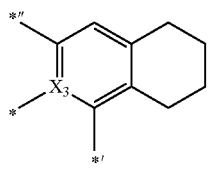
CY3(10)
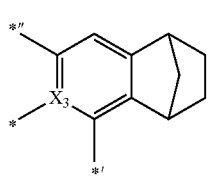
CY3(11)
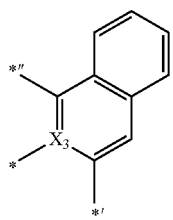
CY3(12)
-continued
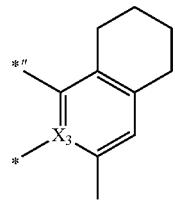
CY3(13)
CY3(14)
CY3(15)
CY3(16)
CY3(17)
CY3(18)
CY4(1)

-continued
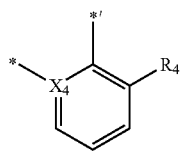
CY4(2)
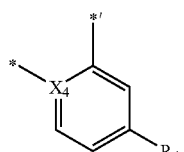
CY4(3)
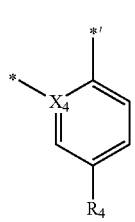
CY4(4)
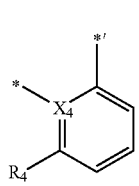
CY4(5)
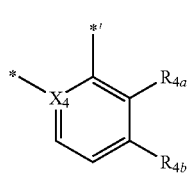
CY4(6)
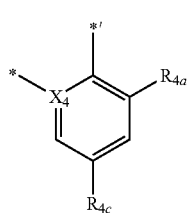
CY4(7)
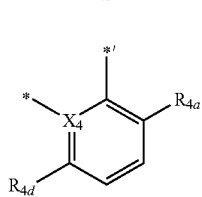
CY4(8)
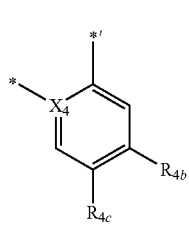
CY4(9)
-continued
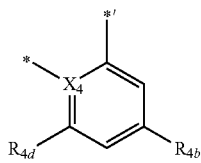
CY4(10)
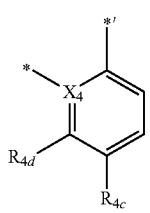
CY4(11)
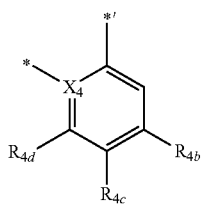
CY4(12)
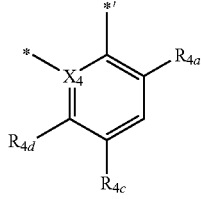
CY4(13)
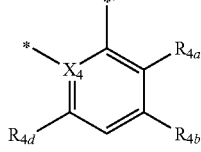
CY4(14)
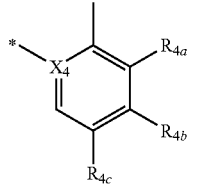
CY4(15)
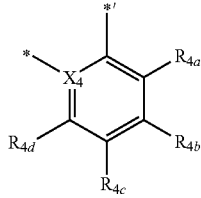
CY4(16)
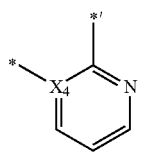
CY4(17)

-continued
CY4(18)
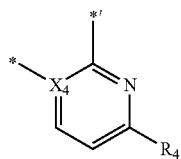
CY4(19)
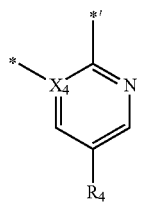
CY4(20)
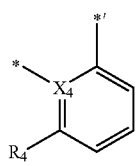
CY4(21)
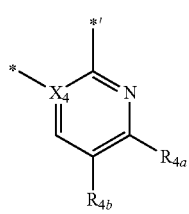
CY4(22)
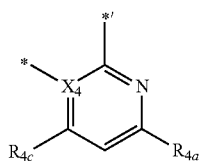
CY4(23)
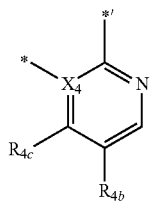
CY4(24)
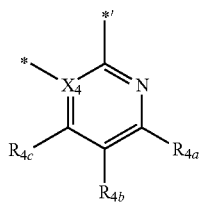
CY4(25)
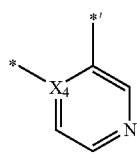
-continued
CY4(26)
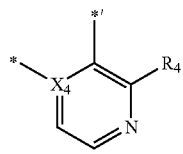
CY4(27)
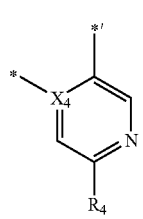
CY4(28)
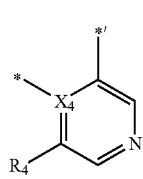
CY4(29)
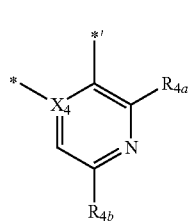
CY4(30)
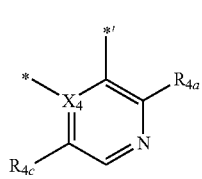
CY4(31)
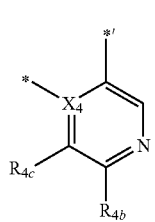
CY4(32)
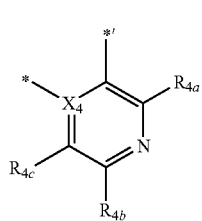
CY4(33)
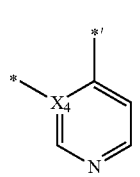

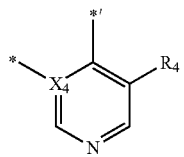
CY4(34)
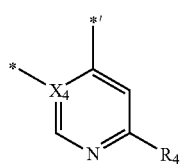
CY4(35)
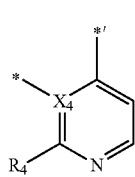
CY4(36)
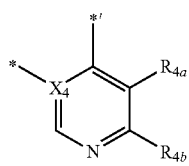
CY4(37)
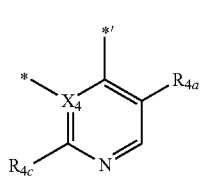
CY4(38)
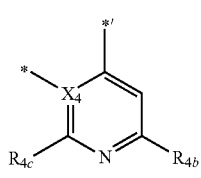
CY4(39)
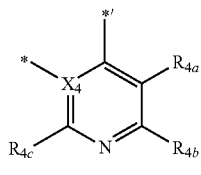
CY4(40)
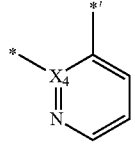
CY4(41)
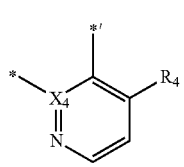
CY4(42)
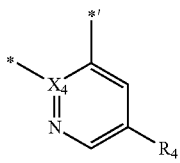
CY4(43)
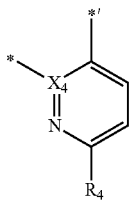
CY4(44)
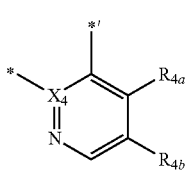
CY4(45)
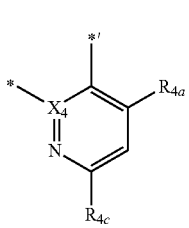
CY4(46)
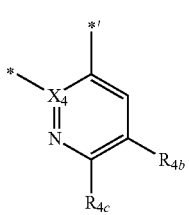
CY4(47)
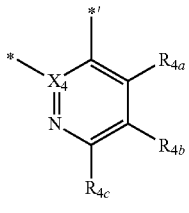
CY4(48)
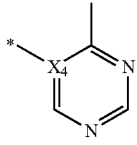
CY4(49)
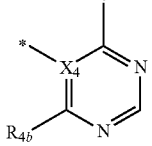
CY4(50)

-continued
CY4(51)
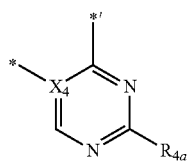
CY4(52)
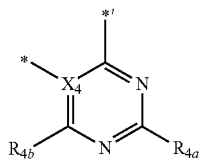
CY4(53)
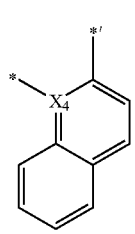
CY4(54)
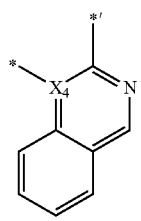
CY4(55)
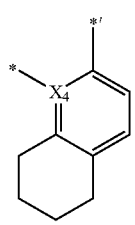
CY4(56)
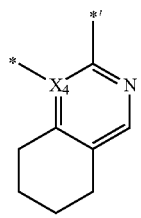
CY4(57)
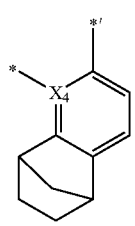
-continued
CY4(58)
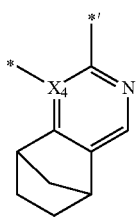
CY4(59)
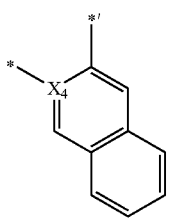
CY4(60)
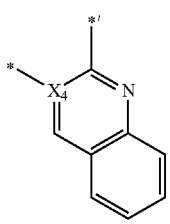
CY4(61)
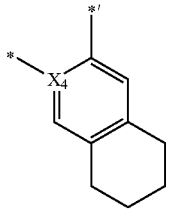
CY4(62)
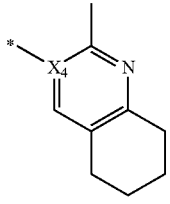
CY4(63)
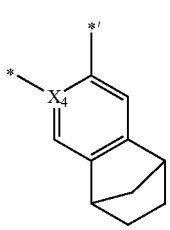
CY4(64)
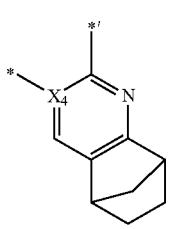

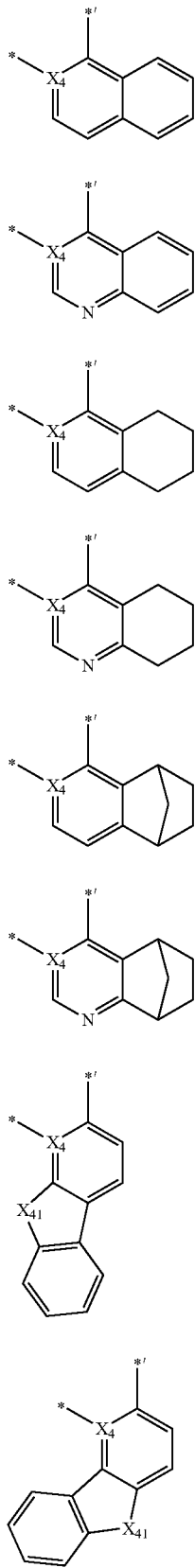

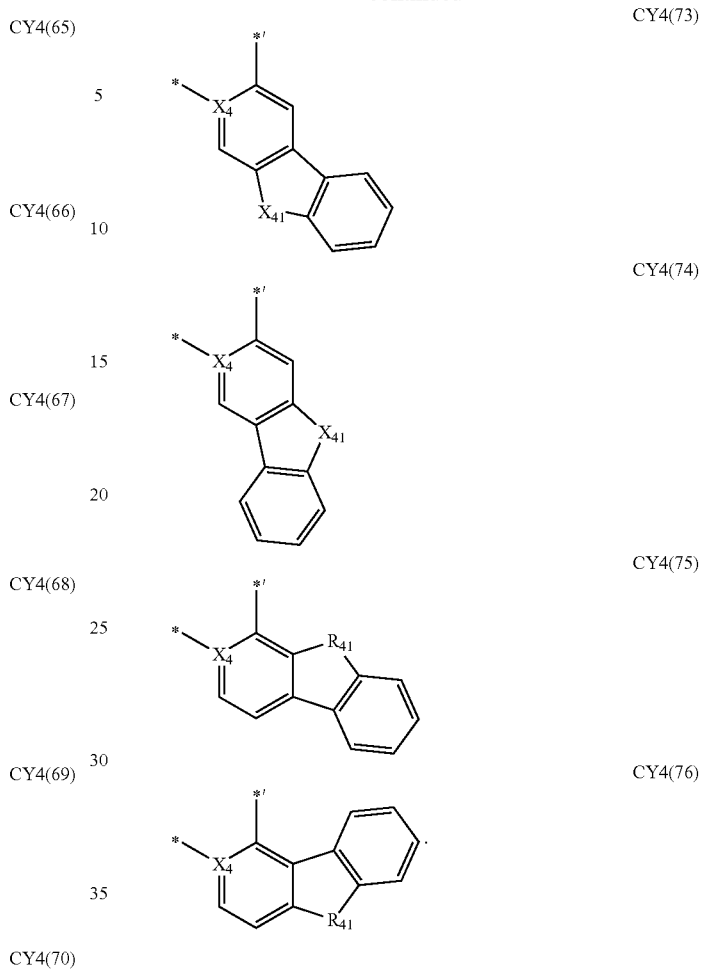

In Formulae CY1(1) to CY1(31), CY2(1) to CY2(8), CY3(1) to CY3(18), and CY4(1) to CY4(76), $X_1$ to $X_4$, $Y_1$, $T_3$, and $R_1$ to $R_5$ may each independently be the same as described herein, $X_{11}$ may be O, S, $N(R_{11})$, $C(R_{11})(R_{12})$, or $Si(R_{11})(R_{12})$, $X_{31}$ may be O, S, $N(R_{31})$, $C(R_{31})(R_{32})$, or $Si(R_{31})(R_{32})$, $X_{41}$ may be O, S, $N(R_{41})$, $C(R_{41})(R_{42})$, or $Si(R_{41})(R_{42})$, $R_{1a}$ to $R_{1d}$, $R_{11}$, and $R_{12}$ may each independently be the same as defined in connection with $R_1$, $R_{3a}$ to $R_{3c}$, $R_{31}$, and $R_{32}$ may each independently be the same as defined in connection with $R_3$, $R_{4a}$ to $R_{4d}$, $R_{41}$, and $R_{42}$ may each independently be the same as defined in connection with $R_4$, $R_1$ to $R_5$, $R_{1a}$ to $R_{1d}$, $R_{11}$, $R_{12}$, $R_{3a}$ to $R_{3c}$, $R_{31}$, $R_{32}$, $R_{4a}$ to $R_{4d}$, $R_{41}$, and $R_{42}$ may not be hydrogen, in Formulae CY1(1) to CY1(31), * indicates a binding site to $X_5$ in Formula 1, and *' indicates a binding site to $Y_1$ in Formula 1, in Formulae CY2(1) to CY2(8), * indicates a binding site to M in Formula 1, *' indicates a binding site to ring $CY_1$ in Formula 1, and *'' indicates a binding site to $T_1$ in Formula 1, and in Formulae CY3(1) to CY3(18), *'' indicates a binding site to $T_1$ in Formula 1, * indicates a binding site to M in Formula 1, and *' indicates a binding site to $T_2$ in Formula 1.

In Formulae CY4(1) to CY4(76), * indicates a binding site to M in Formula 1, and *' indicates a binding site to $T_2$ in Formula 1.

In one or more embodiments, the organometallic compound may be one of Compounds 1 to 200, but embodiments of the present disclosure are not limited thereto:
1
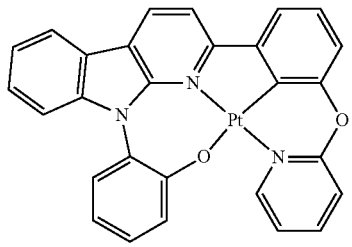
2
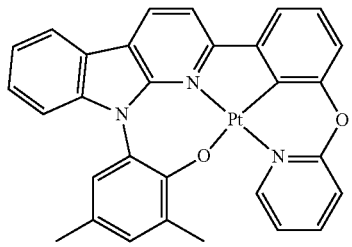
3
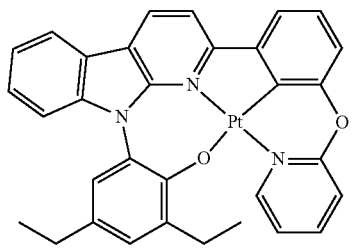
4
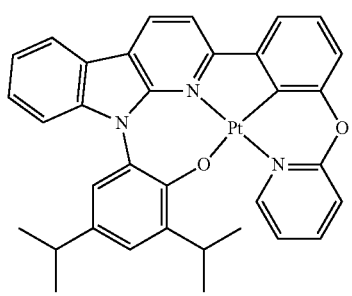
5
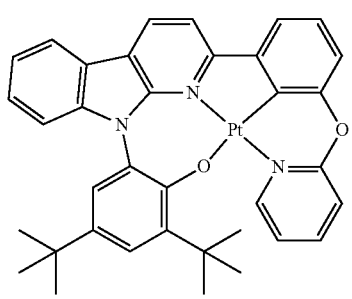
6
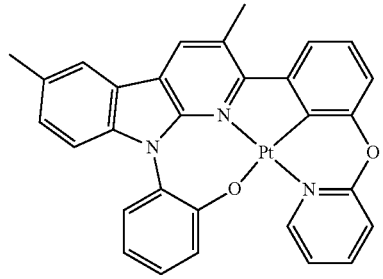
7
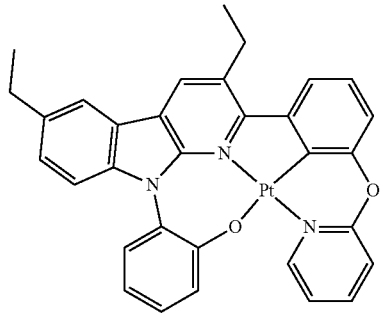
8
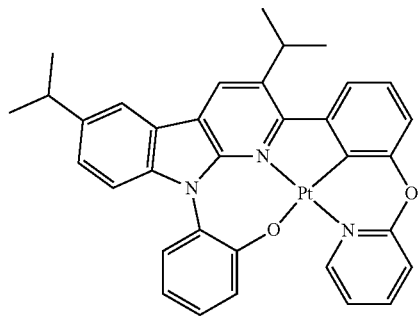
9
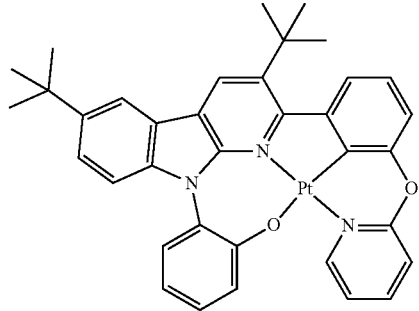
10
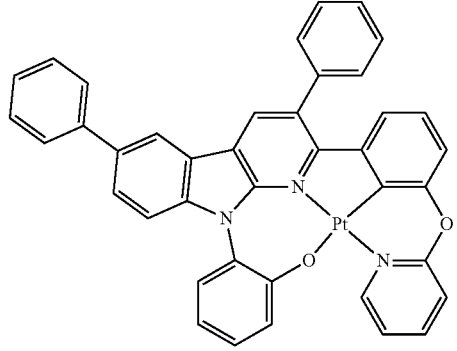

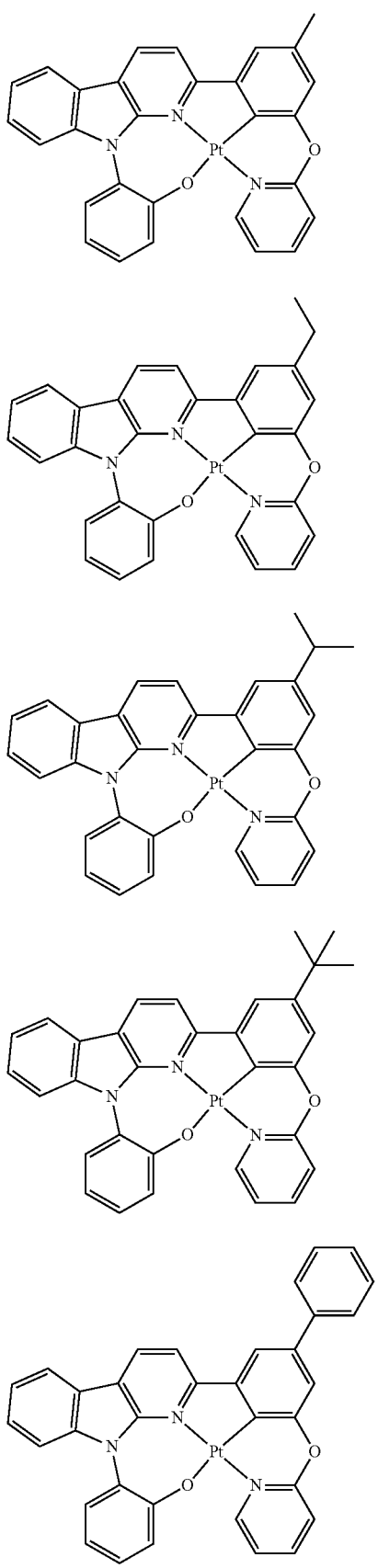
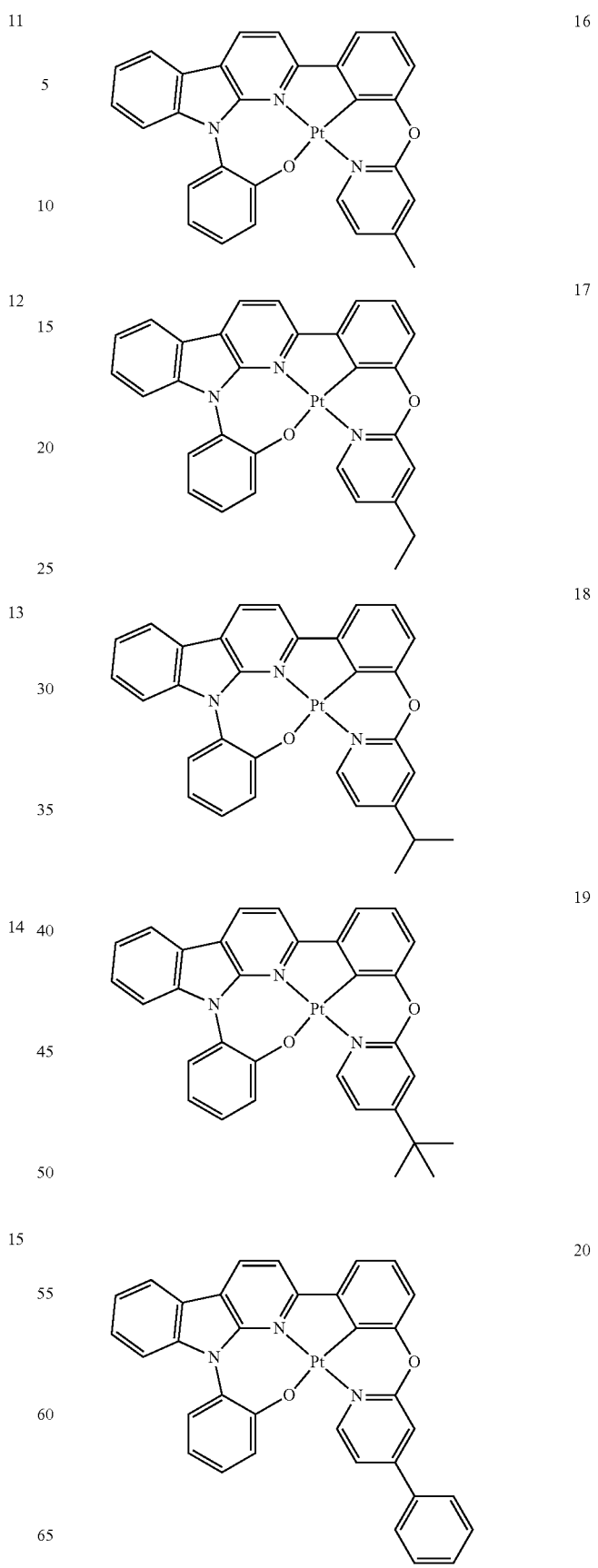

-continued
21
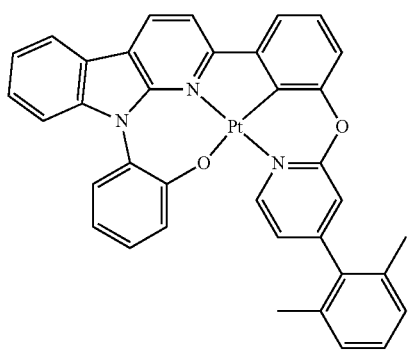
22
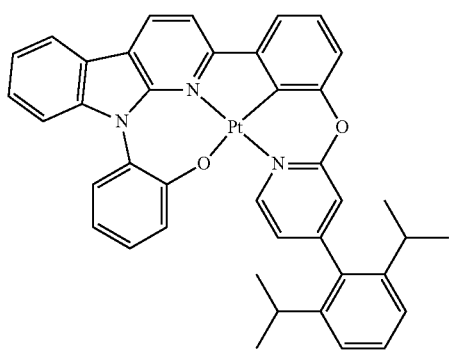
23
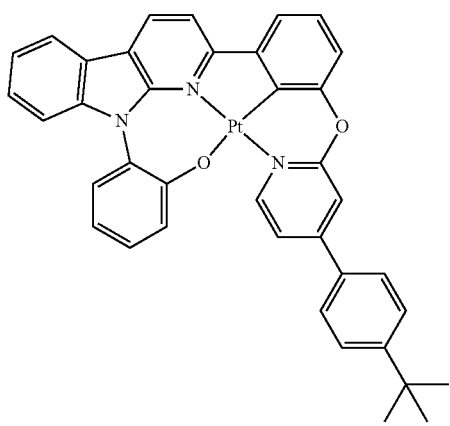
24
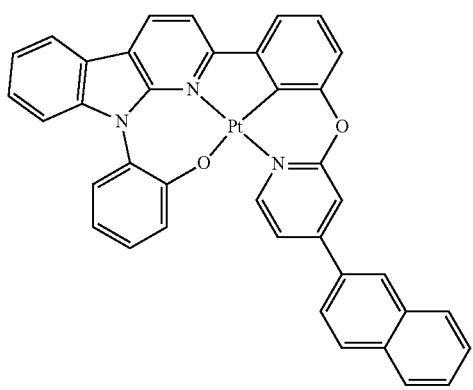
-continued
25
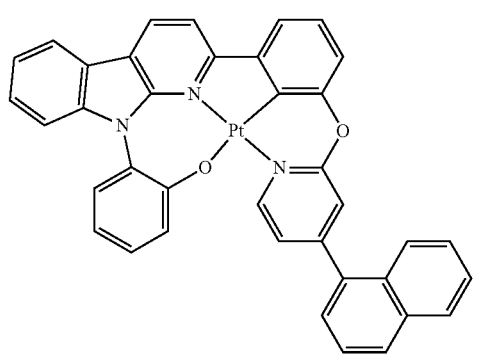
26
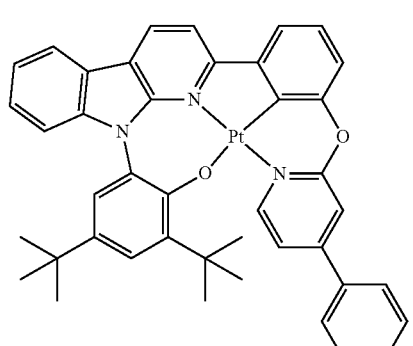
27
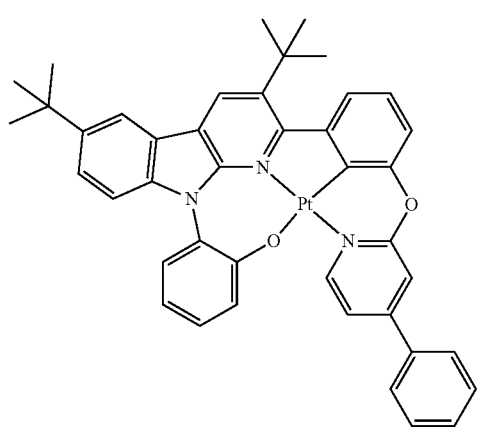
28
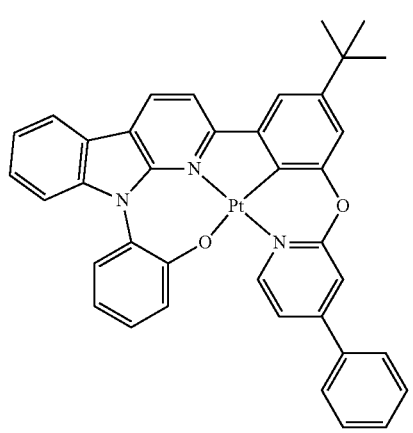

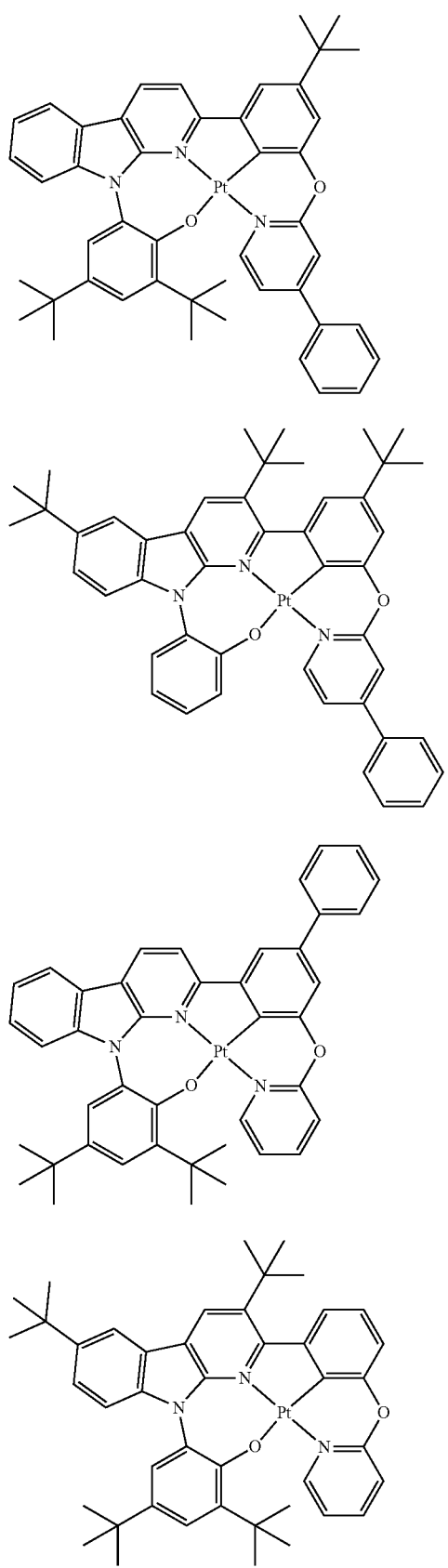
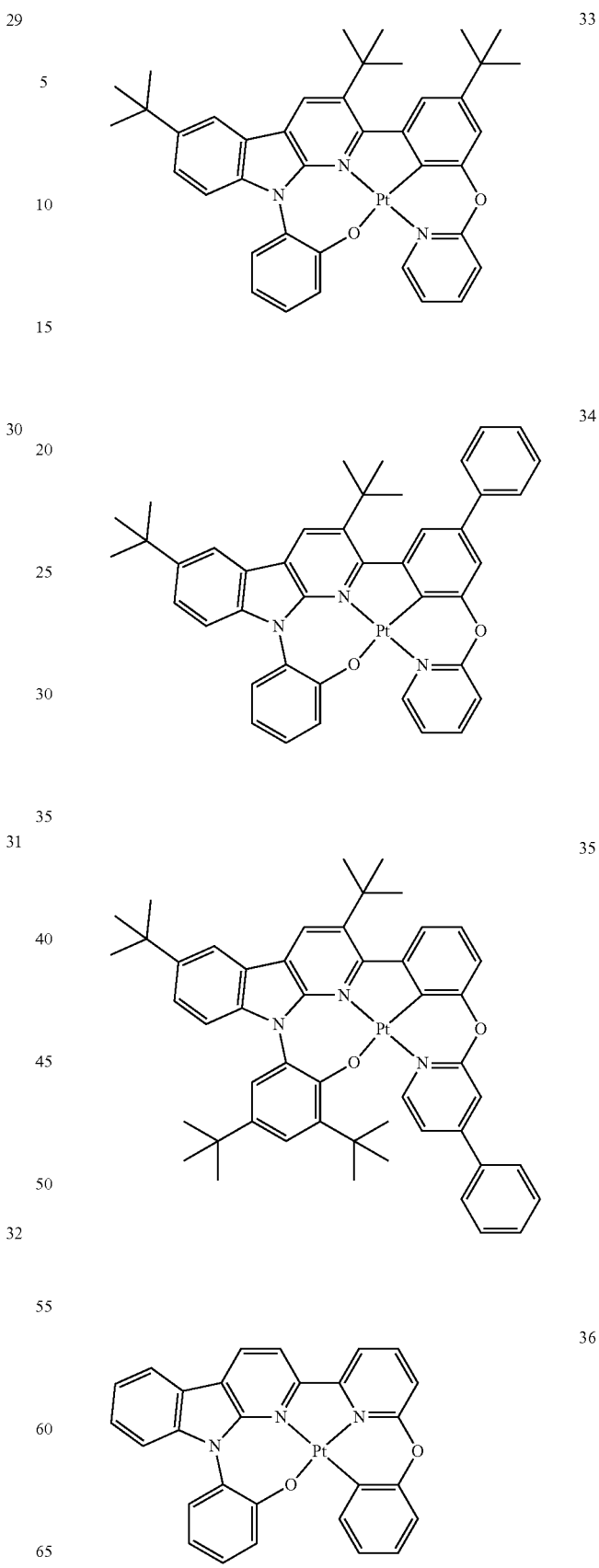

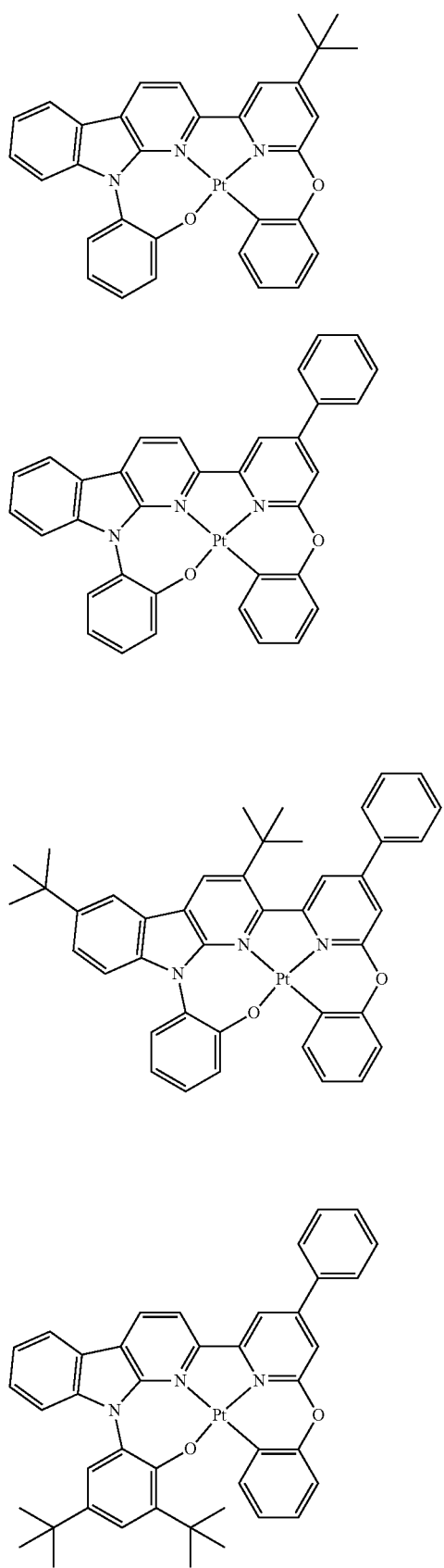
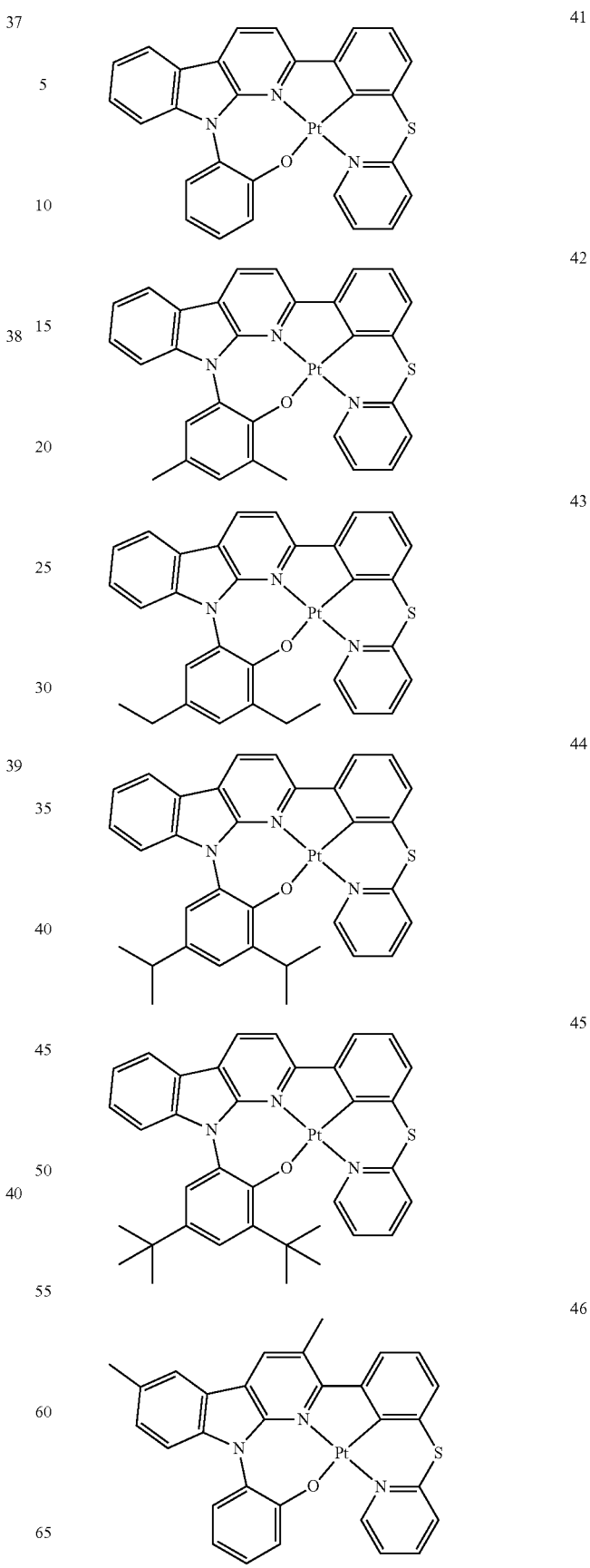

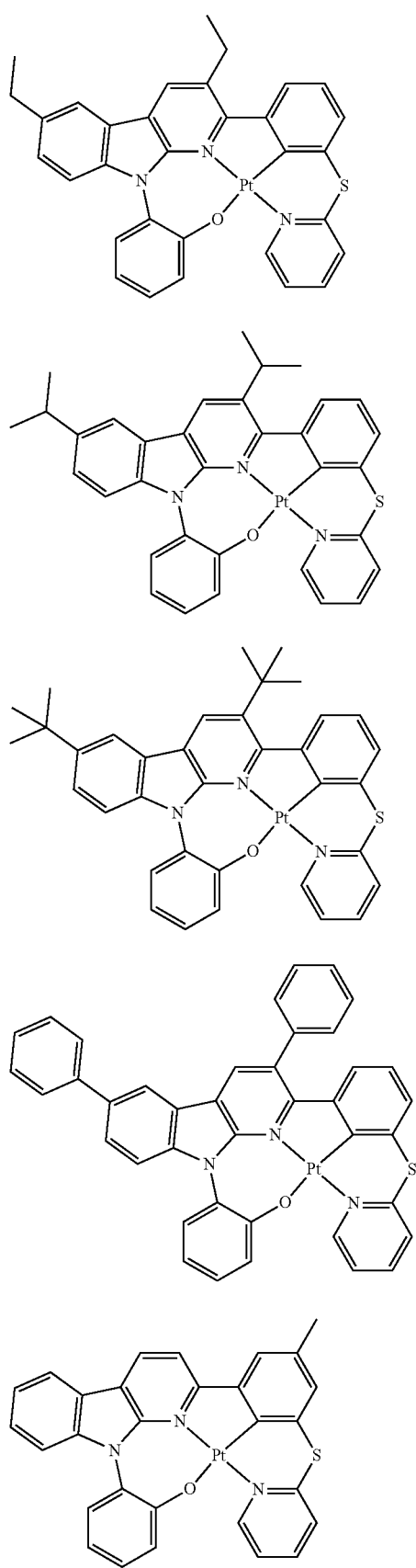
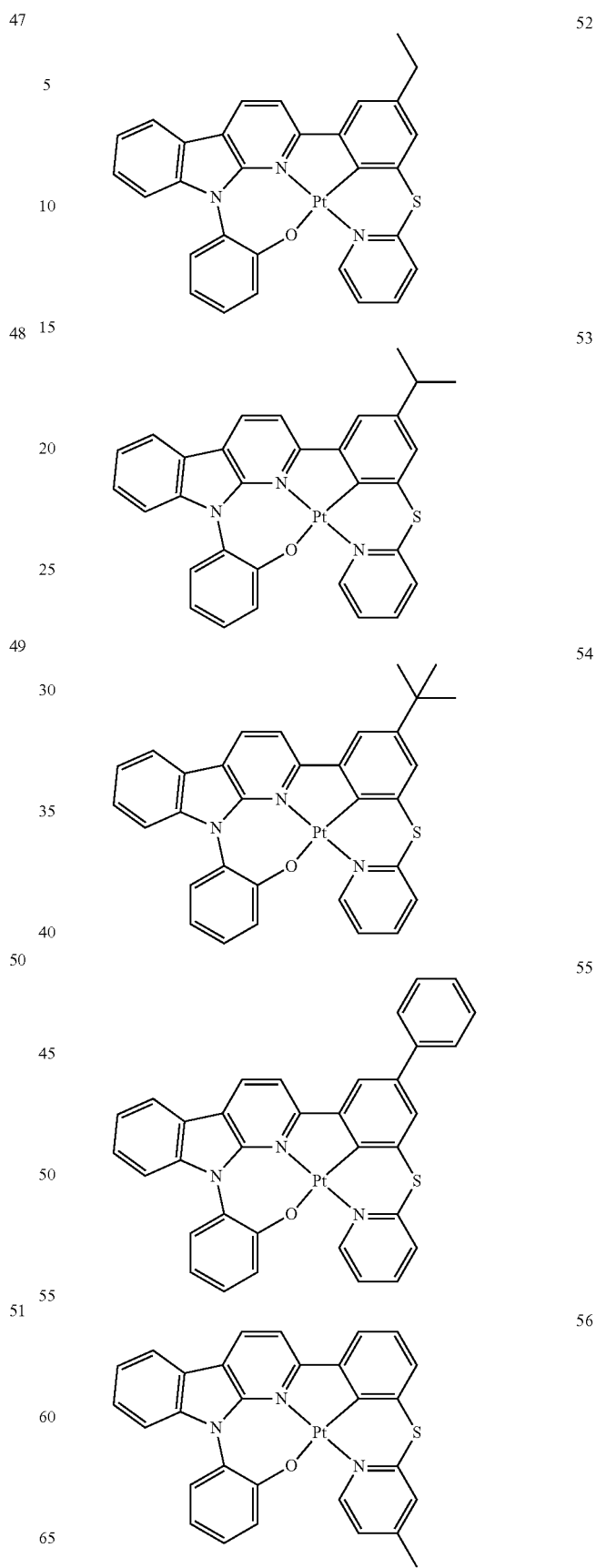

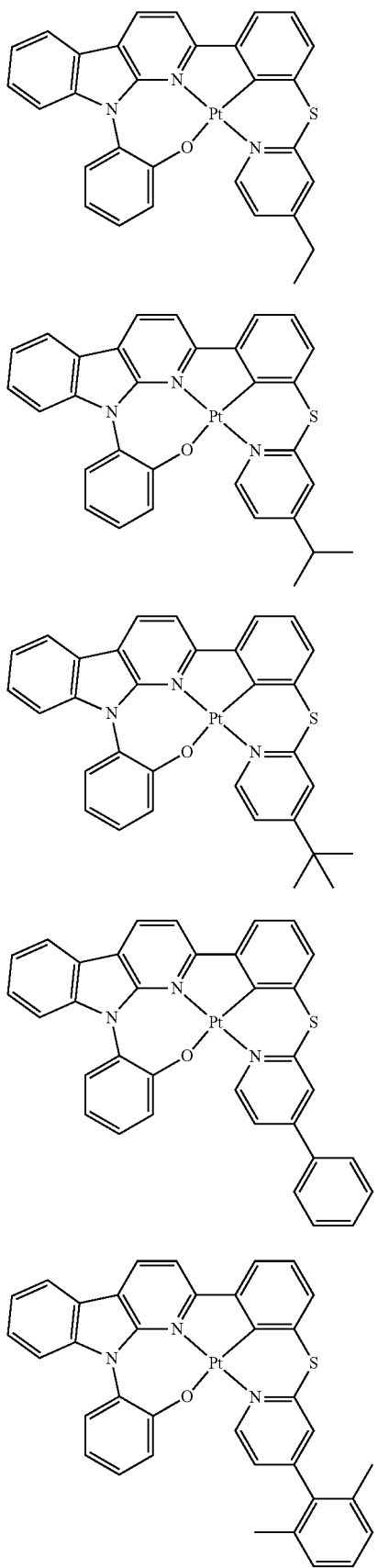
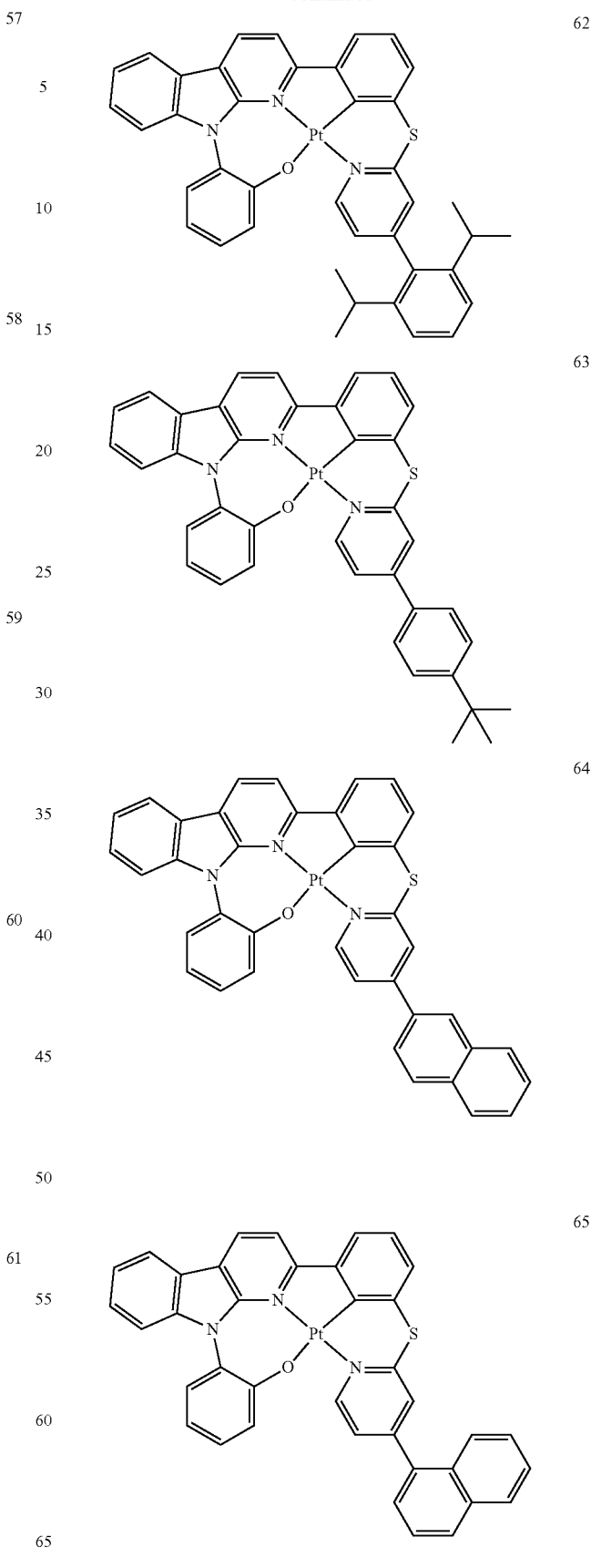

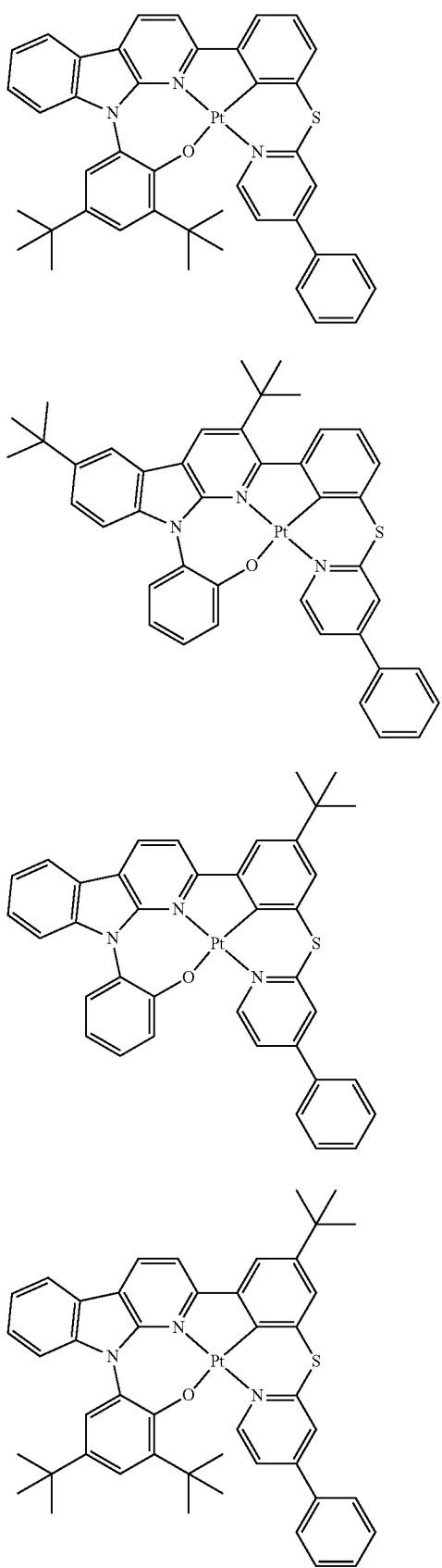
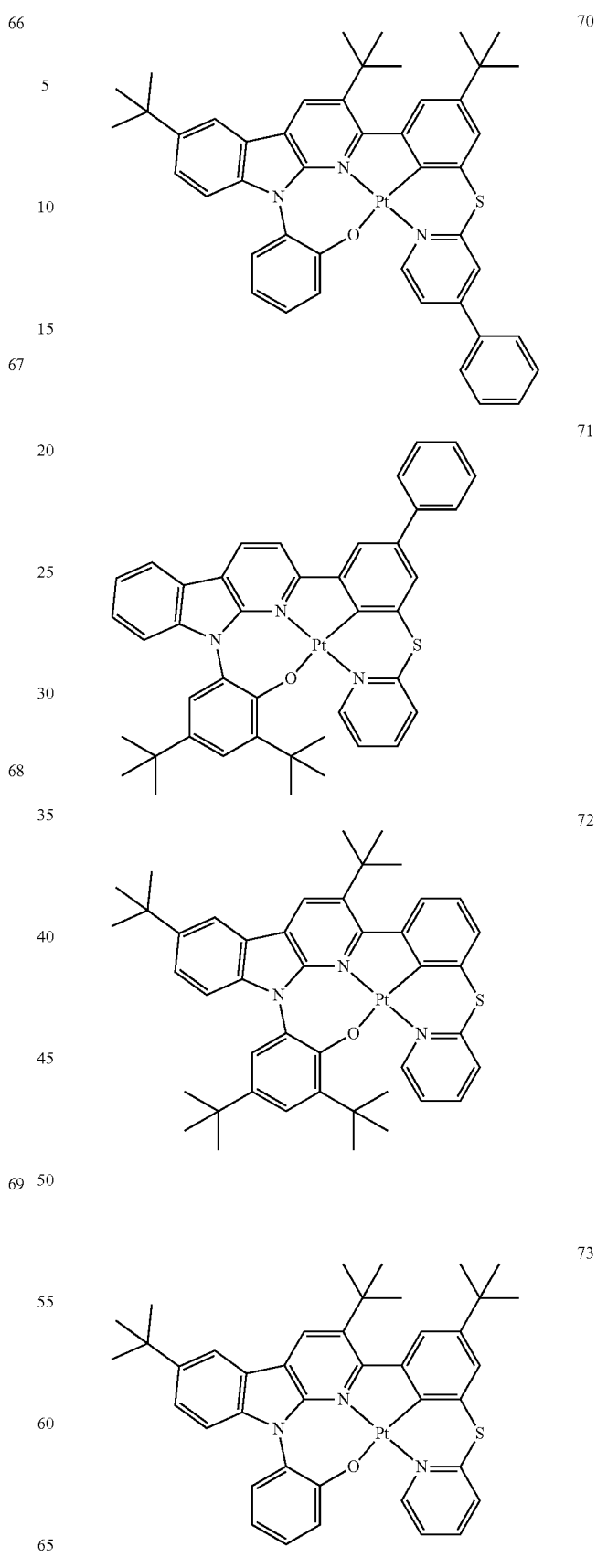

74
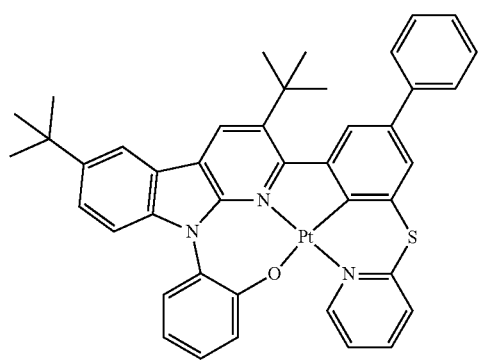
75
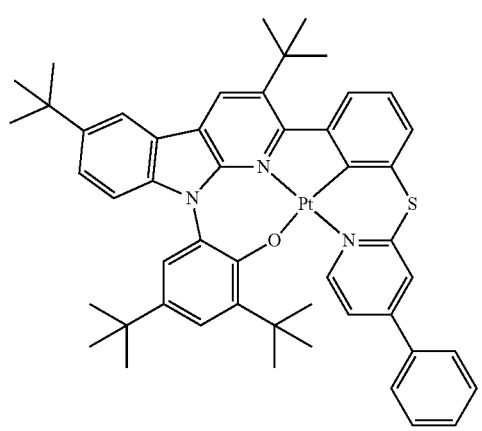
76
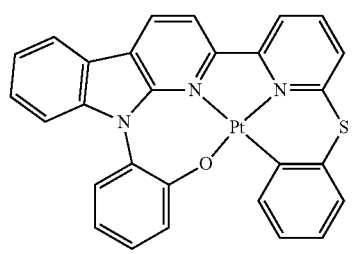
77
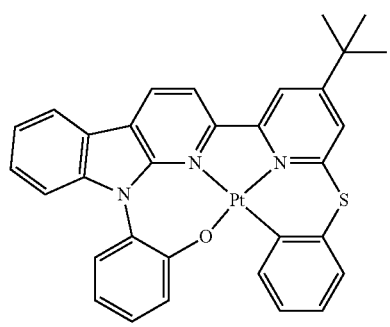
78
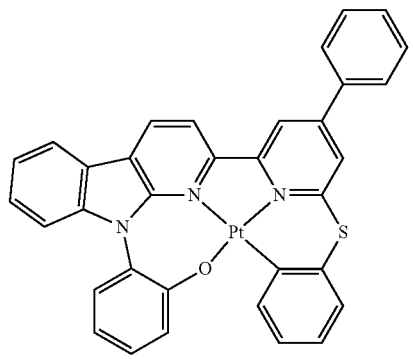
79
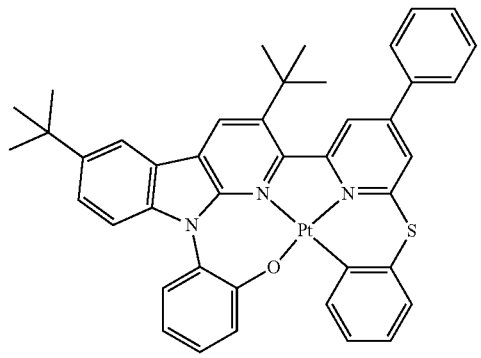
80
81
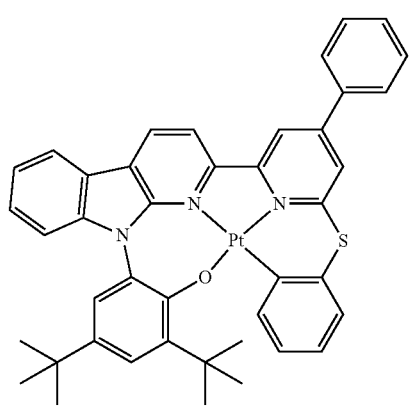
82
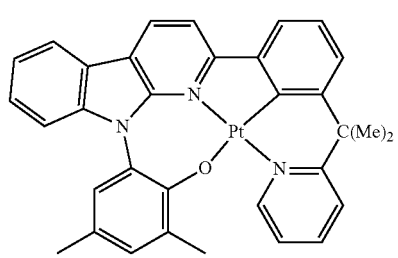

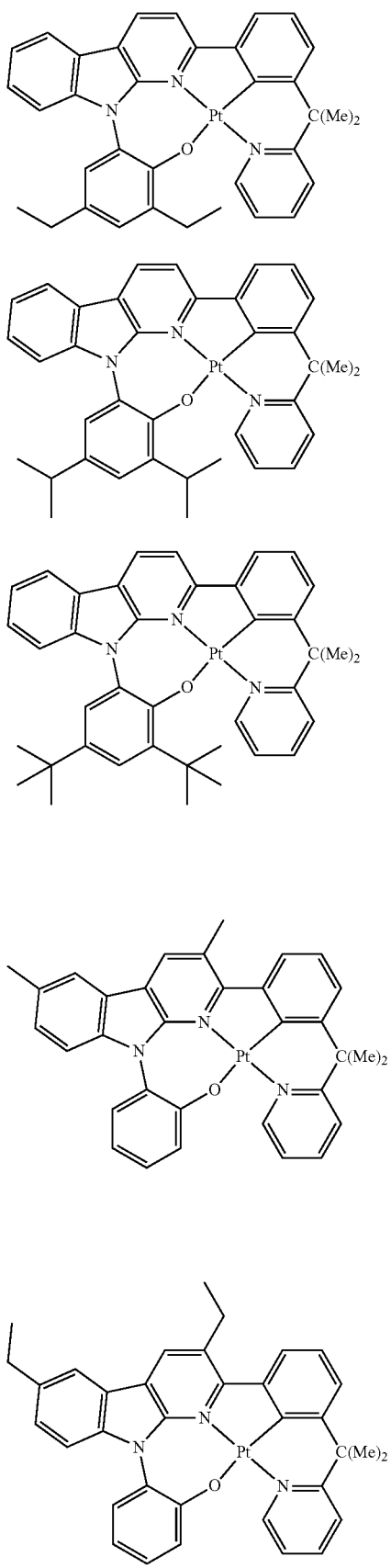
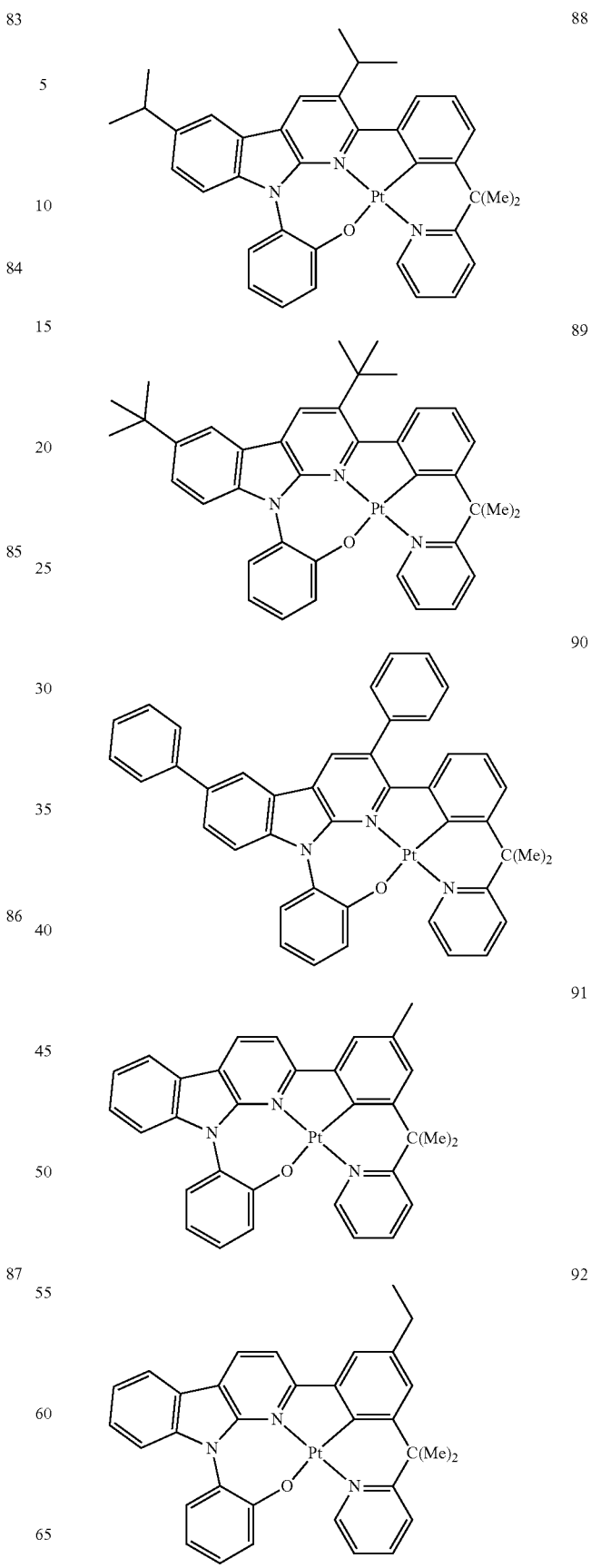

93
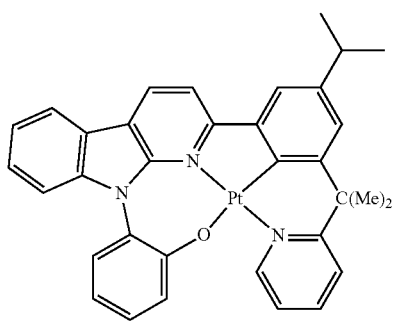
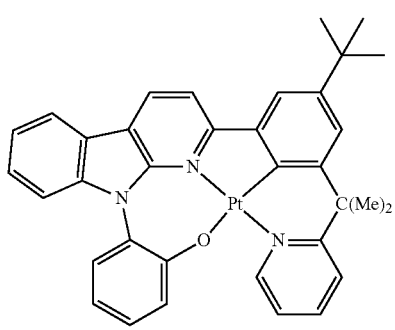
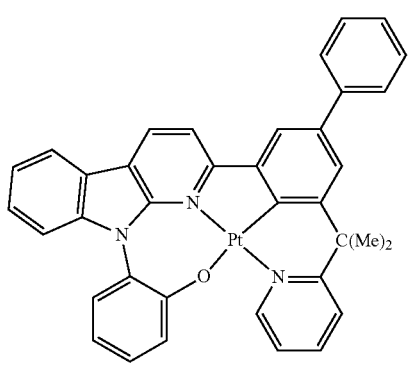
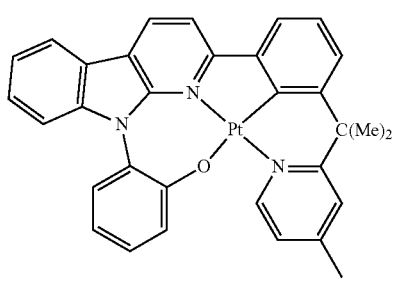
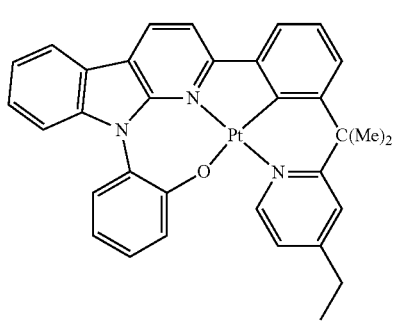
98
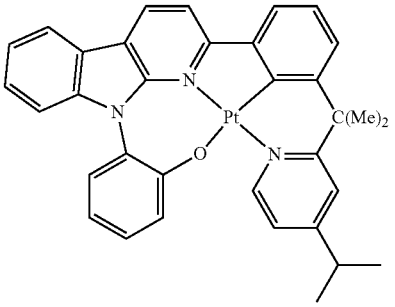
99
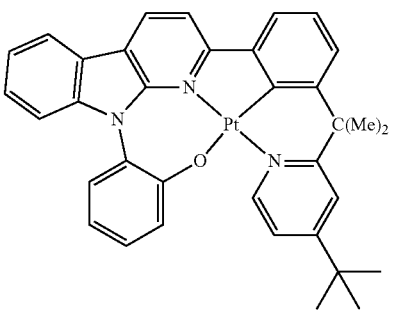
100
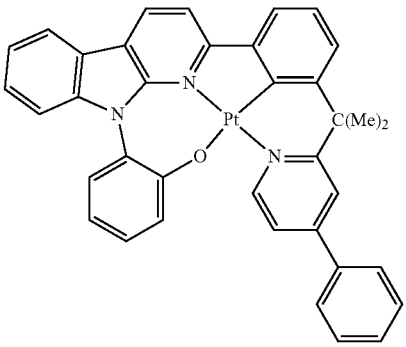
101
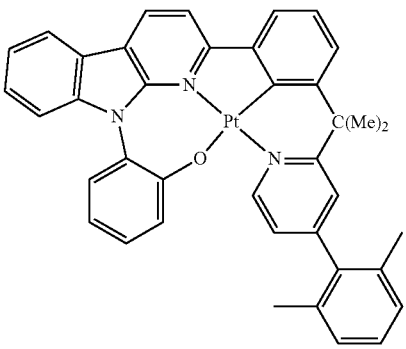

95
-continued
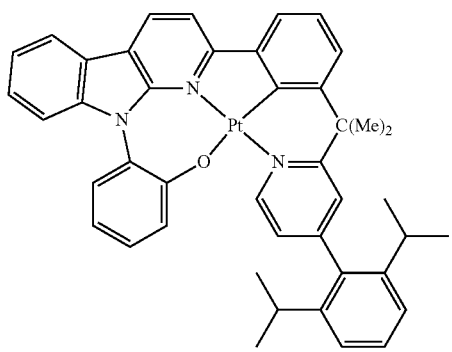
102
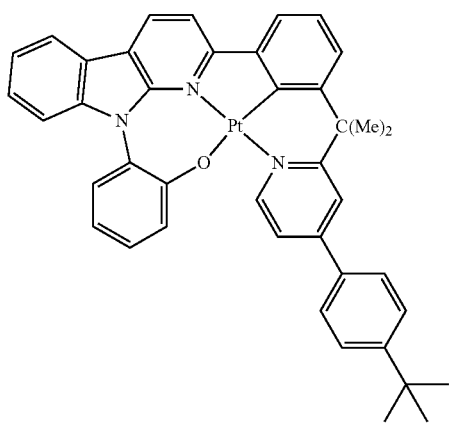
103
104
105
96
-continued
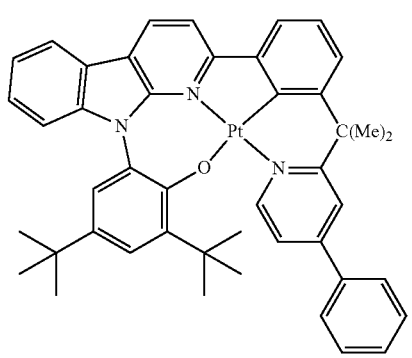
106
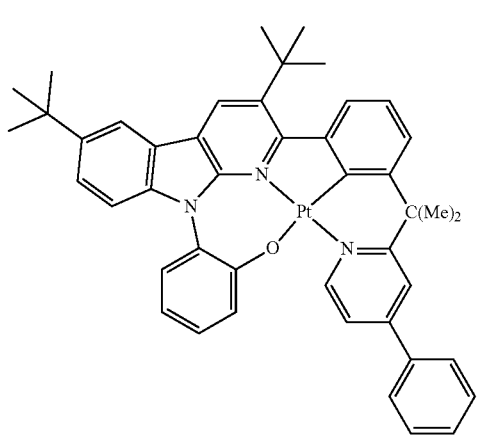
107
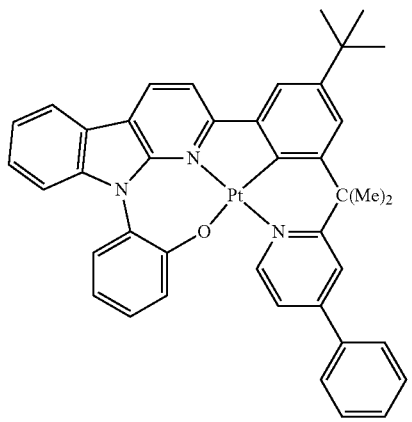
108
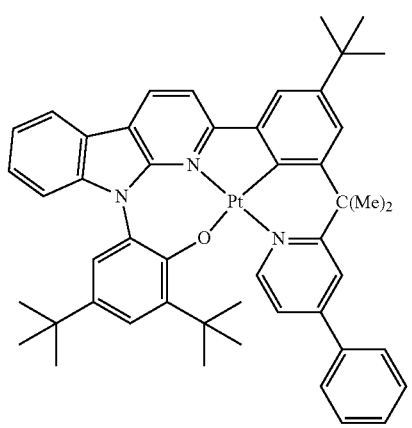
109

110
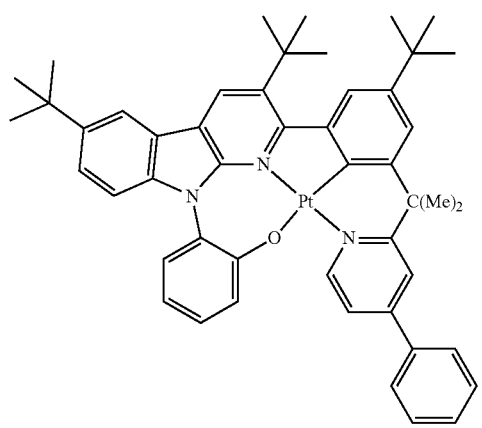
111
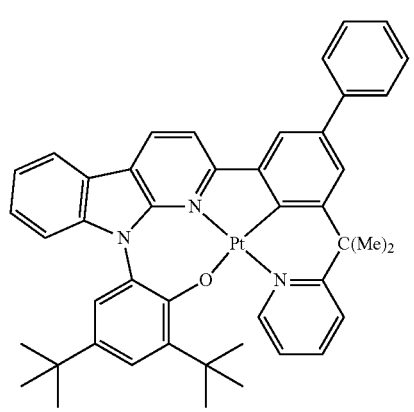
112
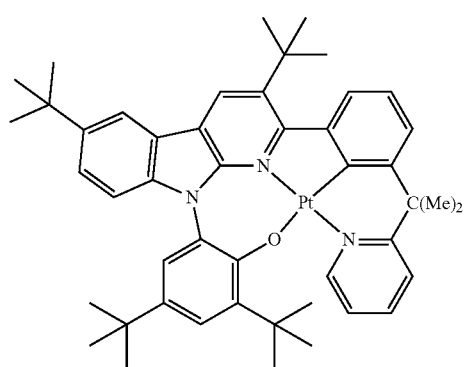
113
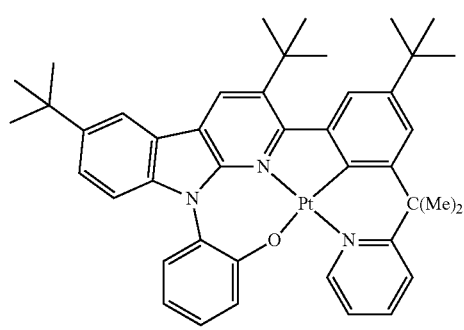
114
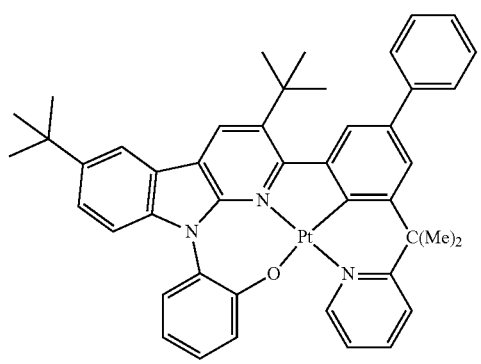
115
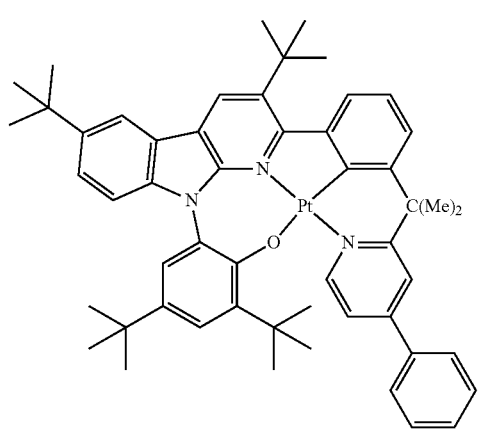
116
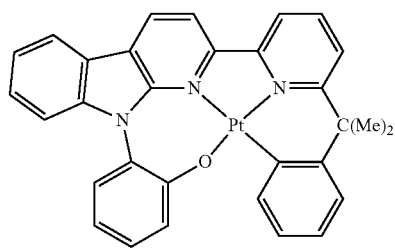
117
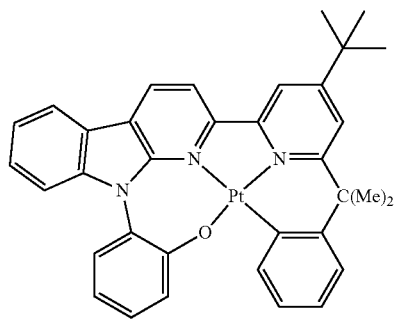

US 11,665,957 B2
99
-continued
118
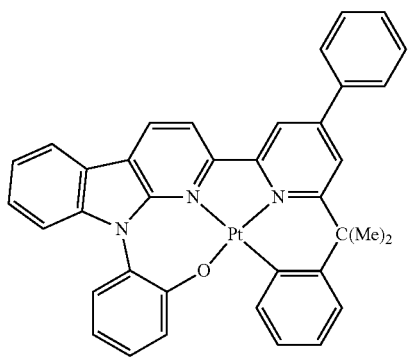
119
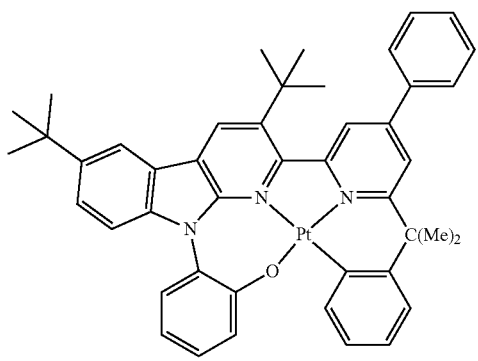
120
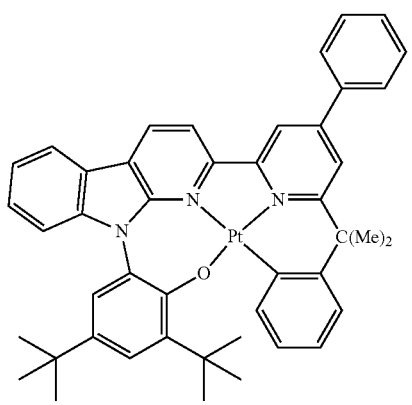
121
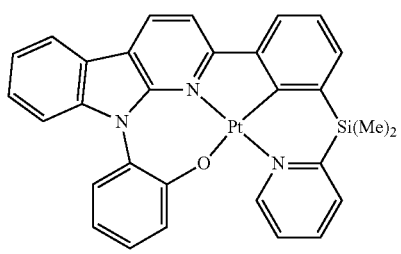
122
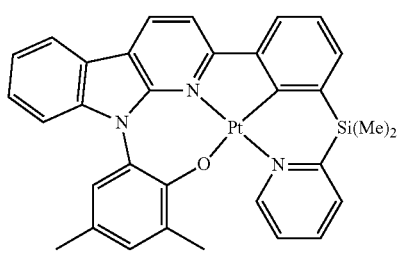
100
-continued
123
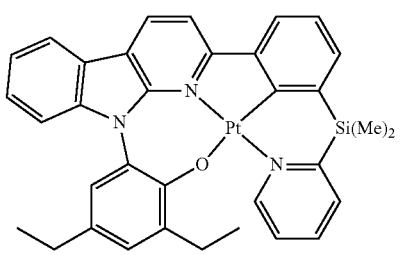
124
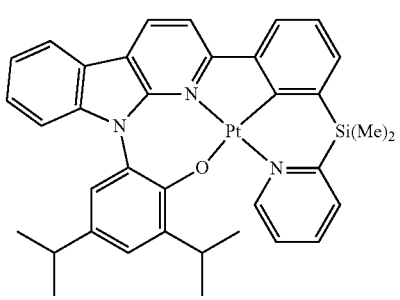
125
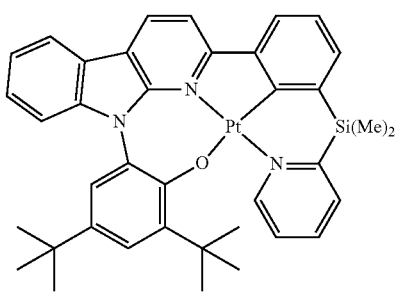
126
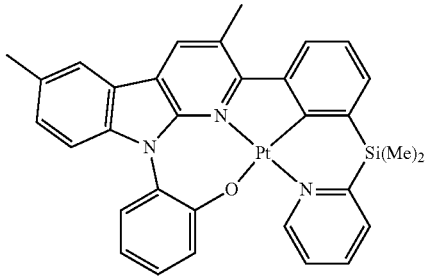
127
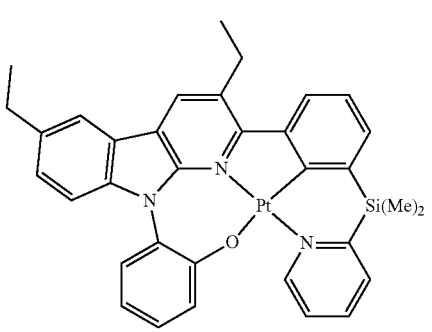

-continued
128
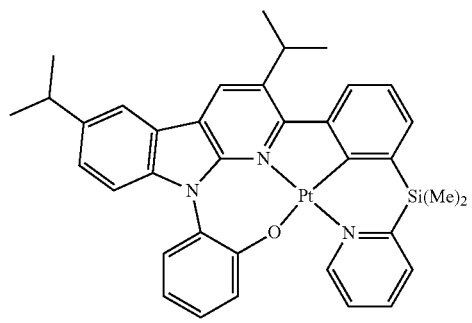
129
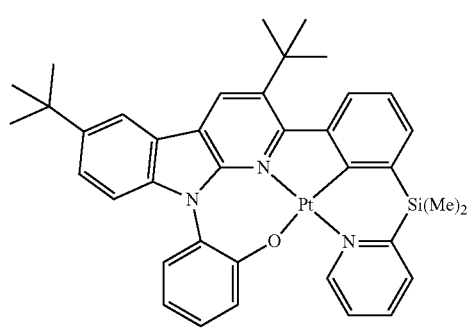
130
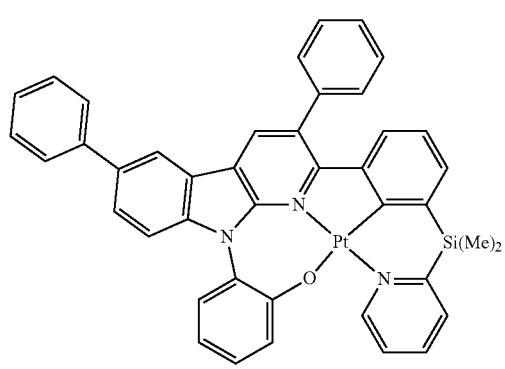
131
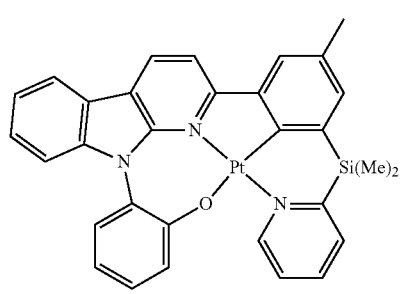
132
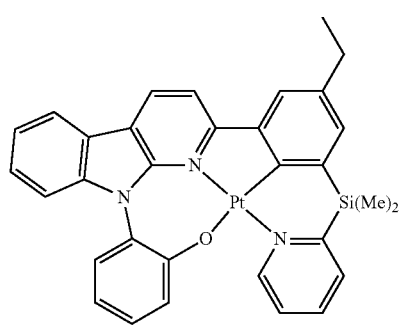
-continued
133
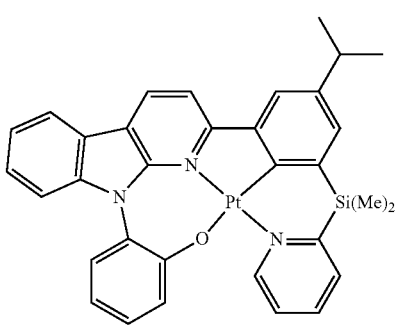
134
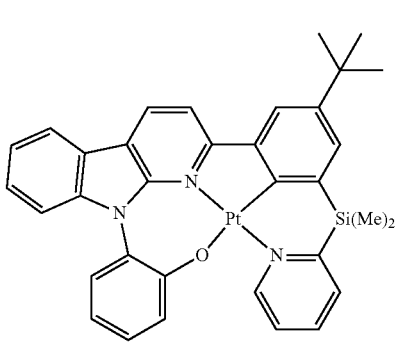
135
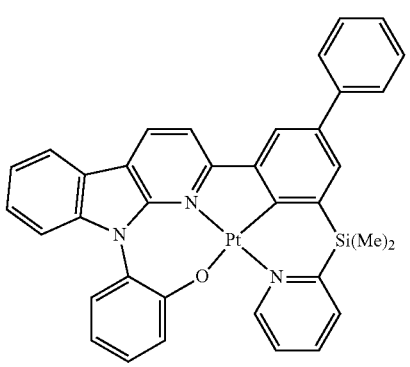
136
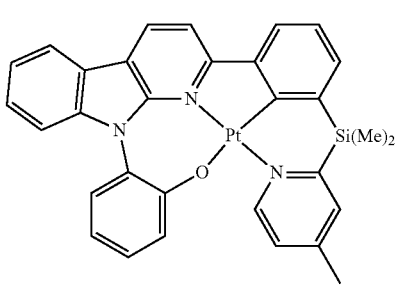
137
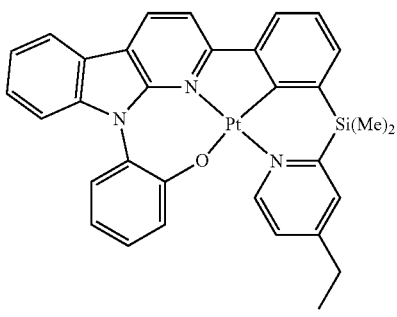

138 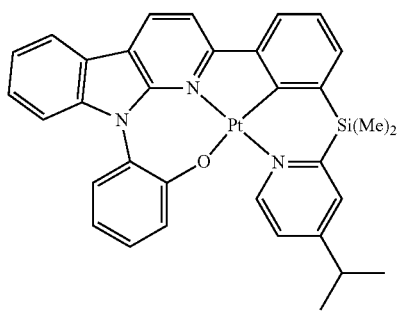
139 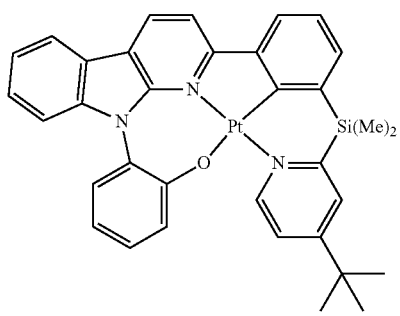
140 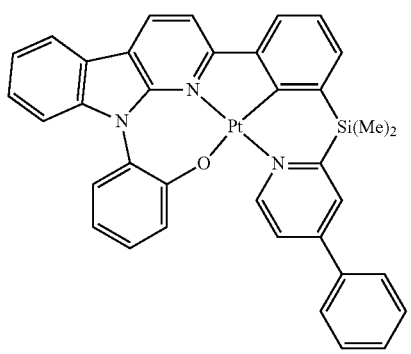
141 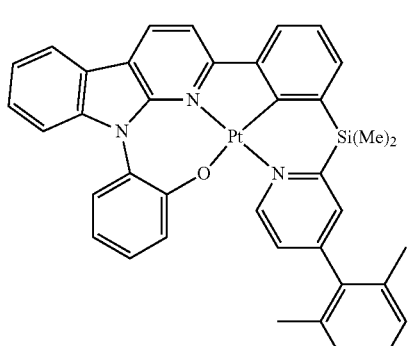
142 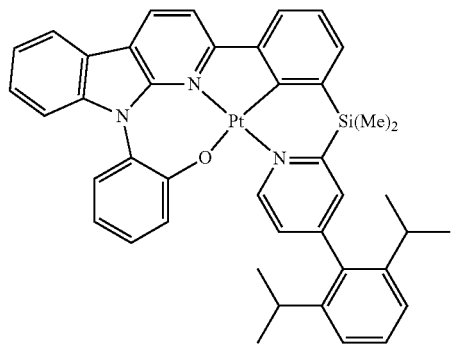
143 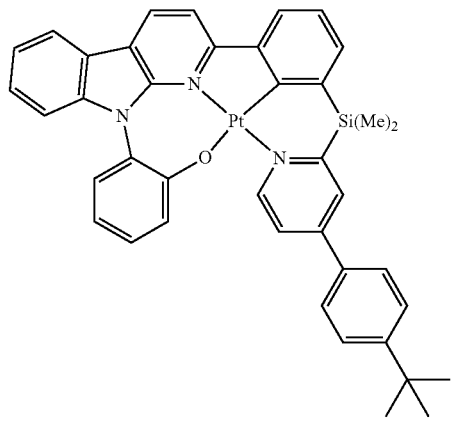
144 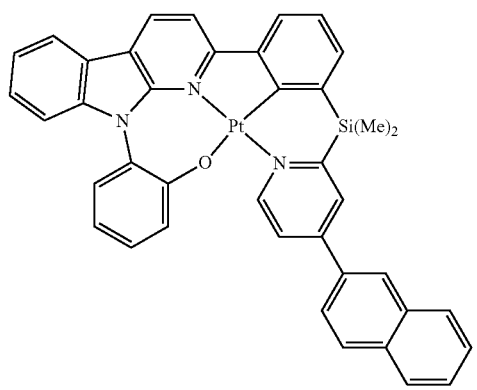
145 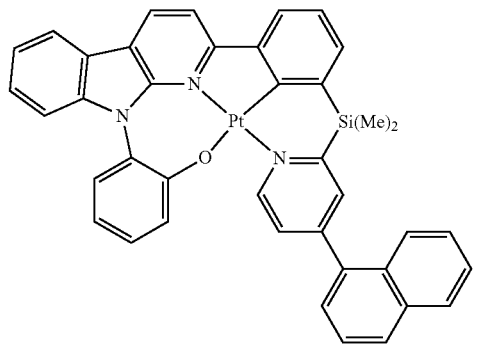

146
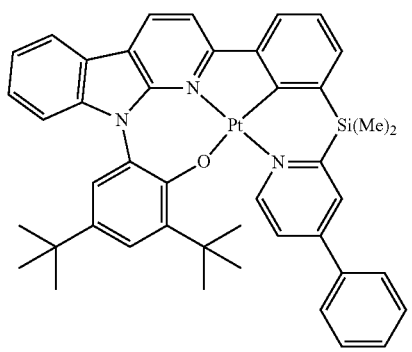
147
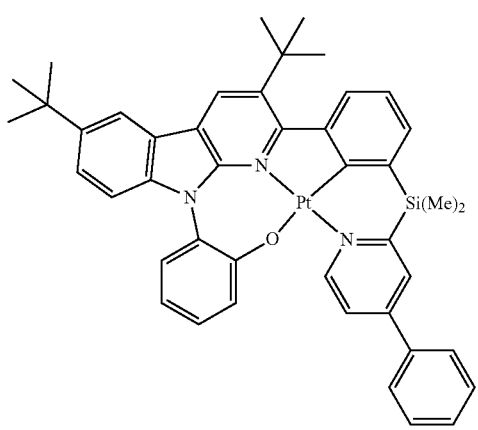
148
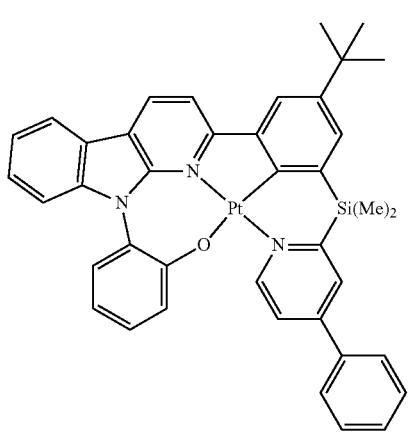
149
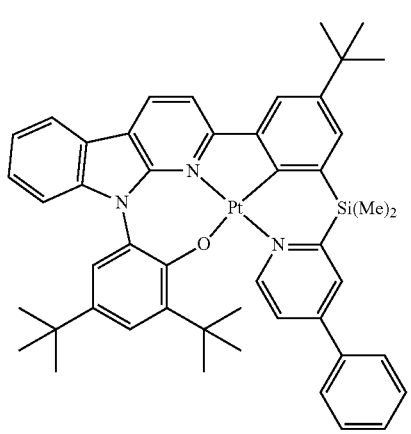
150
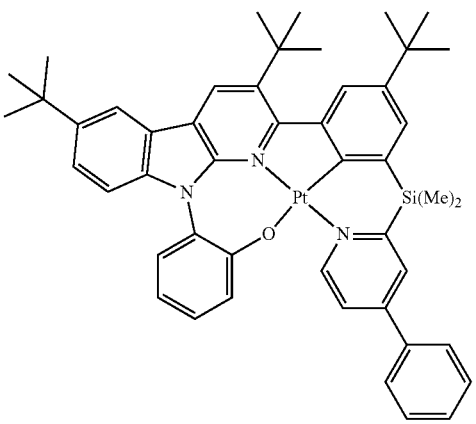
151
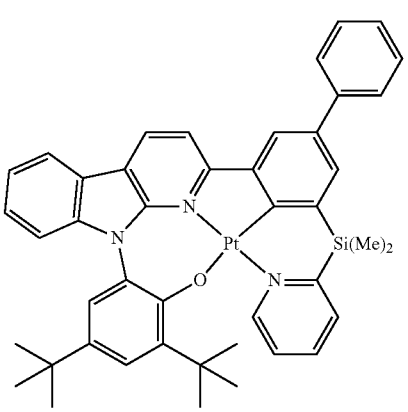
152
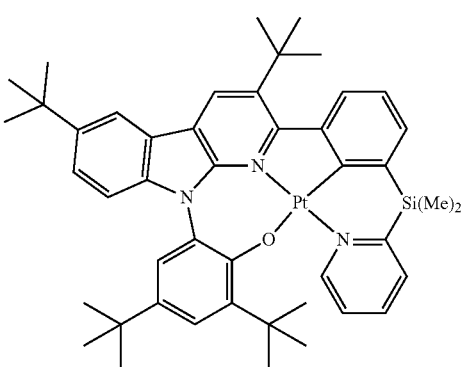
153
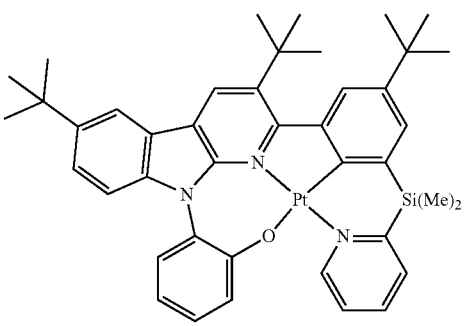

154
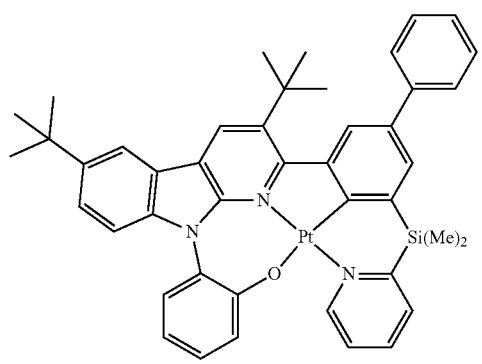
155
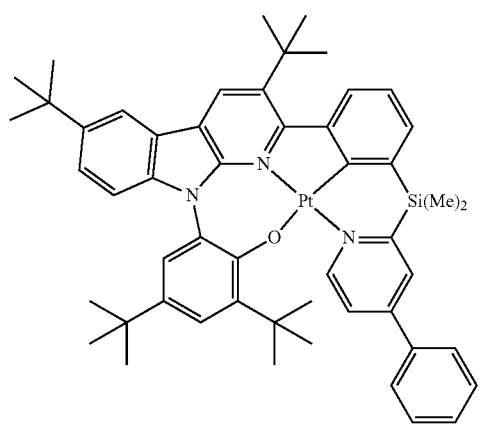
156
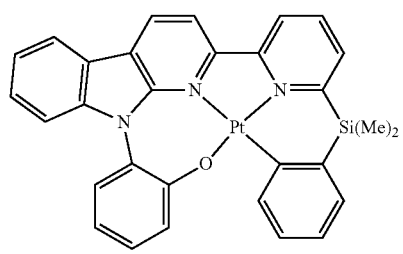
157
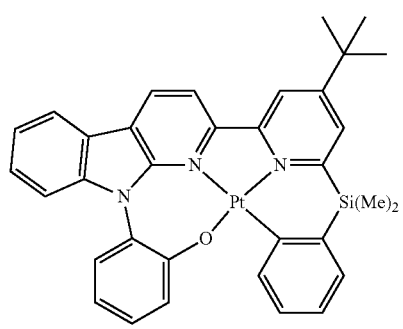
158
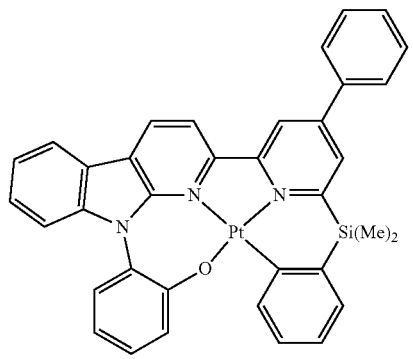
159
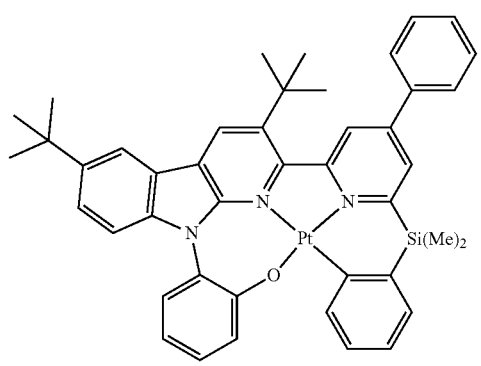
160
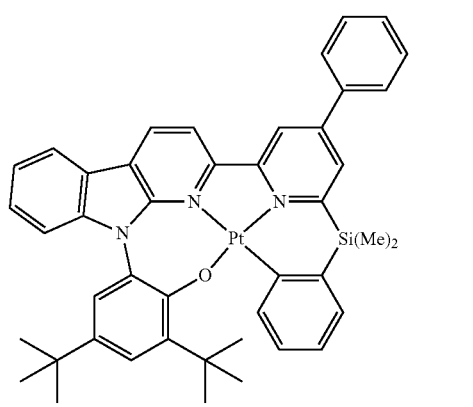
161
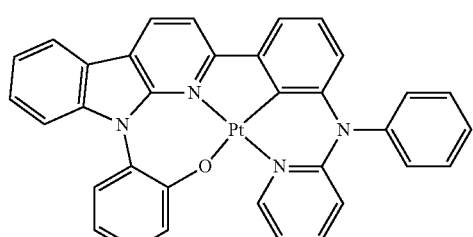
162
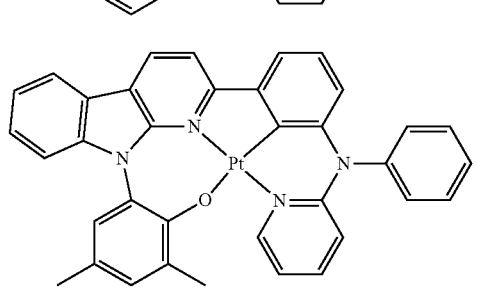

109
-continued
163
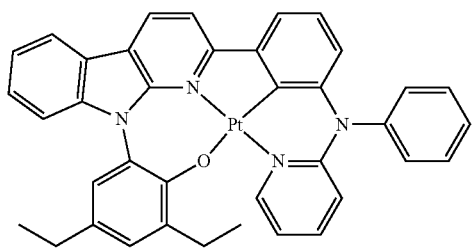
164
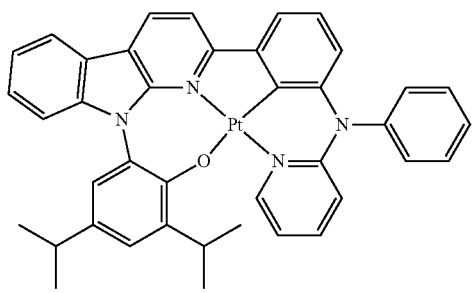
165
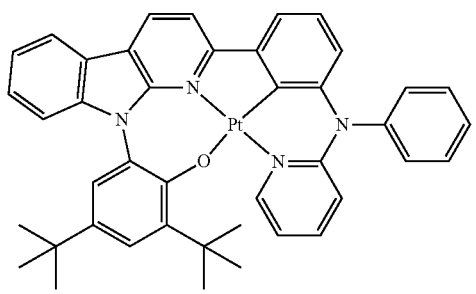
166
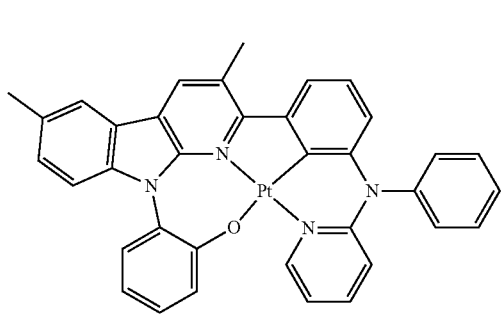
167
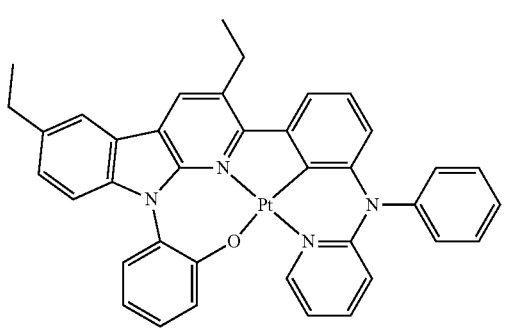
110
-continued
168
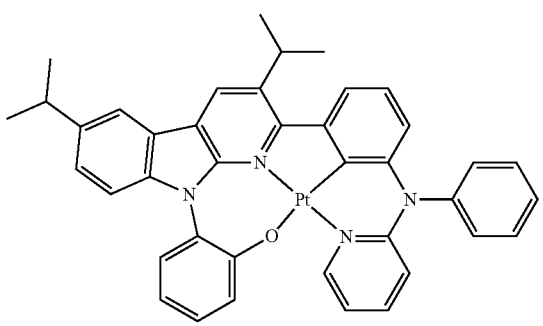
169
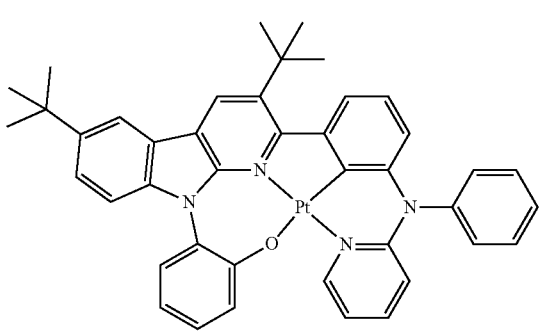
170
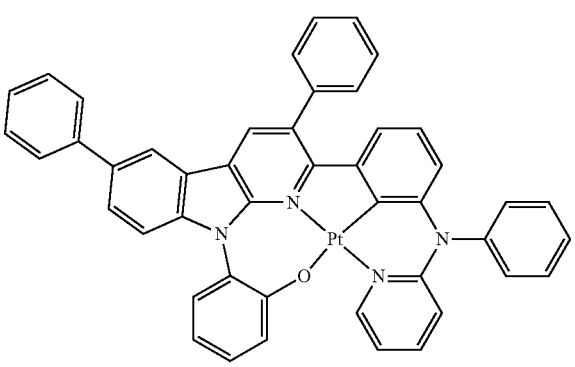
171
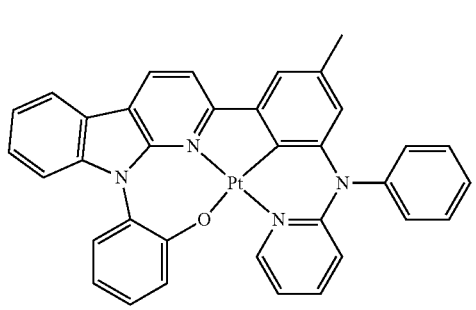

| 172 | 177 |
|---|---|
| 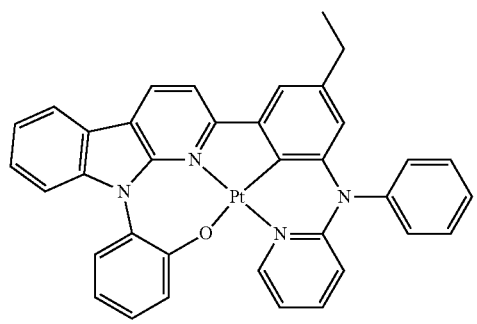 | 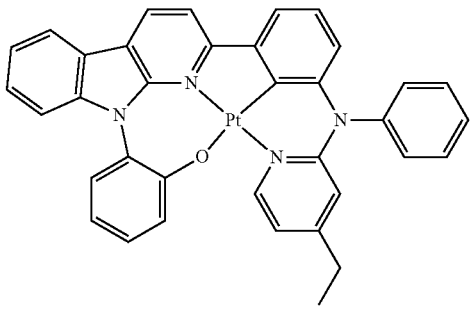 |
| 173 | 178 |
| 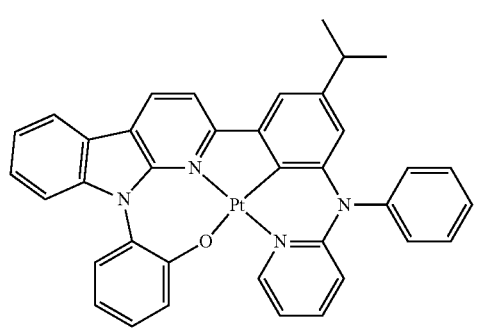 | 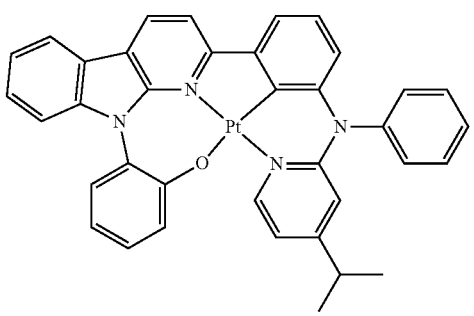 |
| 174 | 179 |
| 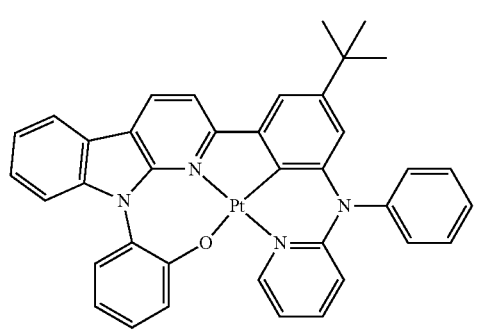 | 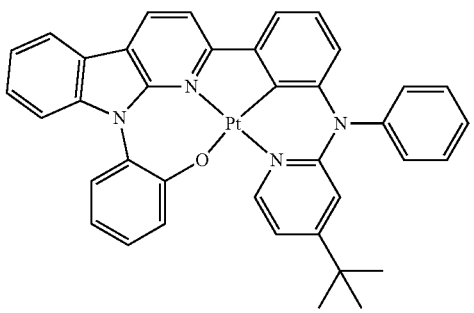 |
| 175 | 180 |
| 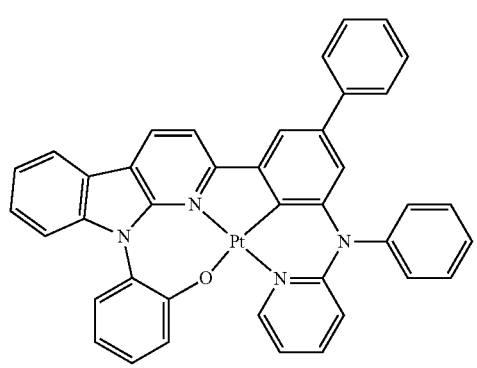 | 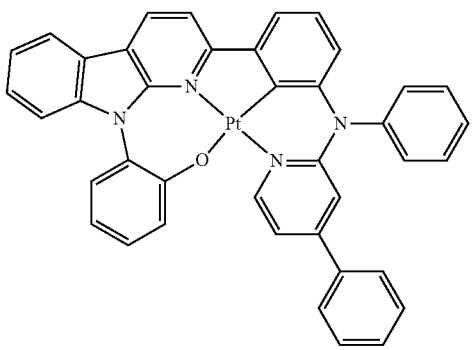 |
| 176 | 181 |
| 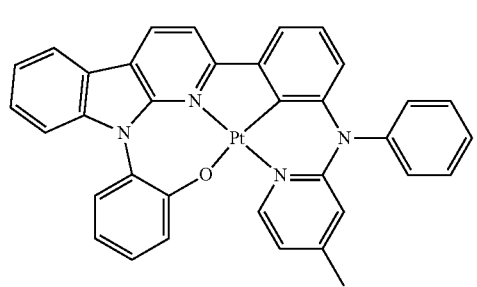 | 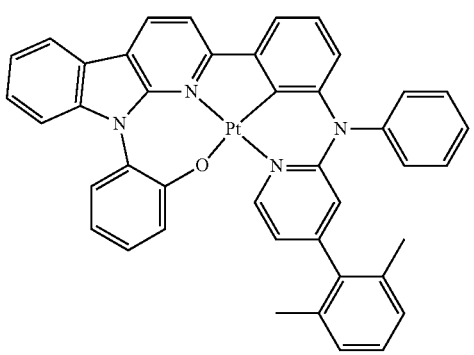 |

182
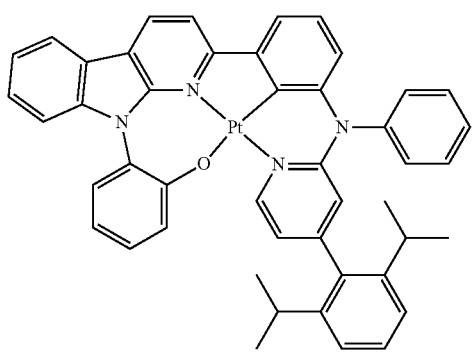
183
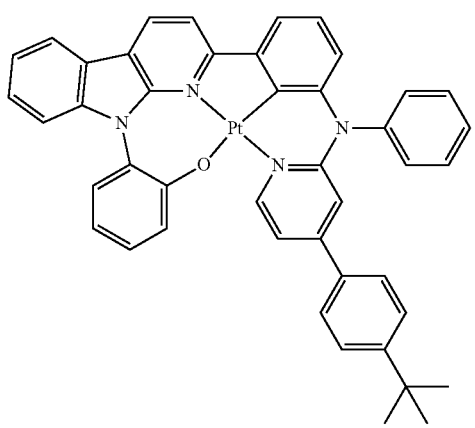
184
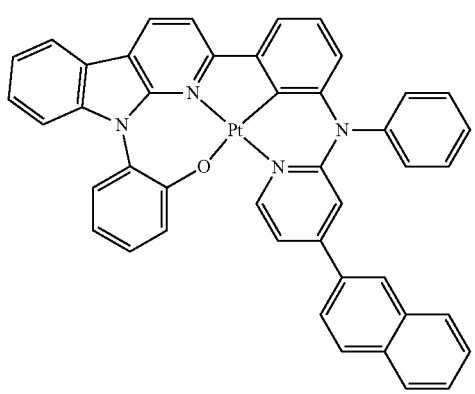
185
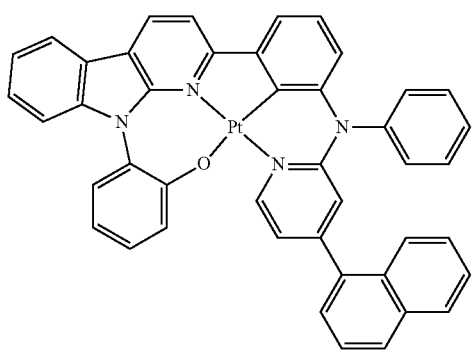
186
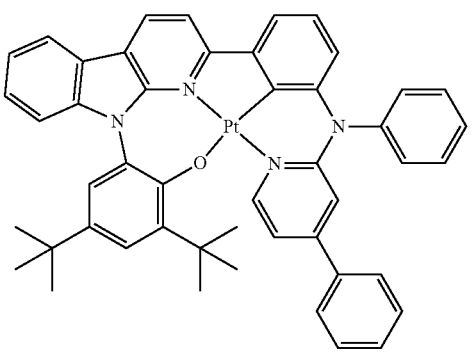
187
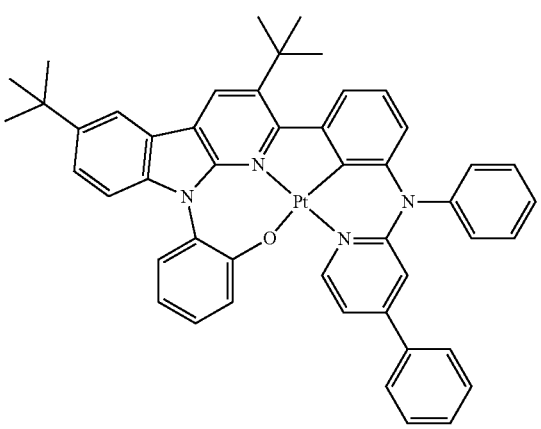
188
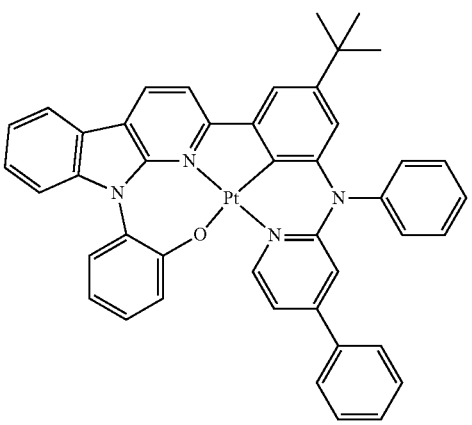
189
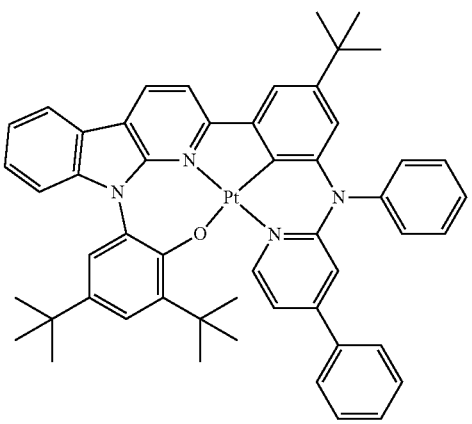

190
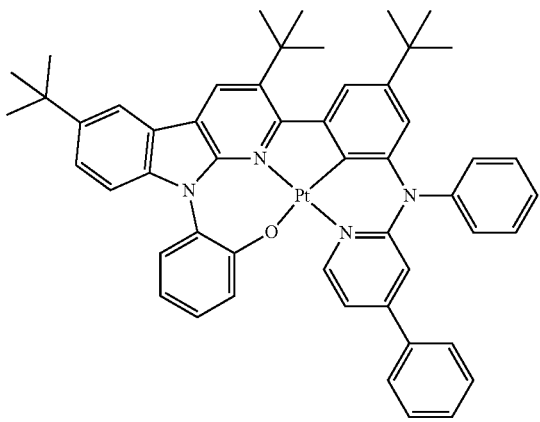
191
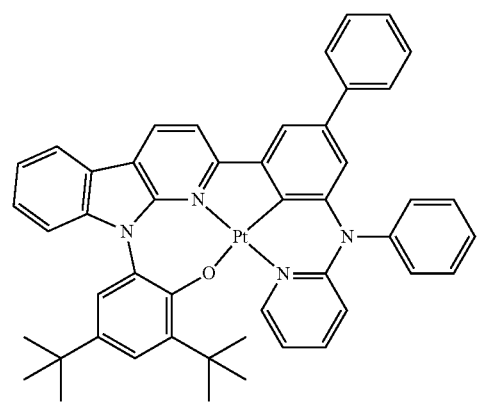
192
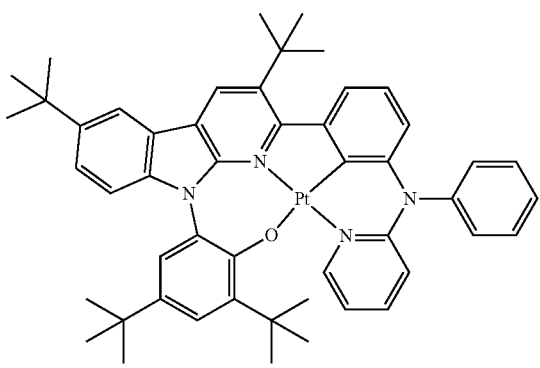
193
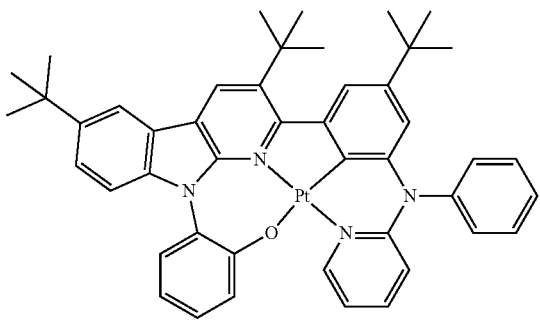
194
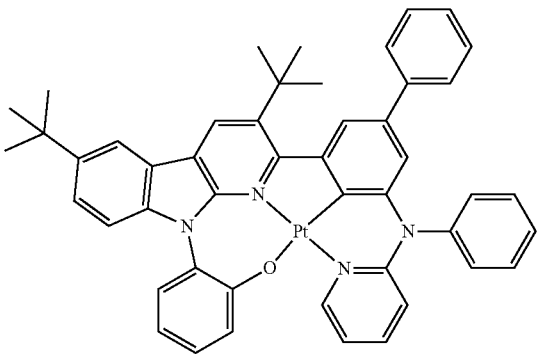
195
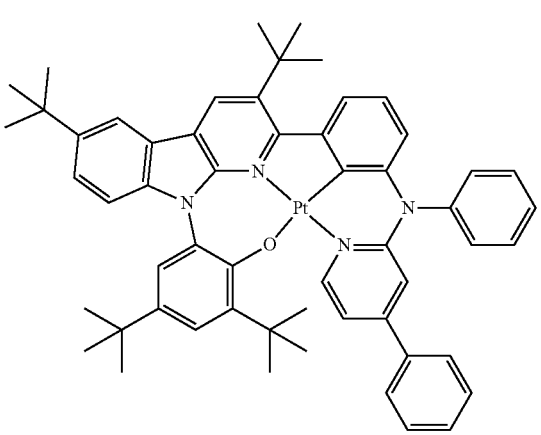
196
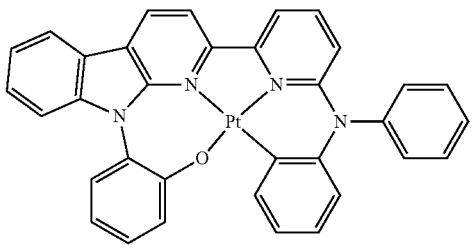
197
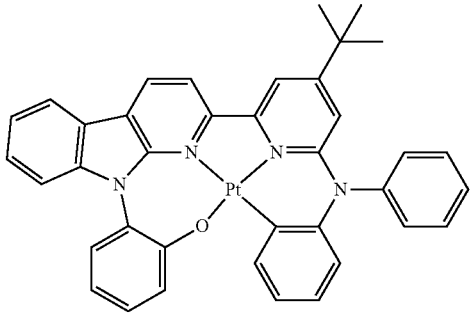

-continued

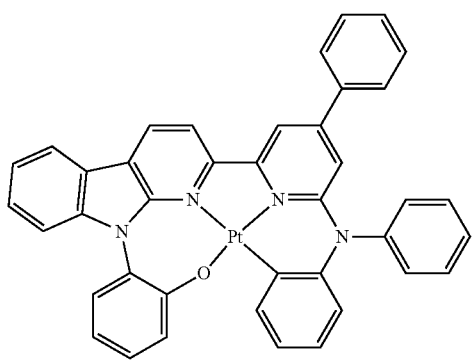
198

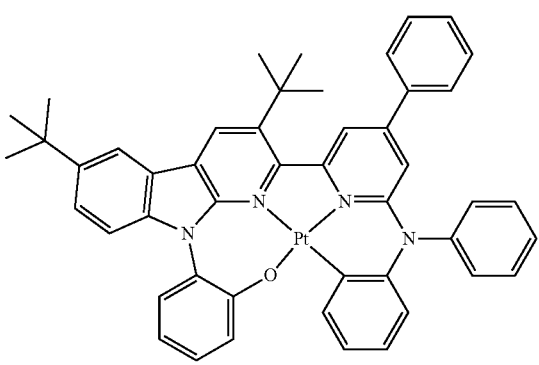
199

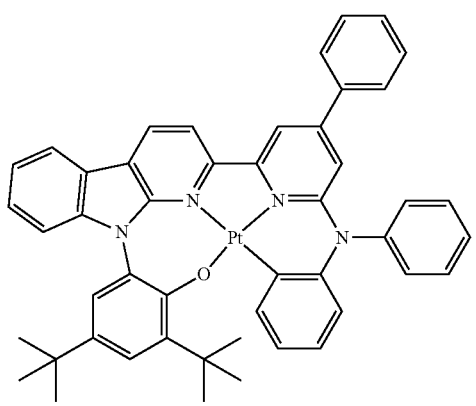
200

In Formula 1, $X_5$ may be O, S, B(R'), N(R'), P(R'), C(R')(R''), Si(R')(R''), Ge(R')(R''), C(=O), B(R')(R''), N(R')(R''), or P(R')(R''). That is, $X_5$ in Formula 1 may not be a single bond, and a cyclometalated ring formed by M, $X_5$, ring $CY_1$, $Y_1$, and $X_2$ in Formula 1 may be a 7-membered ring. Therefore, $X_5$ in Formula 1 does not belong to a plane that forms a core metal (M) with a ligand of Formula 1. In forming a thin film including the organometallic compound represented by Formula 1, a stacking effect between the organometallic compounds represented by Formula 1 may be reduced, and the polarity of the organometallic compound represented by Formula 1 may be increased. Therefore, an electronic device, for example, an organic light-emitting device, which includes the organometallic compound represented by Formula 1, may have a relatively low roll-off ratio.

In addition, since $T_2$ in Formula 1 is not a single bond, a cyclometalated ring formed by M, ring $CY_4$, $T_2$, and ring $CY_3$ in Formula 1 may be a 6-membered ring. Therefore, hybridization between a HOMO contributing moiety and a LUMO contributing moiety in Formula 1 may be substantially prevented, and a charge transfer ratio via a core metal (M) in Formula 1 may be increased. Therefore, an electronic device, for example, an organic light-emitting device, which includes the organometallic compound represented by Formula 1, may have high luminescence efficiency.

For example, the highest occupied molecular orbitals (HOMO), the lowest unoccupied molecular orbitals (LUMO), and the triplet ($T_1$) energy levels of some of the compounds illustrated above were evaluated by using a Discrete Fourier Transform (DFT) method of a Gaussian program (structurally optimized at a level of B3LYP, 6-31G (d,p)). Evaluation results are shown in Table 1 below.

TABLE 1

| Compound No. | HOMO (eV) | LUMO (eV) | $T_1$ energy level (eV) |
|---|---|---|---|
| 1 | −4.899 | −1.887 | 2.415 |
| 5 | −4.640 | −1.924 | 2.183 |
| 20 | −4.916 | −1.910 | 2.371 |
| 28 | −4.884 | −1.898 | 2.404 |
| 161 | −4.801 | −1.852 | 2.438 |
| 180 | −4.816 | −1.877 | 2.390 |

From Table 1, it is confirmed that the organometallic compound represented by Formula 1 has such electric characteristics that are suitable for use in an electronic device, for example, for use as a dopant for an organic light-emitting device.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an organic layer including an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compound represented by Formula 1" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one embodiment, in the organic light-emitting device, the first electrode may be an anode, and the second electrode may be a cathode, and the organic layer may further include a hole transport region between the first electrode and the emission layer and an electron transport region between the emission layer and the second electrode, and the hole transport region may include a hole injection layer, a hole transport layer, an electron blocking layer, or any combination thereof, and the electron transport region may include a hole blocking layer, an electron transport layer, an electron injection layer, a buffer layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate known in the organic light-emitting device art may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include a material with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods such as vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

-continued
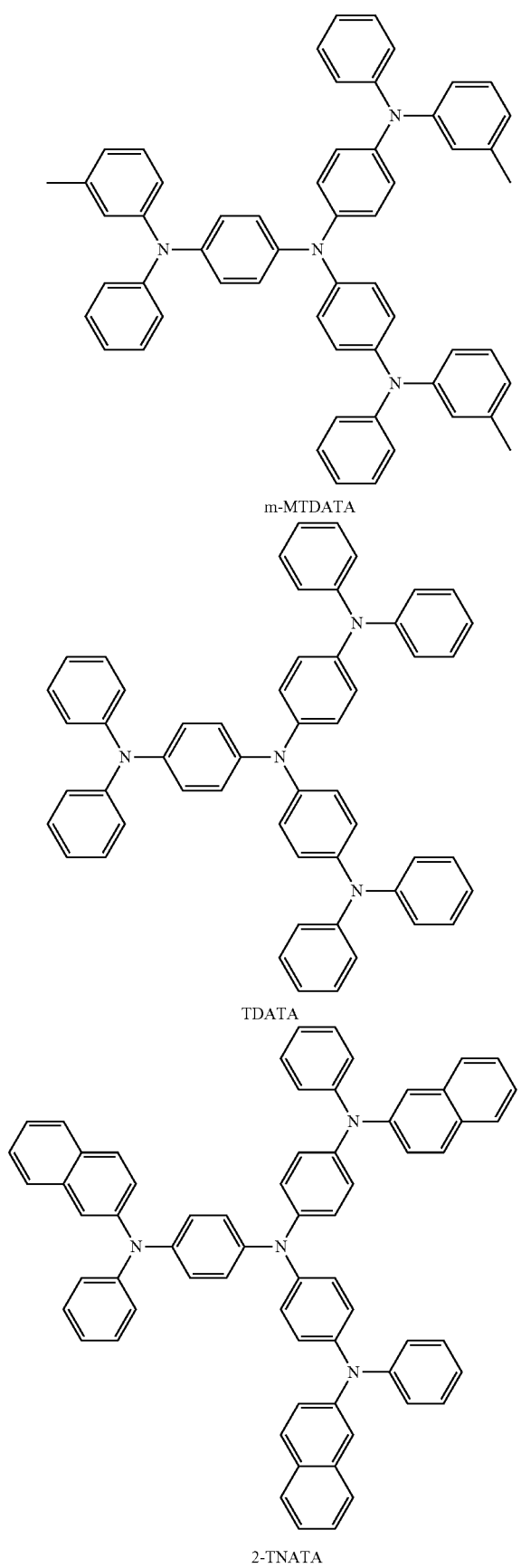
m-MTDATA
TDATA
2-TNATA
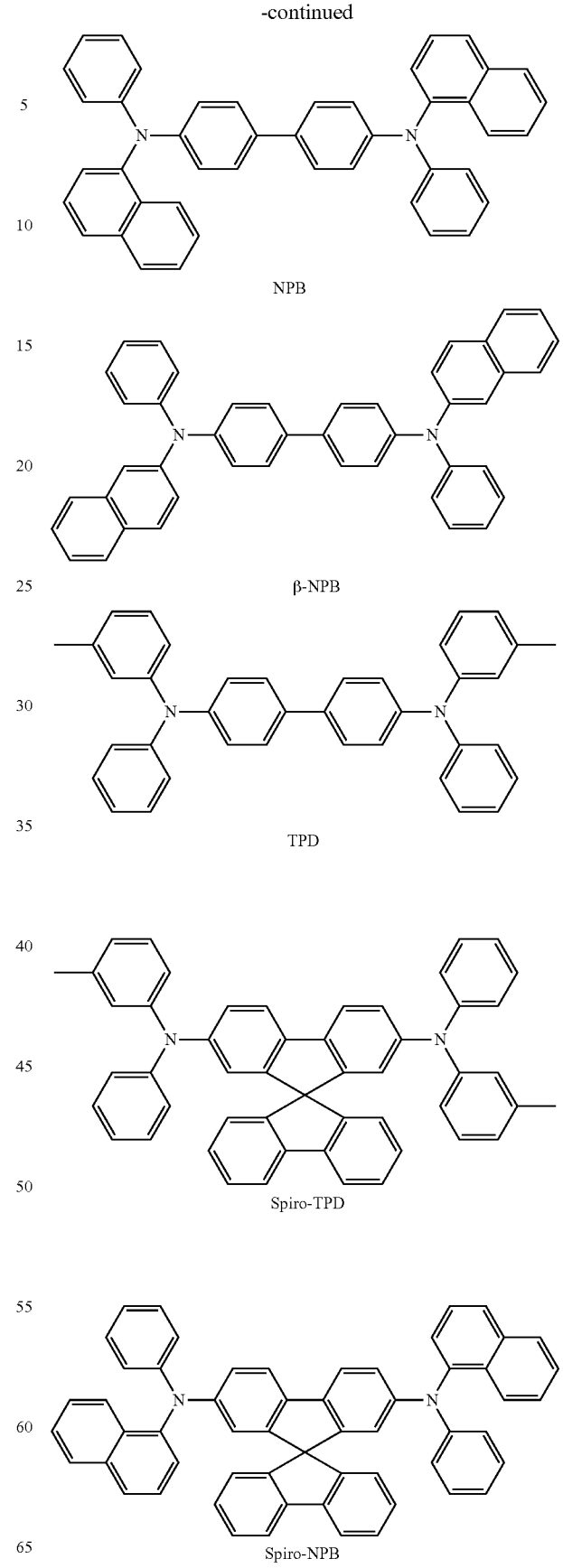
NPB
β-NPB
TPD
Spiro-TPD
Spiro-NPB -continued

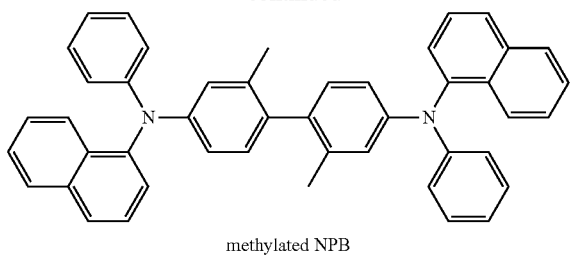

methylated NPB

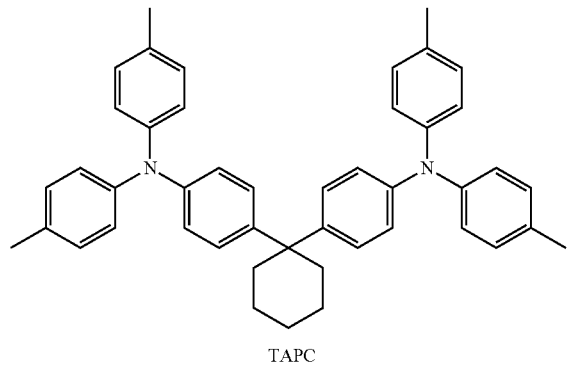

TAPC

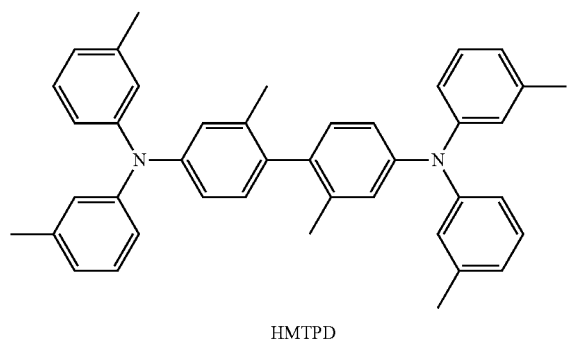

HMTPD

Formula 201

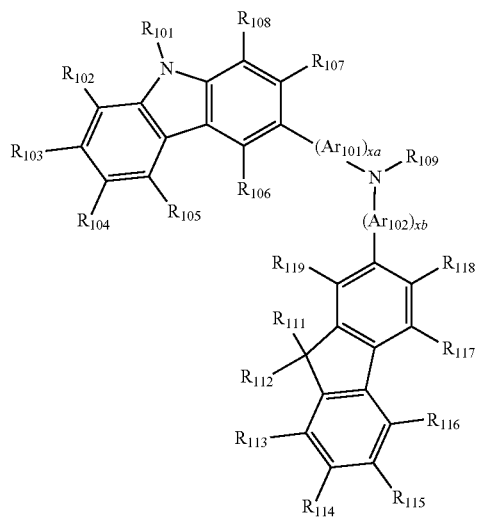

-continued

Formula 202

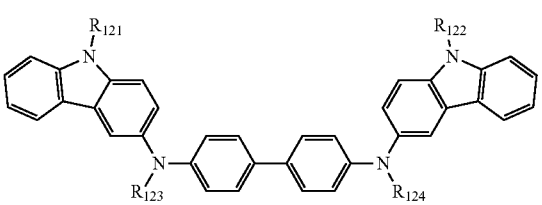

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, or any combination thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof, but embodiments of the present disclosure are not limited thereto.

$R_{109}$ in Formula 201 may be a phenyl group, a naphthyl group, an anthracenyl group, or a pyridinyl group; and a phenyl group, a naphthyl group, an anthracenyl group, or a pyridinyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one embodiment, the compound represented by Formula 201 may be represented by Formula 201A, but embodiments of the present disclosure are not limited thereto:

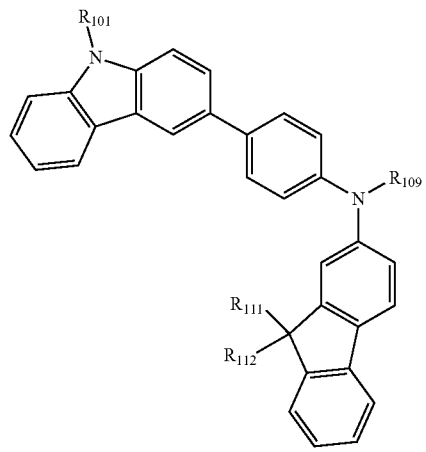

Formula 201A $R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

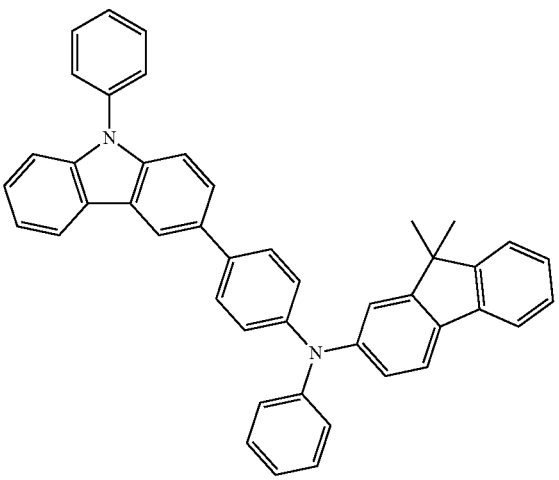

HT1

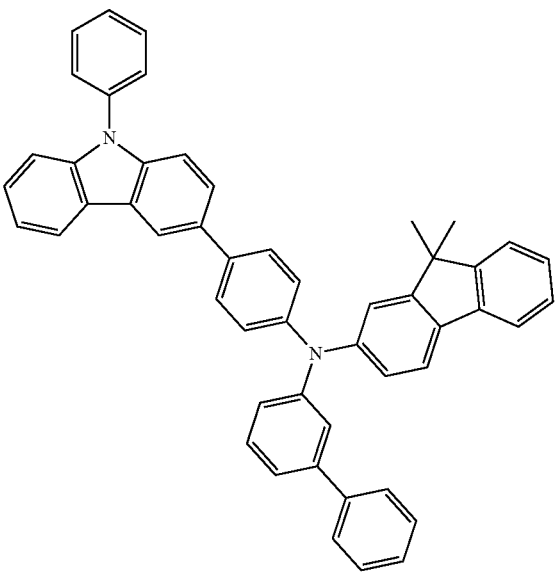

HT2

HT3
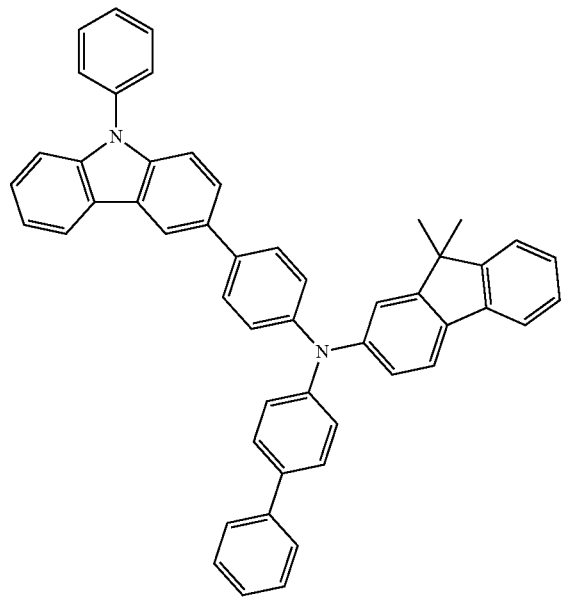
HT5
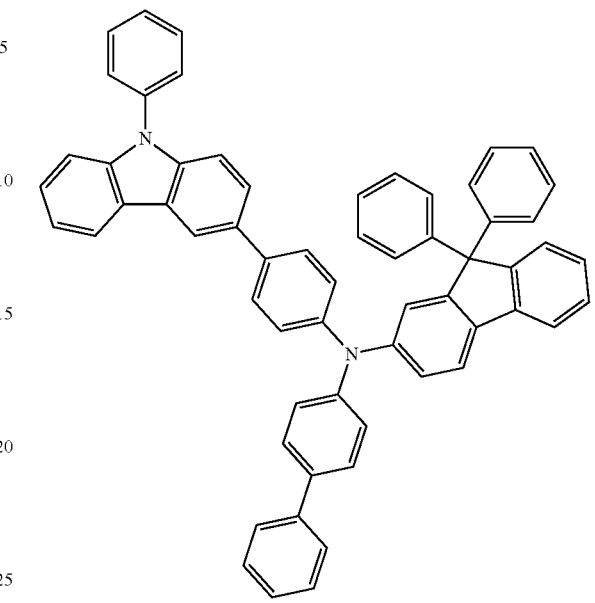
HT4
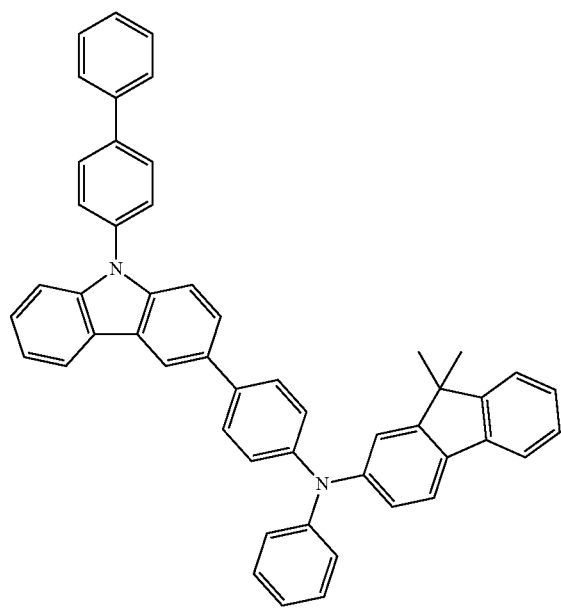
HT6
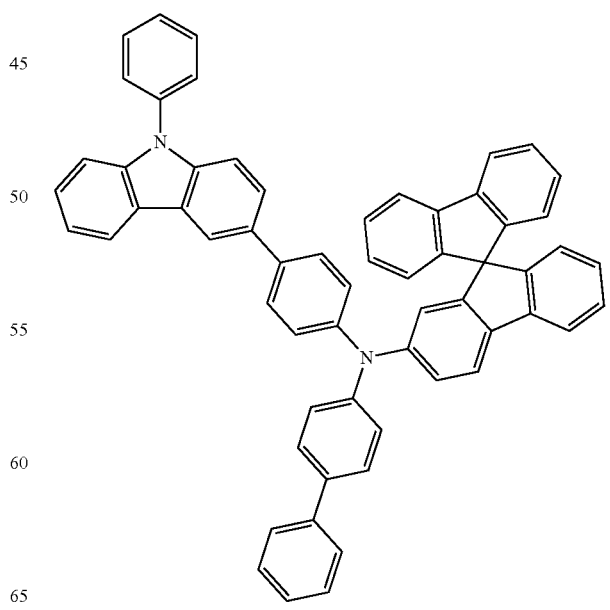

HT7
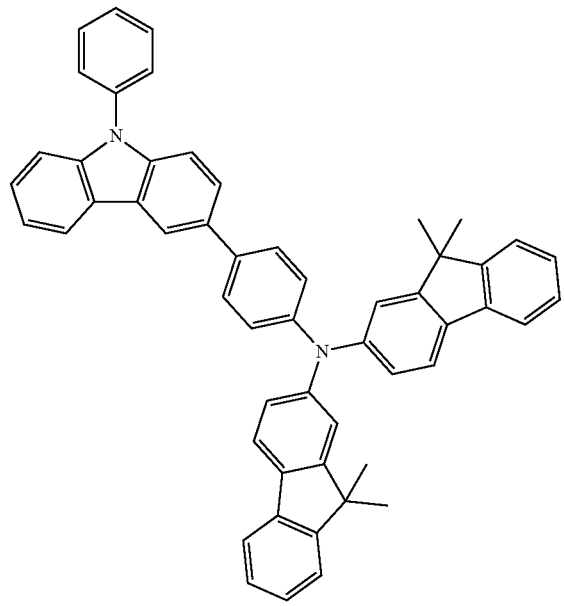
HT10
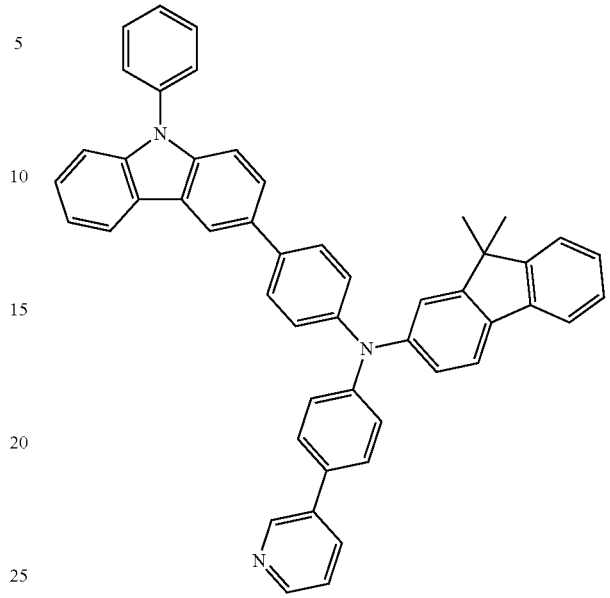
HT8
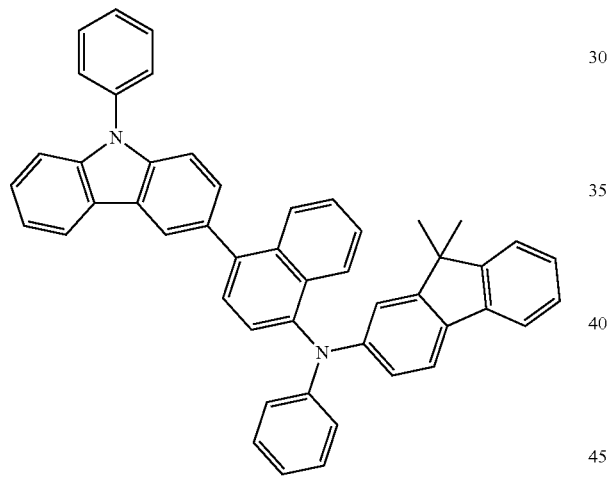
HT9
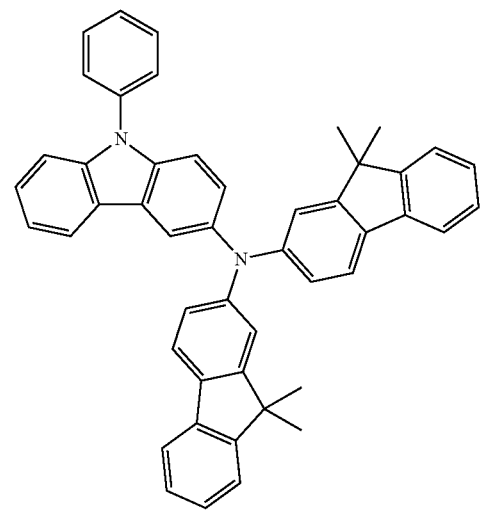
HT11
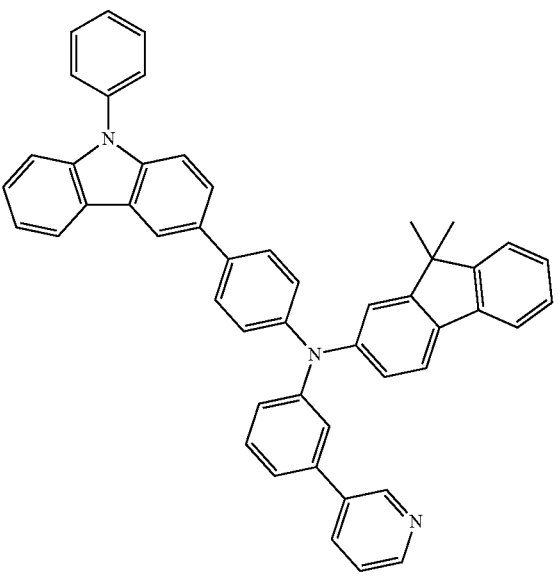

HT12
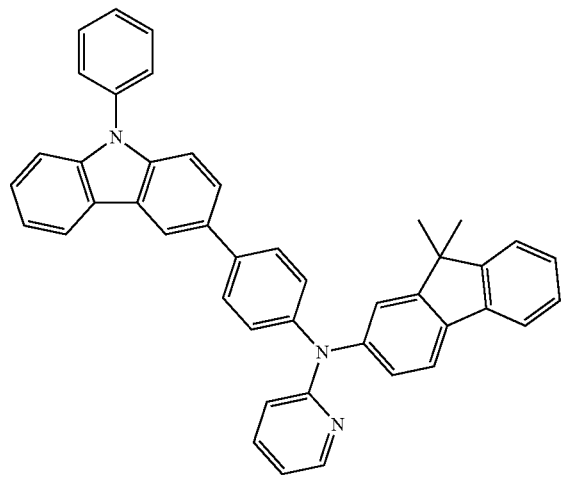
HT13
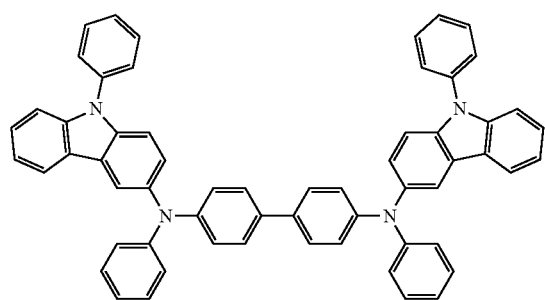
HT14
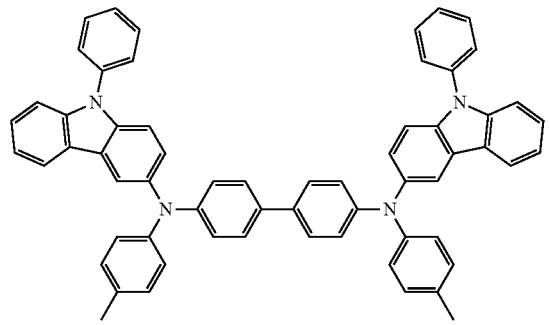
HT15
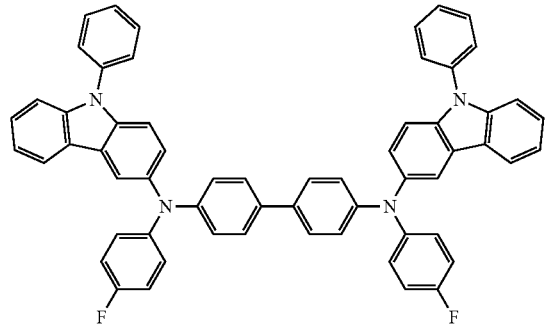
HT16
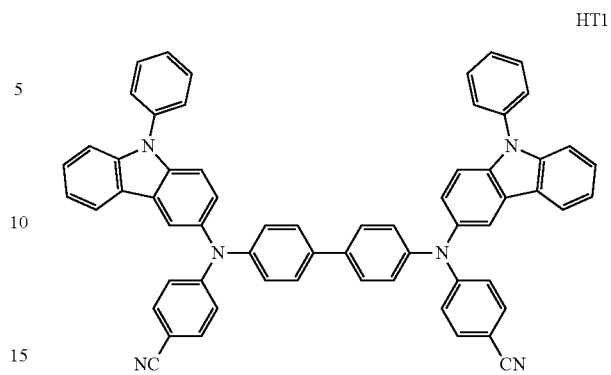
HT17
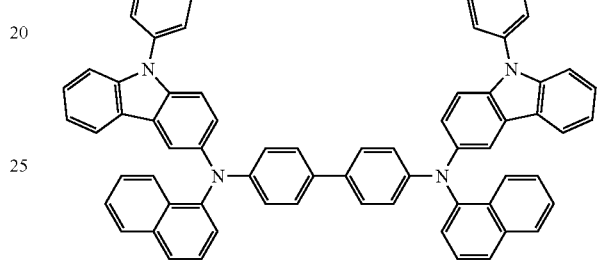
HT18
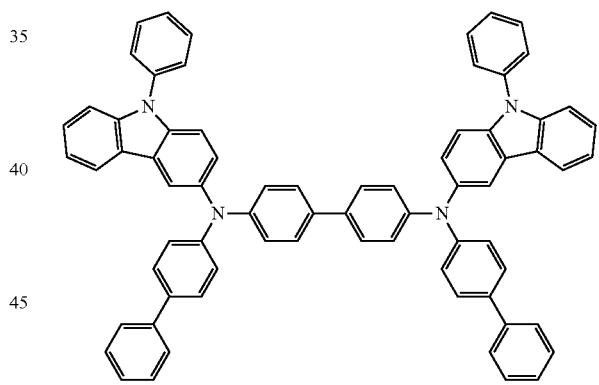
HT19
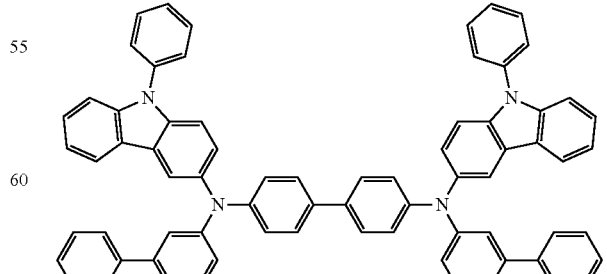

-continued

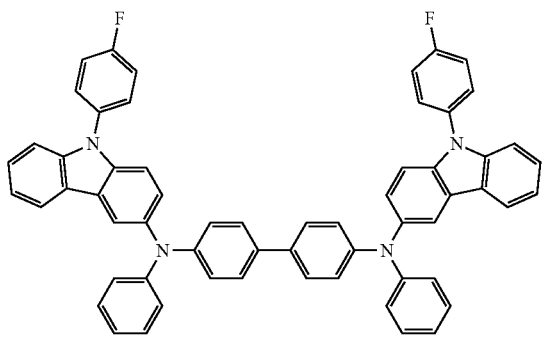
HT20

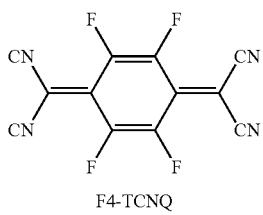
F4-TCNQ

A thickness of the hole transport region may be in a range of about 100 Å to about 10,000 Å, for example, about 100 Å to about 1,000 Å. When the hole transport region includes a hole injection layer, a hole transport layer, or a combination thereof, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, such as tetracyanoquinodimethane (TCNQ) or 2,3,5,6-tetrafluoro-7,7,8,8-tetracyano-1,4-benzoquinodimethane (F4-TCNQ); a metal oxide, such as a tungsten oxide or a molybdenum oxide; and a cyano group-containing compound, such as Compound HT-D1 below, but are not limited thereto:

The hole transport region may include a buffer layer.

Also, the buffer layer may compensate for an optical resonance distance according to a wavelength of light emitted from the emission layer, and thus, efficiency of a formed organic light-emitting device may be improved.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be a material for the hole transport region described above or a material for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, or any combination thereof:

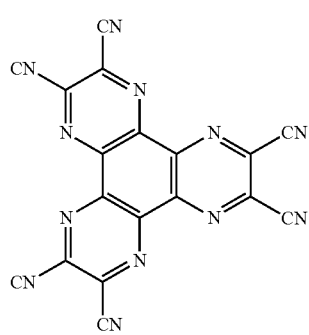
HT-D1

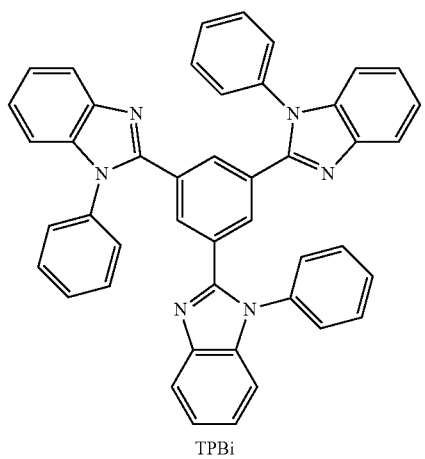
TPBi

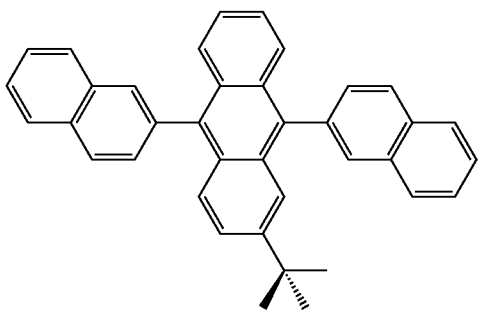
TBADN

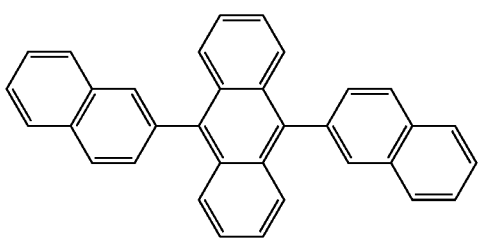
ADN

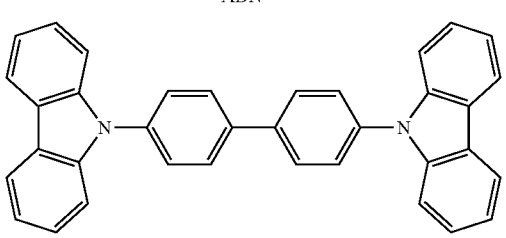
CBP

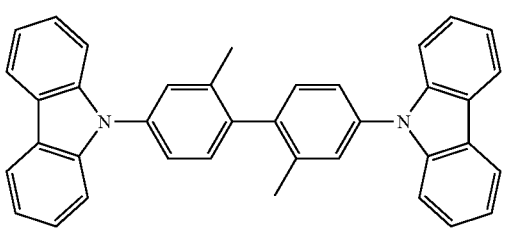
CDBP

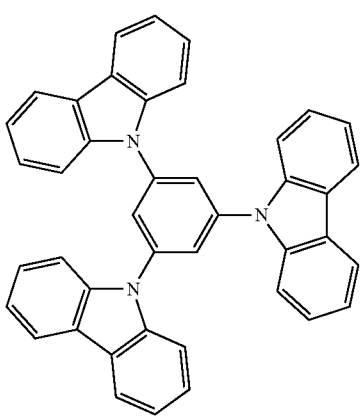
TCP

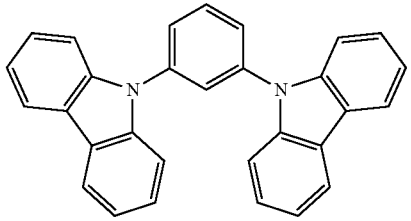
mCP

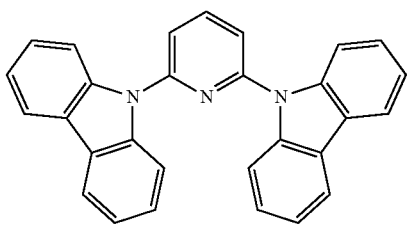
H50

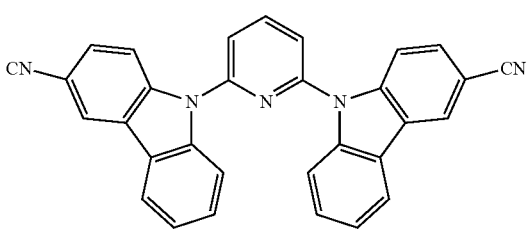
H51

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto.

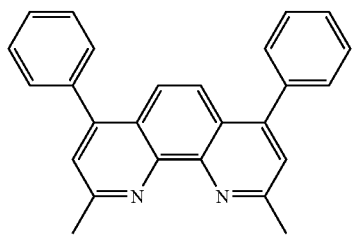

BCP

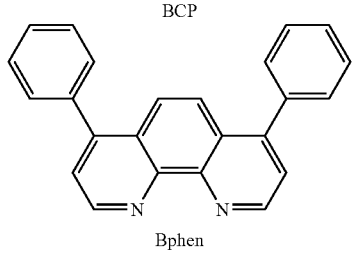

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may include BCP, Bphen, Alq$_3$, BAlq, TAZ, NTAZ, or any combination thereof:

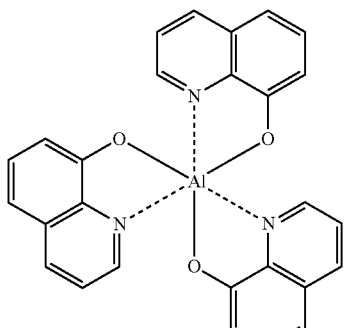

Alq$_3$

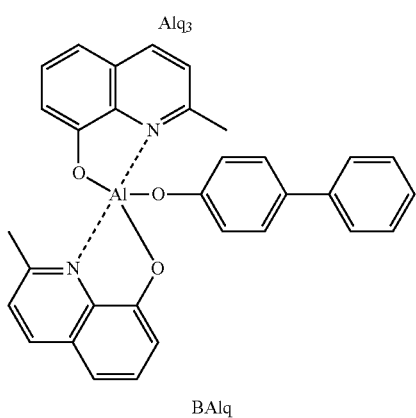

BAlq

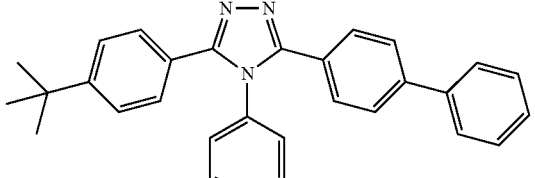

TAZ

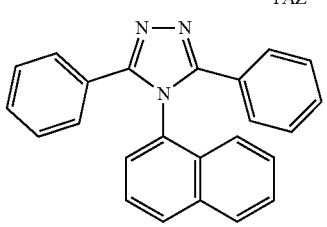

NTAZ

In one or more embodiments, the electron transport layer may include at least one of ET1 to ET25, but are not limited thereto:

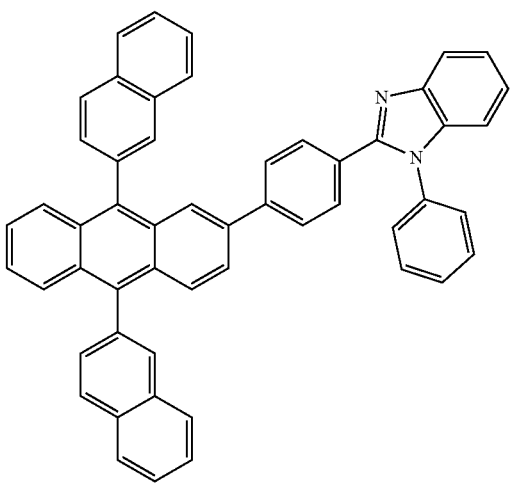

ET1

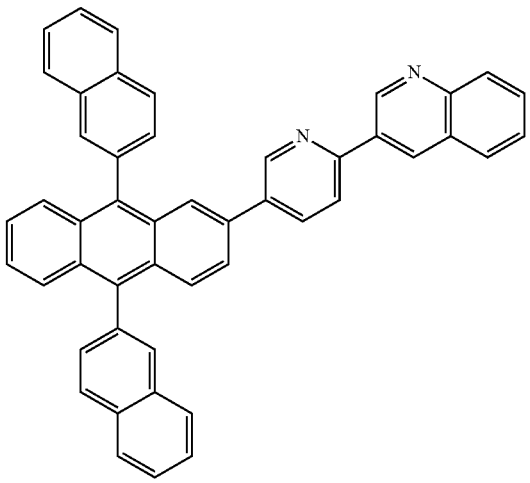

ET2

-continued
ET3
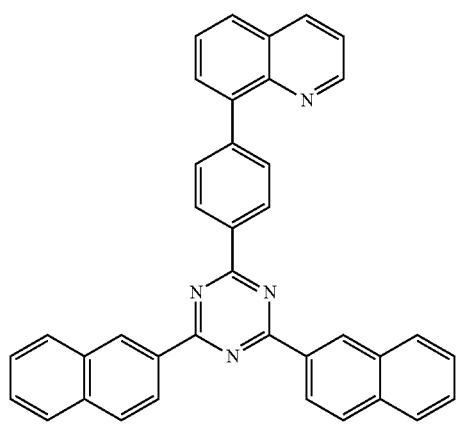
ET6
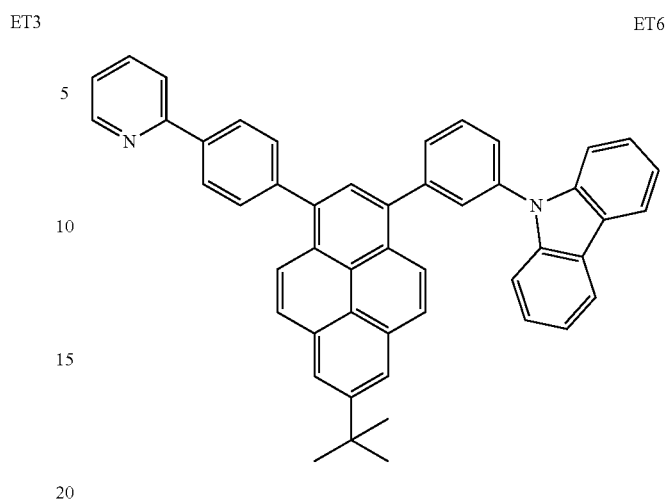
ET4
ET7
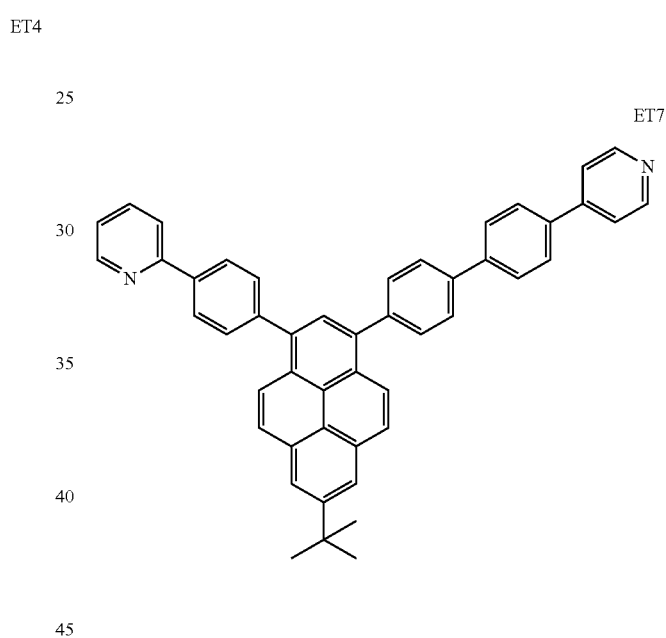
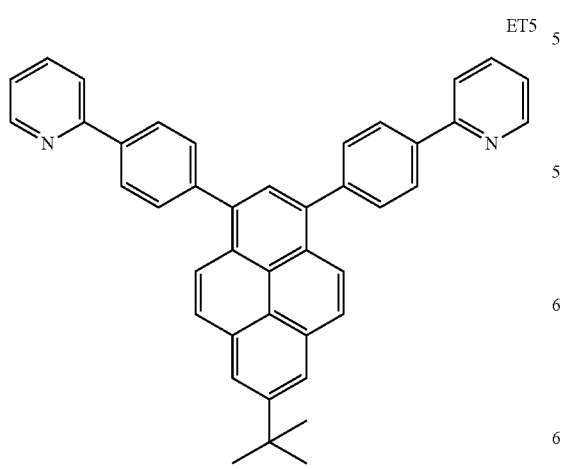
ET5
ET8
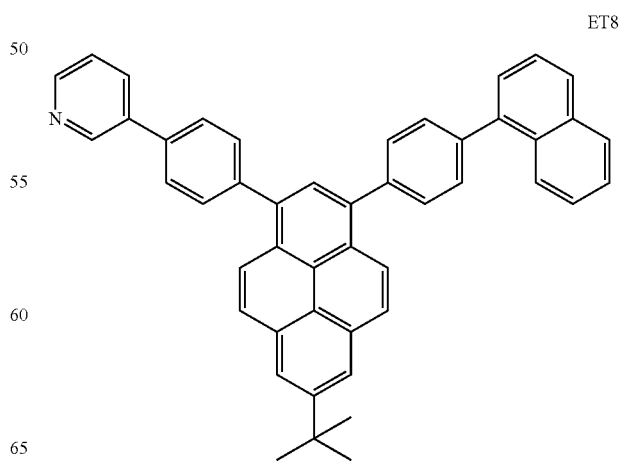

ET9
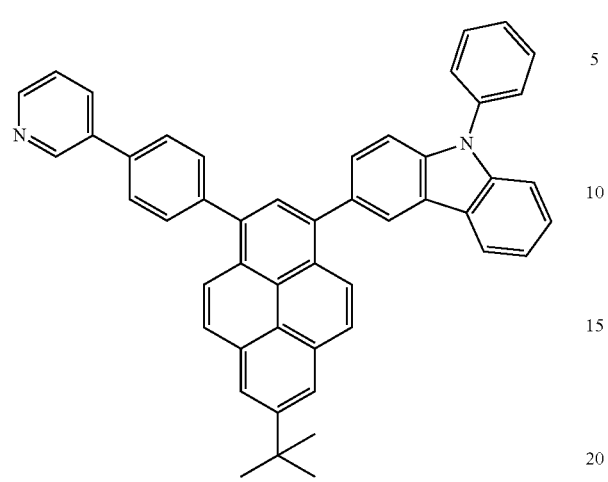
ET10
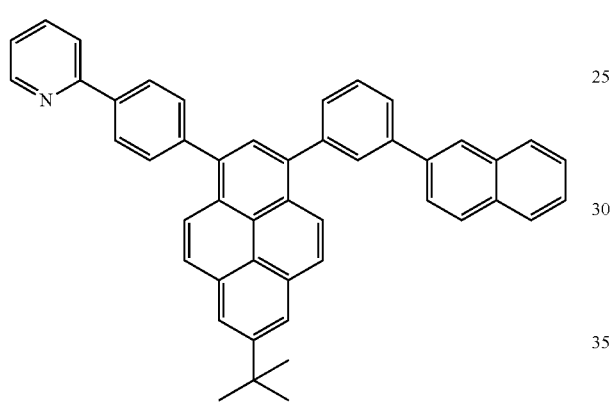
ET11
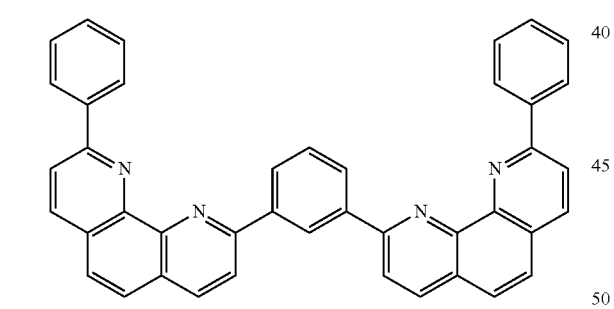
ET12
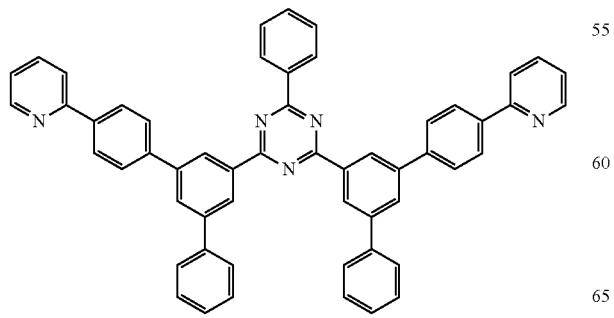
ET13
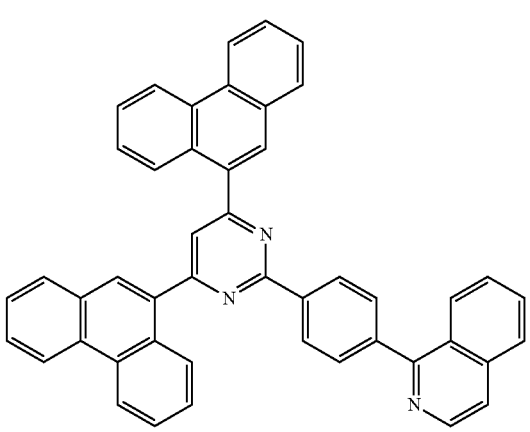
ET14
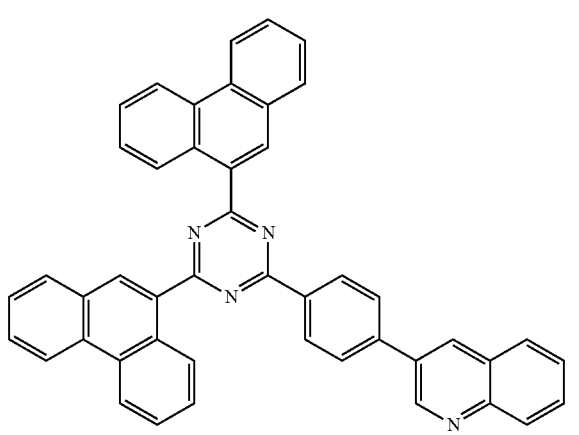
ET15
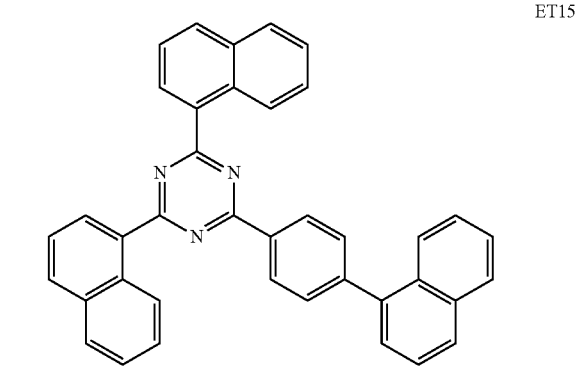

ET16
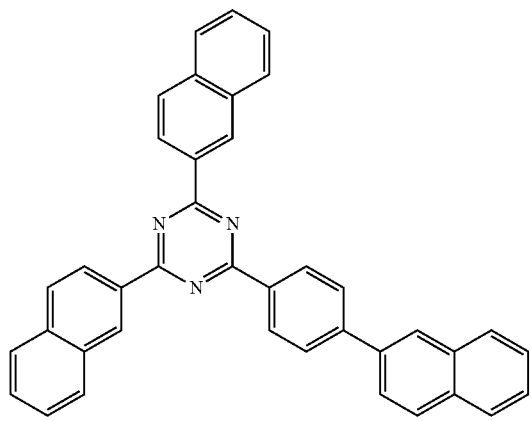
ET19
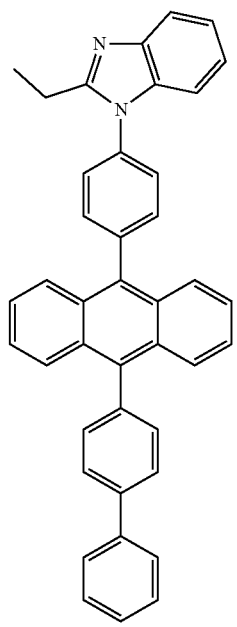
ET17
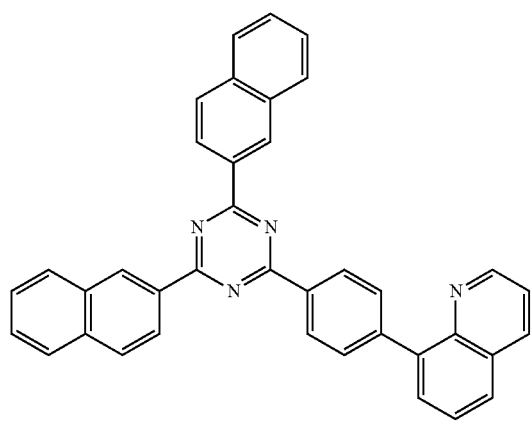
ET20
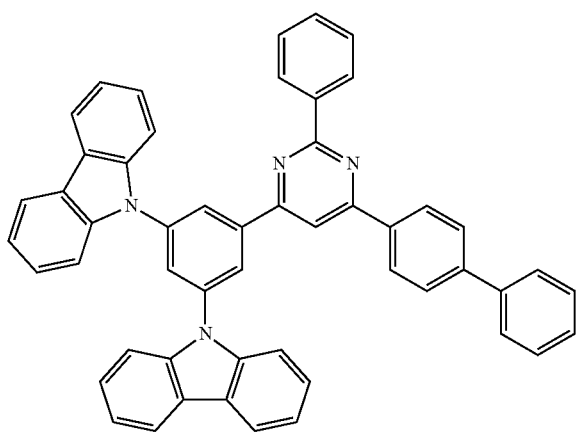
ET18
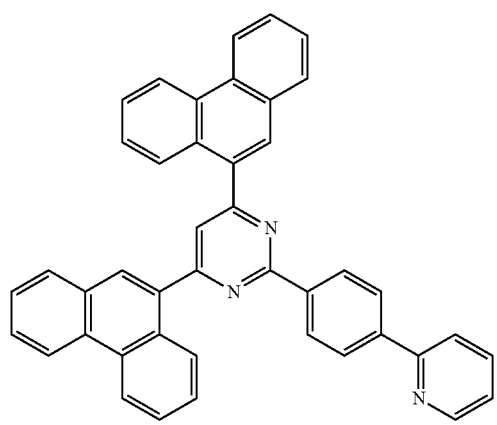
ET21
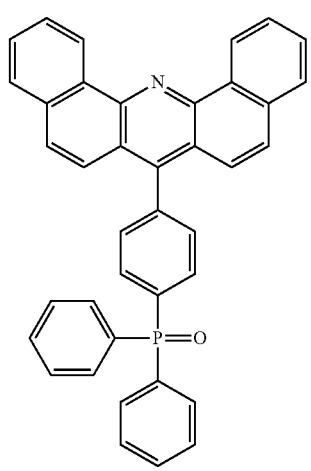

ET22

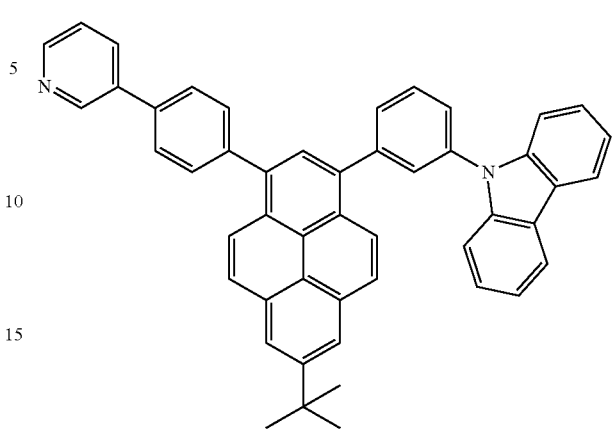

ET23

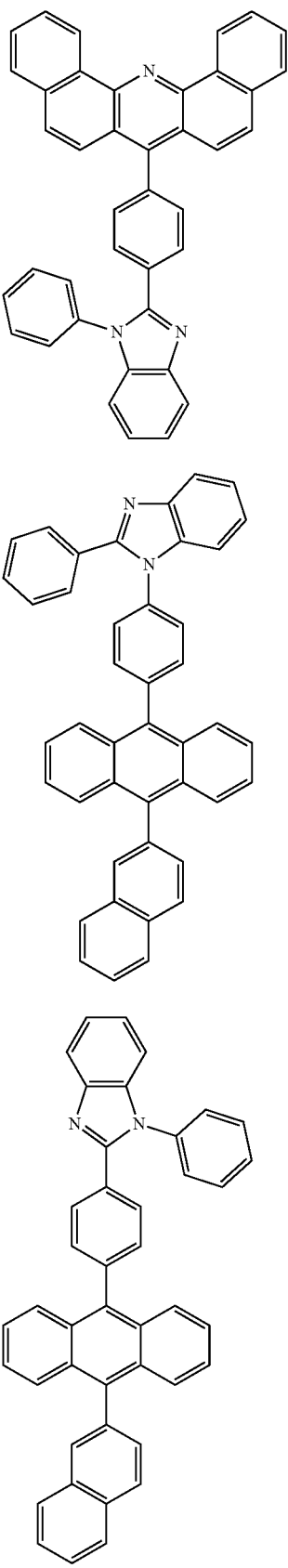

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (8-hydroxyquinoline lithium, LiQ) or ET-D2:

ET-D1

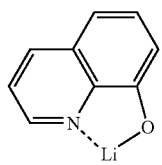

ET-D2

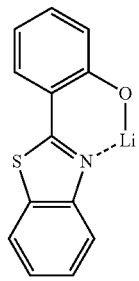

The electron transport region may include an electron injection layer that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be a metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by substituting at least one double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent saturated monocyclic group having N, O, P, Si, Se, S, or any combination thereof, as a ring-forming atom and 1 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has N, O, P, Si, Se, S, or any combination thereof as a ring-forming atom, 1 to 10 carbon atoms, and carbon-carbon double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has N, O, P, Si, Se, S, or any combination thereof as a ring-forming atom, and 1 to 60 carbon atoms. The term "$C_1$-$C_{60}$ heteroarylene group" as used herein refers to a divalent group having a carbocyclic aromatic system that has N, O, P, Si, Se, S, or any combination thereof as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, N, O, P, Si, Se, S, or any combination thereof other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_2$-$C_{30}$ heterocyclic group" as used herein refers to a saturated or unsaturated cyclic group having, as a ring-forming atom, N, O, Si, P, Se, S, or any combination thereof other than 1 to 30 carbon atoms. The $C_2$-$C_{30}$ heterocyclic group may be a monocyclic group or a polycyclic group.

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), —P(=O)(Q$_{18}$)(Q$_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(=O)(Q$_{28}$)(Q$_{29}$), or any combination thereof; or —N(Q$_{31}$)(Q$_{32}$), —Si(Q$_{33}$)(Q$_{34}$)(Q$_{35}$), —B(Q$_{36}$)(Q$_{37}$), or —P(=O)(Q$_{38}$)(Q$_{39}$).

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

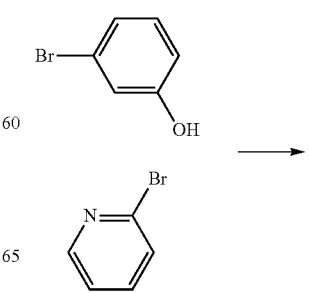

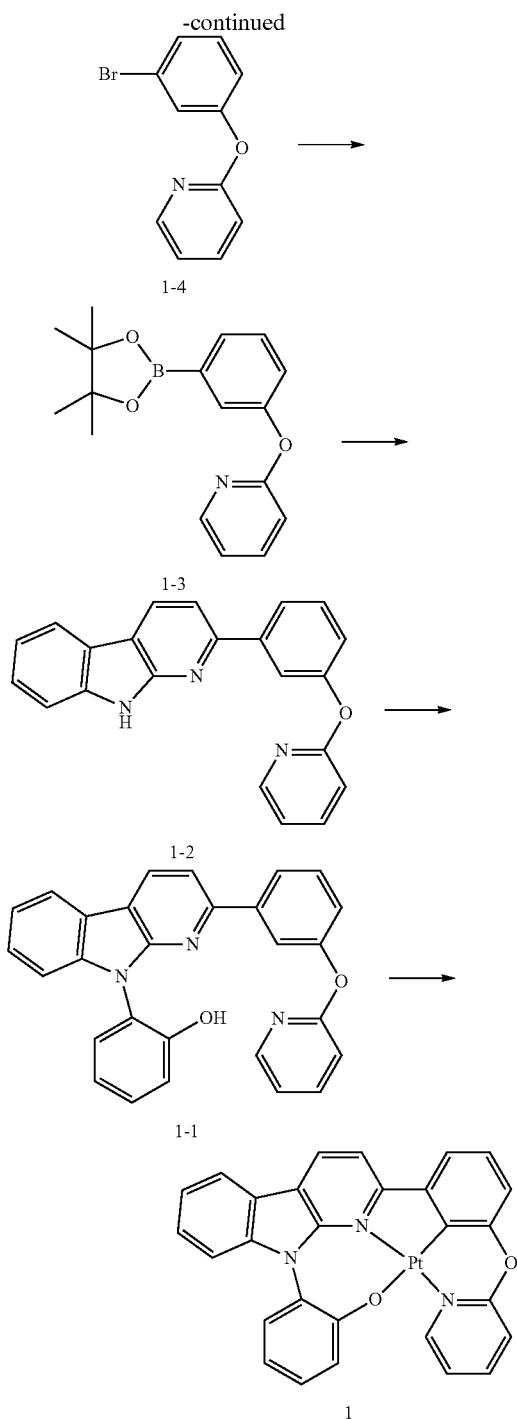

Synthesis of Intermediate 1-4

3-bromophenol (2.95 g, 17.09 mmol), 2-bromopyridine (3.00 g, 18.99 mmol), CuI (0.362 g, 1.90 mmol), $Cs_2CO_3$ (9.28 g, 28.48 mmol), and pyridine-2-carboxylic acid (0.42 g, 3.42 mmol) were mixed with 150 mL of 1,4-dioxane and stirred for 18 hours under reflux. A reactant obtained therefrom was cooled to room temperature, and a solvent was distilled off therefrom under reduced pressure. Then, an organic layer was extracted therefrom by using 200 mL of water and 200 mL of dichloromethane (DCM), dried by using $MgSO_4$, and then filtered to obtain a filtrate. Then, a residue obtained by concentrating the filtrate was purified by silica gel column chromatography to obtain Intermediate 1-4 (4.21 g, 89%). The obtained compound was identified by LC-MS.

LC-MS m/z=249.98 $(M+H)^+$.

Synthesis of Intermediate 1-3

Intermediate 1-4 (4.21 g, 16.83 mmol), bis(pinacolato) diboron (5.57 g, 21.88 mmol), potassium acetate (4.96 g, 50.50 mmol), and $PdCl_2(dppf)$ (1.232 g, 1.68 mmol) were mixed with 150 mL of toluene, and the mixture was heated to a temperature of 120° C. and stirred for 12 hours under reflux. The reaction mixture was cooled to room temperature, and an organic layer was extracted therefrom by using 200 mL of water and 200 mL of ethyl acetate. The extracted organic layer was dried by using $MgSO_4$. Then, a residue obtained by evaporating a solvent therefrom was purified by silica gel column chromatography to obtain Intermediate 1-3 (3.97 g, 79%). The obtained compound was identified by LC-MS.

LC-MS m/z=298.15 $(M+H)^+$.

Synthesis of Intermediate 1-2

Intermediate 1-3 (3.97 g, 13.04 mmol), 2-chloro-9H-pyrido[2,3-b]indole (2.40 g, 11.86 mmol), potassium carbonate (4.1 g, 29.64 mmol), barium hydroxide (0.813 g, 4.74 mmol), and $Pd(PPh_3)_4$ (0.96 g, 0.83 mmol) were mixed with 120 mL of THF and 40 mL of distilled water, and the mixture was heated to a temperature of 90° C. and stirred for 3 hours under reflux. The reaction mixture was cooled to room temperature, and an organic layer was extracted therefrom by using 200 mL of water and 200 mL of ethyl acetate. The extracted organic layer was dried by using $MgSO_4$. Then, a residue obtained by evaporating a solvent therefrom was purified by silica gel column chromatography to obtain Intermediate 1-2 (3.71 g, 93%). The obtained compound was identified by LC-MS.

LC-MS m/z=338.12 $(M+H)^+$.

Synthesis of Intermediate 1-1

Intermediate 1-2 (1.4 g, 3.39 mmol), 2-iodine phenol (0.819 g, 3.73 mmol), potassium phosphate (2.16 g, 10.16 mmol), and CuI (0.13 g, 0.68 mmol) were mixed with 50 mL of dimethylformamide (DMF), and the mixture was heated to a temperature of 150° C. and stirred for 16 hours under reflux. The reaction mixture was cooled to room temperature, and the solvent was distilled off therefrom under reduced pressure. Then, an organic layer was extracted therefrom by using 100 mL of water and 100 mL of DCM and dried by using $MgSO_4$. Then, a residue obtained by evaporating a solvent therefrom was purified by silica gel column chromatography to obtain Intermediate 1-1 (0.82 g, 47%). The obtained compound was identified by LC-MS.

LC-MS m/z=430.15 $(M+H)^+$.

Synthesis of Compound 1

Intermediate 1-1 (0.82 g, 1.62 mmol), bis(benzonitrile) dichloroplatinum (0.84 g, 1.78 mmol), and 30 mL of benzonitrile (PhCN) were mixed, heated to a temperature of 130° C., and stirred for 14 hours under reflux. After the reaction was completed, the reaction mixture was cooled to room temperature, and a residue obtained by evaporating a solvent therefrom under reduced pressure was purified by silica gel column chromatography to obtain Compound 1 (0.42 g, 37%). The obtained compound was identified by LC-MS.

LC-MS m/z=623.10 $(M+H)^+$.

153
Synthesis Example 2 (Compound 5)

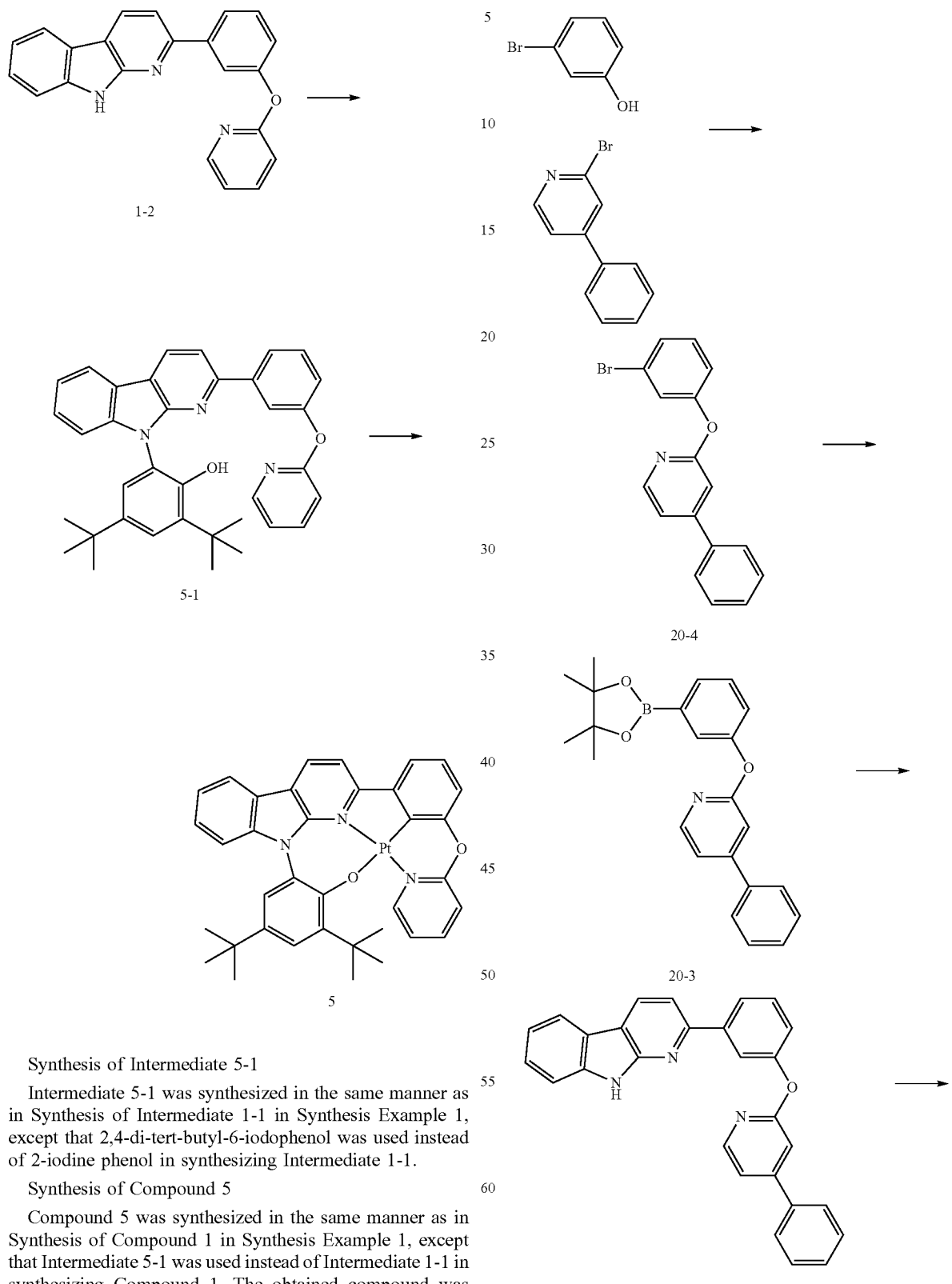

Synthesis of Intermediate 5-1

Intermediate 5-1 was synthesized in the same manner as in Synthesis of Intermediate 1-1 in Synthesis Example 1, except that 2,4-di-tert-butyl-6-iodophenol was used instead of 2-iodine phenol in synthesizing Intermediate 1-1.

Synthesis of Compound 5

Compound 5 was synthesized in the same manner as in Synthesis of Compound 1 in Synthesis Example 1, except that Intermediate 5-1 was used instead of Intermediate 1-1 in synthesizing Compound 1. The obtained compound was identified by LC-MS.

LC-MS m/z=735.22 (M+H)$^+$.

154
Synthesis Example 3 (Compound 20)

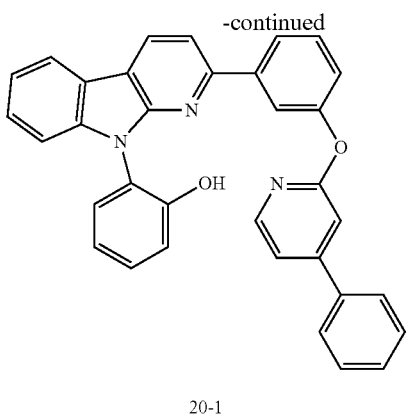

20-1

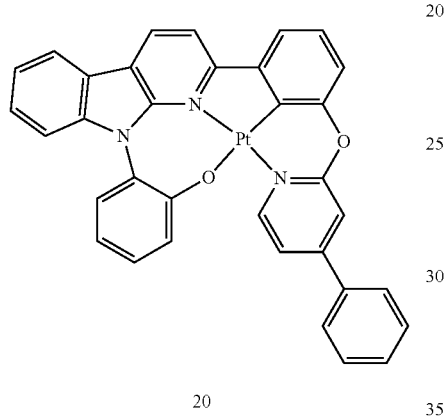

20

Synthesis of Intermediate 20-4

Intermediate 20-4 was synthesized in the same manner as in Synthesis of Intermediate 1-4 in Synthesis Example 1, except that 2-bromo-4-phenylpyridine was used instead of 2-bromopyridine in synthesizing Intermediate 1-4.

Synthesis of Intermediate 20-3

Intermediate 20-3 was synthesized in the same manner as in Synthesis of Intermediate 1-3 in Synthesis Example 1, except that Intermediate 20-4 was used instead of Intermediate 1-4 in synthesizing Intermediate 1-3.

Synthesis of Intermediate 20-2

Intermediate 20-2 was synthesized in the same manner as in Synthesis of Intermediate 1-2 in Synthesis Example 1, except that Intermediate 20-3 was used instead of Intermediate 1-3 in synthesizing Intermediate 1-2.

Synthesis of Intermediate 20-1

Intermediate 20-1 was synthesized in the same manner as in Synthesis of Intermediate 1-1 in Synthesis Example 1, except that Intermediate 20-2 was used instead of Intermediate 1-2 in synthesizing Intermediate 1-1.

Synthesis of Compound 20

Compound 20 was synthesized in the same manner as in Synthesis of Compound 1 in Synthesis Example 1, except that Intermediate 20-1 was used instead of Intermediate 1-1 in synthesizing Compound 1. The obtained compound was identified by LC-MS.

LC-MS m/z=699.13 (M+H)$^+$.

Synthesis Example 4 (Compound 28)

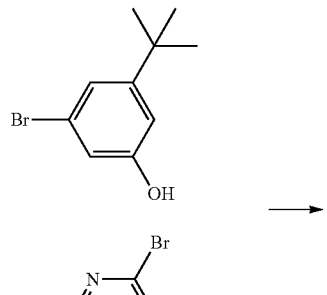

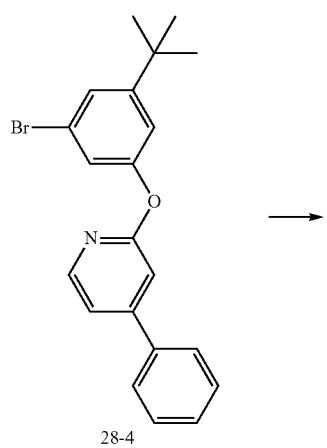

28-4

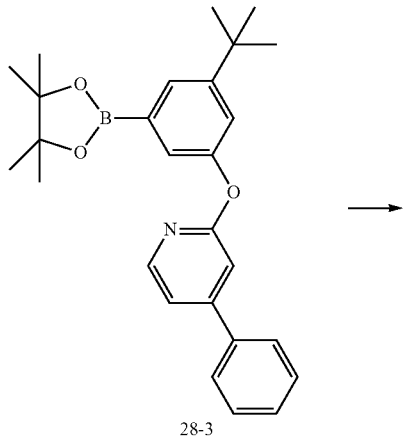

28-3

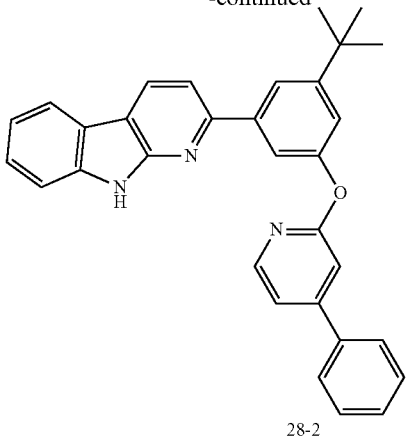

28-2

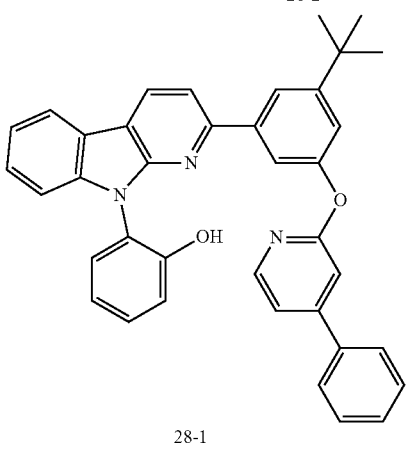

28-1

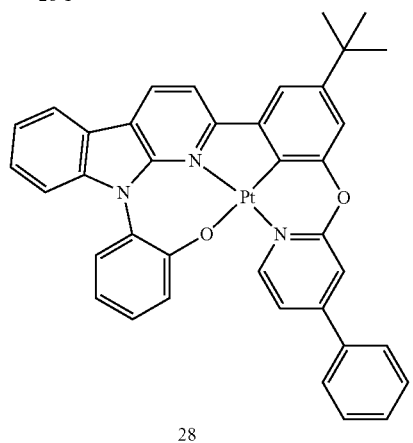

28

Synthesis of Intermediate 28-4

Intermediate 28-4 was synthesized in the same manner as in Synthesis of Intermediate 1-4 in Synthesis Example 1, except that 2-bromo-4-phenylpyridine and 3-bromo-5-(tert-butyl)phenol were respectively used instead of 2-bromopyridine and 3-bromophenol in synthesizing Intermediate 1-4.

Synthesis of Intermediate 28-3

Intermediate 28-3 was synthesized in the same manner as in Synthesis of Intermediate 1-3 in Synthesis Example 1, except that Intermediate 28-4 was used instead of Intermediate 1-4 in synthesizing Intermediate 1-3.

Synthesis of Intermediate 28-2

Intermediate 28-2 was synthesized in the same manner as in Synthesis of Intermediate 1-2 in Synthesis Example 1, except that Intermediate 28-3 was used instead of Intermediate 1-3 in synthesizing Intermediate 1-2.

Synthesis of Intermediate 28-1

Intermediate 28-1 was synthesized in the same manner as in Synthesis of Intermediate 1-1 in Synthesis Example 1, except that Intermediate 28-2 was used instead of Intermediate 1-2 in synthesizing Intermediate 1-1.

Synthesis of Compound 28

Compound 28 was synthesized in the same manner as in Synthesis of Compound 1 in Synthesis Example 1, except that Intermediate 28-1 was used instead of Intermediate 1-1 in synthesizing Compound 1. The obtained compound was identified by LC-MS.

LC-MS m/z=755.19 (M+H)$^+$.

Synthesis Example 5 (Compound 161)

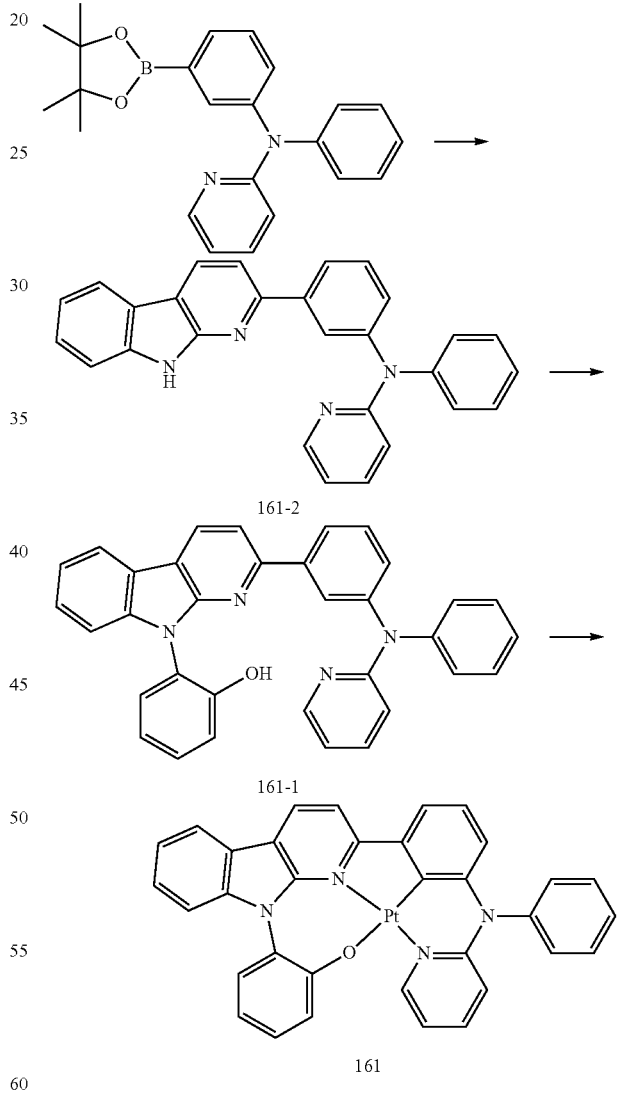

Synthesis of Intermediate 161-2

Intermediate 161-2 was synthesized in the same manner as in Synthesis of Intermediate 1-2 in Synthesis Example 1, except that N-phenyl-N-(3-(4,4,5,5-tetramethyl-1,3,2-dioxaborolan-2-yl)phenyl)pyridin-2-amine was used instead of Intermediate 1-3 in synthesizing Intermediate 1-2.

Synthesis of Intermediate 161-1

Intermediate 161-1 was synthesized in the same manner as in Synthesis of Intermediate 1-1 in Synthesis Example 1, except that Intermediate 161-2 was used instead of Intermediate 1-2 in synthesizing Intermediate 1-1.

Synthesis of Compound 161

Compound 161 was synthesized in the same manner as in Synthesis of Compound 1 in Synthesis Example 1, except that Intermediate 161-1 was used instead of Intermediate 1-1 in synthesizing Compound 1. The obtained compound was identified by LC-MS.

LC-MS m/z=698.14 (M+H)$^+$.

Synthesis Example 6 (Compound 180)

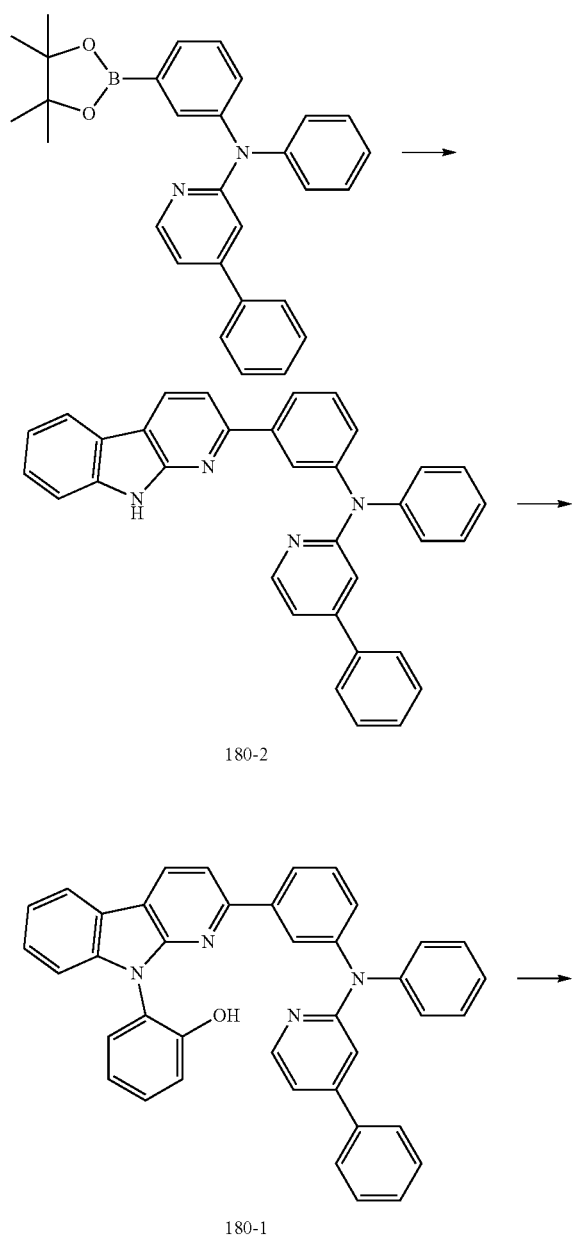

Synthesis of Intermediate 180-2

Intermediate 180-2 was synthesized in the same manner as in Synthesis of Intermediate 1-2 in Synthesis Example 1, except that N,4-diphenyl-N-(3-(4,4,5,5-tetramethyl-1,3,2-dioxaborolan-2-yl)phenyl)pyridin-2-amine was used instead of Intermediate 1-3 in synthesizing Intermediate 1-2.

Synthesis of Intermediate 180-1

Intermediate 180-1 was synthesized in the same manner as in Synthesis of Intermediate 1-1 in Synthesis Example 1, except that Intermediate 180-2 was used instead of Intermediate 1-2 in synthesizing Intermediate 1-1.

Synthesis of Compound 180

Compound 180 was synthesized in the same manner as in Synthesis of Compound 1 in Synthesis Example 1, except that Intermediate 180-1 was used instead of Intermediate 1-1 in synthesizing Compound 1. The obtained compound was identified by LC-MS.

LC-MS m/z=774.18 (M+H)$^+$.

Example 1

An anode, a glass substrate, on which ITO/Ag/ITO were deposited to thicknesses of 70 Å/1,000 Å/70 Å, was cut to a size of 50 mm×50 mm×0.5 mm, sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

Then, CBP (host) and Compound 1 (dopant) were co-deposited on the hole transport layer at a weight ratio of 90:10 to form an emission layer having a thickness of 400 Å, and BCP was deposited on the emission layer to form a hole blocking layer having a thickness of 50 Å. Then, Alq$_3$ was deposited on the hole blocking layer to form an electron transport layer having a thickness of 350 Å, LiF was deposited on the electron transport layer to form an electron injection layer having a thickness of 10 Å, and Mg and Ag were deposited on the electron injection layer at a weight ratio of 90:10 to form a cathode having a thickness of 120 Å, thereby completing the manufacture of an organic light-emitting device (which emits red light) having a structure of ITO/Ag/ITO/2-TNATA (600 Å)/NPB (1,350 Å)/CBP+Compound 1 (10 wt %) (400 Å)/BCP (50 Å)/Alq$_3$ (350 Å)/LiF (10 Å)/MgAg (120 Å).

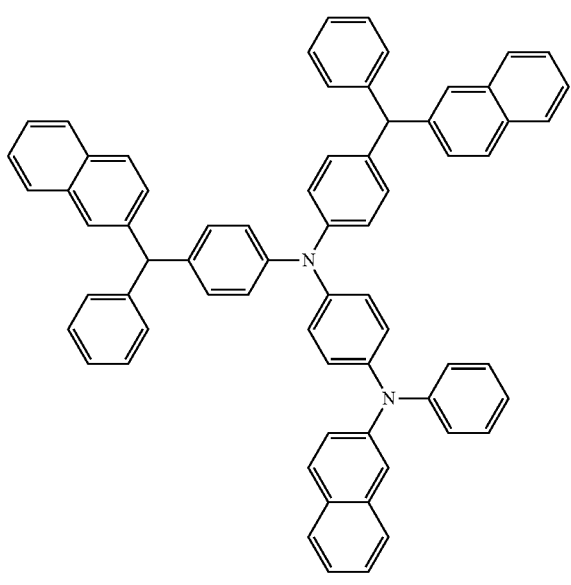

2-TNATA

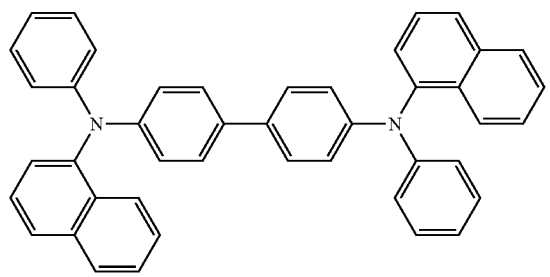

NPB

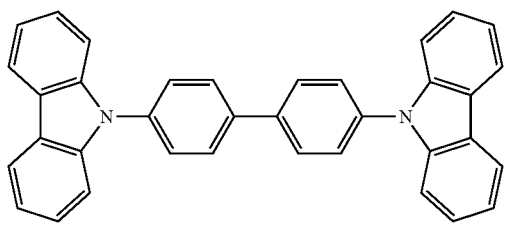

CBP

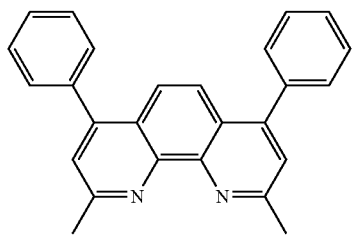

BCP

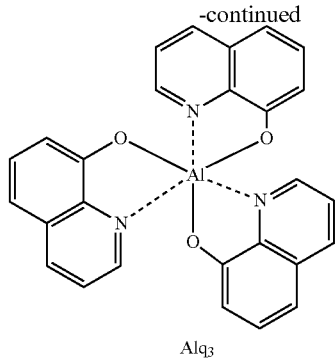

Alq3

Examples 2 to 6 and Comparative Examples A and B

Organic light-emitting devices were manufactured in the same manner as in Example 1, except that Compounds shown in Table 2 were each used instead of Compound 1 as a dopant in forming an emission layer.

Evaluation Example 1: Evaluation of Characteristics of Organic Light-Emitting Devices The driving voltage, maximum quantum luminescent efficiency, and roll-off ratio of the organic light-emitting devices manufactured according to Examples 1 to 6 and Comparative Example A and B were evaluated, and results thereof are shown in Table 2. A current-voltage meter (Keithley 2400) and a luminance meter (Minolta Cs-1000A) were used as the evaluation apparatuses, and the roll-off ratio was calculated by Equation 10. The maximum quantum luminescent efficiency and the roll-off ratio was expressed by relative values (%).

Roll off ratio={1−(Efficiency (at 3,500 nit)/Maximum luminescent efficiency)}×100%   Equation 10

TABLE 2

| | Dopant | Driving voltage (V) | Maximum quantum luminescent efficiency (%) (relative value) | Roll-off ratio (%) (relative value) |
|---|---|---|---|---|
| Example 1 | Compound 1 | 4.42 | 19.6% | 7% |
| Example 2 | Compound 5 | 4.24 | 15.3% | 4% |
| Example 3 | Compound 20 | 4.34 | 23.4% | 8% |
| Example 4 | Compound 28 | 4.27 | 23.2% | 5% |
| Example 5 | Compound 161 | 4.53 | 17.8% | 10% |
| Example 6 | Compound 180 | 4.48 | 19.2% | 11% |
| Comparative Example A | Compound A | 5.23 | 14.6% | 18% |
| Comparative Example B | Compound B | 5.51 | 8.2% | 14% |

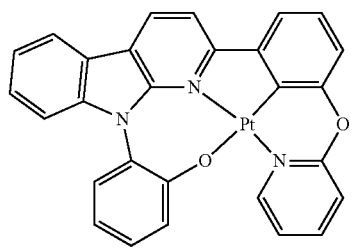

1

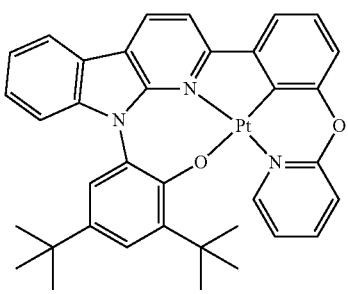

5

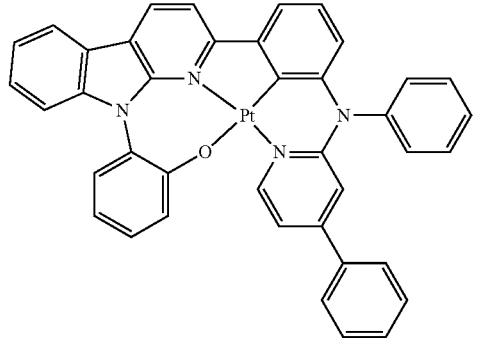

180

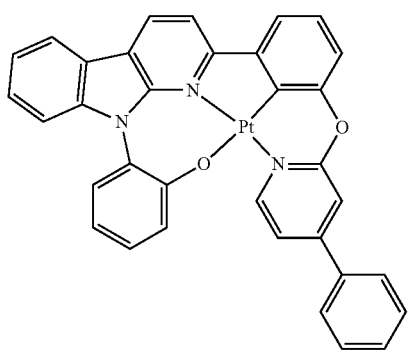

20

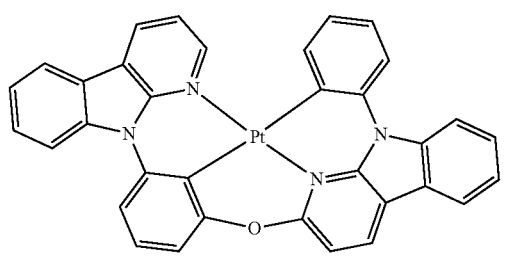

A

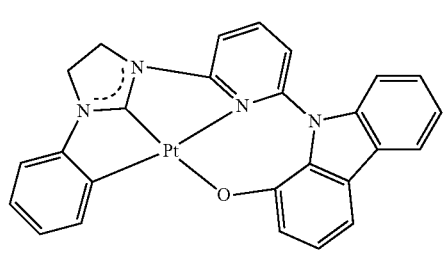

B

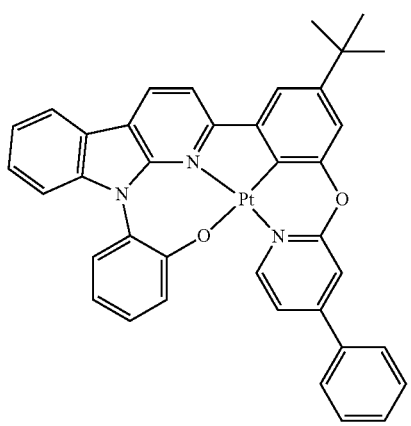

28

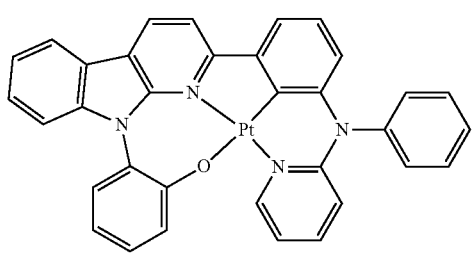

161

Table 2 shows that the organic light-emitting devices of Examples 1 to 6 have a low driving voltage, high maximum quantum luminescent efficiency, and a low roll-off ratio, as compared with those of the organic light-emitting devices of Comparative Examples A and B.

Since the organometallic compound has excellent electric characteristics and thermal stability, an organic light-emitting device including the organometallic compound may have excellent driving voltage, efficiency, power, color purity, and lifespan characteristics. In addition, since the organometallic compound has excellent phosphorescence characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

Formula 1

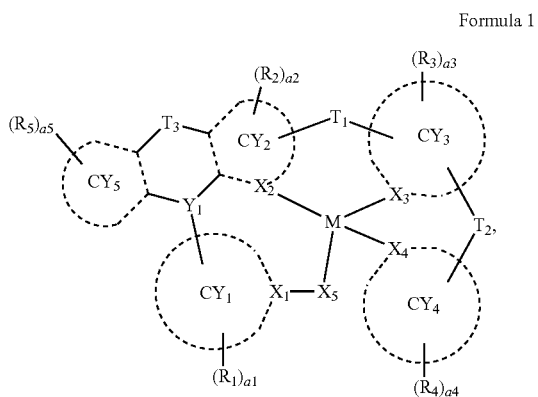

wherein, in Formula 1,

M is beryllium, magnesium, aluminum, calcium, titanium, manganese, cobalt, copper, zinc, gallium, germanium, zirconium, ruthenium, rhodium, palladium, silver, rhenium, platinum, or gold, $X_1$ to $X_4$ are each independently N or C, $Y_1$ is C, Si, Ge, B, N, or P, $X_5$ is O, S, B(R'), N(R'), P(R'), C(R')(R"), Si(R')(R"), Ge(R')(R"), C(=O), B(R')(R"), N(R')(R"), or P(R')(R"), two bonds of a bond between $X_5$ and M, a bond between $X_2$ and M, a bond between $X_3$ and M, and a bond between $X_4$ and M are each a covalent bond, and the others thereof are each a coordinate bond, ring $CY_1$ to ring $CY_5$ are each independently a $C_5$-$C_{30}$ carbocyclic group or a $C_1$-$C_{30}$ heterocyclic group, $T_1$ and $T_2$ are each independently a single bond, a double bond, *—N($R_6$)—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=*', *=C($R_6$)—*', *—C($R_6$)=C($R_7$)—*', *—C(=S)—*', or *—C≡C—*', and * and *' each indicate a binding site to a neighboring atom, wherein $T_2$ is not a single bond, $R_7$ and $R_8$ are optionally linked via a single bond, a double bond, or a first linking group to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, $T_3$ is a single bond, a double bond, *—N($R_8$)—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=*', *=C($R_8$)—*', *—C($R_8$)=C($R_9$)—*', *—C(=S)—*', or *—C≡C—*', and * and *' each indicate a binding site to a neighboring atom, $R_8$ and $R_9$ are optionally linked via a single bond, a double bond, or a second linking group to form a $C_5$-$C_{30}$ carbocyclic group that is unsubstituted or substituted with at least one $R_{10a}$, a $C_2$-$C_{30}$ heterocyclic group that is unsubstituted or substituted with a at least one $R_{10a}$, or a combination thereof, $R_1$ to $R_9$, R', and R" are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), a1 to a5 are each independently an integer from 0 to 20, two or more of a plurality of neighboring $R_1$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, two or more of a plurality of neighboring $R_2$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, two or more of a plurality of neighboring $R_3$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, two or more of a plurality of neighboring $R_4$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, two or more of a plurality of neighboring $R_5$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, two or more $R_1$ to $R_9$ are optionally linked to form a $C_5$-$C_{30}$ carbocyclic group that is unsubstituted or substituted with at least one $R_{10a}$, a $C_2$-$C_{30}$ heterocyclic group that is unsubstituted or substituted with at least one $R_{10a}$, or a combination thereof, $R_{10a}$ is the same as defined in connection with $R_1$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, or a C$_1$-C$_{60}$ alkoxy group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), —P(=O)(Q$_{18}$)(Q$_{19}$), or any combination thereof;

a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group;

a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(=O)(Q$_{28}$)(Q$_{29}$), or any combination thereof; or —N(Q$_{31}$)(Q$_{32}$), —Si(Q$_{33}$)(Q$_{34}$)(Q$_{35}$), —B(Q$_{36}$)(Q$_{37}$), or —P(=O)(Q$_{38}$)(Q$_{39}$), and Q$_1$ to Q$_9$, Q$_{11}$ to Q$_{19}$, Q$_{21}$ to Q$_{29}$, and Q$_{31}$ to Q$_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_1$-C$_{60}$ alkyl group substituted with deuterium, a C$_1$-C$_{60}$ alkyl group, a C$_6$-C$_{60}$ aryl group, or any combination thereof, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_2$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryl group substituted with deuterium, a C$_1$-C$_{60}$ alkyl group, a C$_6$-C$_{60}$ aryl group, or any combination thereof, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropoly cyclic group.

2. The organometallic compound of claim 1, wherein M is Pd, Pt, or Au.

3. The organometallic compound of claim 1, wherein
X$_1$ and X$_3$ are each independently C,
X$_2$ and X$_4$ are each independently N, and
Y$_1$ is B, N, or P.

4. The organometallic compound of claim 1, wherein X$_5$ is O or S.

5. The organometallic compound of claim 1, wherein
a bond between X$_5$ and M and a bond between X$_3$ and M are each a covalent bond, and
a bond between X$_2$ and M and a bond between X$_4$ and M are each a coordinate bond.

6. The organometallic compound of claim 1, wherein ring CY$_1$ to ring CY$_5$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an indazole group, a benzofluorene group, a benzocarbazole group, a naphthobenzofuran group, a naphthobenzothiophene group, or a naphthobenzosilole group.

7. The organometallic compound of claim 1, wherein
T$_1$ is a single bond, and
T$_2$ is *—N(R$_7$)—*', *—B(R$_7$)—*', *—P(R$_7$)—*', *—C(R$_7$)(R$_8$)—*', *—Si(R$_7$)(R$_8$)—*', *—Ge(R$_7$)(R$_8$)—*', *—S—*', or *—O—*'.

8. The organometallic compound of claim 1, wherein T$_3$ is a single bond.

9. The organometallic compound of claim 1, wherein R$_1$ to R$_9$, R', and R" are each independently:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a C$_1$-C$_{20}$ alkyl group, or a C$_1$-C$_{20}$ alkoxy group;

a C$_1$-C$_{20}$ alkyl group or a C$_1$-C$_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, or a naphthoxy group;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a phenoxy group, or a naphthoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —Si(Q$_{33}$)(Q$_{34}$)(Q$_{35}$), or any combination thereof; or —N(Q$_1$)(Q$_2$), —Si(Q$_3$)(Q$_4$)(Q$_5$), —B(Q$_6$)(Q$_7$), or —P(=O)(Q$_8$)(Q$_9$), and Q$_1$ to Q$_9$ and Q$_{33}$ to Q$_{35}$ are each independently:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with deuterium, a C$_1$-C$_{10}$ alkyl group, a phenyl group, or any combination thereof.

10. The organometallic compound of claim 1, wherein a group represented by

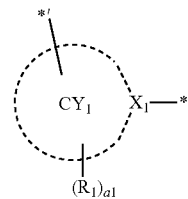

in Formula 1 is a group represented by one of Formulae CY1-1 to CY1-34:
CY1-1
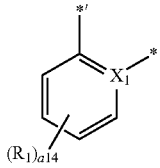
CY1-2
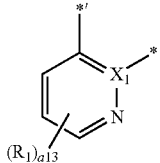
CY1-3
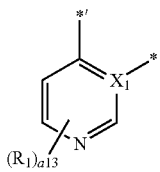
CY1-4
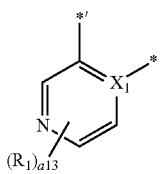
CY1-5
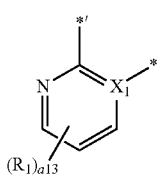
CY1-6
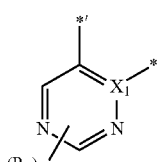
CY1-7
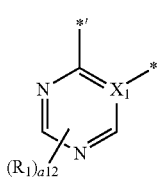
CY1-8
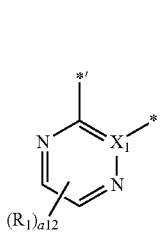
-continued
CY1-9
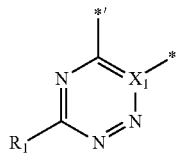
CY1-10
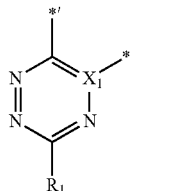
CY1-11
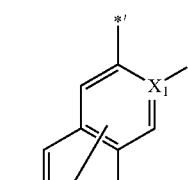
CY1-12
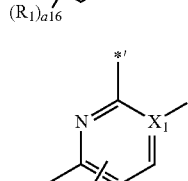
CY1-13
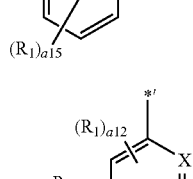
CY1-14
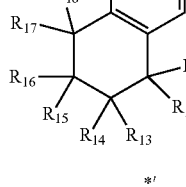
CY1-15
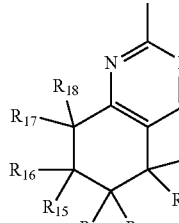
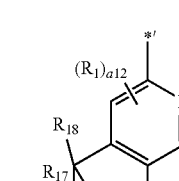
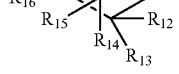

-continued
CY1-16
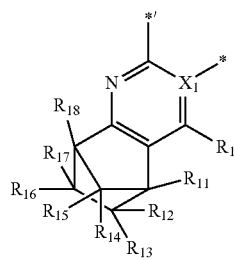
CY1-17
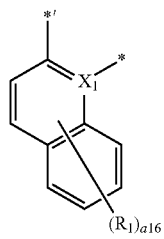
CY1-18
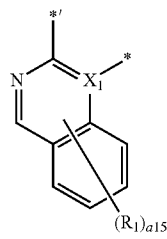
CY1-19
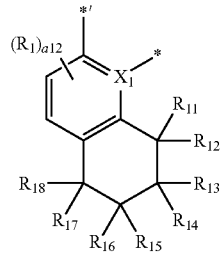
CY1-20
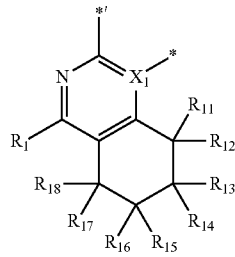
CY1-21
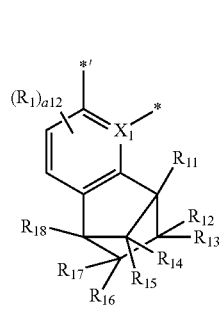
-continued
CY1-22
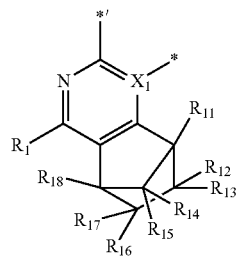
CY1-23
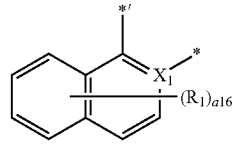
CY1-24
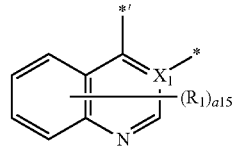
CY1-25
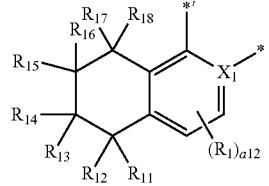
CY1-26
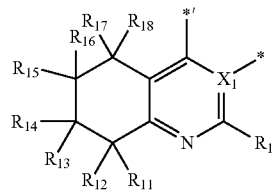
CY1-27
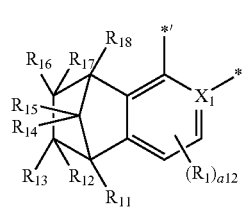
CY1-28
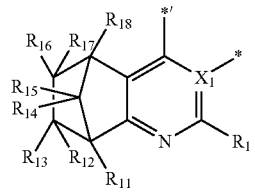

CY1-29 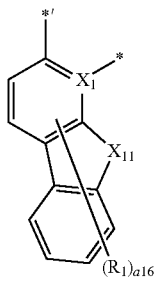

CY1-30 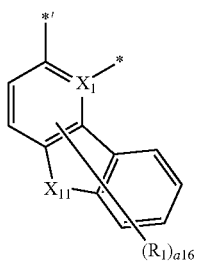

CY1-31 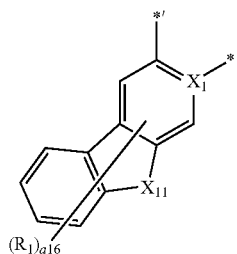

CY1-32 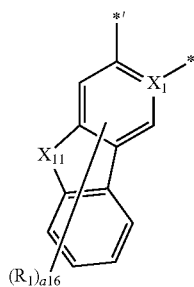

CY1-33 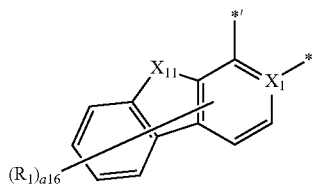

CY1-34 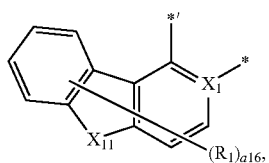

wherein, in Formulae CY1-1 to CY1-34,
$X_1$ and $R_1$ are each independently the same as described in claim 1,
$X_{11}$ is O, S, $N(R_{11})$, $C(R_{11})(R_{12})$, or $Si(R_{11})(R_{12})$,
$R_{11}$ to $R_{18}$ are each independently the same as defined in connection with $R_1$ in claim 1,
a16 is an integer from 0 to 6,
a15 is an integer from 0 to 5,
a14 is an integer from 0 to 4,
a13 is an integer from 0 to 3,
a12 is an integer from 0 to 2,
* indicates a binding site to $X_5$ in Formula 1, and
*' indicates a binding site to $Y_1$ in Formula 1.

11. The organometallic compound of claim 1, wherein a group represented by

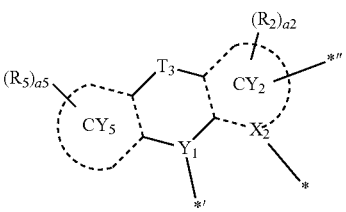

in Formula 1 is a group represented by one of Formulae CY2-1 to CY2-7:

CY2-1 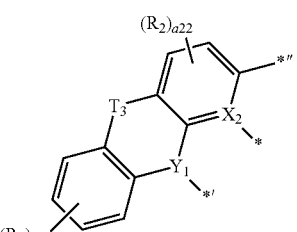

CY2-2 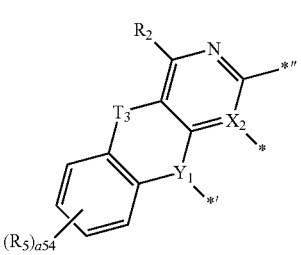

CY2-3 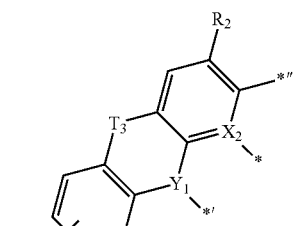

CY2-4 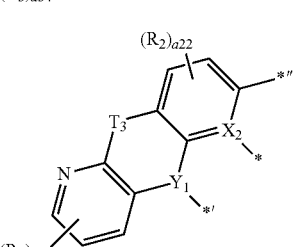

-continued

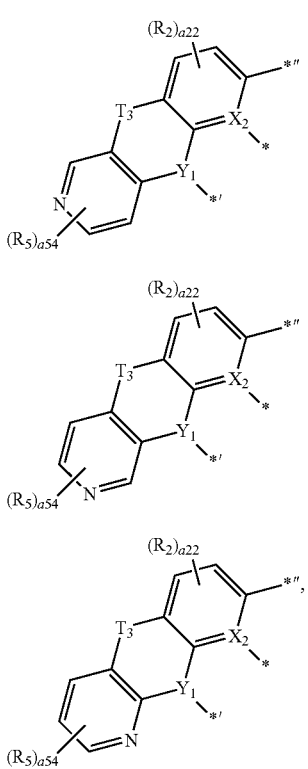

CY2-5

CY2-6

CY2-7 wherein, in Formulae CY2-1 to CY2-7,
$X_2$, $Y_1$, $T_3$, $R_2$, and $R_5$ are each independently the same as described in claim 1,
a22 is an integer from 0 to 2,
a54 is an integer from 0 to 4,
a53 is an integer from 0 to 3,
*indicates a binding site to M in Formula 1,
*' indicates a binding site to ring $CY_1$ in Formula 1, and
*'' indicates a binding site to $T_1$ in Formula 1.

12. The organometallic compound of claim 1, wherein a group represented by

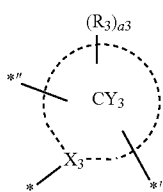

in Formula 1 is a group represented by one of Formulae CY3-1 to CY3-26:

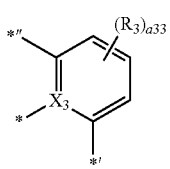
CY3-1

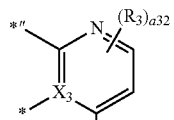
CY3-2

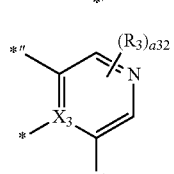
CY3-3

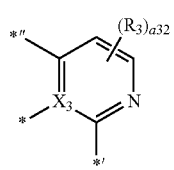
CY3-4

CY3-5

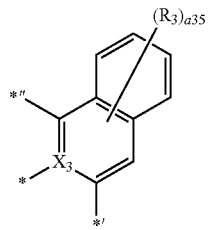
CY3-6

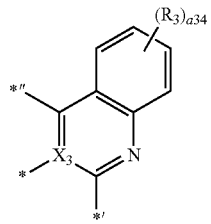
CY3-7

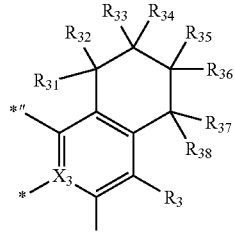
CY3-8

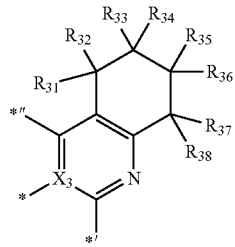
CY3-9

-continued

CY3-10
CY3-11
CY3-12
CY3-13
CY3-14
CY3-15
CY3-16
CY3-17

-continued

CY3-18
CY3-19
CY3-21
CY3-22
CY3-23
CY3-24
CY3-25

-continued

CY3-26
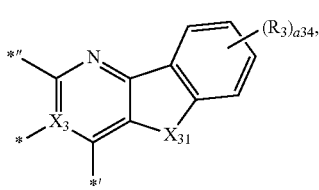

wherein, in Formulae CY3-1 to CY3-26, $X_3$ and $R_3$ are each independently the same as described in claim 1, $X_{31}$ is O, S, $N(R_{31})$, $C(R_{31})(R_{32})$, or $Si(R_{31})(R_{32})$, $R_{31}$ to $R_{38}$ are each independently the same as defined in connection with $R_3$ in claim 1, a35 is an integer from 0 to 5, a34 is an integer from 0 to 4, a33 is an integer from 0 to 3, a32 is an integer from 0 to 2,

*″ indicates a binding site to $T_1$ in Formula 1,

* indicates a binding site to M in Formula 1, and

*′ indicates a binding site to $T_2$ in Formula 1.

13. The organometallic compound of claim 1, wherein a group represented by

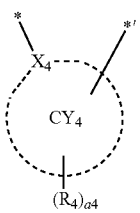

in Formula 1 is a group represented by one of Formulae CY4-1 to CY4-34:

CY4-1
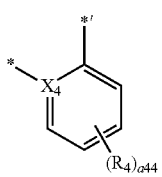

CY4-2
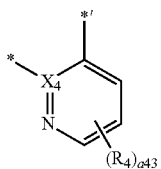

CY4-3
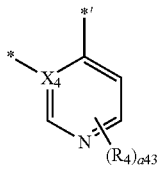

CY4-4
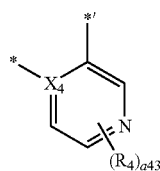

CY4-5
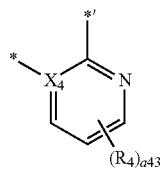

CY4-6
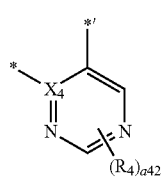

CY4-7
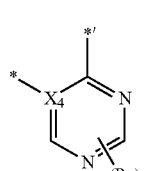

CY4-8
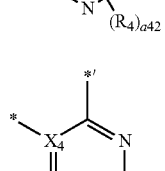

CY4-9
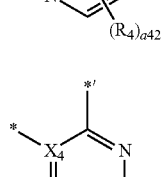

CY4-10
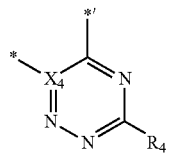

CY4-11
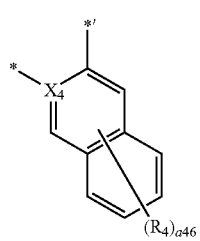

-continued
CY4-12
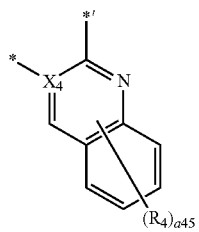
CY4-13
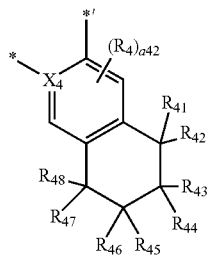
CY4-14
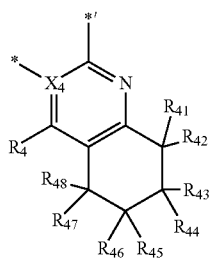
CY4-15
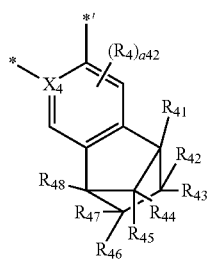
CY4-16
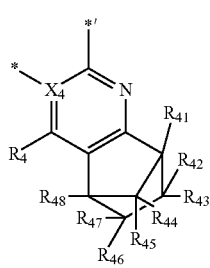
CY4-17
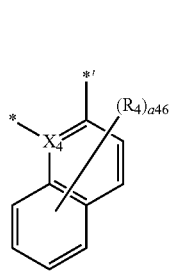
-continued
CY4-18
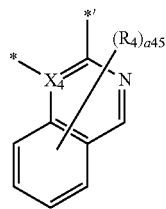
CY4-19
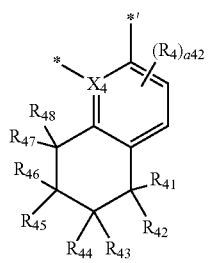
CY4-20
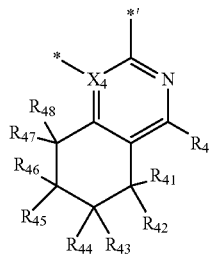
CY4-21
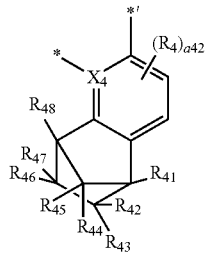
CY4-22
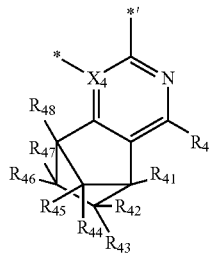
CY4-23
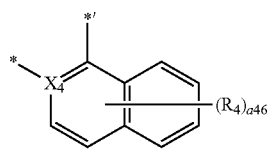
CY4-24
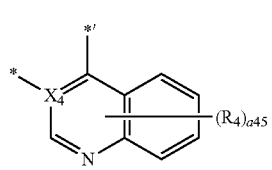

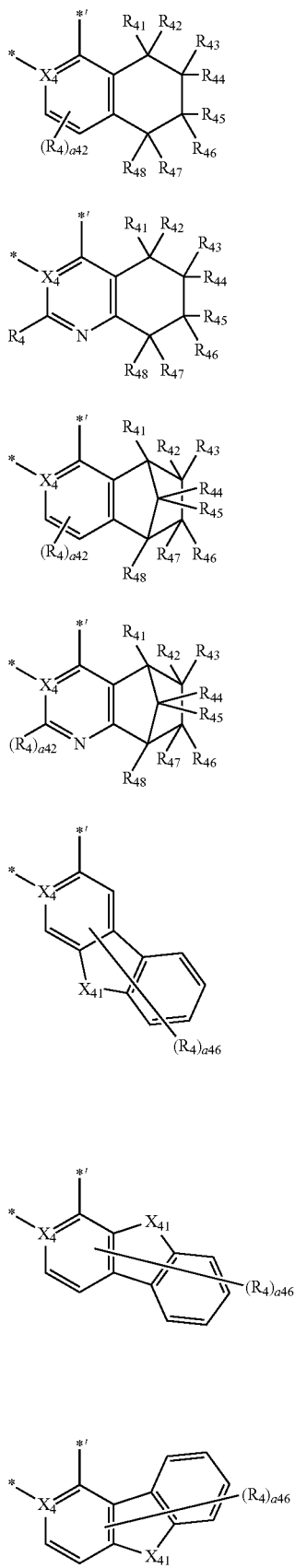

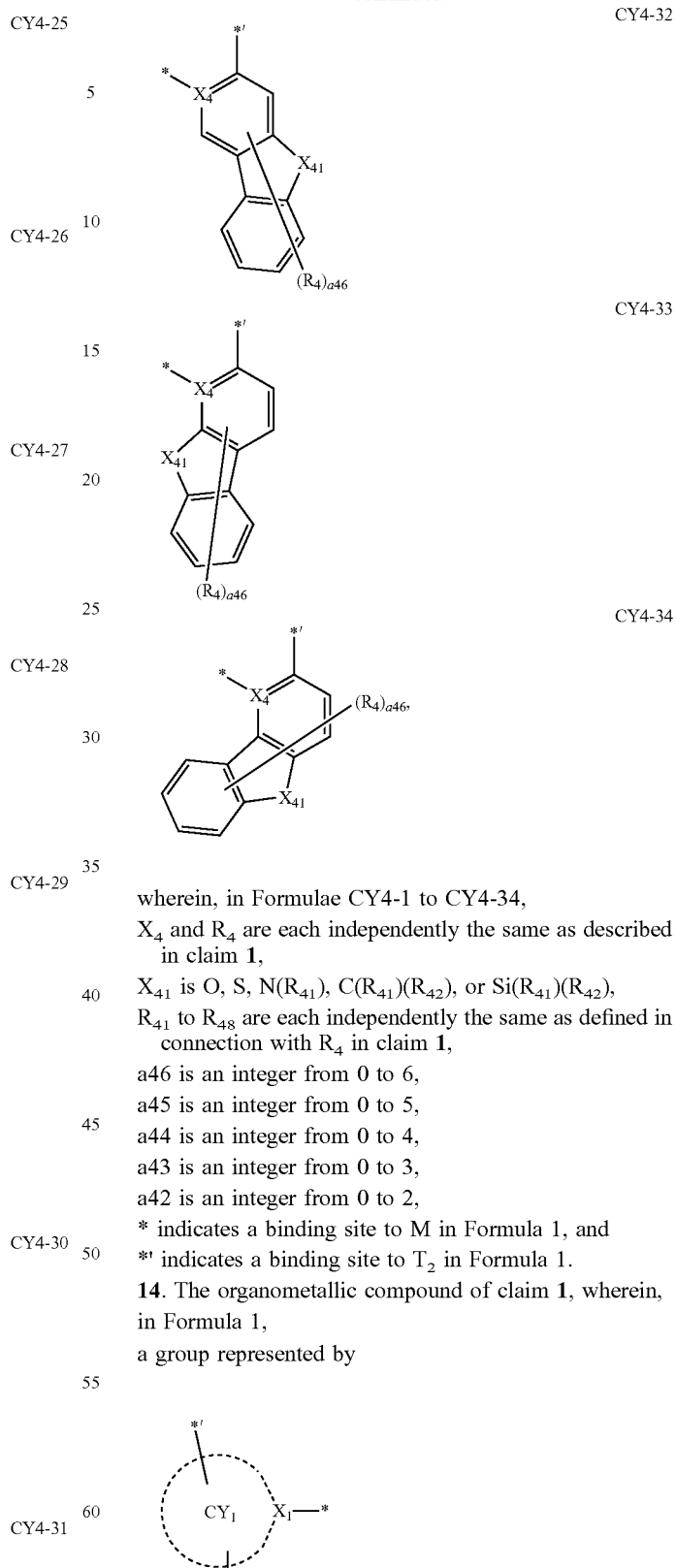

wherein, in Formulae CY4-1 to CY4-34, $X_4$ and $R_4$ are each independently the same as described in claim 1, $X_{41}$ is O, S, $N(R_{41})$, $C(R_{41})(R_{42})$, or $Si(R_{41})(R_{42})$, $R_{41}$ to $R_{48}$ are each independently the same as defined in connection with $R_4$ in claim 1, a46 is an integer from 0 to 6, a45 is an integer from 0 to 5, a44 is an integer from 0 to 4, a43 is an integer from 0 to 3, a42 is an integer from 0 to 2, \* indicates a binding site to M in Formula 1, and \*' indicates a binding site to $T_2$ in Formula 1.

14. The organometallic compound of claim 1, wherein, in Formula 1, a group represented by

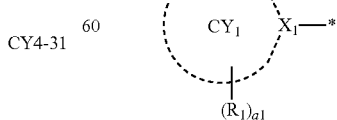

is a group represented by one of Formulae CY1(1) to CY1(31), a group represented by
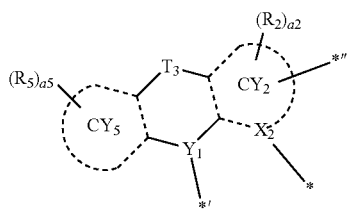
is a group represented by one of Formulae CY2(1) to CY2(8),
a group represented by
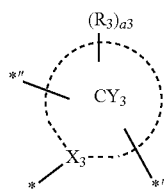
is a group represented by one of Formulae CY3(1) to CY3(18), and
a group represented by
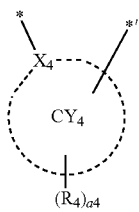
is a group represented by one of Formulae CY4(1) to CY4(76):
CY1(1)
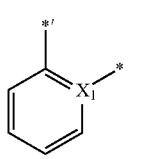
CY1(2)
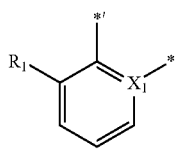
CY1(3)
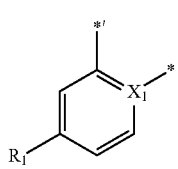
CY1(4)
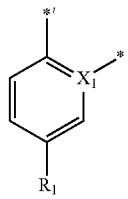
CY1(5)
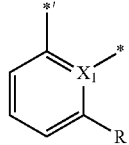
CY1(6)
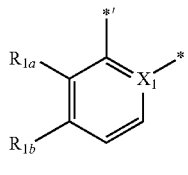
CY1(7)
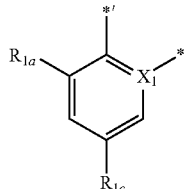
CY1(8)
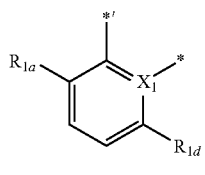
CY1(9)
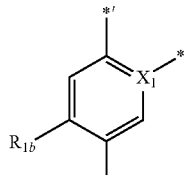
CY1(10)
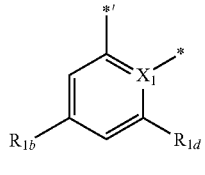
CY1(11)
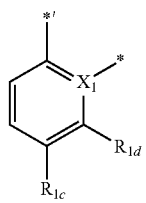

-continued
CY1(12) 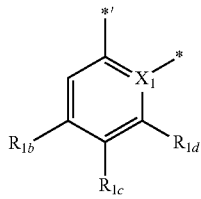
CY1(13) 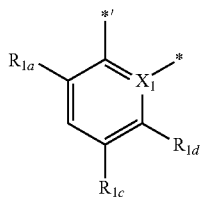
CY1(14) 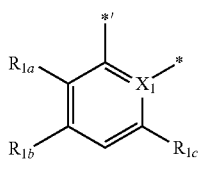
CY1(15) 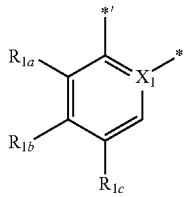
CY1(16) 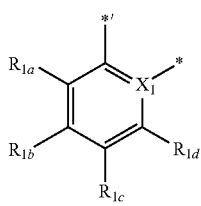
CY1(17) 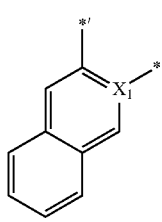
CY1(18) 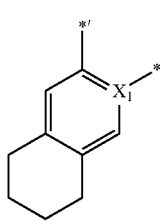
-continued
CY1(19) 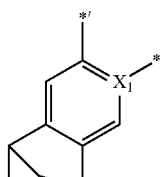
CY1(20) 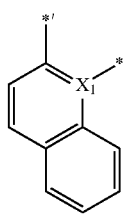
CY1(21) 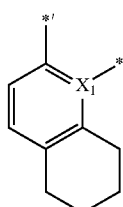
CY1(22) 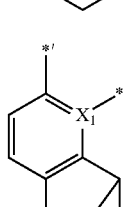
CY1(23) 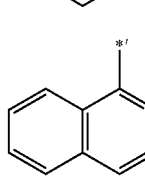
CY1(24) 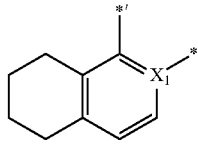
CY1(25) 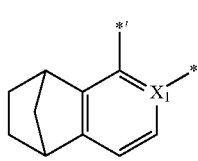
CY1(26)

191
-continued
CY1(27)
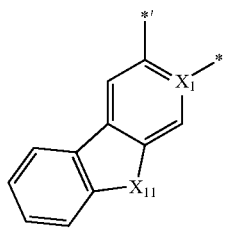
CY1(28)
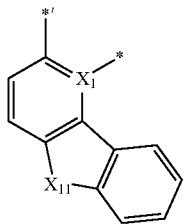
CY1(29)
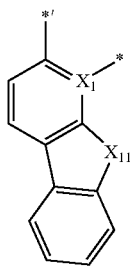
CY1(30)
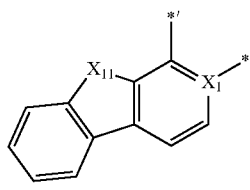
CY1(31)
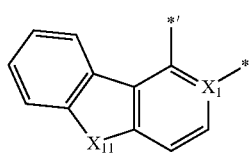
CY2(1)
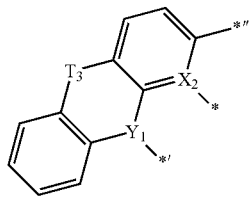
CY2(2)
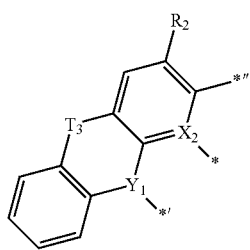
192
-continued
CY2(3)
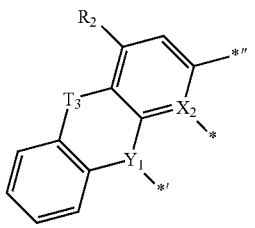
CY2(4)
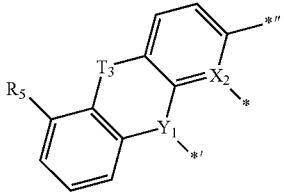
CY2(5)
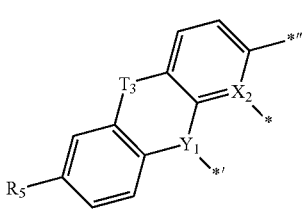
CY2(6)
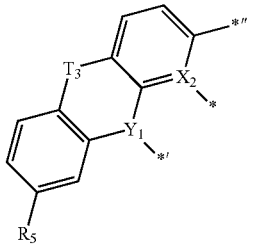
CY2(7)
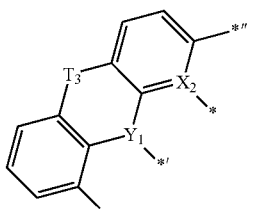
CY2(8)
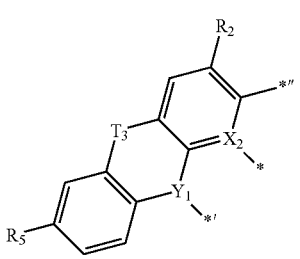
CY3(1)
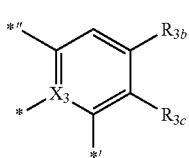

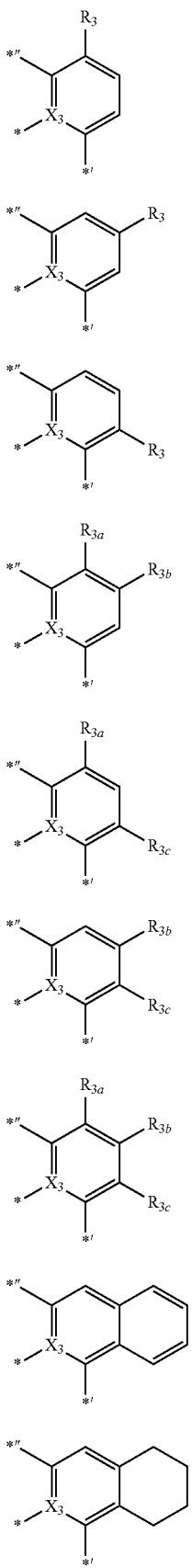
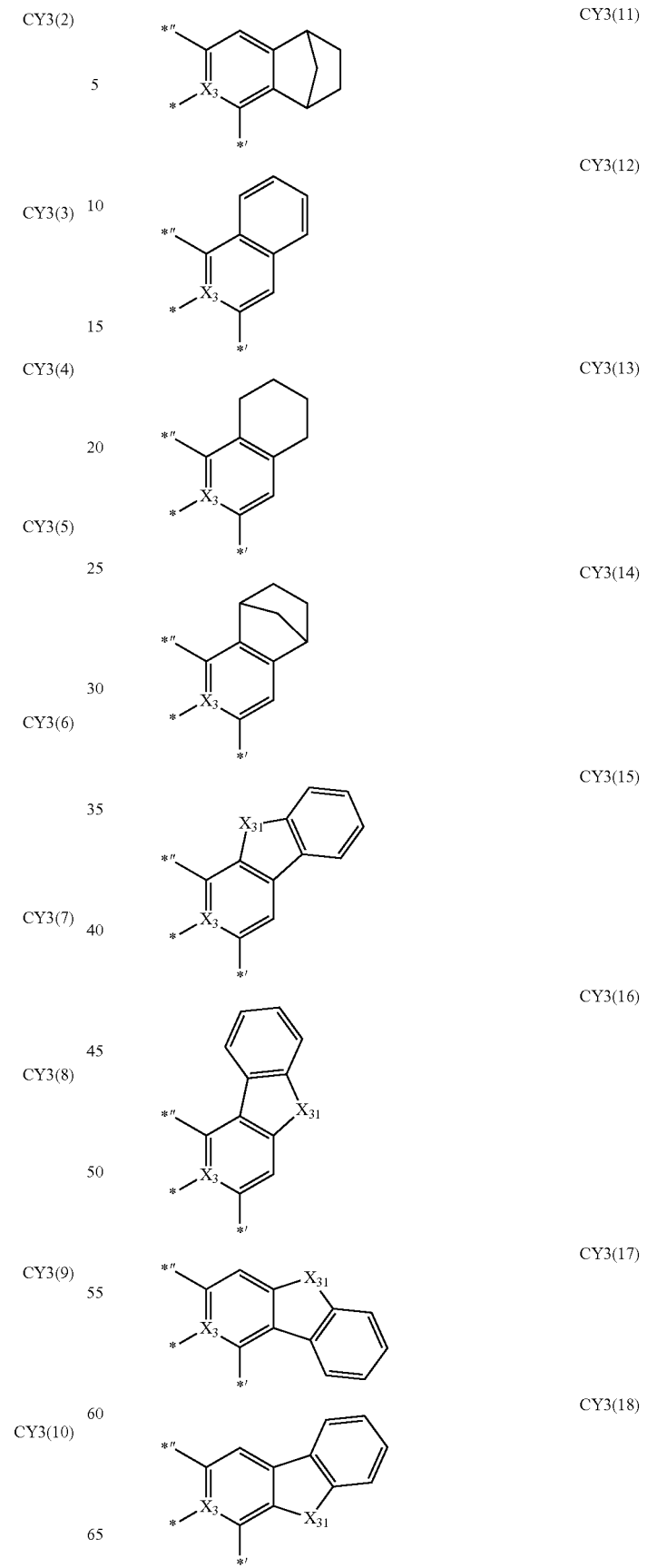

-continued
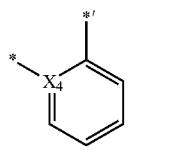
CY4(1)
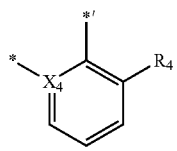
CY4(2)
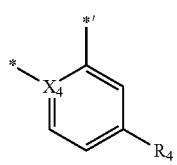
CY4(3)
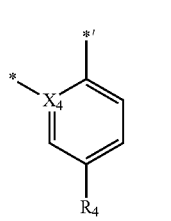
CY4(4)
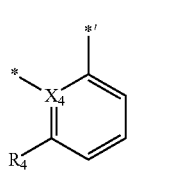
CY4(5)
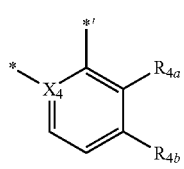
CY4(6)
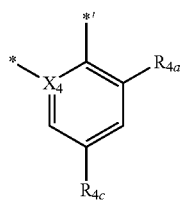
CY4(7)
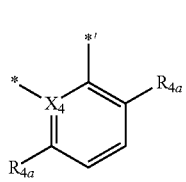
CY4(8)
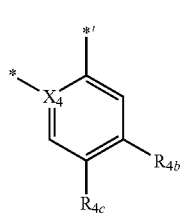
CY4(9)
-continued
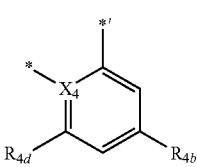
CY4(10)
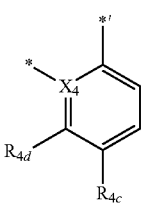
CY4(11)
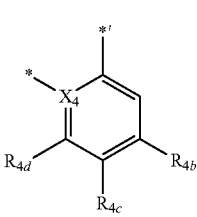
CY4(12)
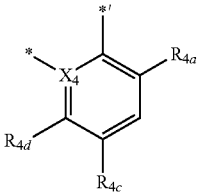
CY4(13)
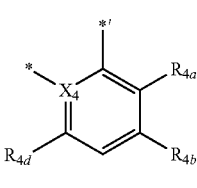
CY4(14)
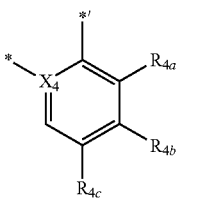
CY4(15)
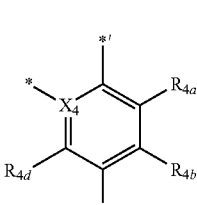
CY4916)
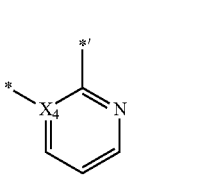
CY4(17)

-continued

CY4(18), CY4(19), CY4(20), CY4(21), CY4(22), CY4(23), CY4(24), CY4(25), CY4(26)

-continued

CY4(27), CY4(28), CY4(29), CY4(30), CY4(31), CY4(32), CY4(33), CY4(34)

CY4(35) 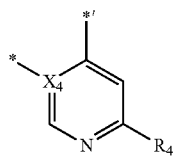
CY4(36) 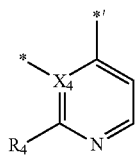
CY4(37) 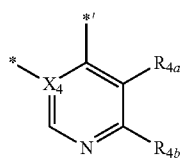
CY4(38) 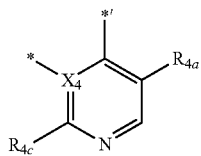
CY4(39) 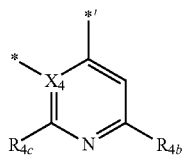
CY4(40) 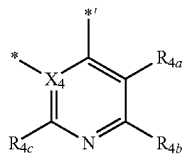
CY4(41) 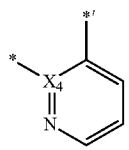
CY4(42) 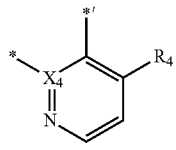
CY4(43) 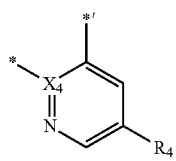
CY4(44) 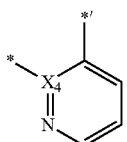
CY4(45) 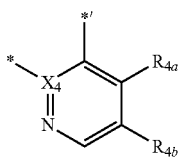
CY4(46) 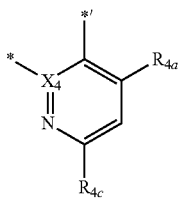
CY4(47) 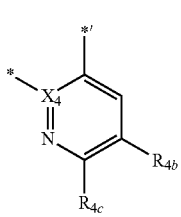
CY4(48) 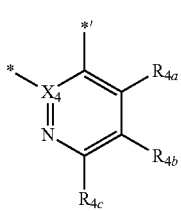
CY4(49) 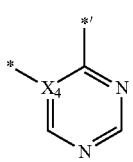
CY4(50) 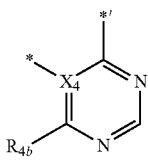
CY4(51) 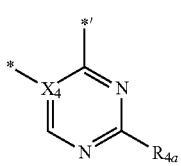

-continued
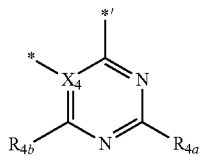
CY4(52)
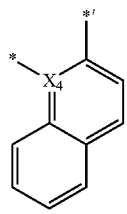
CY4(53)
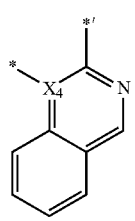
CY4(54)
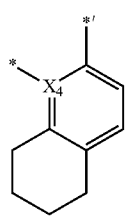
CY4(55)
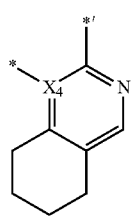
CY4(56)
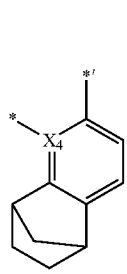
CY4(57)
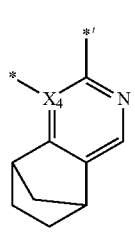
CY4(58)
-continued
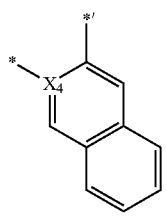
CY4(59)
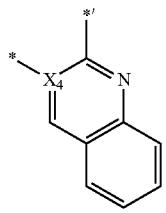
CY4(60)
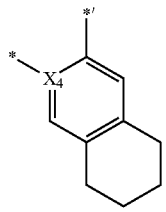
CY4(61)
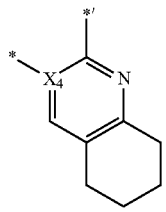
CY4(62)
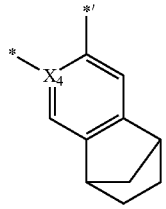
CY4(63)
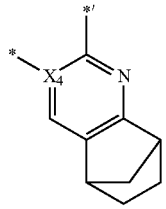
CY4(64)
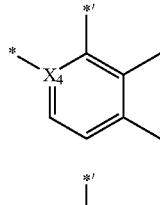
CY4(65)
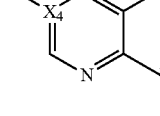
CY4(66)

CY4(67) 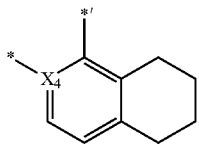

CY4(68) 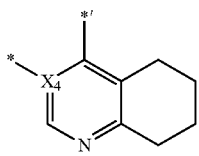

CY4(69) 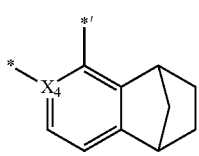

CY4(70) 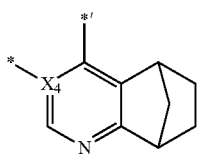

CY4(71) 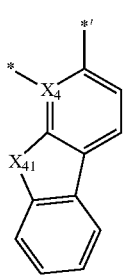

CY4(72) 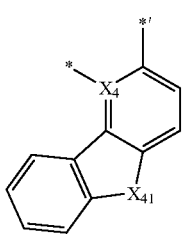

CY4(73) 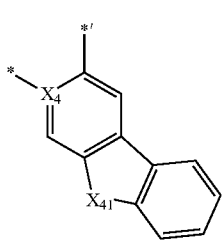

CY4(74) 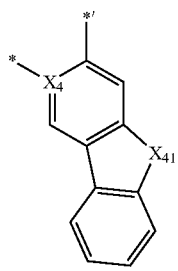

CY4(75) 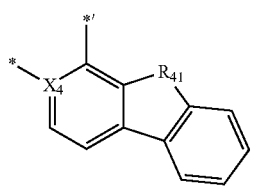

CY4(76) 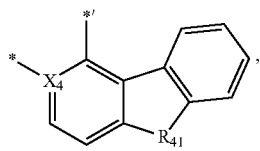

wherein, in Formulae CY1(1) to CY1(31), CY2(1) to CY2(8), CY3(1) to CY3(18), and CY4(1) to CY4(76), $X_1$ to $X_4$, $Y_1$, $T_3$, and $R_1$ to $R_5$ are each independently the same as described in claim 1, $X_{11}$ is O, S, $N(R_{11})$, $C(R_{11})(R_{12})$, or $Si(R_{11})(R_{12})$, $X_{31}$ is O, S, $N(R_{31})$, $C(R_{31})(R_{32})$, or $Si(R_{31})(R_{32})$, $X_{41}$ is O, S, $N(R_{41})$, $C(R_{41})(R_{42})$, or $Si(R_{41})(R_{42})$, $R_{1a}$ to $R_{1d}$, $R_{11}$, and $R_{12}$ are each independently the same as defined in connection with $R_1$ in claim 1, $R_{3a}$ to $R_{3c}$, $R_{31}$, and $R_{32}$ are each independently the same as defined in connection with $R_3$ in claim 1, $R_{4a}$ to $R_{4d}$, $R_{41}$, and $R_{42}$ are each independently the same as defined in connection with $R_4$ in claim 1, $R_1$ to $R_5$, $R_{1a}$ to $R_{1d}$, $R_{11}$, $R_{12}$, $R_{3a}$ to $R_{3c}$, $R_{31}$, $R_{32}$, $R_{4a}$ to $R_{4d}$, $R_{41}$, and $R_{42}$ are not hydrogen, in Formulae CY1(1) to CY1(31), * indicates a binding site to $X_5$ in Formula 1, and *' indicates a binding site to $Y_1$ in Formula 1, in Formulae CY2(1) to CY2(8), * indicates a binding site to M in Formula 1, *' indicates a binding site to ring $CY_1$ in Formula 1, and *'' indicates a binding site to $T_1$ in Formula 1, in Formulae CY3(1) to CY3(18), *'' indicates a binding site to $T_1$ in Formula 1, * indicates a binding site to M in Formula 1, and *' indicates a binding site to $T_2$ in Formula 1, and in Formulae CY4(1) to CY4(76), * indicates a binding site to M in Formula 1, and *' indicates a binding site to $T_2$ in Formula 1.

15. The organometallic compound of claim 1, wherein the organometallic compound is one of Compounds 1 to 200:

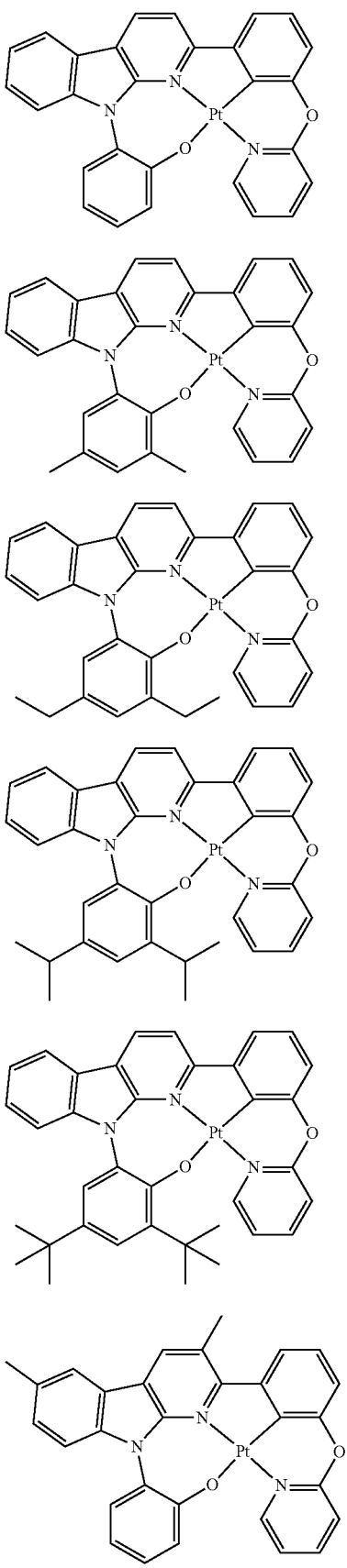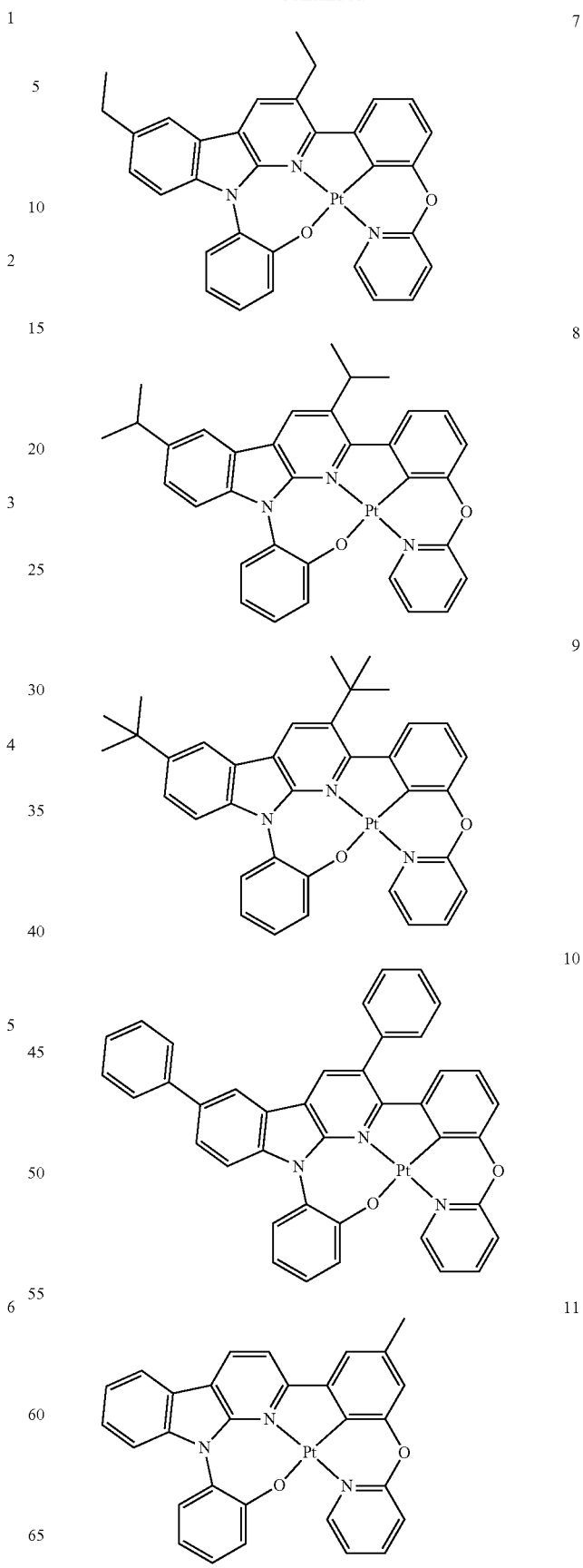

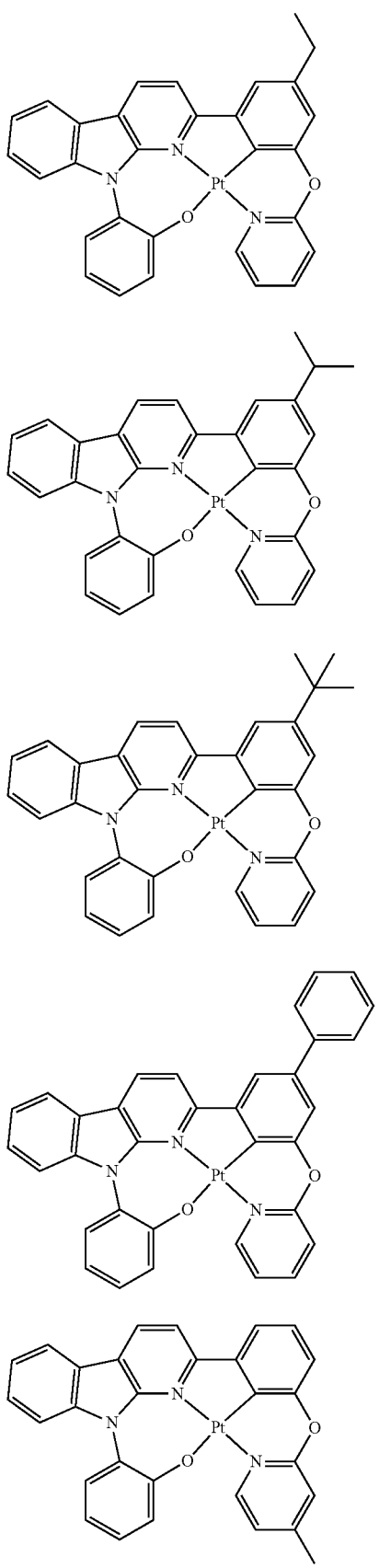
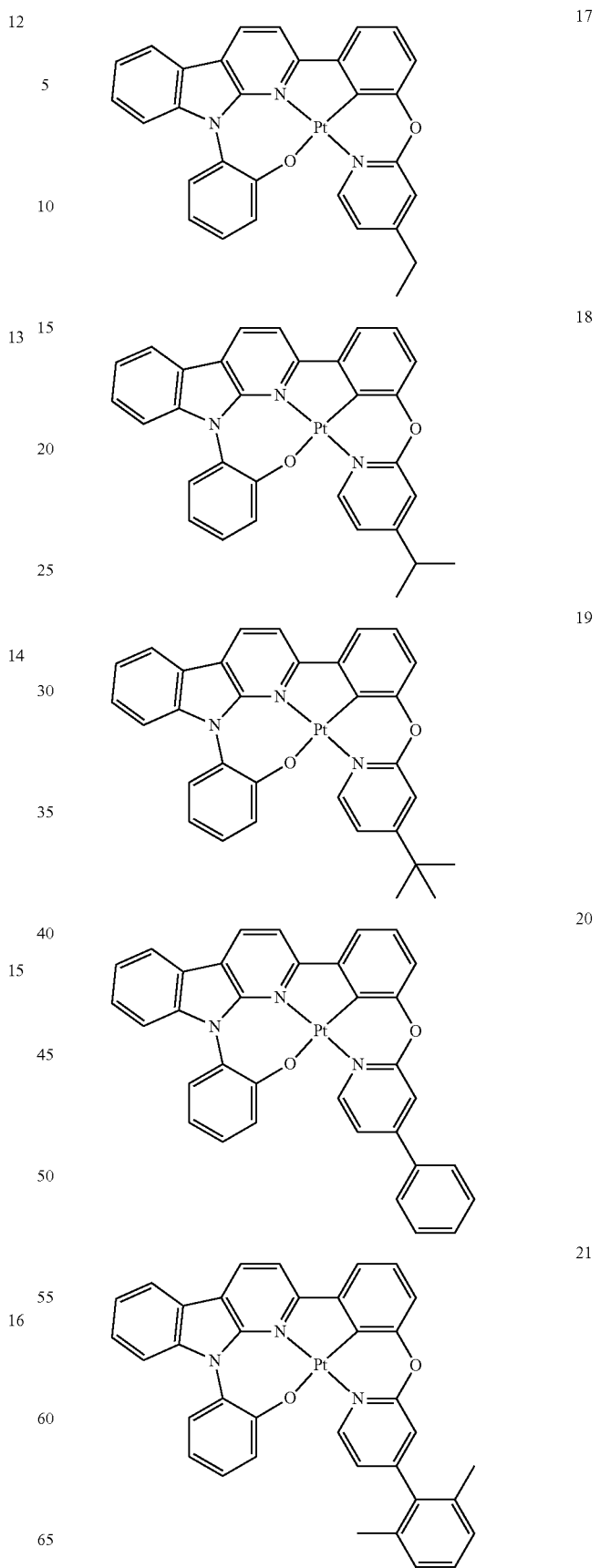

22 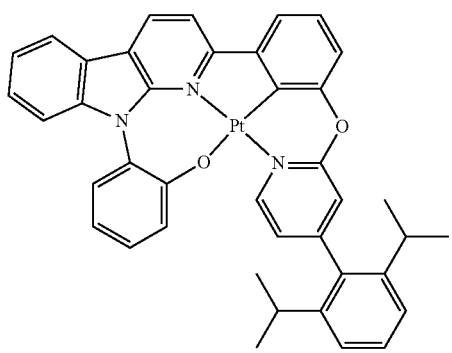
23 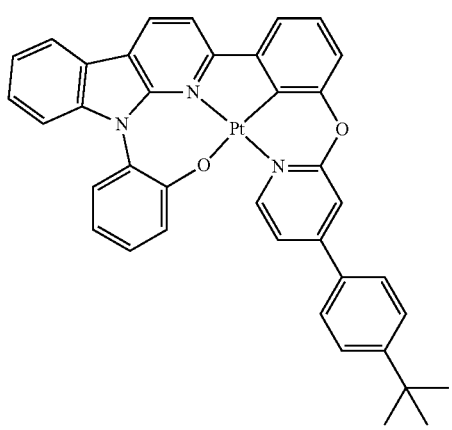
24 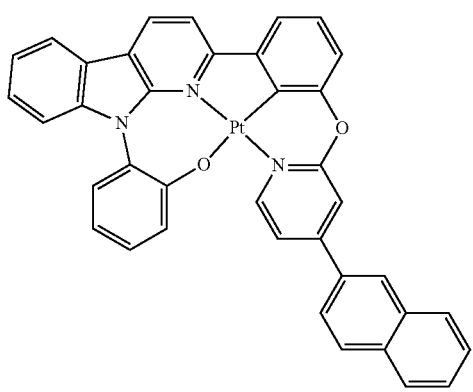
25 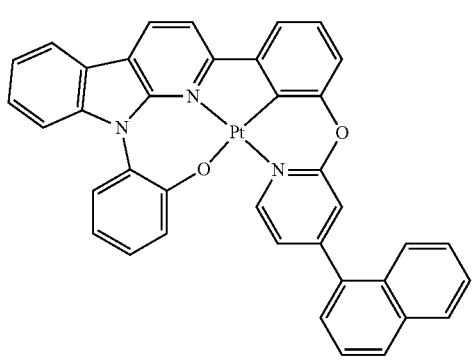
26 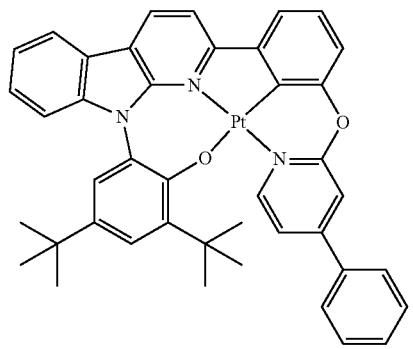
27 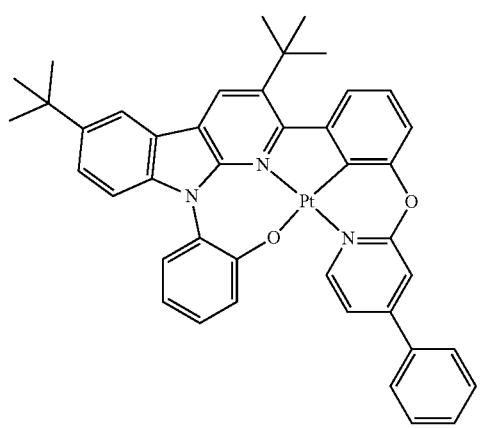
28 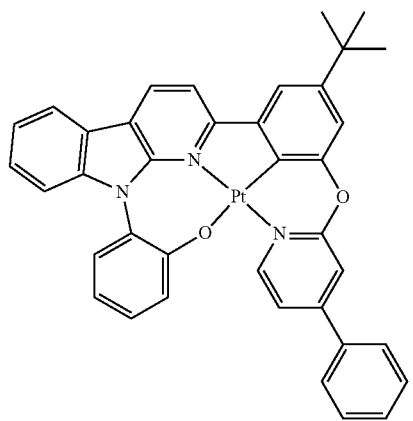
29 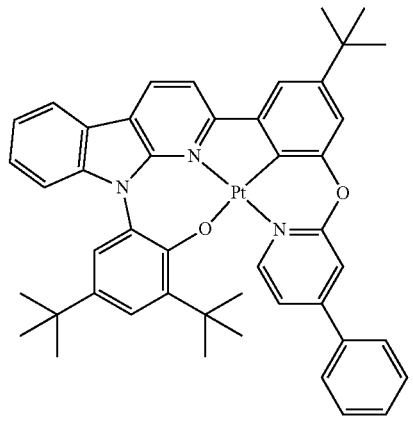

211 -continued
30
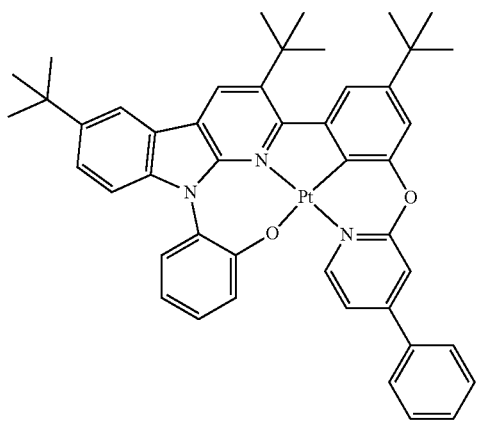
31
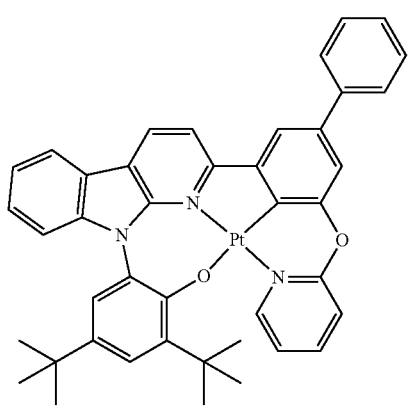
32
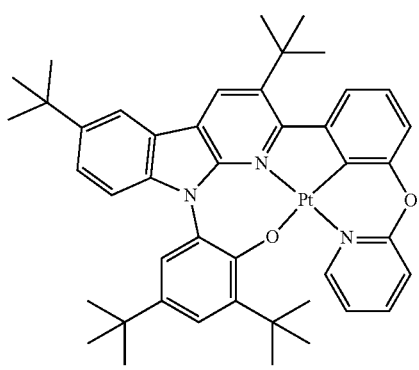
33
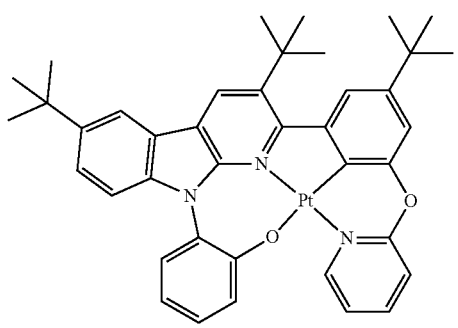
212 -continued
34
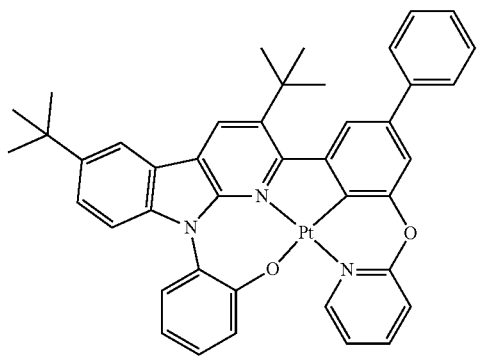
35
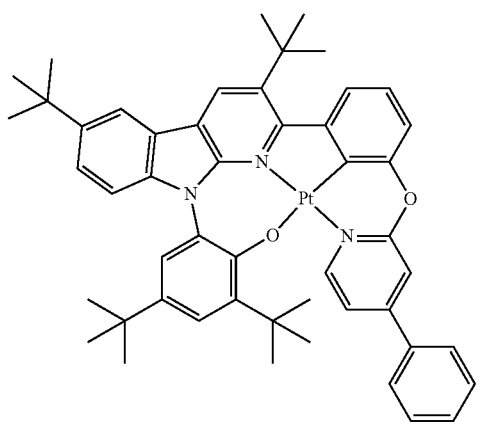
36
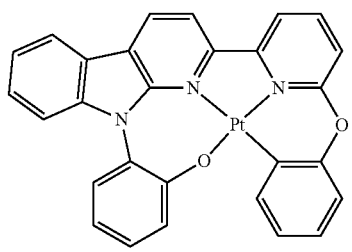
37
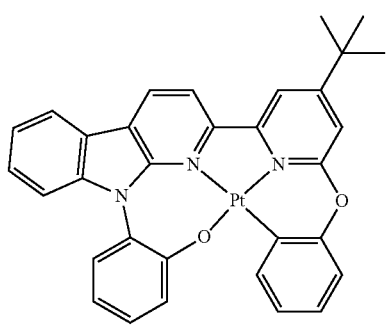

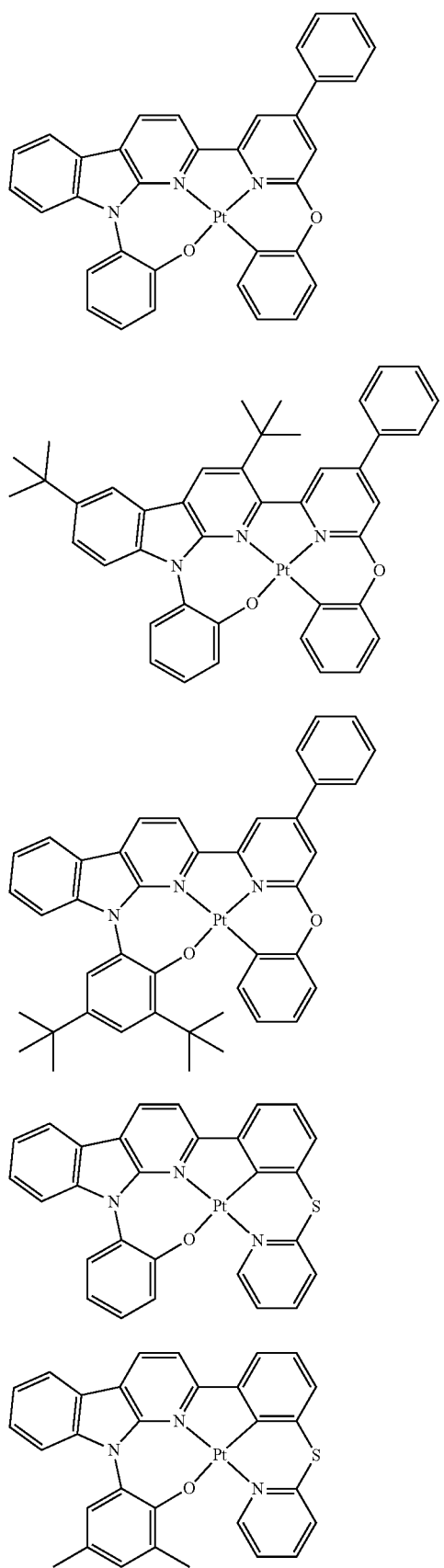
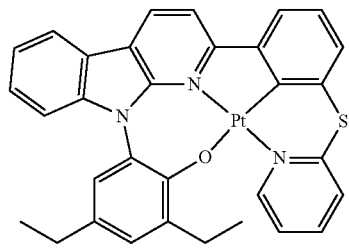
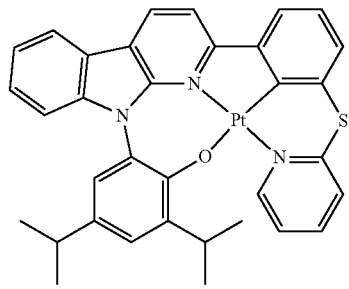
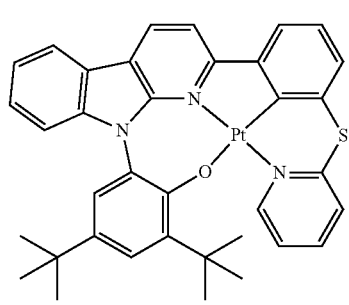
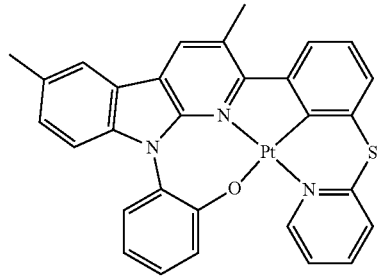
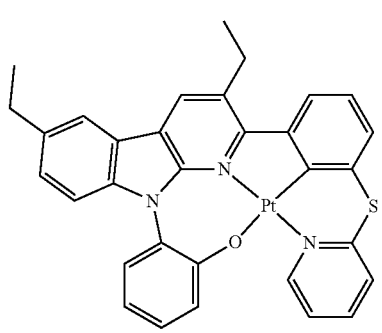

48
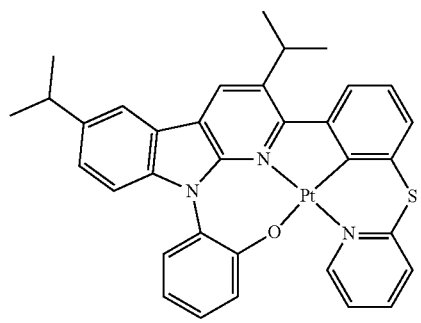
49
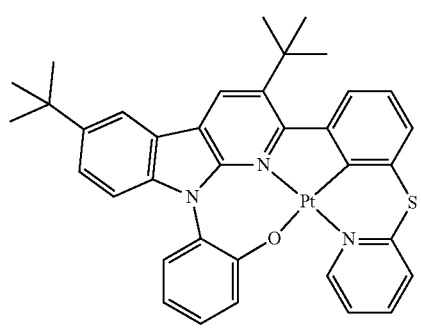
50
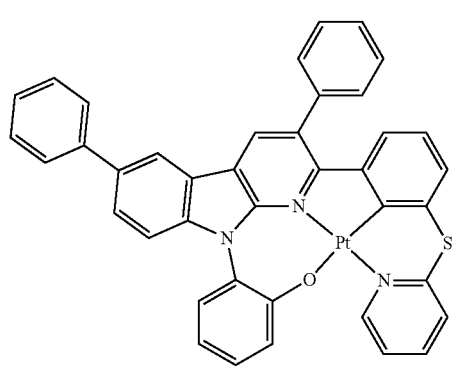
51
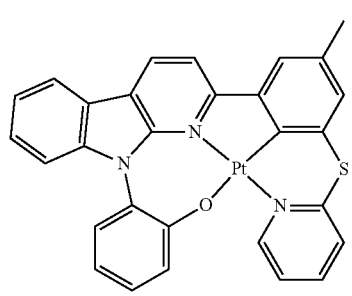
52
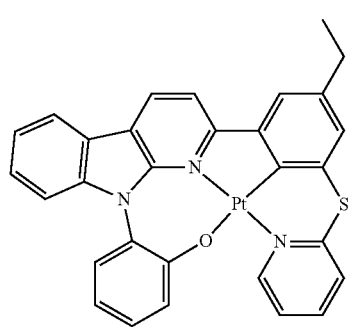
53
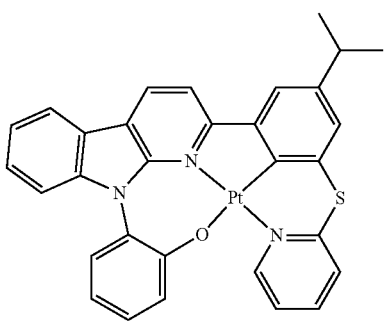
54
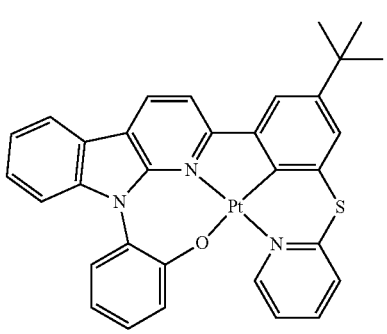
55
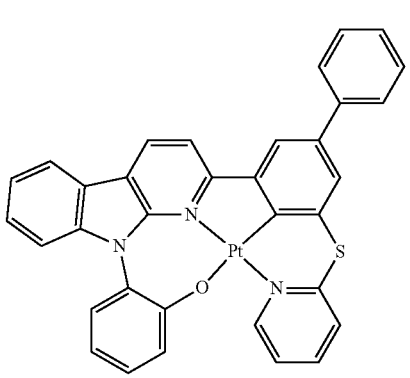
56
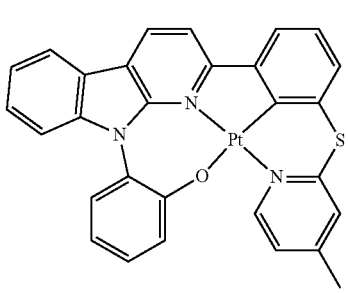
57
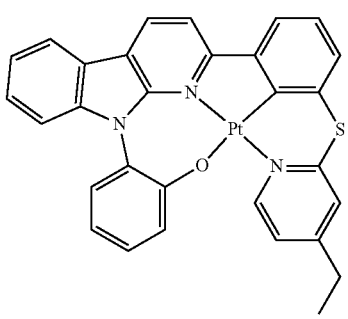

217
-continued
58
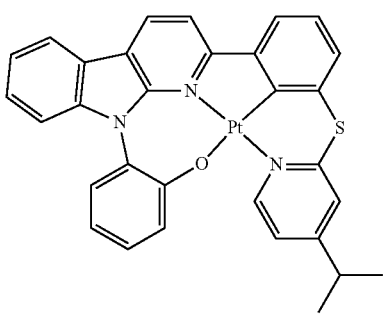
59
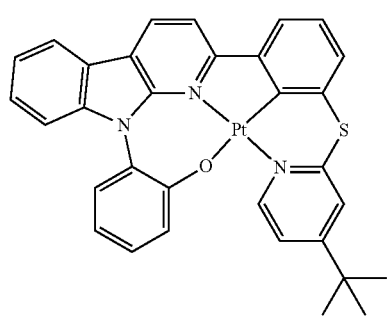
60
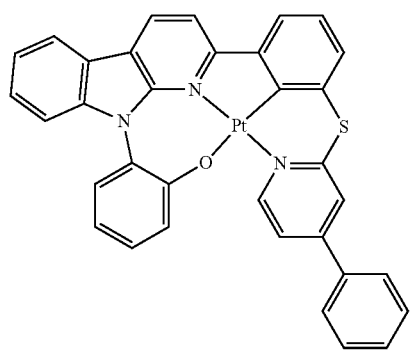
61
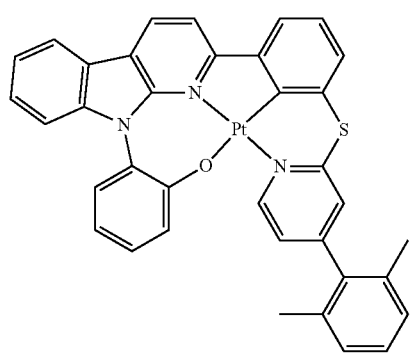
218
-continued
62
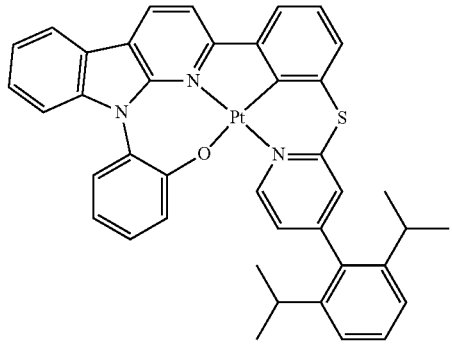
63
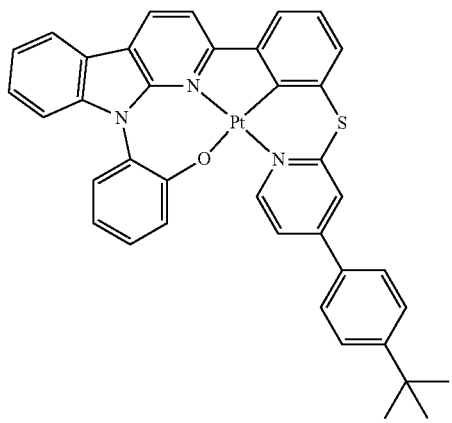
64
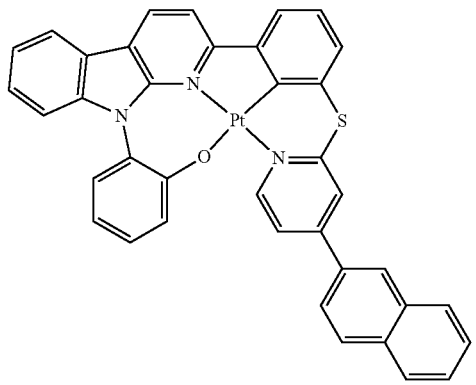
65
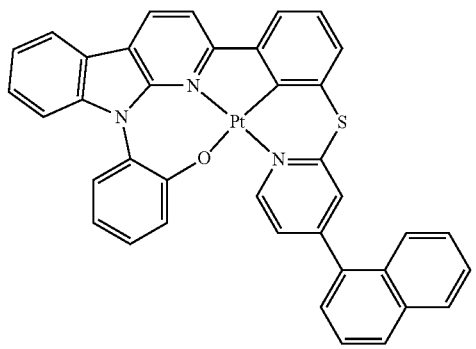

66
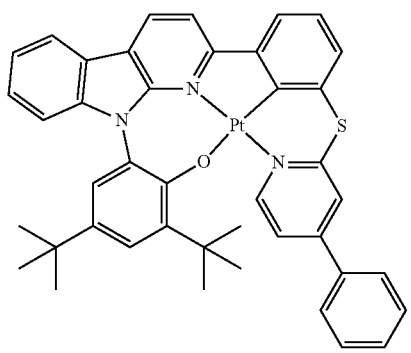
67
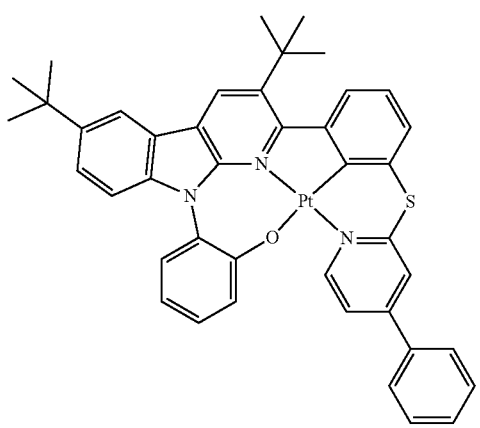
68
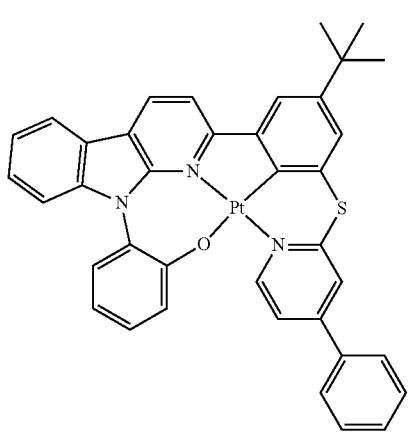
69
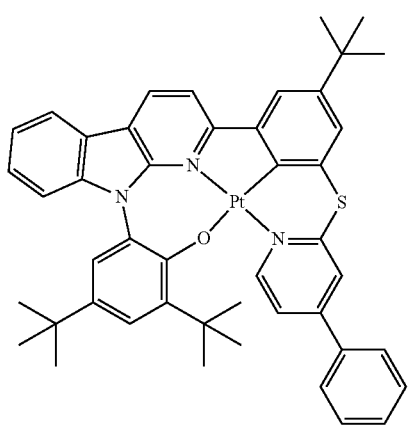
70
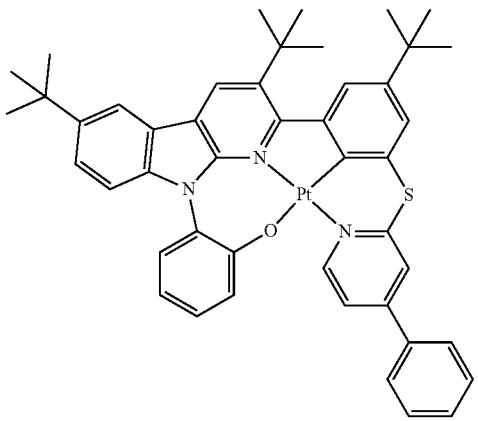
71
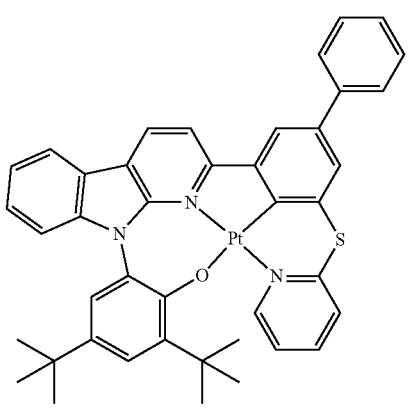
72
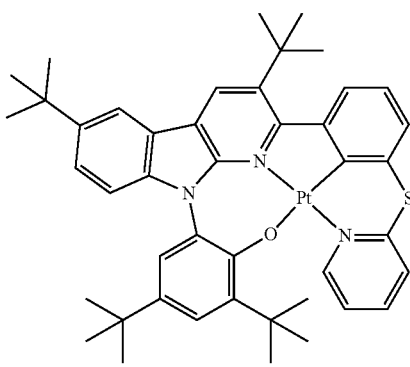
73
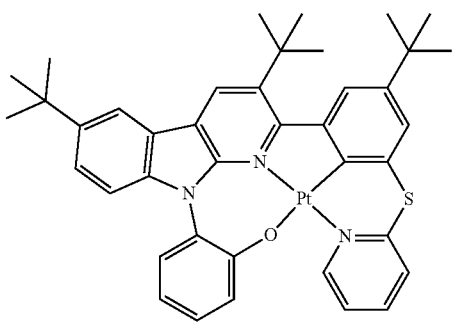

-continued
74
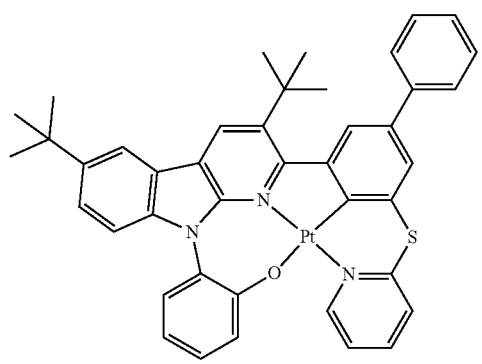
75
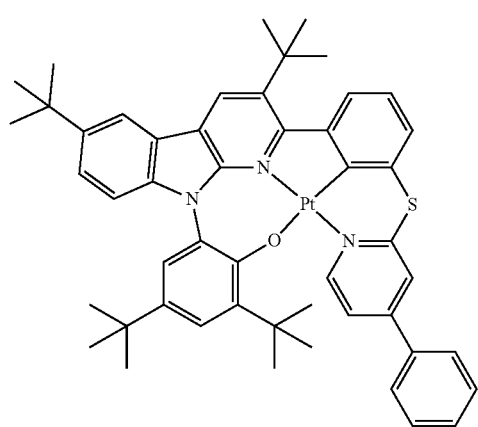
76
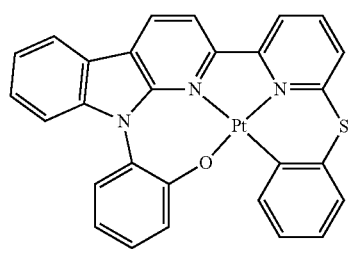
77
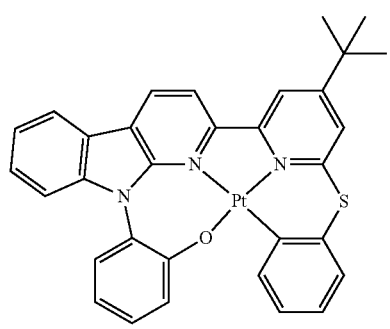
-continued
78
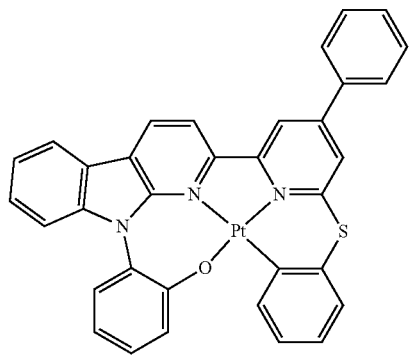
79
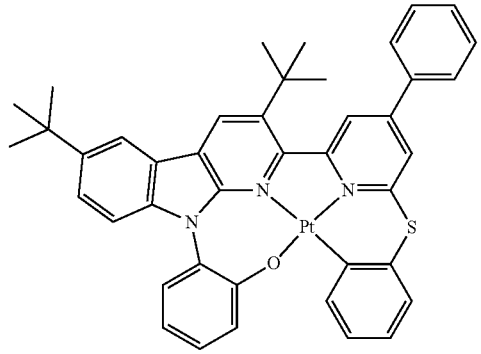
80
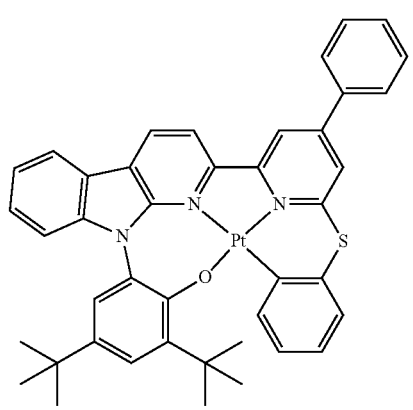
81
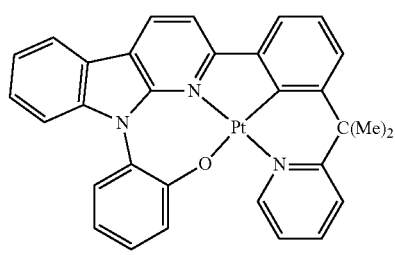
82
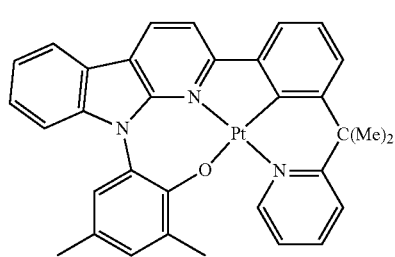

223
-continued
83
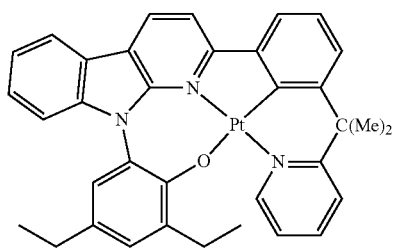
84
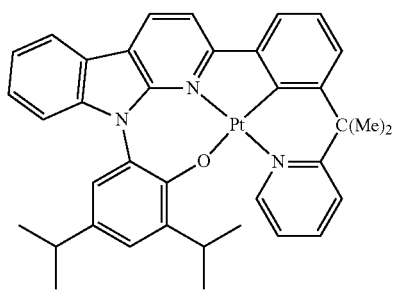
85
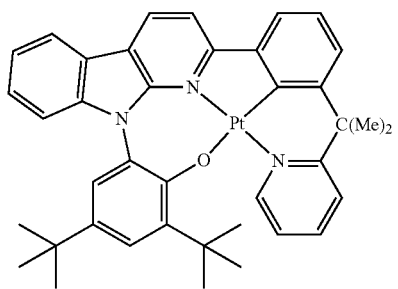
86
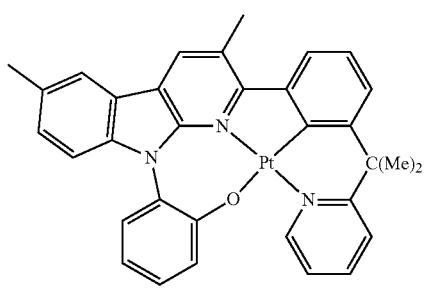
87
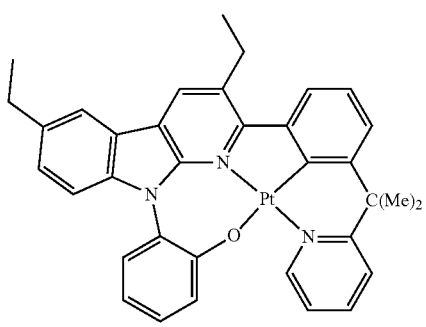
224
-continued
88
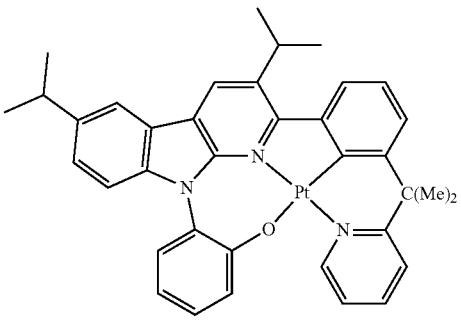
89
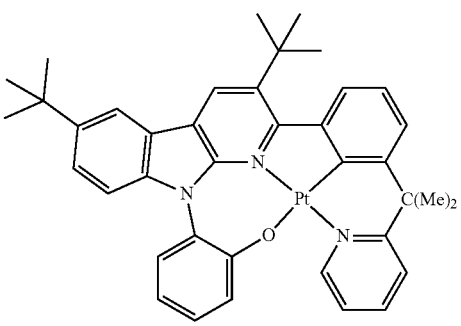
90
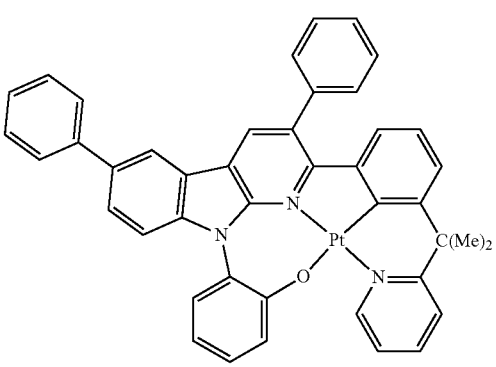
91
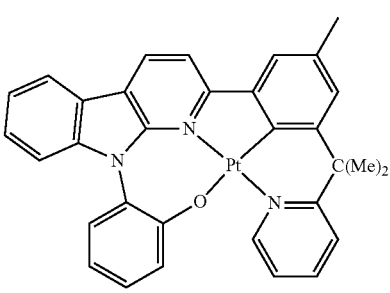
92
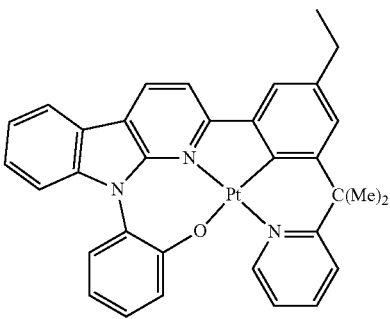

225
-continued
93
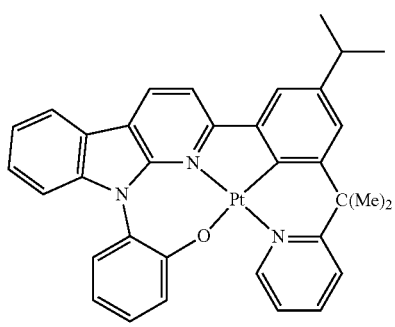
94
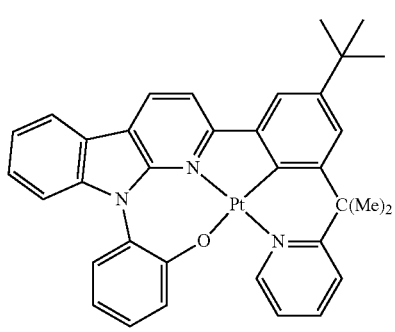
95
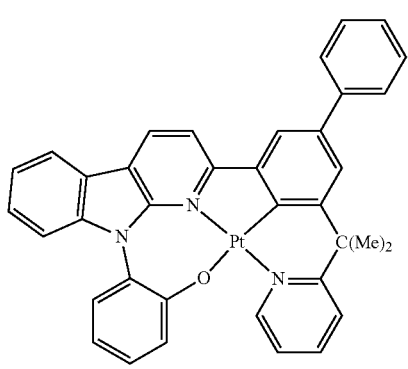
96
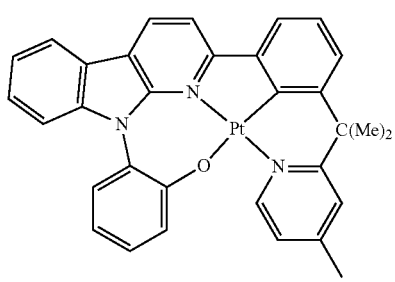
97
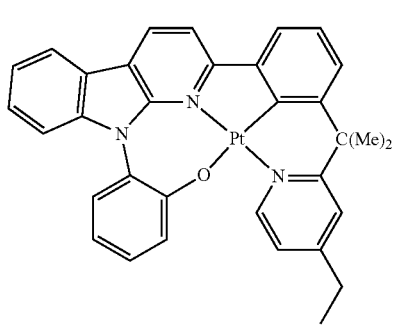
226
-continued
98
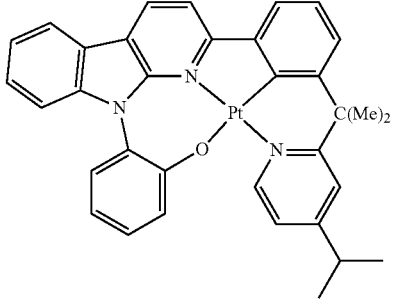
99
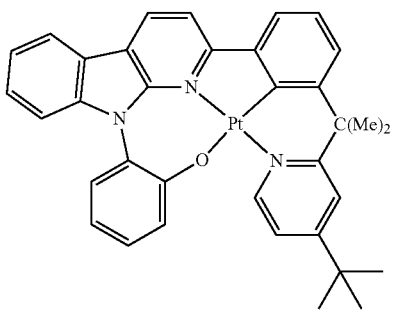
100
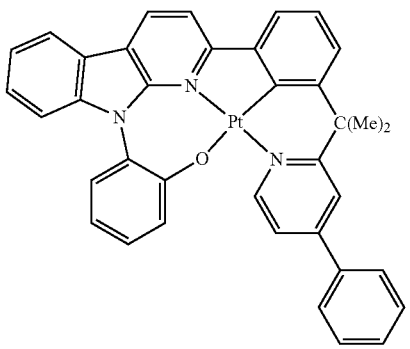
101
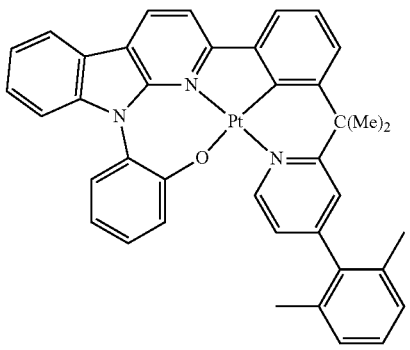

227
-continued
102
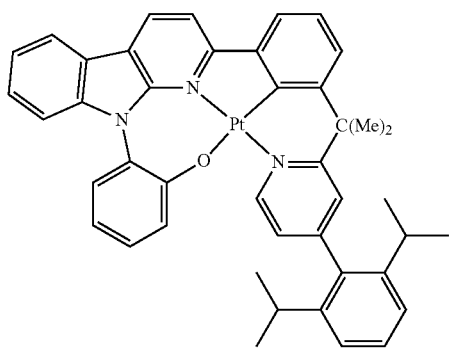
103
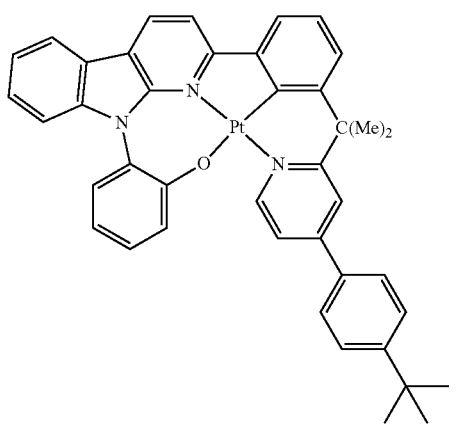
104
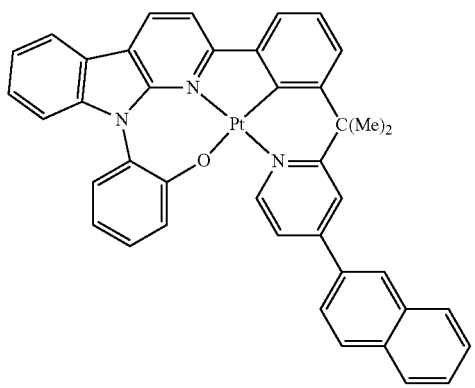
105
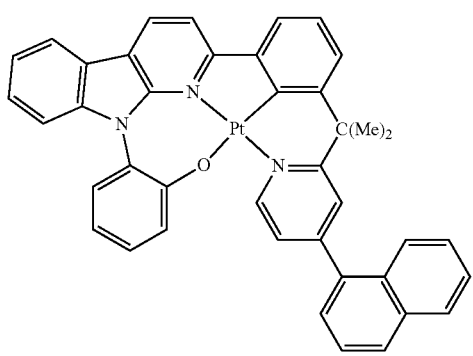
228
-continued
106
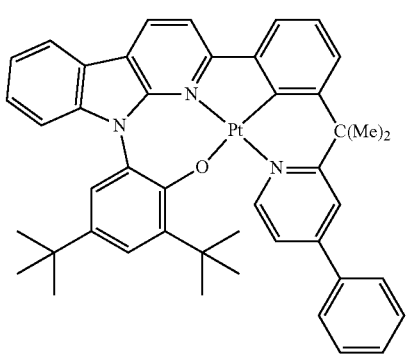
107
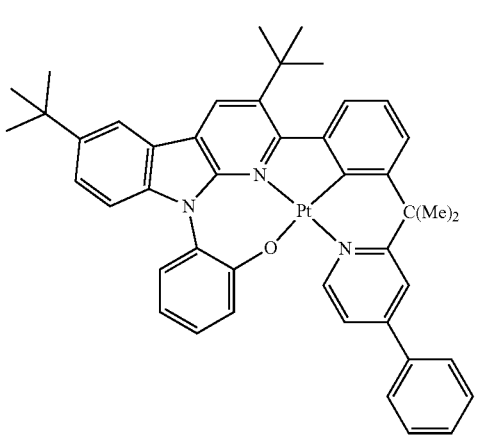
108
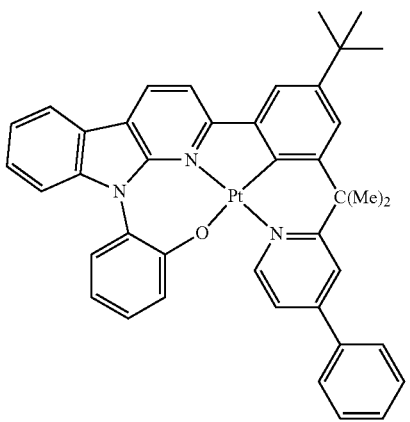
109
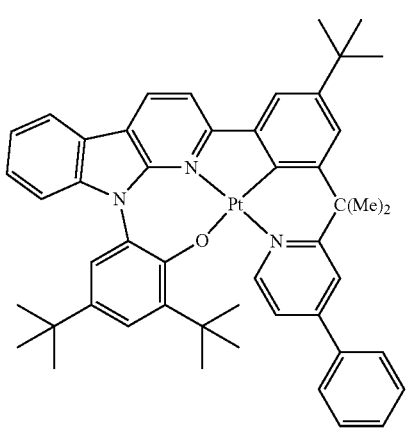

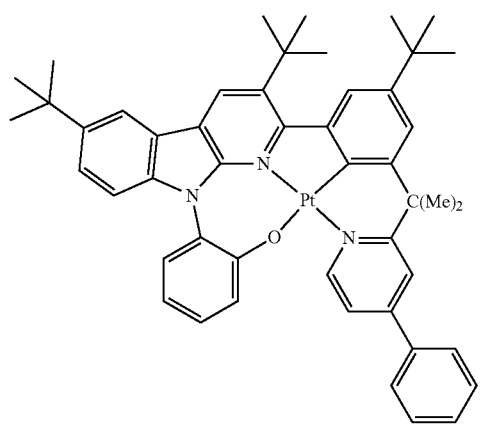
110
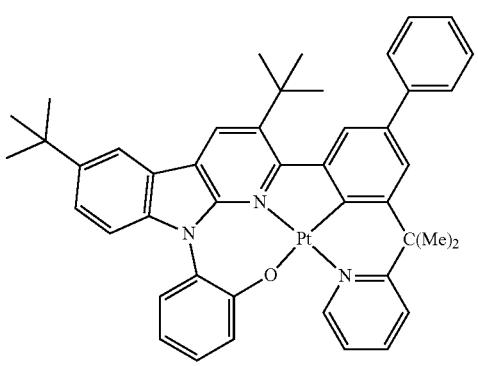
114
111
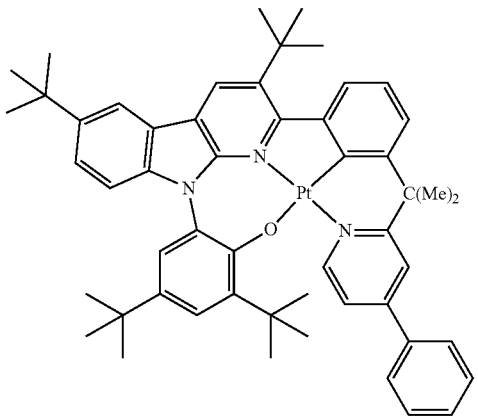
115
112
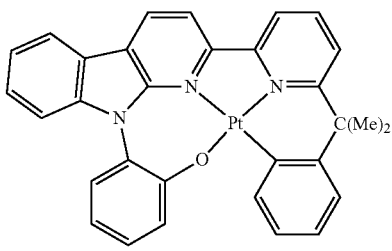
116
113
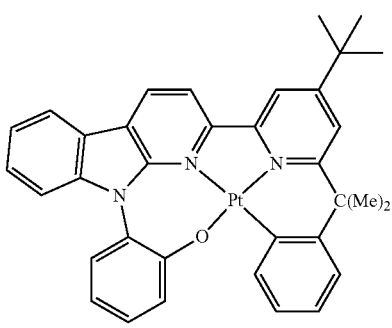
117

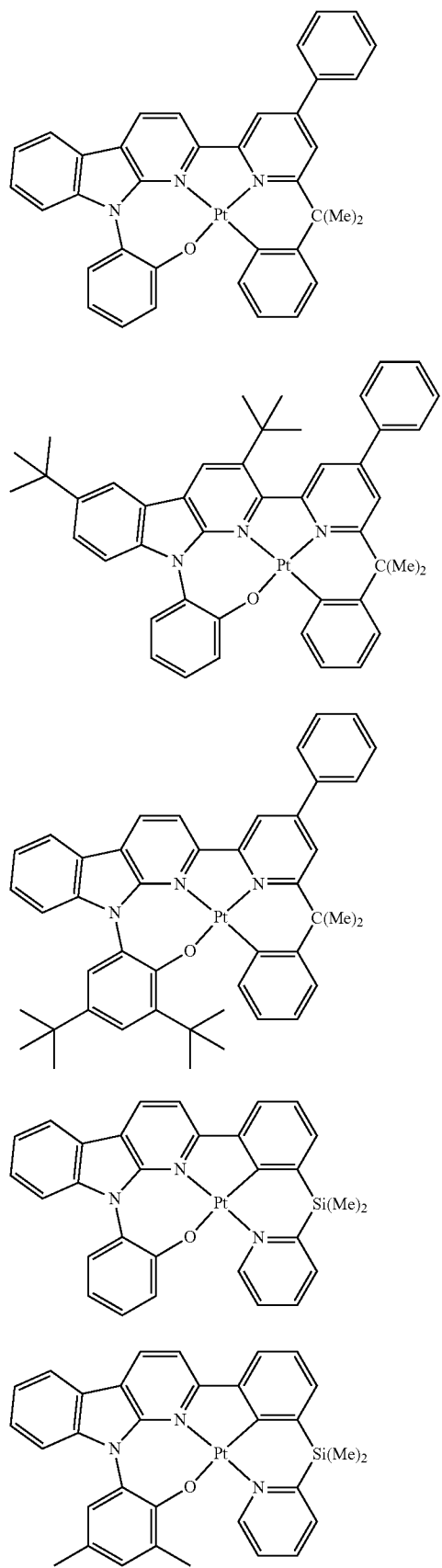
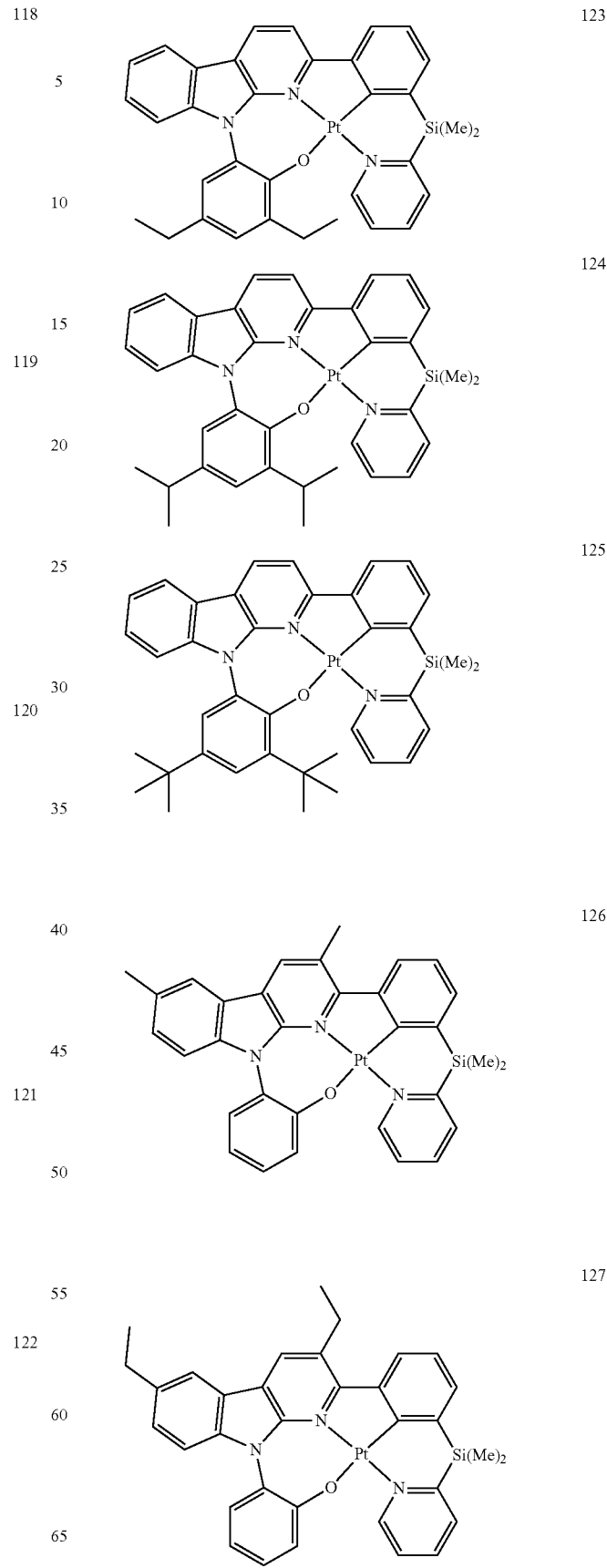

128
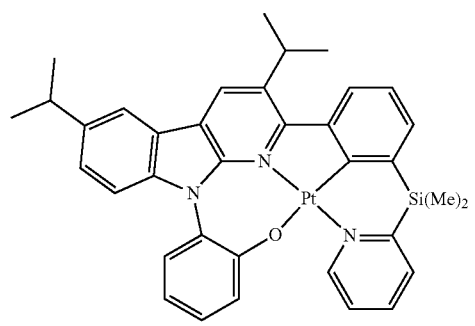
129
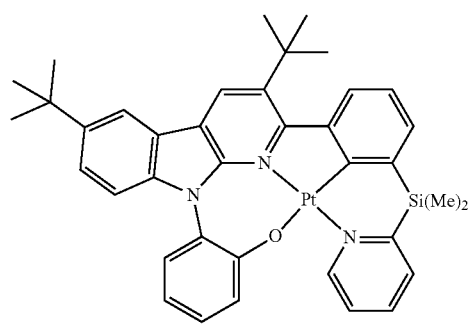
130
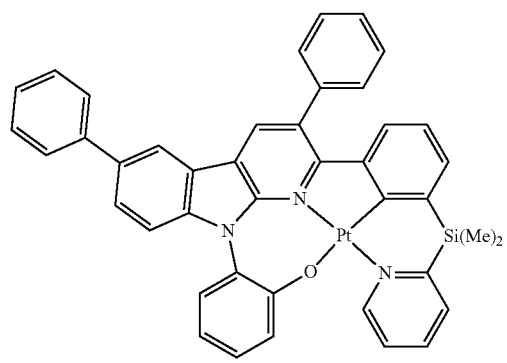
131
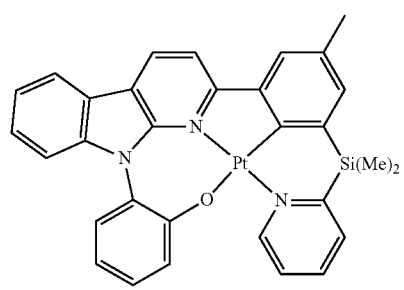
132
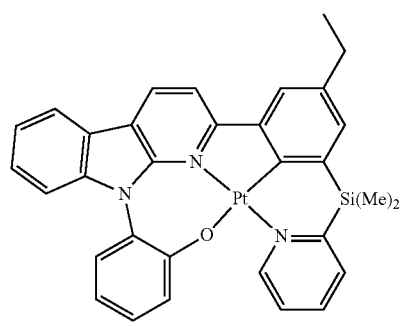
133
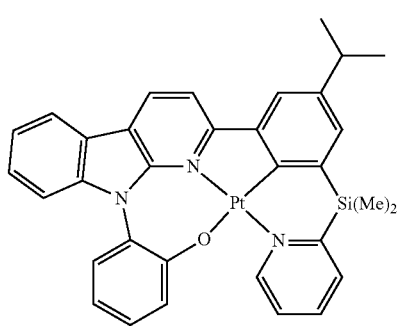
134
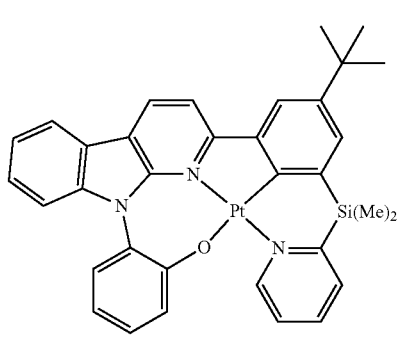
135
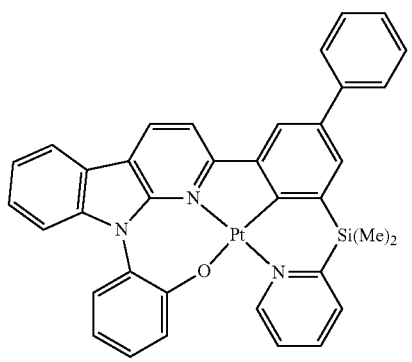
136
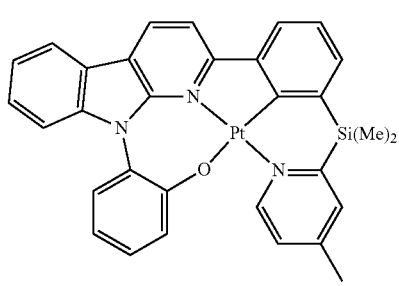
137
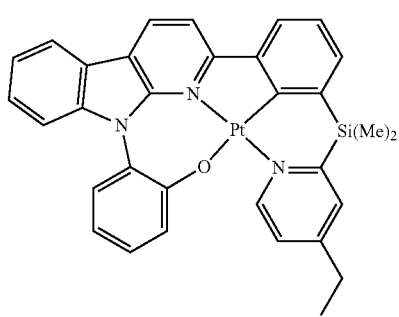

138
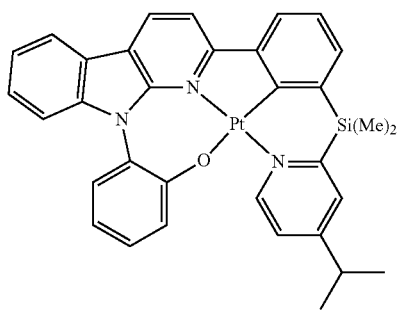
139
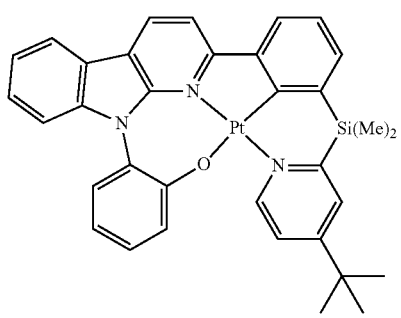
140
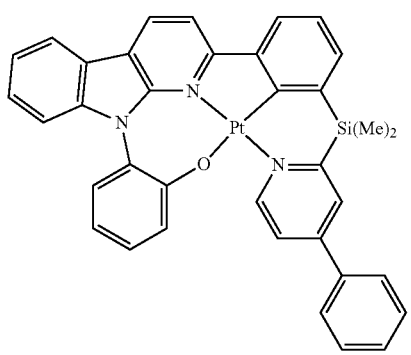
141
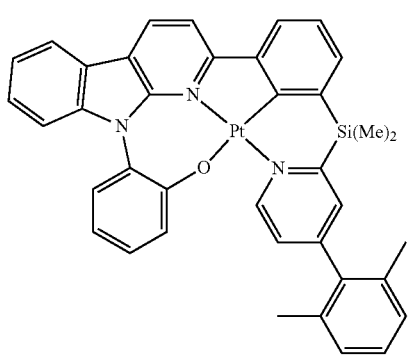
142
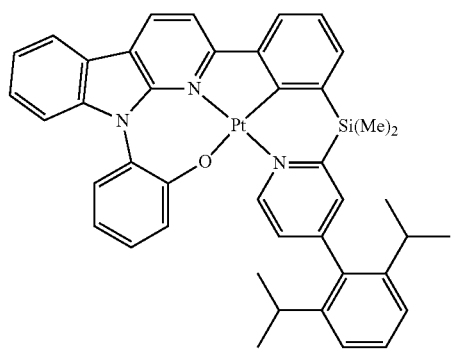
143
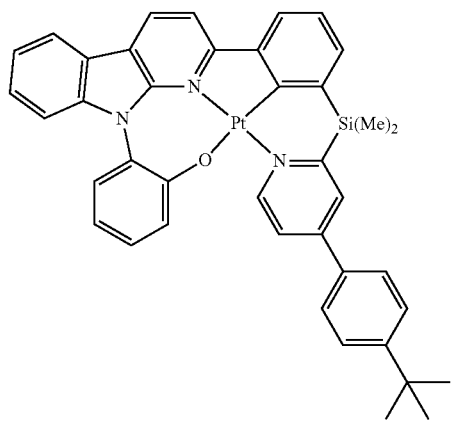
144
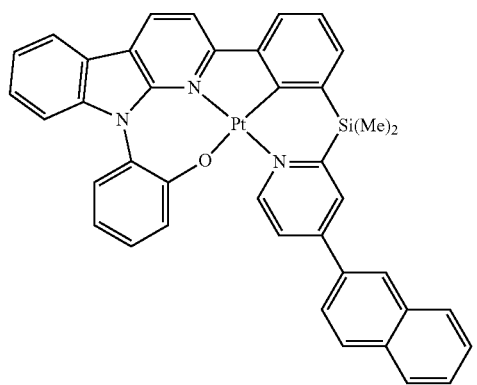
145
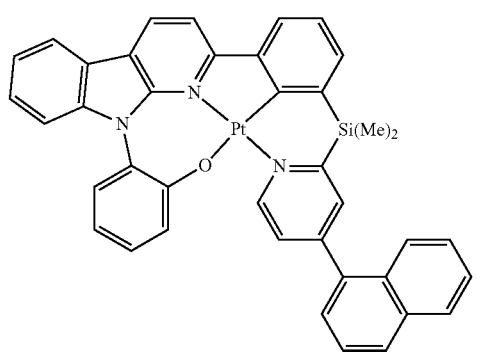

237
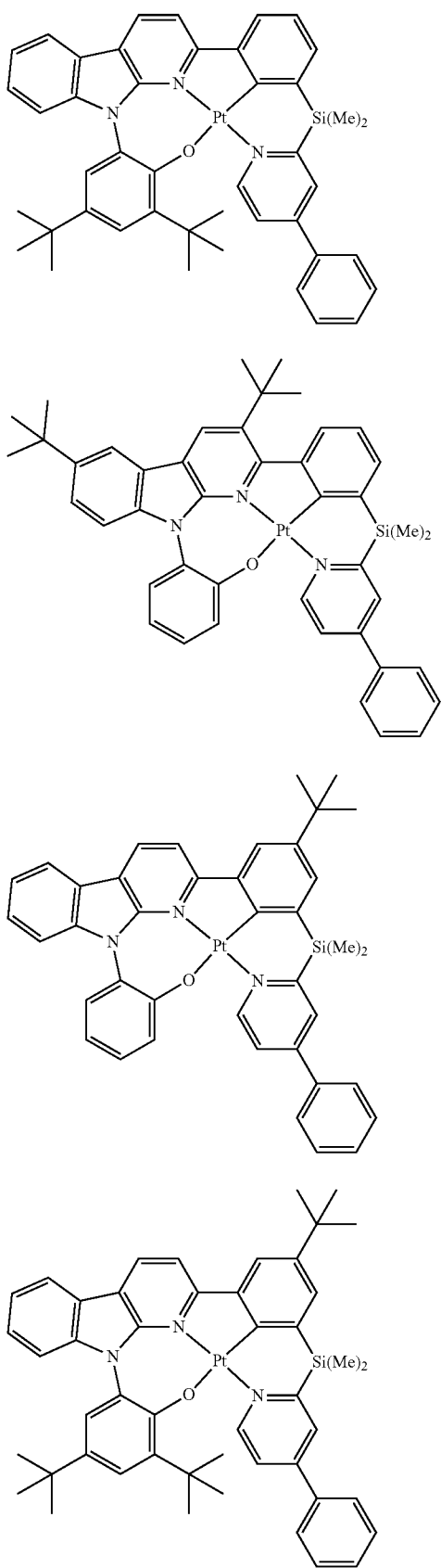
146
147
148
149
238
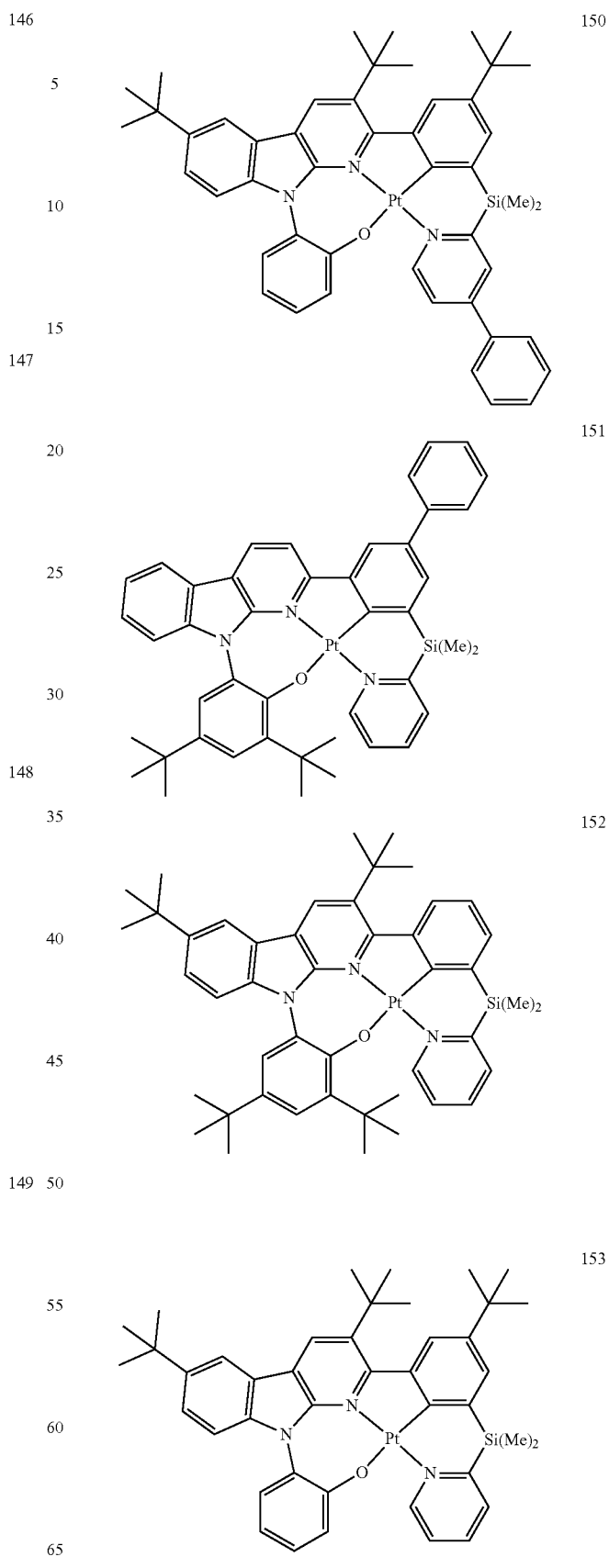
150
151
152
153

154
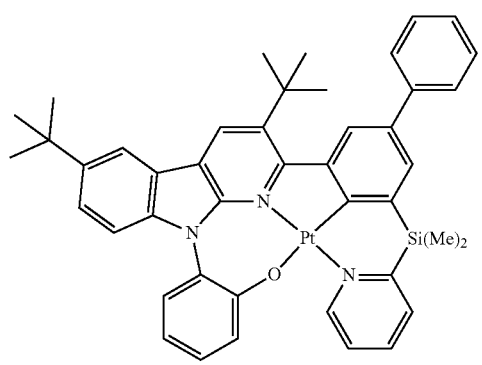
155
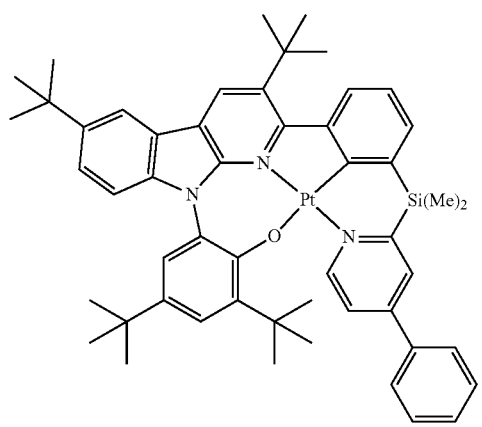
156
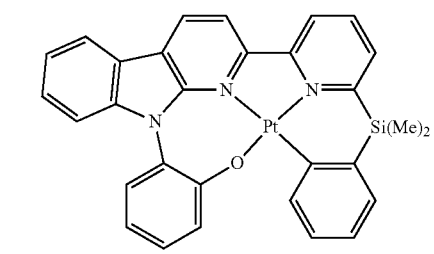
157
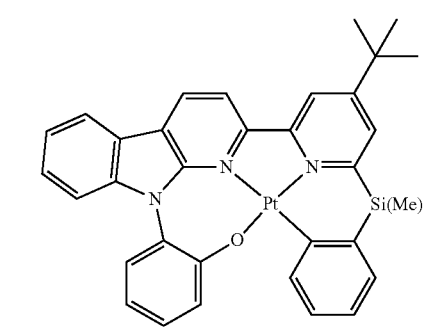
158
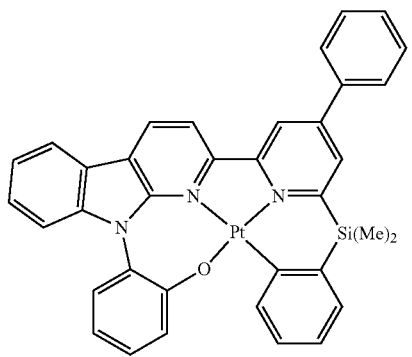
159
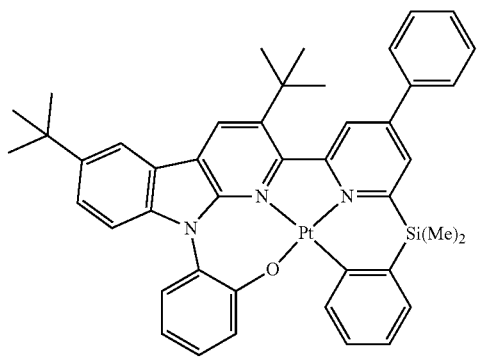
160
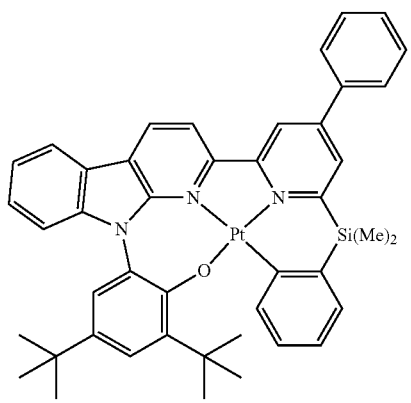
161
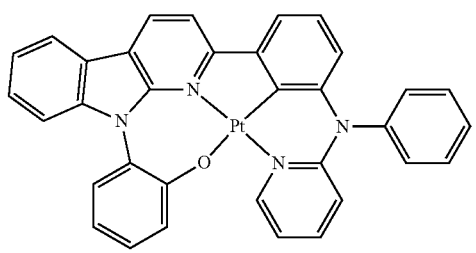
162
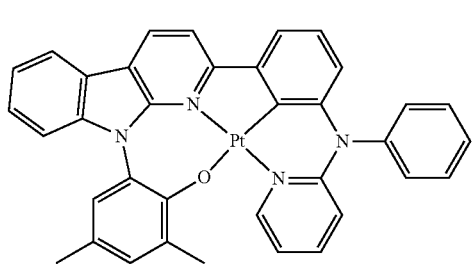

163
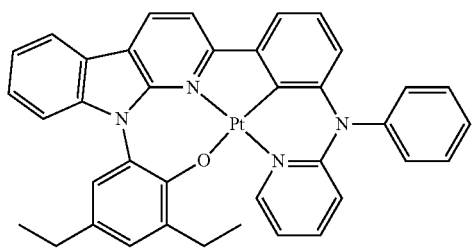
164
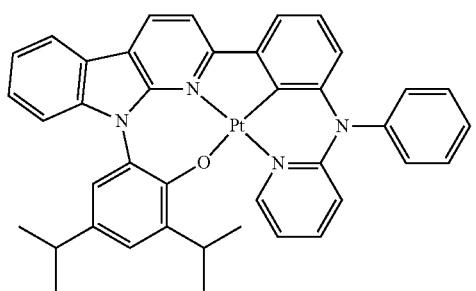
165
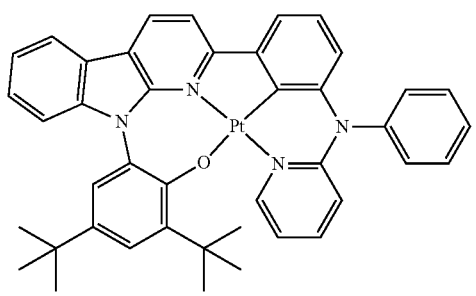
166
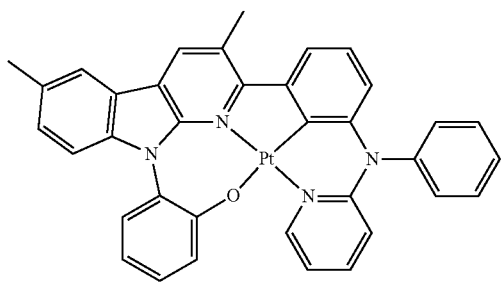
167
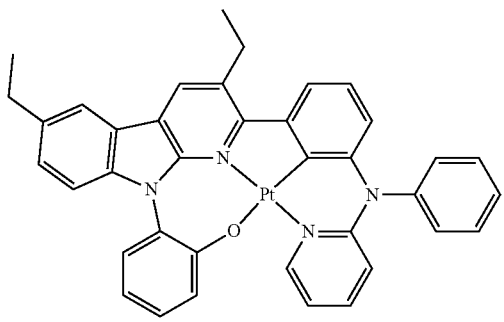
168
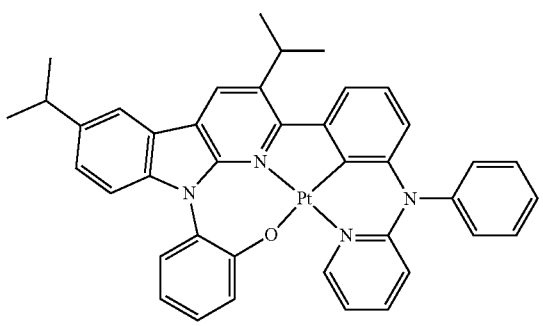
169
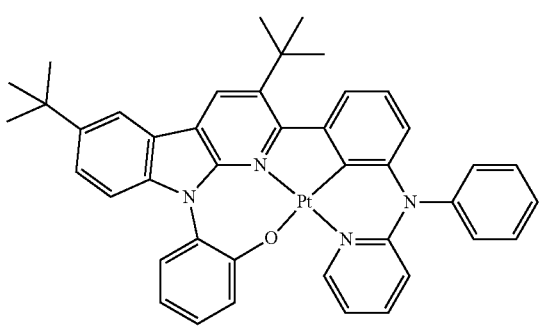
170
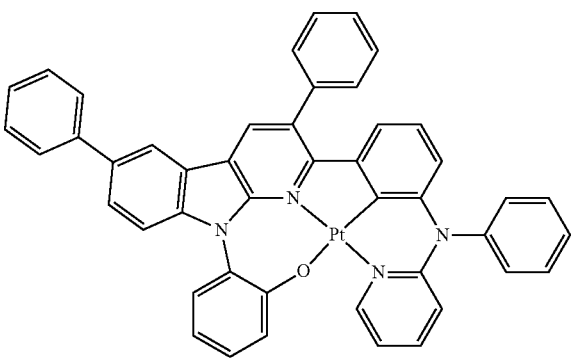
171
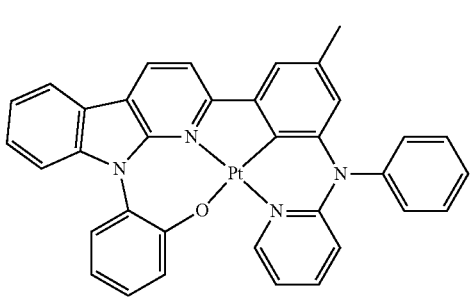

172
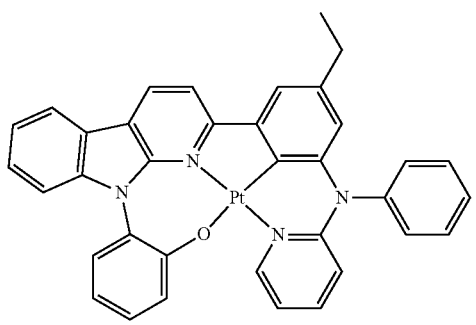
173
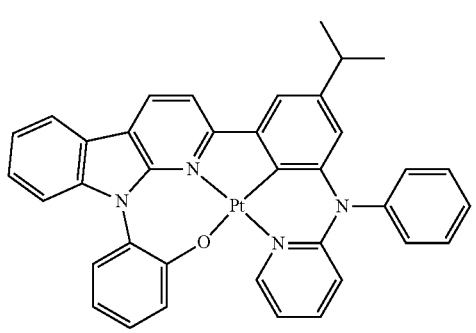
174
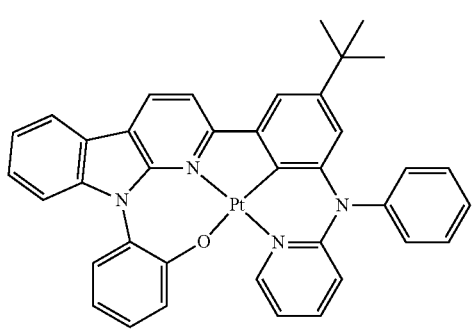
175
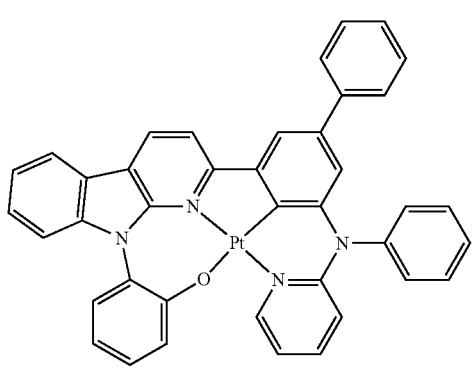
176
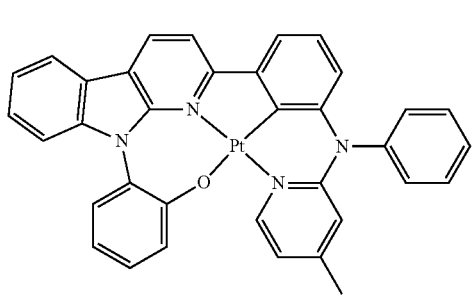
177
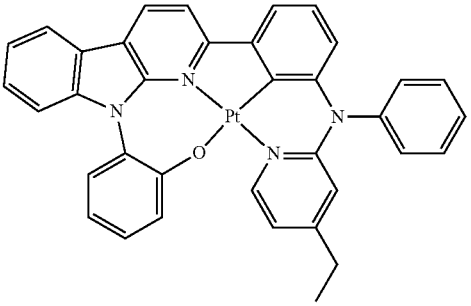
178
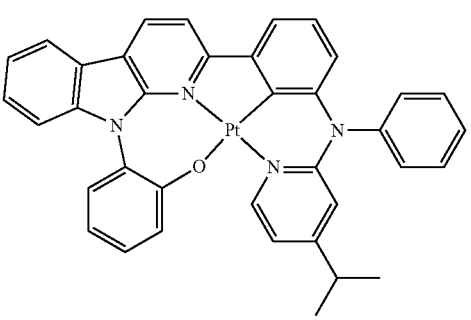
179
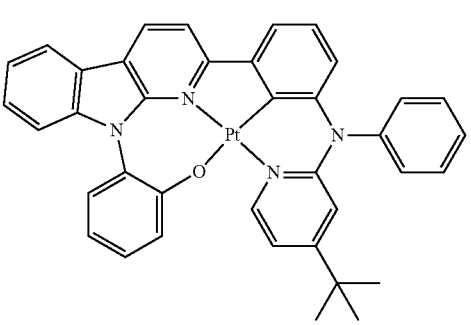
180
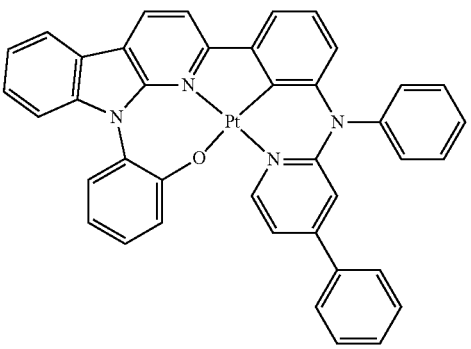
181
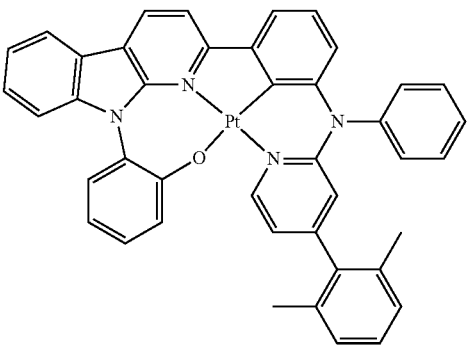

245
-continued
182
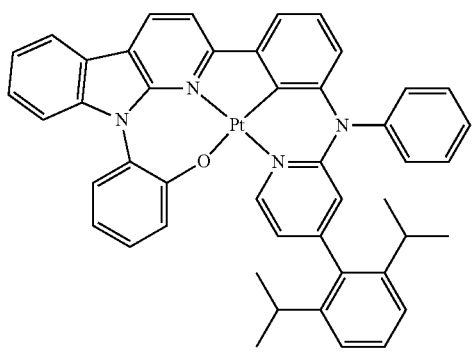
183
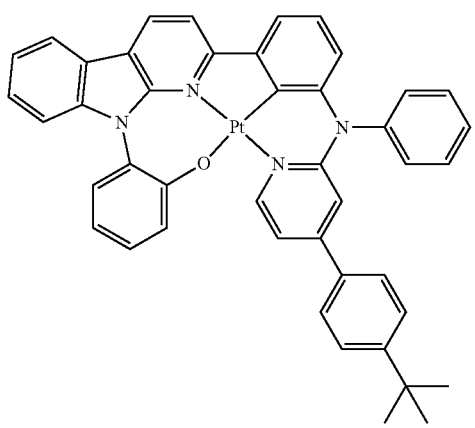
184
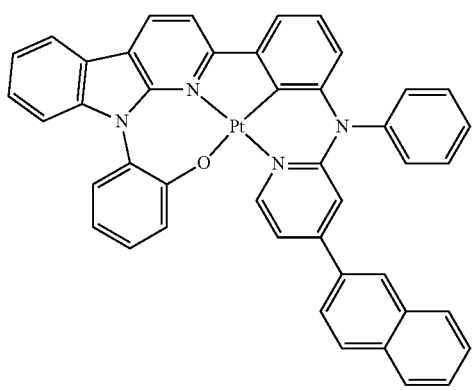
185
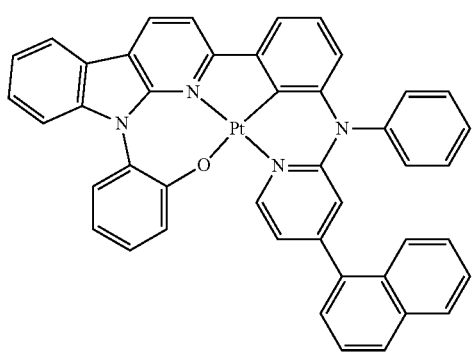
246
-continued
186
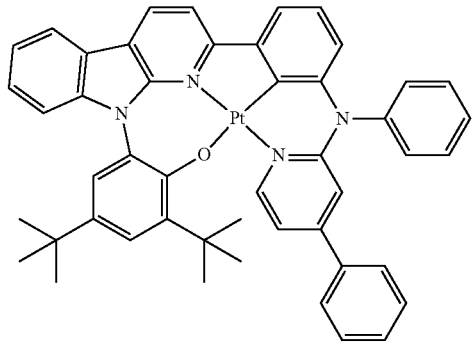
187
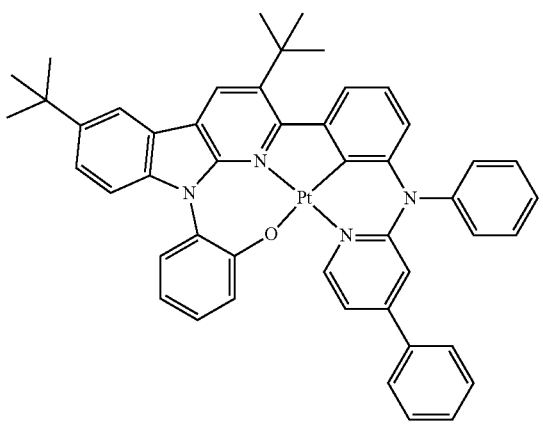
188
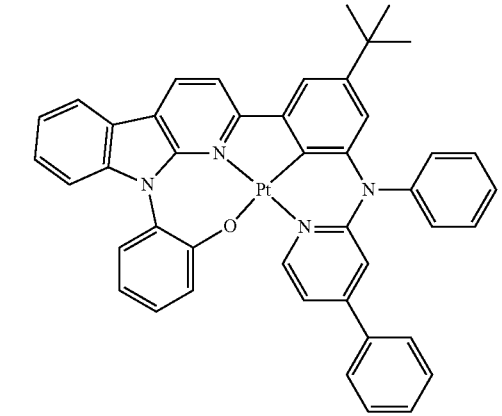
189
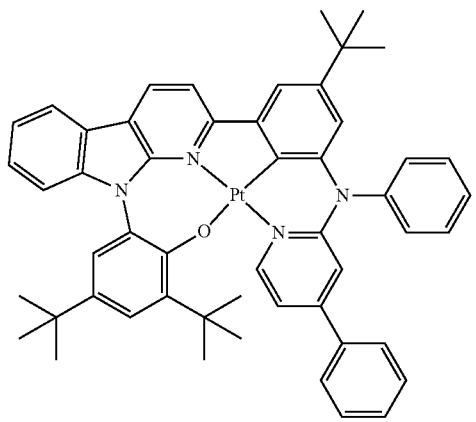

-continued
190
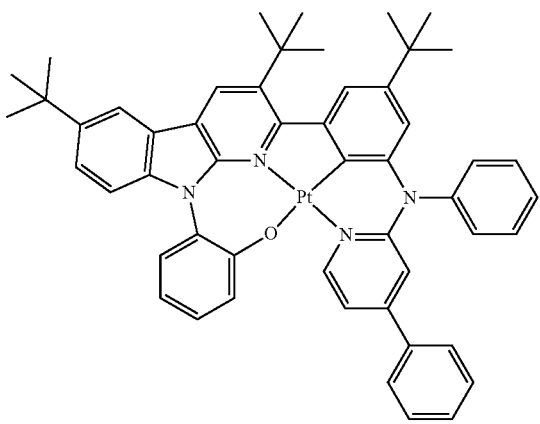
191
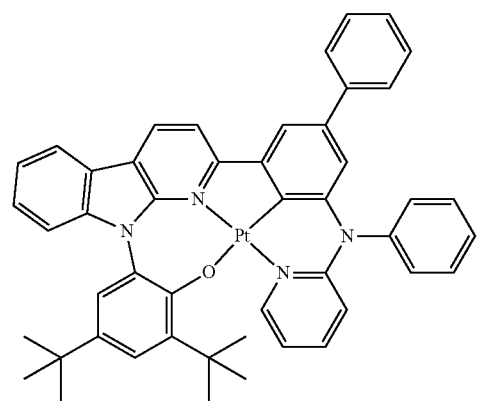
192
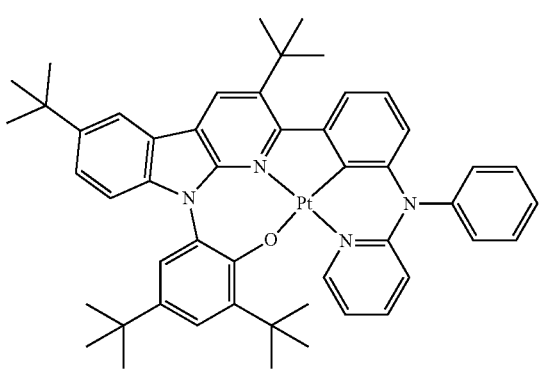
-continued
193
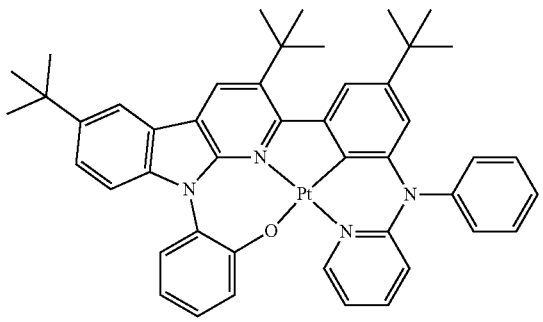
194
195
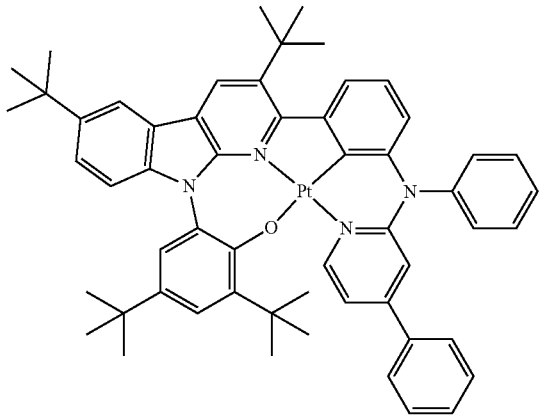
196
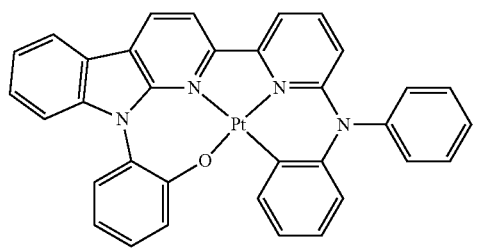

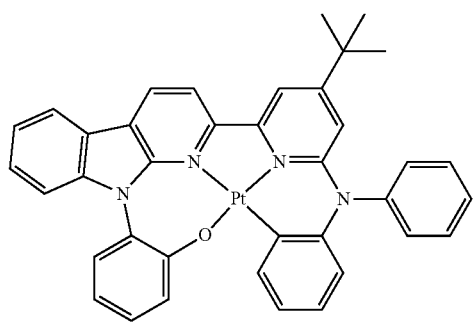

197

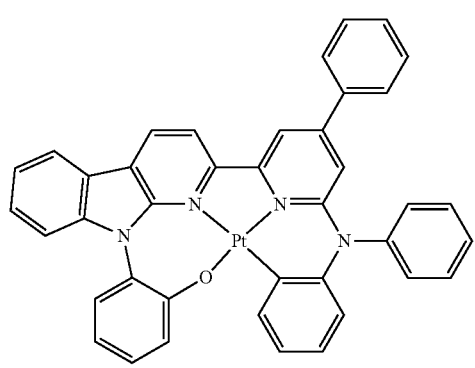

198

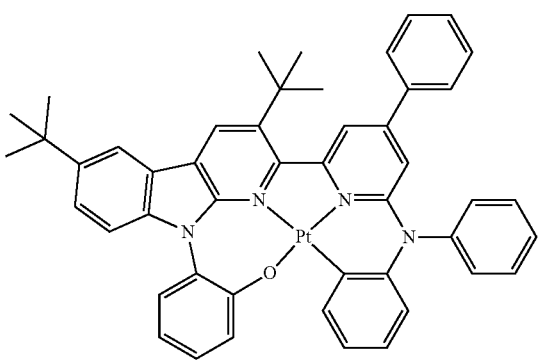

199

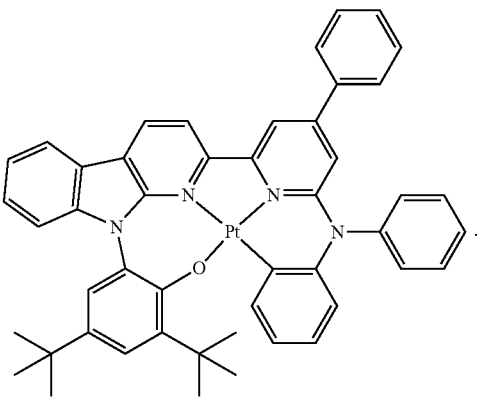

200

16. An organic light-emitting device comprising:
a first electrode;
a second electrode; and
an organic layer between the first electrode and the second electrode and comprising an emission layer,
wherein the organic layer comprises at least one organometallic compound of claim 1.

17. The organic light-emitting device of claim 16, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and an amount of the host is larger than an amount of the organometallic compound.

20. A diagnostic composition comprising at least one organometallic compound of claim 1.

* * * * *